US012801800B2

(12) United States Patent
Murphy et al.

(10) Patent No.: US 12,801,800 B2
(45) Date of Patent: Nov. 17, 2026

(54) AI-ASSISTED AUTOMATED TURNOVER SYSTEMS

(71) Applicant: Togal.AI Inc., Miami, FL (US)

(72) Inventors: Patrick E. Murphy, Miami, FL (US); Johnny Maghzal, Miami, FL (US); Thomas Patrick Murphy, Miami, FL (US)

(73) Assignee: TOGAL.AI, INC., Miami, FL (US)

( * ) Notice: Subject to any disclaimer, the term of this patent is extended or adjusted under 35 U.S.C. 154(b) by 0 days.

(21) Appl. No.: 19/255,683

(22) Filed: Jun. 30, 2025

(65) Prior Publication Data

US 2026/0228373 A1 Aug. 6, 2026

Related U.S. Application Data

(60) Provisional application No. 63/752,516, filed on Jan. 31, 2025.

(51) Int. Cl.
*G06F 30/13* (2020.01)
*G06F 3/0482* (2013.01)
*G06F 9/451* (2018.01)

(52) U.S. Cl.
CPC ............ *G06F 30/13* (2020.01); *G06F 3/0482* (2013.01); *G06F 9/451* (2018.02)

(58) Field of Classification Search
CPC ......... G06F 30/13; G06F 3/0482; G06F 9/451
(Continued)

(56) References Cited

U.S. PATENT DOCUMENTS 11,475,174 B2 10/2022 Murphy et al.
11,481,704 B2 10/2022 Murphy et al.
(Continued)

FOREIGN PATENT DOCUMENTS

WO WO2025109381 * 5/2025 ............ G06F 30/13

OTHER PUBLICATIONS

Besiktepe, D.: M.E..; Atadero, R.A. Identification of the Criteria for Building Maintenance Decisions in Facility Management: First Step to Developing a Multi-Criteria Decision Making Approach. Buildings 2020, 10, 166.

(Continued)

*Primary Examiner* — Juan C Ochoa
(74) *Attorney, Agent, or Firm* — Tracnik Law, PLLC; Joseph P Kincart

(57) ABSTRACT

Methods, systems, and apparatus for generating a user interactive interface replicating a design of a building that includes details of building construction or renovation practices. The invention employs a controller capable of operating AI and GAN engines to analyze, interpret, and dynamically update design plans as physical changes in the building are registered on-site. Via the interactive user interface, contractors can view, select, and modify design components, documenting details such as dimensions, specifications, compliance notes, and reasons for the physical change. The system is capable of real-time feedback, analyzing the impacts of modifications on other building systems (e.g., HVAC, plumbing) and generating prompts or automated suggestions to maintain design integrity. Annotations, multimedia, and change indicators enhance collaborative review and tracking, streamlining the turnover process. The invention further enables selective access for authorized contractors and parts vendors based upon updated design plans and historical interactions.

29 Claims, 43 Drawing Sheets

(58) Field of Classification Search
USPC ............................................................... 703/1
See application file for complete search history.

(56) References Cited

U.S. PATENT DOCUMENTS

| | | | | |
|---|---|---|---|---|
| 11,625,553 | B2 * | 4/2023 | Powles | G06V 30/413 382/155 |
| 11,797,733 | B2 * | 10/2023 | Murphy | G06N 3/08 |
| 12,373,613 | B2 * | 7/2025 | Jain | G06F 30/13 |
| 2002/0007225 | A1 | 1/2002 | Costello et al. | |
| 2003/0046174 | A1 | 3/2003 | Goldsmith et al. | |
| 2008/0059220 | A1 * | 3/2008 | Roth | G06Q 50/18 705/317 |
| 2014/0089209 | A1 | 3/2014 | Akcamete et al. | |
| 2016/0117785 | A1 | 4/2016 | Lerick et al. | |
| 2016/0132046 | A1 | 5/2016 | Beoughter et al. | |
| 2017/0323238 | A1 | 11/2017 | Tanaka | |
| 2018/0130260 | A1 | 5/2018 | Schmirler et al. | |
| 2021/0381861 | A1 * | 12/2021 | Brown | G05D 22/02 |

OTHER PUBLICATIONS

Shen, Qiping, Kak-Keung Lo, and Qian Wang. "Priority Setting in Maintenance Management: A Modified Multi-Attribute Approach Using Analytic Hierarchy Process." Construction Management and Economics 16.6 (1998):693-702 (Shen).

* cited by examiner

| | | 322 | 323 | 324 | 325 | 326 | 327 |
|---|---|---|---|---|---|---|---|
| | AREA TYPE | PRIVATE OFFICE | GENERAL OFFICE SPACE | PUBLIC CONF. ROOM | PRIVATE CONF. ROOM | PRIVATE WATER CLOSET | PUBLIC WATER CLOSET |
| 322 | PRIVATE OFFICE | 50/50 | 50/40 | 40/50 | 50/50 | 50/50 | 40/60 |
| 323 | GENERAL OFFICE SPACE | | | | | | |
| 324 | PUBLIC CONF. ROOM | | | | | | |
| 325 | PRIVATE CONF. ROOM | | | | | | |
| 326 | PRIVATE WATER CLOSET | | | | | | |
| 327 | PUBLIC WATER CLOSET | | | | | | |

FIG. 3D

TABLE A

| | AREA TYPE MAPPING | | |
|---|---|---|---|
| | CASUAL NAME | CLASS NAME | # |
| 413 | NONE | non | 0 |
| | RESIDENTIAL | residential | I |
| | HOTEL | hotel | I |
| | RETAIL | office | I |
| 411 | OFFICE | amenity | I |
| | AMENITIES | foh | I |
| | FOH | bohAc | I |
| | BOH AC | bohNonAc | I |
| | PARKING | parking | I |
| 412 | STAIRS | stair | I |
| | PUBLIC TERRACES | public terrace | I |
| | PRIVATE BALCONIES | privateBalcony | I |
| | NON-ACCESSIBLE | nonAccessible | I |

| | 415 | 416 | 417 | 418 | 419 | 420 | 421 |
|---|---|---|---|---|---|---|---|
| 414 | UNIT | WORK TYPE | WORK QTY. | WORK HRS. | ADDTL. COST | EXPEDITE COST | LINE ITEM COST |
| ITEM ONE | A | ELEC. | 1 | 650 | $2000 | $5500 | $7750 |
| ITEM TWO | | | | | | | |
| ITEM THREE | | | | | | | |
| ITEM FOUR | | | | | | | |
| | | | | | | | |
| TOTAL 422 | | | | | | | |

TABLE B

FIG. 4B

AI-ASSISTED AUTOMATED TURNOVER SYSTEMS

CROSS-REFERENCE TO RELATED APPLICATIONS

This application claims priority to U.S. Provisional Application No. 63/752,516, filed Jan. 31, 2025, and entitled AI-ASSISTED AUTOMATED TURNOVER SYSTEMS, the entire disclosure of which is incorporated herein by reference.

FIELD OF THE INVENTION

The present invention relates generally to the field of construction management and building deployment processes, and more specifically to automated systems, methods and apparatus for registering physical aspects of a constructed building in a manner conducive to turning over responsibility of a building from construction personnel to a building owner. The invention leverages artificial intelligence (AI) and machine learning technologies, including Generative Adversarial Networks (GANs), to interpret, document, and update aspects of a constructed building in a format conducive to turning responsibility of a constructed building from those responsible for constructing the building to the building owner and/or maintenance personnel. The system enables authorized contractors and other stakeholders to register physical changes, analyze impacts, and manage compliance, facilitating a comprehensive and intelligent turnover of the updated design plan for future maintenance, historical tracking, and compliance verification.

BACKGROUND OF THE INVENTION

In the construction industry, a "turnover" refers to a formal process of transferring a completed building from a contractor or other entity responsible for construction of the building over to the building owner. This process ensures that the owner receives a facility in line with a specified design plan, along with all necessary documentation and knowledge for the building's effective deployment (operation and maintenance).

Typically, before turnover, the contractor finalizes all construction activities and addresses any outstanding items noted on an associated punch list. Such tasks may be identified during inspections that check for contractual obligations being met. In addition, the contractor is responsible for compiling and handing over building related documentation, such as, for example: As-Built Drawings detailing all changes made during construction, providing an accurate representation of the completed structure; Operation and Maintenance (O&M) Manuals: that outline the procedures for operating and maintaining building systems and equipment; Warranties specifying the terms under which repairs or replacements will be made in case of defects; and official documents verifying that the building meets all regulatory standards and codes.

In the modern construction industry, building projects are initiated with the creation of detailed design plans. These plans serve as the blueprint for what the final structure will look like, detailing everything from the architectural layout to the placement of important systems such as HVAC, plumbing, and electrical wiring. The design plan is a highly structured document, often created by architects and engineers in collaboration with the client, aimed at outlining every aspect of the building's construction. It includes detailed specifications on materials, dimensions, load-bearing elements, and aesthetic features like lighting and fixtures. However, despite the meticulous nature of these plans, they often do not survive the construction process unaltered.

Construction projects frequently encounter changes that alter the initial design plan. One common reason may be the evolving preferences of the client. For example, a client may initially approve a design, but as construction progresses and certain elements begin to take physical form, the client may request modifications. This can include altering room layouts, a change of materials, or requesting additional features that were not part of the original plan. For example, a client may decide halfway through construction to add an extra room or shift the placement of windows for better lighting. Such changes often require modifications not only to the architectural plan but also to the underlying systems like electrical wiring and plumbing, creating a ripple effect throughout the entire project.

Another factor that frequently leads to deviations from the design plan is the emergence of unforeseen issues during construction. No matter how thorough the planning is, there are always site-specific challenges that cannot be fully anticipated. For example, the discovery of underground pipes or poor soil conditions during foundation work may force contractors to rework the layout of the building. Additionally, unexpected weather conditions or delays in material supply can necessitate changes in the construction schedule and, consequently, the building's design. These unforeseen events may require real-time adjustments to the design, and in some cases, significant portions of the original plan may be discarded.

As a result of these changes, the building that ultimately gets constructed can have numerous variations from the original design plan. These variations may be minor, such as a slight shift in the location of a door, or significant, such as the complete reconfiguration of a wing of the building. When it is time to turn the building over to the client, they often need to understand what has changed during construction. This is not just a matter of aesthetics but also a practical necessity, as the client will want to know how the building functions compared to the original vision. For example, if the placement of HVAC systems was altered due to structural limitations, the client will need to be informed of these changes to manage future maintenance or potential upgrades.

Previously, building documentation was primarily paper-based or maintained in digital formats that are not integrated, it is prone to being lost or misfiled over time. This is particularly problematic for larger projects or projects that span several years, where numerous changes are made. Older reports may be lost or damaged, which makes it difficult to review the building's complete history at later stages, especially during retrofitting or renovations. Incomplete documentation can also be problematic for new owners who acquire the building after construction is completed but do not have easy access to the history of modifications.

At the end of construction, reports are typically prepared and provided to the client to document the changes that have occurred. These reports can include detailed descriptions of the modifications made, the reasons for those changes, and the impact on the overall building. For example, if the design called for a specific type of insulation that was not available and a substitute was used, this would be documented in the report along with any differences in thermal performance. Similarly, if a section of the building required structural reinforcement that was not part of the initial plan, this would also be detailed. While these reports serve as an important record of the construction process, they can be difficult for the client to navigate and understand.

There is a clear need for improved methods of tracking and documenting construction changes that can provide building owners and future contractors with a complete and easily accessible record of the building's history. This documentation needs to be centralized, accurate, and dynamic, allowing for real-time updates and comprehensive tracking of all modifications made during the construction and renovation processes. The ability to provide such detailed and organized information would significantly reduce the risks and costs associated with future building maintenance, retrofitting, and renovations, while also simplifying the handover process from contractors to building owners.

In summary, the current methods of documenting and tracking changes during building construction are fraught with inefficiencies, inaccuracies, and organizational challenges. These methods struggle to keep pace with the dynamic nature of construction projects, where changes to design plans and systems occur frequently. The result is a fragmented record of the construction process, with incomplete documentation of important modifications, scattered reports that are difficult to consolidate, and knowledge gaps that create challenges for future building management, renovations, or maintenance.

SUMMARY OF THE DISCLOSURE

Accordingly, the present invention provides an innovative system for tracking and managing changes made during the construction or renovation of a building, which enables real-time updates to the floor plan as modifications occur, while maintaining a detailed history of these changes. The invention records the progress from the initial design plan through to the as-built configuration, allowing builders, contractors, and service personnel to log and document all deviations, adjustments, or upgrades made throughout the construction process. The system is designed to offer a centralized, easily accessible repository of information for the building's owner or client, giving them a clear understanding of every modification made during the life of the project.

In some embodiments of the present invention, the system comprises a controller that includes an artificial intelligence (AI) engine and/or a generative adversarial network (GAN) engine. The controller serves as the core of the system, receiving an initial or original design plan of a building or a portion of the building. The design plan may be fed into the controller in the form of a two-dimensional (2D) reference, such as architectural blueprints, PDFs, computer-aided design (CAD) files, or building information modeling (BIM) representations. The types of design plans that can be processed by the controller are varied, and may include detailed drawings of structural elements, electrical schematics, plumbing layouts, and HVAC plans. These design plans serve as the basis for the system's ability to dynamically interact with and update building construction information.

Upon receiving the design plan, the controller uses its AI or GAN engine to convert the design plan into multiple dynamic components. These components represent the individual elements of the building or portion of the building, which can include walls, doors, windows, structural supports, fixtures, appliances, and other system elements such as electrical wiring or plumbing pipes. Each dynamic component is given its own set of properties or parameters, such as dimensions, location, material specifications, and performance characteristics. These parameters can be updated and adjusted as the construction progresses, allowing the system to maintain an accurate representation of the building at all times.

The controller generates a first interactive user interface that comprises at least some of these dynamic components, representing the portion of the building in question. The first interactive user interface is designed to provide users, such as contractors, builders, or even clients, with the ability to view, interact with, and modify the building's design in real time. Each dynamic component displayed in the user interface includes a set of parameters that are changeable via the user interface. For example, a user may be able to adjust the length of a wall, relocate a window, or modify the type of material used for a floor. The first interactive user interface serves as the main point of interaction between the user and the system during the construction process.

In some embodiments, the controller arranges the multiple dynamic components included in the first interactive user interface to form a first set of boundaries. The first set of boundaries includes respective measurements such as length and area, and these boundaries define at least a portion of a first unit within the building. A unit can refer to any section of the building, such as a room, hallway, or other defined space. The controller is capable of arranging multiple such units within the design plan and on the user interface, so that the layout of the building is organized and reflects the user's modifications in real time.

As construction progresses, the need for changes, replacements, installations, or relocations of various dynamic components is likely to arise. These needs may stem from a variety of reasons, such as changes in the client's preferences, budgetary constraints, or the discovery of unforeseen site conditions during construction. For example, a user may decide to replace a specified fixture with a less expensive model or may opt to install a newer version of a component that was not part of the initial design plan. Additionally, it may become necessary to relocate a fixture, such as moving a light switch or electrical outlet from one position to another due to adjustments in wall placement or furniture layout.

When such changes are required, the user can reflect them directly in the design plan through the system. By selecting a dynamic component on the first interactive user interface, the user can initiate a modification process. In some embodiments, a pop-up menu appears, prompting the user to specify what action they would like to take—whether to change, replace, or relocate the selected component. For example, if the user selects a lighting fixture, the system may offer options such as replacing it with a different model, changing its location within the room, or adjusting its specifications, such as wattage or style.

After receiving the user's input, the controller analyzes the requested change and determines the impact it will have on the overall design plan and other related components. This may particularly be important, as modifications to one part of the building may have cascading (ripple) effects on other elements. For example, moving a window might necessitate changes to the location of nearby electrical outlets, or installing a larger HVAC unit could require adjustments to the supporting structure. The AI engine within the controller is capable of performing these complex analyses, taking into account all relevant factors to assess the impact of the change.

If any discrepancies or potential conflicts are detected during the analysis, the controller alerts the user, providing detailed information regarding the implications of the proposed change. For example, if the relocation of a fixture would result in non-compliance with the building's structural integrity or if the chosen replacement component exceeds the load-bearing capacity of the designated area, the system would generate a warning. Similarly, the controller can provide insights into how the change might affect other components of the design plan or the building's long-term functionality. In this way, users are fully informed of any potential issues before implementing the change.

In some embodiments, the controller also determines the impact of the requested change concerning compliance with preferred building practices or the building's intended deployment objectives. For example, the system may flag a change that would result in a violation of building deployment objectives or reduce the energy efficiency of the building, depending on the objectives set by the client or builder. The AI engine can cross-reference the change against these compliance standards, providing the user with recommendations for alternative solutions if necessary.

If the requested change is deemed acceptable, the controller proceeds to update the design plan accordingly. This update is reflected immediately in the interactive user interface, allowing the user to see the modified component in the context of the entire building. The system also logs all information related to the change, including who made the change, when it occurred, and any justifications or supporting documentation provided by the user. This log serves as an important record, allowing for future reference and accountability during the construction process.

In cases where a fixture or appliance is replaced or newly installed, the system prompts the user to input all relevant information about the component. This includes details such as the brand name, model name, year of manufacturing, specifications, and performance ratings. For example, if a builder replaces an HVAC system, they would need to enter the new system's specifications, including its energy efficiency rating, warranty period, and any associated maintenance requirements. The system then stores this information, making it easily accessible for future reference. This functionality may especially be useful for building owners who will need this information for maintenance, repairs, or eventual replacement of fixtures.

In some embodiments, the system also tracks warranty information for newly installed components. For example, when a user installs a new appliance or fixture, they can input the warranty's start date and duration, allowing the system to track when the warranty will expire. The system can generate reminders for the building owner or maintenance team when the warranty is close to expiring, prompting them to schedule any necessary services or inspections. This helps avoid the risk of losing warranty coverage due to missed deadlines or overlooked maintenance requirements.

Additionally, the system may support the input of performance data for each dynamic component. This can include energy consumption metrics, safety ratings, or any other relevant performance specifications. For example, if a new lighting fixture is installed, the user can input details about its wattage, lumens, and expected lifespan. This data allows the system to provide the building owner or facilities manager with insights into the building's overall performance, such as its energy efficiency or maintenance needs.

In some embodiments of the present invention, the system allows a user to interact directly with the design plan by tapping on a specific spot using the user interface. This feature enables the user to select any area on the design plan where a component needs to be changed, modified, or newly installed. Once a spot is selected, the system presents the user with options related to the action they want to perform, such as installing a new fixture, replacing or relocating an existing component, or modifying the current configuration.

For example, let's consider a scenario where a user selects a spot on the design plan to install a new window. The user taps on the desired location for the window on the interactive interface, triggering a pop-up that prompts them to input information related to the action. The user is then required to enter all the relevant details about the new window, including its dimensions, material, manufacturer, and other specifications such as insulation properties or energy efficiency ratings. Once the user has provided this information, the system registers the installation of the new window at the selected spot.

However, installing a new window is not an isolated change, it can impact other components in the building's design, particularly those related to electrical wiring, ventilation, plumbing layout, and even structural elements. In some cases, the controller, using the AI engine, analyzes how the installation of the new window affects associated components within the design plan. For example, the system will recognize that the addition of the window alters the wall where electrical wiring might have been routed or where ventilation ducts were positioned. Since placing a window in this spot changes the physical layout of the wall, the system must determine how to adjust the electrical and ventilation systems to accommodate the new window.

The AI engine in the controller plays an important role in this process. Once the user inputs the window details, the AI engine begins analyzing how the affected components, such as electrical circuits and ventilation systems, should be modified to align with the new window's position. For example, if there were electrical wiring running through the selected spot, the controller (e.g., using GAN engine) will automatically re-route the wiring around the new window. Similarly, if the building's ventilation system includes ducts running through the wall, the controller will adjust the duct layout, either rerouting the ducts or repositioning vents to maintain proper airflow in the room.

This automatic update to the associated components by the GAN engine is based on the system's understanding of both the initial design plan and the user's inputs for the new window. The GAN engine is capable of generating alternative configurations for the associated electrical and ventilation systems in real time. It may, for example, suggest rerouting electrical cables to another section of the wall or reconfiguring air ducts to avoid obstruction by the new window. The system also takes into account regulatory compliance and practical considerations, such as maintaining optimal airflow or facilitating that the new layout meets safety standards for electrical systems.

As part of the process, the controller alerts the user to any significant impacts the change may have on other components. For example, if rerouting the electrical wiring leads to a longer cable run or if the ventilation ducts need additional support due to the new layout, the system will provide this information to the user. The user is then given the option to approve or adjust the proposed changes before they are finalized. Once approved, the controller automatically updates the design plan to reflect the new configurations, logging all changes made to the associated components, including who performed the updates and when they were made.

In some embodiments of the present invention, a dynamic floor plan automatically updates as changes are logged. When a contractor or builder modifies an element, such as shifting the placement of a wall or upgrading a fixture, the system adjusts the floor plan accordingly. For example, if an HVAC system is rerouted due to unforeseen structural issues, the floor plan will reflect the new path of the ductwork in real time. This provides a visual representation of the building's evolving state, eliminating the need for manual updates to paper plans or static digital files. The dynamic nature of the floor plan facilitates that everyone involved in the construction or renovation process has access to the most current information.

The invention also provides detailed logging capabilities that capture the reason behind each change. For example, if a client decides to change the flooring material in a particular room from wood to tile, the system logs this decision along with the date of the change, the contractor responsible for implementing it, and any relevant details about the materials used. This creates a detailed historical record of the entire construction process, providing a clear trail of decision-making and execution. The log can be accessed at any point during or after construction, giving stakeholders a transparent view of the changes made and their rationale.

One of the key advantages of the present invention is its ability to track the installation of specific fixtures and appliances within the building. Each fixture, whether it's an HVAC system, lighting fixture, plumbing component, or electrical switch, is logged in the system with detailed information such as installation date, manufacturer, model number, and warranty details. This allows the building owner to easily access important information about the building's components, including any maintenance or service requirements. For example, if a specific light fixture needs to be replaced, the system can provide the exact model and rating of the original fixture, along with information about where and when it was installed.

The system also enables users to associate photographic documentation with specific locations within the building. Contractors or builders can take pictures of the installation or modification of fixtures and tag those images to the corresponding location on the floor plan. For example, if plumbing is installed within a wall, a contractor can take a picture of the installation before the wall is closed and link that photo to the floor plan. This provides future contractors or service personnel with a visual reference of what is hidden behind walls or beneath floors, reducing the risk of accidental damage during future renovations or repairs.

In addition to tracking fixtures and structural modifications, the invention logs all electrical and plumbing installations, providing detailed information on wiring, pipe placement, and system configurations. This may particularly be valuable during renovations, as contractors will be able to reference the system (for the latest floor plan) to determine the exact placement of hidden systems before making any changes to walls or floors. For example, if a contractor is tasked with installing a new fixture in a wall, they can use the system to check if there is any plumbing or electrical wiring behind that wall before drilling, thus avoiding costly mistakes such as damaging pipes or cutting through wires.

The invention further allows for the tagging of specific areas on the floor plan for future reference. Contractors or service personnel can mark areas where changes have been made, such as the location of a newly installed HVAC unit or where electrical wiring has been modified. These tags provide detailed context about the changes made, such as the reason for the modification, who performed the work, and any relevant technical specifications. This tagging system is particularly useful for large or complex buildings, where multiple contractors may be working in different areas simultaneously and need to coordinate their efforts.

Another important aspect of the invention is the ability to track the history of each change made throughout the construction or renovation process. Each modification is recorded with a timestamp, allowing users to see not only what was changed but also when the change occurred. This is useful for tracking the progress of the project and for understanding how the building has evolved over time. For example, if a client wants to review the changes made to a specific room, they can view a timeline of modifications that shows when each change was implemented and the reason behind it.

The invention also allows for the association of change purposes with specific modifications. For example, if a change was made to accommodate new safety regulations or to improve energy efficiency, this information is logged in the system along with the modification itself. This provides a clear understanding of the reasons behind each change and helps to justify the decisions made during construction. Additionally, it allows the building owner to review the building's compliance with any relevant regulations or standards.

One embodiment of the invention allows contractors to assign tasks or updates to specific areas on the floor plan. For example, if a particular section of the building requires a new fixture to be installed, the contractor can tag that location on the floor plan and assign the task to a specific team member. Once the task is completed, the system logs the completion and updates the floor plan to reflect the new installation. This task management functionality helps streamline the construction process by keeping all stakeholders informed of the current status of the project and the tasks that still need to be completed.

The system can also store and display all relevant documentation related to the building's construction or renovation. For example, blueprints, permits, and inspection reports can be uploaded and linked to specific areas of the floor plan. This provides a centralized location for all project-related documents, making it easy for contractors and building owners to access important information when needed. In the case of future renovations, these documents will provide a valuable reference for understanding the building's original design and any subsequent changes.

Another feature of the invention is the ability to compare the initial design plan with the final as-built configuration. The system allows users to view side-by-side comparisons of the original design and the completed project, highlighting any discrepancies or deviations from the plan. For example, if a structural change was made due to unforeseen site conditions, the system will show both the original design and the final implementation, allowing the building owner to see exactly how the project evolved. This comparison feature is especially useful for clients who want to understand the scope of changes made during construction and their impact on the final building.

The invention also provides support for tracking warranties and maintenance schedules for the building's fixtures and systems. Each component installed during construction is logged with its warranty information, including the warranty expiration date and any conditions that need to be met to keep the warranty valid. The system can generate reminders for the building owner when warranties are set to expire or when maintenance is required, helping to extend the lifespan of the building's systems and avoid costly repairs.

In some embodiments, the system includes the ability to generate reports summarizing the changes made during the construction or renovation process. These reports can be customized to show specific types of changes, such as structural modifications, fixture installations, or electrical system updates. The reports can also include photographic documentation, tagged locations, and detailed logs of who made each change and why. These reports provide a valuable tool for building owners when reviewing the project's progress or preparing for future renovations.

The system is designed to accommodate buildings of all sizes and complexities, from small residential homes to large commercial structures. The system's flexible design allows it to be scaled to meet the needs of any project, regardless of the number of contractors or the complexity of the building's systems. This makes it an ideal solution for managing both simple renovations and large-scale construction projects, where keeping track of changes and coordinating multiple teams can be particularly challenging.

Another embodiment of the invention allows building owners to access the system remotely, via a web-based interface or mobile application. This enables clients to track the progress of the construction or renovation project in real time, even if they are not physically present on the site. The system provides a detailed overview of the current status of the project, along with access to all relevant documentation, photographs, and logs of changes. This remote access functionality is particularly useful for clients who want to stay informed about the project without needing to be involved in the day-to-day management.

The invention also provides support for integration with other construction management tools, such as project management software, BIM (Building Information Modeling) systems, and asset management platforms. This integration allows the system to pull in data from multiple sources and provide a comprehensive view of the project, combining construction progress with asset tracking and project timelines. For example, if a BIM system is used to model the building's structure, the invention can integrate with that system to update the floor plan in real time as changes are made during construction.

One embodiment of the invention includes a notification system that alerts stakeholders when significant changes are made to the building's design or construction. For example, if a major structural modification is implemented, the system can automatically send notifications to the project manager, client, and any relevant contractors, providing them with an update on the project's progress and any implications of the change. This notification system helps to keep all stakeholders informed and reduces the risk of miscommunication during the construction process.

The invention is also designed to facilitate the turnover process when the building is handed over to the client. At the end of construction, the system generates a comprehensive report that summarizes all changes made during the project, along with detailed information on the as-built configuration. This report provides the client with a clear understanding of the building's final state, as well as a record of any deviations from the original design. The report can also include maintenance schedules, warranty information, and photographs of key installations, giving the client all the information they need to manage the building effectively.

In some embodiments, the system includes functionality for building owners to request renovations or modifications after construction is complete. The owner can use the system to tag specific areas of the building where they would like changes to be made, such as adding new fixtures or reconfiguring rooms. Contractors can then access these tags, review the requested changes, and update the floor plan as the renovations are implemented. This functionality streamlines the renovation process by providing a clear and organized method for requesting and managing changes.

Another embodiment of the invention allows building owners to export the data from the system into various formats, such as PDFs, spreadsheets, or CAD files. This allows for easy sharing of information with third parties, such as contractors, inspectors, or regulatory agencies. For example, if a building inspector requests detailed information about the building's fire safety systems, the owner can export the relevant data and provide it to the inspector in the required format.

The invention is also capable of generating predictive maintenance schedules based on the building's usage and the age of its systems. By analyzing the data logged during construction, the system can predict when certain fixtures or systems are likely to require maintenance or replacement. For example, if the building's HVAC system is nearing the end of its warranty period, the system can generate a maintenance schedule that recommends servicing the system to prevent any issues before the warranty expires. This predictive functionality helps to extend the lifespan of the building's systems and reduce the risk of unexpected failures.

In another embodiment, the invention includes functionality for tagging specific locations in the building with safety-related information. For example, if a fire safety system is installed in a particular area, the system can log this information and provide alerts if the system requires maintenance or if any modifications are made that could affect its performance.

In some embodiments, the present invention provides methods, apparatus and systems for users (e.g.: architects, owners, developers, engineers, compliance reviewers, builders, and other users to annotate a dynamic interface based upon a static two-dimensional (sometimes referred to herein as "2D") or three dimensional (sometimes referred to herein as "3D") references, such as floorplans, design plans, blueprints, and the like, with the aid of artificial intelligence (sometimes referred to herein as "AI" and an AI platform programmed to accomplish the methods described herein as an "AI Engine").

According to the present invention, automated systems, apparatus, and methods provide tools that empower users to select spatial designations, such as those associated with specific segments, elements or components within a design plan and associate one or more annotations with the spatial designation and/or segment, element, or component. In some embodiments, automated processes discern a specific type of element or dynamic component present within a design plan based on a pixel-level examination by the AI engine. Elements may encompass a diverse array of features, including but not limited to: walls, windows, doors, stairwells, staircases, ramps, ceilings, floors, columns, beams, roofs, skylights, facades, and an assortment of other architectural components. Furthermore, the present invention provides users with the capability to intelligently annotate these elements (including annotating lines and polygons), significantly enhancing the precision and utility of design plan modifications. This dynamic annotation process, (which may be powered by the AI engine) allows for annotations to adapt in real time to changes within the design plans.

In some embodiments, annotations may be designated to remain accurately aligned with an intended design element, even as modifications are made to the design element and/or other aspects of the design plan. The AI engine may facilitate spatial alignment of an annotation by automatically updating annotations based on the AI Engine's analysis of design components' spatial relationships and dimensions. This level of intelligence in annotation not only streamlines the design review and modification process but also enhances collaborative efforts by maintaining a consistent and up-to-date representation of the design intent across all user interactions.

By enabling detailed and dynamic annotations in a user interface based upon a static design plan, the present disclosure empowers stakeholders involved in a process referencing the design plan to achieve a higher degree of accuracy, efficiency, and collaboration, ultimately leading to the realization of more sophisticated and well-coordinated projects.

In some embodiments, automated systems described by the present invention may maintain a dynamic user interface similar to an up-to-date digital twin of a portion of a building. The dynamic user interface may reflect thought processes, alterations in a physical environment, or suggestions for improvements, back to the dynamic user interface based upon the static design plan. Such synchronization may facilitate (by way of non-limiting examples) more accurate material lists, cost assessments, workforce allocation, and adherence to best practices, thereby optimizing the collaborative process in planning, executing, and managing architectural projects.

In general, the present invention provides for apparatus and methods related to receiving as input static representations (either physical or electronic, and either two-dimensional or three-dimensional) and generating one or more pixel patterns based upon automated processing of the static representations. The pixel patterns are analyzed using computerized processing techniques to mimic the perception, learning, problem-solving, and decision-making formerly performed by human workers (sometimes referred to herein as artificial intelligence or "AI"). The AI analysis process is repeated for multiple static representations over time, each static representation including a change to the design of a building. The AI processes denote, and track changes made in the sequence of static representations of design documents.

Based upon AI analysis of pixel patterns derived from the two-dimensional references and knowledge accumulated from increasing volumes of analyzed two-dimensional references, interactive user interfaces may be generated that allow for a user to modify dynamic static representations of features gleaned from the two-dimensional reference. The interactive user interfaces may enable users to select specific portions or segments on the design plans, wherein the AI engine employs AI processing to determine the elements or components present within the chosen segment by analyzing the pixel patterns of the two-dimensional references. AI processing of the pixel patterns, based upon the two-dimensional references, may include mathematical analysis of polygons formed by joining select vectors included in the two-dimensional reference. The analysis of pixel patterns and manipulatable vector interfaces and/or polygon-based interfaces is advantageous over human processing in that AI analysis of pixel patterns, vectors and polygons is capable of leveraging knowledge gained from previous work, whether or not a human was involved, hence the importance of integrating our AI with existing databases.

In still another aspect, in some embodiments, enhanced interactive interfaces may include one or more of: user definable and/or editable lines; user definable and/or editable vectors; and user-definable and/or editable polygons. The interactive interface may also be referenced to generate diagrams based on the lines, vectors and polygons defined in the interactive interface. Still further, various embodiments include values for variables that are definable via the interactive interface with AI processing and human input.

According to the present invention, analysis of pixel patterns and enhanced vector diagrams and/or polygon-based diagrams may include one or more of: neural network analysis, opposing (or adversarial) neural networks analysis, machine learning, deep learning, artificial intelligence techniques (including strong AI and weak AI), forward propagation, reverse propagation and other method steps that mimic capabilities normally associated with the human mind, including learning from examples and experience, recognizing patterns and/or objects, understanding and responding to patterns in positions relative to other patterns, making decisions, solving problems. The analysis also combines these and other capabilities to perform functions the skilled labor force traditionally performed.

In some specific examples, the present invention uses machine learning and/or artificial intelligence to identify architectural aspects and materials, such as walls, stairwells, floors, ceilings, doors, windows, and HVAC components, within the selected portion of the design plan. The present invention identifies such architectural aspects, and other building features and provides dynamic association between design plan elements such as objects, polygons, or lines and their corresponding annotations. Such embodiment facilitates that when a user moves a design plan element within the digital workspace as part of design plan modification, any associated annotations are automatically moved in tandem with the element. This feature is powered by the underlying artificial intelligence (AI) engine, which intelligently recognizes the linkage between the spatial characteristics of design elements and their annotated descriptions or markers.

Upon initiating a move action for a given design element or dynamic component, the system calculates the new position of the element and simultaneously updates the positions of all related annotations. This process is seamless and requires no additional input from the user, thereby enhancing the efficiency of the design modification process. The system facilitates that annotations retain their spatial relevance to the design elements they describe, regardless of how these elements are repositioned within the design plan. By automating the concurrent movement of annotations with their respective design elements, the invention significantly reduces the risk of errors and streamlines the workflow. Furthermore, the intelligent handling of this feature extends to the recognition of complex movements and transformations of design elements, such as rotations, scaling, or mirroring. The AI engine adeptly adjusts the annotations to maintain their correct orientation and relationship to the elements, providing a robust solution that supports a wide range of design activities.

In some preferred embodiments, the AI Engine is seamlessly integrated with databases housing a repository of past similar projects. These databases serve as invaluable resources, facilitating the AI engine's learning process by drawing insights from diverse user decisions made in comparable prior works. This integration empowers the AI Engine with a wealth of accumulated knowledge, enhancing its ability to offer informed and contextually relevant recommendations.

A two-dimensional reference, such as a design floorplan is input into an AI engine and the AI engine converts aspects of the floorplan into components that may be processed by the AI engine, such as, for example, a rasterized version of the floorplan. The floorplan is then processed with machine learning to specify portions that may be specified as discernable components. Discernable components may include, for example, rooms, residential units, hallways, stairs, dead ends, windows, or other discrete aspects of a building.

A scaling process may be applied to the floorplan and size descriptors are assigned to the discernable components. In addition, distances, such as, for example, a distance to an exit from the furthest point in a residential unit are calculated. The scaling process may also be used for determining dimensions of dynamic components, or relative spatial distances between dynamic components.

In some embodiments, the system enables a method for registering physical changes on a design plan by first receiving the design plan into a controller equipped with AI and GAN capabilities. The controller generates an interactive user interface that displays the design plan and its components, allowing users to engage with specific elements, like structural components or utilities. The AI engine in the controller interprets each selected component's purpose and surrounding context to make it possible for the user to register intended physical changes accurately. For example, a contractor may select an HVAC vent on the plan, intending to relocate it. By entering change details, such as intended new placement, dimensions, and relevant building objectives or design considerations, the user helps the controller perform a precise analysis that considers interactions with nearby components.

In specific embodiments of the invention, the process of selecting a spot, a segment, or a component may involve one or both of the following actions: marking around or on the desired segment or design element directly within the user interface or utilizing a polygon shape tool accessible on the user interface, enabling users to drag and position the shape onto the desired segment. Moreover, the selection of a segment can be initiated either manually by a user or automatically by the AI engine. Additionally, when employing the polygon shape tool, users may choose from a range of polygon shapes provided by the AI engine within the user interface for selection and placement.

In some embodiments of the present invention, the system accommodates a variety of annotation formats, providing a versatile and robust platform for user interaction with design plans. Users can annotate design elements using text, comments, images, videos, or voice recordings captured via a microphone. This multimodal annotation capability enables users to convey their feedback or instructions in the most appropriate format for the context, enhancing the clarity and effectiveness of communication within the design process.

By providing such a diverse range of annotation formats and the intelligent processing of these annotations, the present invention fosters a highly adaptable and user-friendly environment. It facilitates that all authorized contributors can engage with the design plan in the manner that best suits their needs and expertise, while also allowing the AI Engine to learn from and adapt to the varied annotation styles, further enhancing the collaborative design process.

In one embodiment of the present invention, the system employs an AI engine that performs intelligent adjustments to annotations within a two-dimensional (or three-dimensional) design plan. As changes occur within the design, such as the repositioning of walls or the resizing of rooms, the AI engine responds by automatically updating the annotations linked to those elements, thus preserving the annotations' accuracy and relevance.

This embodiment also includes a feature that provides a comprehensive analysis of the implications of design changes. When a user modifies a design element, the AI engine assesses the impact of this modification on various project aspects, including but not limited to, the required materials, associated costs, and labor demands. It compiles this data into an easy-to-understand format, offering users a detailed overview of how the changes affect the overall project.

For example, if an architect decides to expand a room's dimensions, the AI engine updates the material list to reflect the increased quantity of flooring needed, adjusts the cost estimation to account for this change, and analyzes whether additional labor is required. By automating these calculations, the system streamlines the planning and estimation phases, significantly enhancing communication and collaboration among all stakeholders.

In one embodiment of the present invention, the system features a sophisticated mechanism for tracking and reflecting real-world modifications within a building's physical structure directly onto its digital counterpart (design plans), effectively maintaining an up-to-date digital twin. Utilizing an array of sensors, IoT devices, and cameras strategically installed throughout the physical building, the system captures any changes or alterations made to the structure. These changes may include architectural modifications, interior design updates, or structural enhancements.

Once a change is detected, the AI Engine analyzes the collected data to understand the nature and scope of the modification. This analysis includes identifying the specific design elements affected, the extent of the changes, and any potential impacts on related components within the design plan. The AI Engine then automatically updates the digital design plan to accurately mirror these physical alterations, so that the digital twin remains a true reflection of the current state of the building.

Moreover, in-depth pixel-level analysis may involve considering spatial relationships between pixels within the static representation, facilitating a predefined distance between them, thus refining the precision of the analysis process.

In some embodiments, the two-dimensional reference input may be file extensions that include but are not limited to: DWG, DXF, PDF, TIFF, PNG, JPEG, GIF, or other types of files based upon a set of engineering drawings. Some two-dimensional reference references may already be in a pixel format, such as, by way of a non-limiting example, a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. As some architects, design firms and others who generate engineering designs for buildings may be reluctant to share raw CAD files with others, the present invention provides a solution that does not require raw CAD files.

In other examples, such as for older structures, a drawing or other 2D representation may be stored in paper format or digital version or may not exist or may never have existed. The input may also be in any raster graphics image or vector image format.

BRIEF DESCRIPTION OF THE DRAWINGS

The accompanying drawings, which are incorporated into and constitute a part of this specification, illustrate several embodiments of the present invention. Together with the description, these drawings serve to illustrate some aspects of the present invention.

FIGS. 3A-3D show various views of the AI-analyzed boundaries and design elements overlaid on the original floorplan including a table illustrated to contain hierarchical dominance relationships between area types.

FIGS. 4A-4B illustrate various aspects of dominance-based area allocation.

DETAILED DESCRIPTION

Figure 1A:
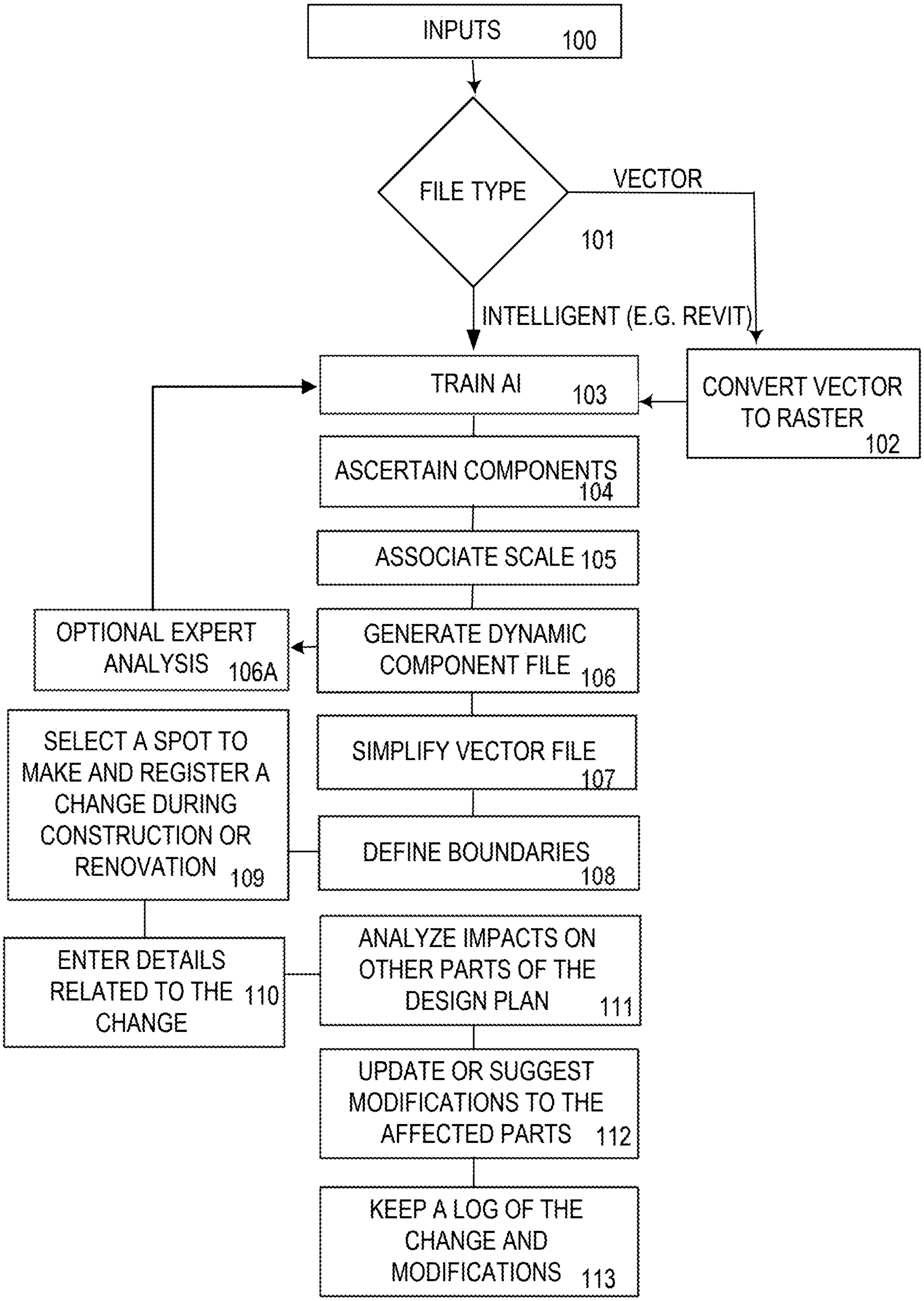
FIG. 1A illustrates method steps that may be implemented in some embodiments of the present invention.

The present invention provides systems, methods, and apparatus for dynamically updating a design plan of a building based on changes made during the construction or renovation process. The design plan of the building may comprise multiple interconnected components, such as structural elements, electrical schematics, plumbing layouts, and HVAC plans. Each of these components plays an important role in the overall construction, and they are typically managed by different contractors or teams specializing in each respective field. For example, structural elements may be handled by general contractors or construction engineers, while electrical systems are the responsibility of electricians, plumbing systems are handled by plumbers, and HVAC plans are implemented by HVAC specialists. These different contractors are tasked with executing their portion of the design plan, often working independently from each other but still relying on a unified design plan.

In some embodiments, different contractors may be responsible for implementing or constructing these various components—structural elements, electrical schematics, plumbing layouts, and HVAC systems. The specialization of contractors allows for expertise in each area, but it also creates a situation where communication and coordination between these fields are paramount. For example, a contractor responsible for the structural elements may not have an in-depth understanding of electrical or plumbing systems, and vice versa. Therefore, a structural contractor might focus solely on their task, such as installing beams, walls, or foundations, without fully considering how their work might impact the placement of wiring, plumbing, or HVAC ducts. This can lead to conflicts later on in the project, where a decision made by one contractor inadvertently disrupts another part of the plan.

The potential disconnect between these specialized contractors is often compounded by the fact that design plans for structural elements, electrical schematics, plumbing layouts, and HVAC plans are all inherently interlinked. For example, the placement of walls or load-bearing beams affects where electrical conduits and plumbing pipes can be routed. Similarly, HVAC systems depend on available space in the structure for ductwork, and these ducts must be carefully integrated with both electrical wiring and plumbing to avoid conflicts. Any change to one component of the design plan, such as relocating a structural wall, can have a significant impact on the other systems. For example, if a contractor decides to move a wall to accommodate client preferences or resolve a site issue, this action can disrupt the planned path of electrical wiring or plumbing systems that were designed to pass through that area.

For example, when a structural element, such as a load-bearing wall, is relocated to make space for an additional room, the original design plan might have called for electrical wiring to run through the wall's interior, and plumbing pipes could have been routed along that same section of the building. With the wall relocation, both the electrical and plumbing layouts are now affected, as they must be rerouted to match the new wall configuration. Additionally, if the relocated wall affects the placement of HVAC ducts, the airflow and overall efficiency of the system may also need to be reevaluated. In this case, the original design plan for the building no longer reflects the actual state of construction, creating the potential for costly delays and complications.

The present invention addresses these issues by allowing the controller, using AI and GAN engines, to automatically update other parts of the design plan when there is a change or addition in one component of the design plan. For example, when a structural element is altered, the controller recognizes the interconnection between that element and the electrical, plumbing, and HVAC systems. The controller processes the change, analyzing its impact on the other systems and generating updated layouts that account for the new structural configuration. In this way, the design plan is kept in sync with the physical construction of the building, minimizing errors and preventing miscommunications between contractors.

An exemplary embodiment of the invention can be seen during the relocation of an HVAC unit. For example, during the construction of the building, an unforeseen requirement, such as a client request or a discovered structural issue, necessitates relocating the HVAC unit from its original designated location. In traditional construction processes, this change would require manual updates to the HVAC plan, and contractors responsible for electrical wiring and plumbing would need to be notified of the change and adjust their layouts accordingly. With the present invention, the user selects the spot where the HVAC unit will be relocated using the interactive design plan interface. The AI engine within the controller immediately analyzes the implications of this change, including how the new location affects electrical power requirements, ventilation ducts, and any plumbing connections related to the HVAC system.

The controller then may update the affected parts of the design plan automatically. For example, if the new location of the HVAC unit requires additional electrical wiring, the controller recalculates the required wiring length, updates the electrical schematic to reflect the new connections, and reroutes any conflicting systems, such as lighting fixtures, to accommodate the new placement. Similarly, if the ventilation layout needs to be adjusted to optimize airflow due to the HVAC relocation, the controller revises the HVAC plan, moving ducts or adjusting vents as needed. These updates are made automatically and reflected in the design plan in real time, meaning the contractor responsible for electrical or HVAC systems can immediately see the new configurations and adjust their work accordingly.

By using the present invention, different contractors or users are always kept up to date with the latest version of the design plan as it evolves during construction. This may particularly be valuable in large construction projects where multiple teams work on different sections of the building simultaneously. For example, while an electrician is wiring a portion of the building, the plumbing team may be installing pipes in another area. If the design plan changes in one part of the building due to structural adjustments or client requests, the system automatically updates the plans for all contractors, allowing them to proceed with accurate, synchronized information. In this way, the system minimizes delays caused by miscommunications or the need to manually update design plans.

The interconnectivity between the structural elements, electrical schematics, plumbing layouts, and HVAC plans is central to how the present invention operates. Each component relies on the proper configuration of the others to function correctly. For example, in a kitchen renovation, installing a new island with a built-in sink will impact the plumbing layout, requiring new water and drainage lines. This installation will also affect the electrical system, as outlets or lighting fixtures might need to be added or relocated. Furthermore, if the kitchen's HVAC layout was initially designed based on the previous room configuration, the addition of the island might block airflow, necessitating changes to the ductwork. The present invention automatically detects these dependencies and adjusts the design plans accordingly.

Another important example is when structural modifications are made during a renovation. For example, a commercial building where the client decides to remove a dividing wall between two rooms to create a larger open office space. This change affects not only the structural layout but also the electrical systems, as wiring may have been routed through the now-removed wall. Similarly, HVAC ducts designed for the smaller, divided rooms will need to be adjusted to optimize airflow for the larger, open space. In this case, the present invention's controller would recognize the wall removal (based on marked changes on the design plan or based on live images or video feeds from the construction site), automatically update the electrical wiring and HVAC duct layout, and provide updated design plans for each contractor. The electrician and HVAC specialists would immediately have access to the modified schematics, preventing any disruption in the workflow.

Furthermore, the system is designed to manage changes that arise from both planned modifications and unforeseen circumstances during construction. For example, during the construction of a high-rise building, a contractor might discover that the originally planned location for an elevator shaft conflicts with the building's foundation layout. The contractor can use the system to select a new location for the elevator shaft, and the controller will automatically recalculate the space requirements, update the electrical power routing for the elevator, and adjust any nearby plumbing or HVAC systems. By keeping all components of the design plan in sync, the system prevents any overlap or conflict between the building's various systems, so that construction proceeds efficiently.

Another embodiment of the present invention allows the system to not only update the design plan based on real-time changes but also generate suggestions for alternative configurations. For example, if a structural modification necessitates moving electrical outlets, the GAN engine can propose multiple alternative layouts that optimize for both function and compliance with preferred building practices or building deployment objectives. The system may suggest rerouting electrical conduits through adjacent walls or provide options for relocating HVAC vents to maintain proper airflow. The contractor or user can then choose the most appropriate configuration from the suggested alternatives, allowing for flexibility and precision in the construction process.

Additionally, the present invention is beneficial during post-construction inspections and future renovations. Once construction is complete, inspectors or contractors performing maintenance can use the system to view the final design plan, which includes all the changes made during the construction process. For example, if an electrical inspection reveals that an outlet is malfunctioning, the contractor can access the design plan to see how the wiring was routed during construction and whether any updates were made to accommodate structural changes. This detailed record-keeping simplifies maintenance and renovation processes by providing a clear history of the building's design and any modifications.

The system also streamlines communication between contractors and project managers. In some construction projects, changes are proposed by the project manager based on client feedback or site conditions. With the present invention, the project manager can make changes directly in the design plan, and the system may automatically update the affected components for all contractors involved. For example, if the client requests a larger window in a particular room, the project manager can select the spot for the window in the user interface, enter the new specifications, and let the system update the electrical wiring and HVAC plans accordingly. Each contractor then receives an updated version of the design plan, allowing them to adjust their work without any delay.

Moreover, the invention allows for detailed logging of every change made to the design plan. Each time a user updates the plan, the system records the action, including who made the change, the date it was made, and the reason for the modification. This creates a comprehensive log of the construction process, which can be reviewed at any time. For example, if an issue arises later in the project, the project manager can refer to the log to see when a particular change was made and why. This detailed record-keeping helps determine accountability and facilitates smooth project management by providing a transparent view of the construction timeline.

In some embodiments, the system supports real-time collaboration between multiple users. For example, during a large construction project, a structural engineer working on-site might need to update the design plan to reflect changes in the building's framework. At the same time, an electrician working remotely can see the updated design plan and adjust their wiring layout accordingly. This real-time collaboration feature helps prevent delays and reduces the likelihood of errors caused by outdated information.

The present invention is also designed to integrate with other construction management tools and software systems. For example, it can be used in conjunction with project management platforms, scheduling tools, and budgeting software. This integration allows for a seamless workflow, where updates to the design plan automatically inform other aspects of the project, such as adjusting the construction timeline or allocating resources. For example, if moving a structural element requires additional materials or labor, the system can notify the project management platform to update the budget and schedule accordingly.

In some embodiments, the present invention provides systems, methods and apparatus for an interactive platform that significantly enhances collaborative processes associated with a dynamic user interface based upon a static design plan reference. Within this interactive platform, users can seamlessly select a spatial designation, (such as, for example, a spatial designation associated with a design element) for annotation within an interactive user interface based upon a static design plan document descriptive of at least a portion of a building or construction site.

An AI engine leverages one or more of machine learning, user input, reference documents, applicable standards, applicable codes, external references, databases, digital content accessible via a communications platform (e.g. the Internet), historical data, and current context to suggest automated annotations, optimizing an annotation process by providing users with intelligent, contextually relevant suggestions that align with a project's specifications and goals.

Some embodiments of the present invention provide significant advancements in project definition and project management technology, as it not only automates task scheduling processes, but also adapts in real-time to changes associated with a design plan and spatially relevant annotations. By doing so, it supports a more agile and responsive project execution strategy, directly contributing to the success and quality of architectural, engineering, and construction projects.

In a further embodiment of the invention, a sophisticated dynamic cost estimation functionality is embedded within the system, enabling the real-time assessment of the financial implications stemming from alterations made to the digital design plan. When users initiate changes to design elements or make new annotations, the AI engine evaluates these modifications. It does this by calculating the expected changes in material requirements, updating labor needs based on the scope and scale of the adjustments, and revising cost estimations to reflect these new calculations accurately.

In the following sections, detailed descriptions of examples and methods will be given. The descriptions of both preferred and alternative examples, though thorough, are exemplary only. It is understood by those skilled in the art, that various modifications and alterations may be apparent and within the scope of the present invention. Unless otherwise indicated by the language of the claims, the examples do not limit the broadness of the aspects of the underlying invention as defined by the claims.

Referring to FIG. 1A, a general flow diagram showing some preferred embodiments of the present invention as illustrated. At step 100, a design plan (which may be a design plan or dynamic architectural design file e.g., a Revit® compatible file) indicating aspects of a building; is input into a controller or other data processing system using a computing device. The design plan may include an item of a known size, such as, by way of a non-limiting example, a scale bar that allows a user to ascertain a scale of the drawing (e.g., 1"=100' etc.) or an architectural aspect of a known dimension, such as a wall or doorway of a known length (e.g., a doorway known to be three feet wide). In some embodiments, the design plan may also include various structural elements, electrical schematics, plumbing layouts, and HVAC plans to provide a complete picture of the building layout.

Input of a two-dimensional reference (i.e., design plan) into the controller may occur, for example, via known ways of rendering an image as a vector diagram, such as via a scan of paper-based initial drawings; upload of a vector image file (e.g., encapsulated postscript file (epf file); adobe illustrator file (ai file); or portable document file (pdf file). In other examples, a starting point for estimation may be drawing file in an electronic file containing a model output for an architectural floor plan. In still further examples, other types of images stored in electronic files such as those generated by cameras may be used as inputs for automated processes. For building design plans that have multiple technical layers, such as electrical, plumbing, and HVAC systems, the input method allows each layer to be processed in conjunction with the structural elements for comprehensive analysis.

In some embodiments, the design plan may be file extensions that include but are not limited to: DWG, DXF, PDF, TIFF, PNG, JPEG, GIF, or other types of files based upon a set of engineering drawings. Some design plans may already be in a pixel format, such as, by way of a non-limiting example, a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. In other examples, such as for older structures, a drawing or other design plan may be stored in paper format or digital version or may not exist or may never have existed. The input may also be in any raster graphics image or vector image format. The system can also accommodate older buildings or renovation projects where initial designs may not have been digitalized.

The input process may occur with a user creating, scanning into, or accessing such a file containing a raster graphics image or a vector graphics image. The user may access the file on a desktop or standalone computing device or, in some embodiments, via an application running on a smart device. In some embodiments, a user may operate a scanner or a smart device with a charged coupled device to create the file containing the image on the smart device.

In some embodiments, a degree of the processing as described herein may be performed on a controller, which may include a cloud server, a standalone computing device or a smart device. In many examples, the input file may be communicated by the smart device to a controller embodied in a remote server. In some embodiments, the remote server, which is preferably a cloud server, may have significant computing resources that may be applied to AI algorithmic calculations analyzing the image.

In some embodiments, dedicated integrated circuits tailored for deep learning AI calculations (AI Chips) may be utilized within a controller or in concert with a controller. Dedicated AI chips may be located on a controller, such as a server that supports a cloud service or a local setting directly.

In some embodiments, an AI chip tailored to a particular artificial intelligence calculation may be configured into a case that may be connected to a smart device in a wired or wireless manner and may perform a deep learning AI calculation. Such AI chips may be configurable to match a number of hidden levels to be connected, the manner of connection, and physical parameters that correspond to the weighting factors of the connection in the AI engine (sometimes referred to herein as an AI model). In other examples, software-only embodiments of the AI engine may be run on one or more of: local computers, cloud servers, or on smart device processing environments. The AI engine's deep learning calculations allow for the dynamic analysis of changes to the building's structural elements and updates to associated systems like plumbing, HVAC, or electrical schematics, and vice-versa.

At step 101, a controller may determine if a design plan received into the controller includes a vector diagram. If a file type of the received design plan, such as an input architectural floor plan technical drawing, includes at least a portion that is not already in raster graphics image format (for example, that it is in vector format), then the input architectural floor plan technical drawing may be transformed into a pixel or raster graphics image format in step 102. Vector-to-image transforming software may be executed by the controller, or via a specialized processor and associated software. This transformation allows the AI engine to process all layers of the design plan effectively, especially when dealing with interrelated components like electrical and HVAC systems.

In some embodiments, the controller may determine the pixel count of a resulting rasterized file. The rasterized file will be rendered suitable for the controller hosting an artificial intelligence engine ("AI engine") to process, the AI engine may function best with a particular image size or range of image size and may include steps to scale input images to a pixel count range in order to achieve a desired result. Pixel counts may also be assigned to a file to establish the scale of a drawing—for example, 100 pixels equals 10 feet. As an illustrative example, images can be resized to dimensions such as 1024×1024, 512×512, or other dimensions that may be appropriate for the AI engine to function in a better way.

In various examples, the controller may be operative to scale up small images with interleaved average values with superimposed Gaussian noise as an example, or the controller may be operative to scale down large images with pixel removal. A desired result may be detectable by one or both the controller and a user. For example, a desired result may be a most efficient analysis, a highest quality analysis, a fastest analysis, a version suitable for transmission over an available bandwidth for processing, or other metric. These scaling optimizations may be required for processing multi-layered design plans where complex systems (e.g., electrical, HVAC, or plumbing) are represented in small dimensions but must be analyzed in relation to larger structural elements.

At step 103, training (and/or retraining) of the AI engine is performed. Training may include, for example, manual identification of patterns in a rasterized version of an image included in a design plan that corresponds with architectural aspects, walls, fixtures, piping, duct work, wiring or other features that may be present in the two-dimensional reference. The training may also include one or more of: identification of relative positions and/or frequencies and sizes of identified patterns in a rasterized version of the image included in the design plan. The AI engine's ability to recognize and segment multiple components, such as wiring pathways, HVAC ducts, and plumbing systems, is enhanced through deep learning from previous architectural plans.

In some embodiments, and in a non-limiting sense, an AI engine used to analyze the design plan may be based on a deep learning artificial neural network framework. The AI engine image processing may extract different aspects of an image included in the design plan that is under analysis. At a high level, the processing may perform segmentation to define boundaries between important features. In engineering drawings defined boundaries may be based on the presence of architectural features, such as walls, doorways, windows, stairs, and the like. The AI engine also segments systems within the building, such as HVAC or electrical schematics, and correlates them with the building's structural elements to account for how changes in one system affect others.

In some embodiments, a structure of the artificial neural network may include multiple layers, such as input layers and hidden layers with designed interconnections with weighting factors. For learning optimization, the input architectural floor plan technical drawings may be used for artificial intelligence (AI) training to enhance the AI's ability to detect what is inside a boundary. A boundary is an area on a digital image that is defined by a user and tells the software what needs to be analyzed by the AI. Boundaries may also be automatically defined by a controller executing software during certain process steps, such as a user query. A boundary within the context of a design plan may signify the presence of a wall. Using deep artificial neural networks, original architectural floor plans (along with any labeled boundaries) may be used to train AI models to make predictions about what is inside a boundary. In exemplary embodiments, the AI model may be given over ~50,000 similar architectural floor plans to improve boundary-prediction capabilities. The AI model also recognizes the interconnected nature of systems such as structural, electrical, plumbing, and HVAC, using past data to suggest how changes in one boundary (e.g., a wall shift) may impact other systems.

In some embodiments, a training database may utilize a collection of design data that may include one or more of: a combination of a vector graphic two-dimensional references such as floor plans and associated raster graphic version of the two-dimensional references; raster graphic patterns associated with features; and a determination of boundaries may be automatically or manually derived. (An exemplary AI-processed two-dimensional reference that includes a design plan and/or a floorplan 210, with boundaries 211 predicted, is shown in FIG. 2B, based on the floorplan of FIG. 2A).

In still another aspect, in some embodiments, a controller may access data from various types of BIM and Computer Aided Drafting (CAD) design programs and import dimensional and shape aspects of select spaces or portions of the designs as they are related to a design plan.

At step 104, an AI engine may ascertain features included in the design plan, the AI engine may additionally ascertain that a feature is located within a particular set of boundaries or external to the set of boundaries. Features may include, by way of non-limiting example, one or more of: architectural aspects, fixtures, duct work, wiring, piping, or other items included in a two-dimensional reference submitted to be analyzed. The features and boundaries may be determined, for example, via algorithmically processing an input design plan image with a trained AI model. As a non-limiting example, the AI engine may process a raster file that is converted for output as an image file of a floorplan (as illustrated in FIG. 2B, a boundary is represented as a line, a boundary may also be represented as a polygon, which may be a patterned polygon or other user discernable representation, such as a colored line etc.). Features may also be designated on a user interface. A feature may be represented via an artifact, such as, for example, one or more of: a point, a polygon, an icon, or other shapes. The AI engine analyzes and predicts not only the physical features but also any related systems affected by changes in the boundaries. For example, moving a wall may trigger recalculations in wiring, plumbing, and ductwork.

At step 105, a scale (e.g., FIG. 2B item 217) is associated with the two-dimensional reference. In preferred embodiments, the scale is based upon a portion of the two-dimensional reference dedicated for indicating a scale, such as a ruler of a specific length relative to features included in a technical drawing included in the two-dimensional reference. The software then performs a pixel count on the image and applies this scale to the bitmapped image. Alternatively, a user may input a drawing scale or dimension for a particular image, building component, a wall, a boundary, a drawing or other two-dimensional reference. The drawing scale, may for example, be in inches: feet, centimeters: meters, or any other appropriate scale. Accurate scaling is important, particularly when analyzing the interaction between structural elements, electrical layouts, plumbing layouts, and HVAC plans to predict real-world conflicts.

In some embodiments, a scale may be determined by manually measuring a room, a component, or other empirical basis for assessing a scale (including the ruler discussed above). Examples therefore include a scale included as a printed parameter on two-dimensional reference or derived via reference to one or more dimensioned features in the design plan. For example, if it is known that a particular wall is thirty feet in length, a scale may be based upon a length of the wall in a particular rendition of the two-dimensional reference (or design plan) and proportioned according to that length. The known length of the wall can be determined from the markings or text on the design plan or can be specified by a user as an input. A known length or width of any other building component can be determined or entered by the user. Based on such known length or width of one building component, the scale can be proportioned, and dimensions of other building components can be calculated.

At step 106, a controller is operative to generate an interactive user interface with dynamic components (design elements) that may be manipulated by one or both of user interaction and automated processes. Any or all of the components in a user interface may be converted to a version that allows a user to modify an attribute of the components, such as the length, size, beginning point, end point, thickness, or other attribute. In some embodiments, a boundary may be treated as a component or a wall, and may be manipulated in a similar manner. For example, modifying the dimensions of a room in the user interface may trigger automatic updates or suggestions in the HVAC or electrical layout to reflect new size constraints.

Other components included in the user interface may include, one or more of: AI engine predicted components, user training aspects, and AI training aspects. In some non-limiting examples of the present invention, a generative adversarial network may include a controller with an AI engine operative to generate a user interface that includes dynamic components. In some embodiments, a generative adversarial network may be trained based on a training database for initial AI feature recognition processes. The generative adversarial network may learn how different systems (e.g., structural, electrical, HVAC, plumbing) interact with each other and predict potential conflicts or required adjustments.

An interactive user interface may include one or more of: lines, arcs, or other geometric shapes and/or polygons. In some embodiments, the geometric shapes and/or polygons may comprise boundaries. The components may be dynamic in that they are further definable via user and/or machine manipulation. Components in the interactive user interface may be defined by one or more vertices. In general, a vertex is a data structure that can describe certain attributes, like the position of a point in a two-dimensional or three-dimensional space. It may also include other attributes, such as normal vectors, texture coordinates, colors, or other useful attributes. These interactive components allow users to dynamically adjust elements such as wiring or ducts based on structural changes, enabling a real-time update of all affected systems.

At step 106A, in some embodiments, components presented in the interactive user interface may be analyzed by a user and refinements may be made to one or more components (e.g., size, shape and/or position of the component). In some embodiments, user modifications may also be input back to the AI engine to train the AI engine. User modifications provided back to the AI Engine may be referenced to make subsequent AI processes more accurate, efficient, fast, trained and/or enable additional types of AI processes.

At step 107, some embodiments may include a simplification or component refinement process that is performed by the controller. The component refinement process is functional to reduce a number of vertices generated by a transformation process executed via a controller generating the user interface and to further enhance an image included in the user interface. Improvements may include, by way of non-limiting example, one or more of: smooth an edge, define a start, or endpoint, associate a pattern of pixels with a predefined shape corresponding with a known component or otherwise modify a shape formed by a pattern of pixels.

In addition, some embodiments that utilize the recognition step transform features such as windows, doorways, vias and the like to other features and may remove them and/or replace them as elements—such as line segments, vectors, or polygons referenceable to other neighboring features. In a simplification step, one or more steps the AI performs (which may in some embodiments be referred to as an algorithm or a succession of algorithms) may make a determination that wall line segments, and other line segments represent a single element and then proceeds to merge them into a single element (line, vector, or polygon). In some embodiments, straight lines may be specified as a default for simplified elements, but it may also be possible to simplify collections of elements into other types of primitive or complex elements including polylines, polygons, arcs, circles, ellipses, splines, and non-uniform rational basis spline (NURBS) where a single feature object with definitional parameters may supplant a collection of lines and vertices.

The interaction of two elements at a vertex may define one or more new elements. For example, an intersection of two lines at a vertex may be assessed by the AI as an angle that is formed by this combination. As many construction plan drawings are rectilinear in nature, it may be that the simplification step inside a boundary can be considered a reduction in lines and vertices and replacing them with elements and/or polygons.

In another aspect, in some embodiments, one or both of a user and a controller may indicate a component type for a boundary. Component types may include, for example, one or more of line segments, polygons, multiple line segments, multiple polygons, and combinations of line segments and polygons. This categorization allows the AI engine to treat different components according to their functions, so that changes in one element may trigger appropriate updates, alerts, or suggestions for other elements in the design plan.

At step 108, a controller (such as, by way of a non-limiting example, a cloud server) operative as an AI engine may create AI-predicted dynamic boundaries that are arranged to form a representation of the submitted design plan that does not include the boundaries that bound it.

In various embodiments, a boundary may be used to define a unit, such as a residential unit, a commercial office unit, a common area unit, a manufacturing area, a recreational area, a dining area, or other area delineated according to a permitted use.

Some embodiments include an interface that enables user modifications of boundaries and areas defined by the modified boundaries. For example, a boundary may be selected and "dragged" to a new location. The user interface may enable a user to select a line end, a polygon portion, an apex, or other convenient portion and move the selected portion to a new position and thereby redefine the line and/or polygon. An area that includes a boundary as a border will be redefined based upon the modification to the boundary. As such, an area of a room or unit may be redefined by a user via the user interface. Changing an area of a room and/or unit may in turn be used as a basis for modifying an occupant load, defining an egress path, classifying a space, or other purposes.

For example, a change in a boundary may make an area larger. The larger area may be a basis for an increase in occupancy load. The larger area may also result in a longer path from the furthest point in the defined area to a point of egress (e.g., if a user chooses to use a worst case in determining an egress route). Empowering users with flexibility, the present invention allows for modifications to room boundaries, lines, and polygons, enabling the alteration of shapes and sizes to adhere to best practices with automated revision suggestions to design plans. This dynamic feature not only facilitates compliance with regulatory standards but also caters to user preferences or priorities, allowing them to retain the opulence and aesthetic appeal of their spaces. Whether it is aligning with specific best practice requirements or enhancing the overall user experience by accommodating individual tastes, the present invention offers a harmonious blend of functionality and personalization. Users can effortlessly tailor their rooms to meet both regulatory guidelines and their own vision, striking a balance between compliance and the creation of spaces that truly reflect their unique style and preferences.

At step 109, a user such as a contractor, architect, or client may be required to perform or register a change to a building element during the construction or renovation process. This change may arise from various factors, such as unforeseen site conditions, client preferences, or the need to adjust components to accommodate structural limitations or new requirements. For example, during the installation of structural elements, the contractor may need to relocate a wall to account for unanticipated space constraints. Alternatively, the client may request the repositioning of light fixtures or electrical outlets to better align with their desired layout. To register these physical As-Built changes on the design plan, the user selects the appropriate spot of the design plan on the interactive user interface where the modification is to be performed (in the physical building). The change can relate to any of the building systems, including structural elements, wiring for electrical systems, plumbing installations, or HVAC layouts. For example, if a contractor realizes that a plumbing line needs to be rerouted to avoid a conflict with a load-bearing wall, they will mark the exact location on the design plan and initiate registering the change within the system.

At step 110, after selecting the spot for the required change, the controller may generate a pop-up window or dialog box on the interactive user interface, asking the user for more specific details about the nature of the change they intend to make. The user may be prompted to input the type of modification they are performing, whether it involves relocating, replacing, or installing a new component. For example, if the user selects a wall, the system may ask whether the change involves shifting the wall, modifying its dimensions, or reinforcing it. In another case, where the user selects an electrical fixture, the system may inquire whether the fixture is being replaced with a different model, moved to a new location, or reconnected to a new circuit. The interactive user interface may include fields for the user to enter details such as the new dimensions of the component, the specifications of any new fixtures being installed, and the rationale behind the change. For example, if a light fixture is being moved due to an interior redesign, the user may input details about the new fixture's voltage, placement height, and distance from adjacent structural elements.

At step 111, the controller may analyze whether the proposed change is feasible within the existing design plan, and more importantly, whether the change impacts other building systems. The controller utilizes advanced AI algorithms, potentially leveraging a generative adversarial network (GAN), to simulate how the proposed change might interact with other components of the building. For example, if a wall is being moved to accommodate a new room configuration, the controller may assess how this affects nearby electrical wiring, plumbing pipes, and HVAC ducts that may pass through or near the original wall. It may notify the user if there are any conflicts, such as electrical wiring that needs to be rerouted or HVAC vents that must be repositioned to maintain proper airflow. Similarly, if the user is attempting to modify the placement of a window, the controller may analyze whether the new location impacts the surrounding structural integrity, insulation properties, or even sunlight penetration into the building. In another example, if a plumbing pipe is being relocated, the controller may consider whether the new pipe routing affects the overall water pressure in the system or interferes with the placement of other fixtures, such as electrical outlets. The controller makes the user aware of all these consequences and provides detailed feedback, preventing potential complications during construction or renovation.

At step 112, based on the analysis conducted in the previous step, the controller may provide automated suggestions to address any issues or conflicts that may arise from the proposed changes. For example, if relocating a structural wall affects the HVAC duct layout, the controller may suggest alternative duct routes that maintain optimal airflow while accommodating the new wall position. Similarly, if an electrical wiring conflict is detected when a wall is moved, the controller may propose rerouting the wiring through adjacent walls or ceilings to maintain safety and functionality. In some embodiments, the controller may automatically update the design plan to reflect these changes, adjusting the affected systems in real time without requiring manual input from the user. For example, if a plumbing pipe must be relocated (based on the impact of the required change), the controller will automatically suggest new pathways that avoid structural components while maintaining appropriate water pressure. If the user is replacing an HVAC unit with a newer, larger model, the controller may recommend changes to the ventilation system, such as increasing duct sizes or adjusting vent locations to accommodate the higher airflow requirements. These suggestions may be dynamically generated by the AI engine, so that the building's systems remain integrated and functional, even as changes are made during construction or renovation.

At step 113, once the user confirms and agrees to the changes and/or suggestions, the controller updates the design plan to reflect the latest modifications. The new design plan represents a real-time version that incorporates all the performed changes, which may differ significantly from the original design plan. The controller also saves a detailed log of the changes, capturing important information such as what specific modifications were made, who performed the changes, when they were performed, and why the changes were necessary. For example, if a contractor moved a load-bearing wall to comply with preferred building practices, the log would include the reason for the change and any additional modifications to other building systems, such as electrical wiring or plumbing reroutes. This log may particularly be valuable for future reference, as it allows project managers, contractors, and clients to review the construction process and understand the rationale behind the deviations from the original design. The system also documents whether the changes impacted other elements of the design plan, so that all updates are tracked in a comprehensive manner. When the building is turned over to the client upon completion, the updated design plan is handed over with a full history of the modifications, making it easier for the client to understand what changes were made during construction and why those changes were necessary. This historical record may particularly be beneficial for clients who may need to perform future renovations or maintenance. For example, if the client decides to remodel a space in a few years, they can refer to the logged changes to see where pipes, wiring, or HVAC ducts are located, preventing accidental damage during demolition or remodeling efforts.

The present invention provides a robust and intelligent system for managing changes to a building's design plan during construction or renovation. By allowing users (contractors, builders, clients) to register changes directly on the design plan and providing real-time analysis of the impacts on other systems, the controller streamlines the construction process and minimizes errors. Furthermore, the automated suggestions provided by the controller help contractors and architects make informed decisions, avoiding conflicts between building systems such as structural elements, electrical wiring, plumbing, and HVAC systems. The ability to log every change and update the design plan in real time facilitates that the latest version of the design is always available, providing transparency and accountability throughout the construction process. The system may particularly be beneficial for large projects involving multiple contractors and subcontractors, where coordination between different teams is required. Moreover, the detailed log of changes serves as a valuable tool for clients, allowing them to review the history of the building's construction and understand the reasons behind any modifications. This level of transparency and documentation is also useful for future renovations or maintenance work, as the client or future contractors can easily access information about the building's systems and how they were altered during construction.

In some embodiments of the present invention, the system enables users to not only make changes to the design plan but also register these changes with annotations and associated images that provide a detailed context for the modifications. When a contractor, architect, or user performs a change during construction or renovation, they may add (to the design plan) descriptive notes, upload relevant images, or attach other documents that further explain the reasons for the change and any associated technical details. For example, if a contractor relocates a plumbing pipe to avoid structural interference, they may add an annotation explaining the reason for the relocation, upload a photograph showing the new pipe placement, and provide specifications for any new materials used. This additional information is saved in the system and becomes part of the updated design plan, giving future users or clients access to a comprehensive view of the modifications.

The changes made to the design plan are also highlighted visually, making it easier for clients to identify areas where modifications have occurred. In one embodiment, an icon or symbol may be placed on the updated design plan to indicate that a change has been performed in a specific location. For example, a small wrench or info icon may be used to denote that a mechanical or structural change, such as moving a load-bearing beam, was carried out in that spot. Similarly, a light bulb icon may represent changes to electrical systems, such as the relocation of lighting fixtures or wiring reroutes. These icons serve as visual markers, alerting the user or client to important modifications in the design plan. By clicking on an icon, the user or client can access detailed information related to the change, including the annotations, images, and technical data associated with that specific modification. This feature allows stakeholders to quickly identify and understand the nature of the changes without needing to comb through the entire design plan.

In another embodiment, the user may also access previous versions of the design plan for a specific spot where the change was performed. The system maintains a version history, allowing users to review past configurations of the design plan before the modification was made. This versioning system may be spot-specific, meaning that users can isolate the history of a particular location in the building without having to review the entire design plan. For example, if a client wants to know how the layout of a room evolved over time, they can select the icon for that room, view all past versions of the room's design plan, and read the associated annotations that explain why changes were made. This feature may particularly be useful during the turnover process, as it enables the client to focus on specific areas of interest rather than analyzing the entire design plan. By providing a clear, detailed history of the changes, including the reasons behind them, the system facilitates better decision-making and greater transparency.

In addition to annotations and images, the system may allow the user to associate other types of documents with the change, such as compliance reports, engineering assessments, or material specifications. For example, if a contractor installs a new HVAC system, they may upload the installation manual, warranty information, and energy efficiency ratings for the new unit. These documents are then accessible to the user or client via the design plan's interface, offering a centralized repository of all relevant information for future reference. This capability becomes especially valuable when the client needs to perform future renovations, maintenance, or repairs. For example, if a wall needs to be opened to access wiring or plumbing, the client can refer to the uploaded images and documents to understand the exact placement and specifications of the hidden systems before any work begins.

The ability to highlight changes and provide detailed records of those changes makes the turnover process significantly smoother for the client. When the building is completed and handed over to the client, they are presented with the latest version of the design plan, which clearly walks them through the modifications made during construction. Rather than requiring the client to analyze the entire design plan in detail, the system's interface allows them to click on highlighted areas where changes occurred and access all the relevant information with ease. This streamlined process saves time and eliminates confusion, particularly for clients who may not have a technical background in construction. By offering a visual and interactive way to explore the design plan, the system helps the client understand what was done, why it was done, and how it might affect future use or modifications of the building.

For example, if a client needs to know why a structural column was relocated, they can click on the icon marking the change and instantly view the engineer's annotations explaining that the original location interfered with HVAC ducting. They can also see before-and-after images showing the column's new position and any adjustments made to the surrounding systems. Additionally, if the client later decides to renovate that part of the building, the system allows them to pull up all previous changes made to that area, making it easier to plan new work without disrupting the current layout. This historical data gives the client full transparency over the construction process, allowing them to make informed decisions about future renovations.

The system also aids in reducing errors during renovations. For example, if a client decides to install new fixtures in a room but is unaware of the exact location of plumbing pipes behind the walls, they risk accidentally damaging those pipes. With the present invention, the client can easily refer to the design plan's change log for that specific room, view the exact placement of hidden pipes, and avoid costly mistakes. The visual icons and detailed annotations facilitate that all relevant information is readily available at the click of a button, preventing unnecessary delays and complications during renovation work.

Moreover, the ability to access previous versions of the design plan helps clients and contractors understand how certain modifications might impact future building operations. For example, a client might want to know whether the placement of a new HVAC unit would affect the airflow in adjacent rooms. By reviewing past versions of the design plan and associated annotations, the client can see how airflow patterns have evolved over time and whether the new installation would create any potential issues. This forward-thinking approach facilitates that every change made to the building is done with a full understanding of its broader impact.

Figure 1B:
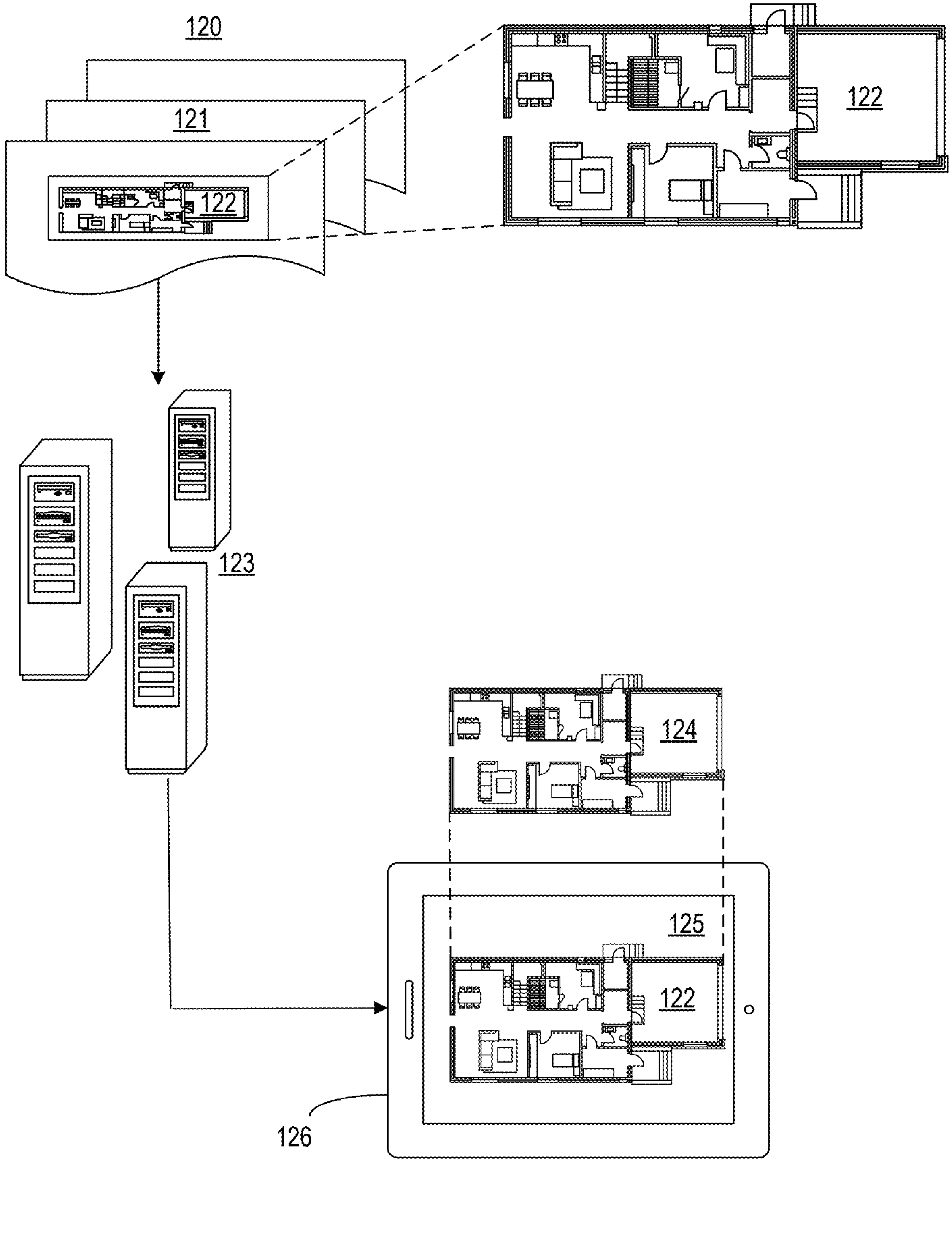
FIG. 1B illustrates a high-level diagram of components included in a system that uses AI to generate an interactive user interface.

Referring now to FIG. 1B, a high-level diagram illustrates components included in a system 120 that uses AI to generate an interactive and collaborative user interface 125 and programmable apparatus (controller) 123 operative to execute method steps useful in one or both of: adding annotations to design elements within a static representation of a design plan, and managing alterations to these design elements while automatically adjusting the associated annotations and rules in real-time. This process may involve identifying design elements that may benefit from additional information or clarification, prompting users to add relevant annotations. Furthermore, when design elements are moved or altered, the AI engine facilitates that all related annotations are dynamically updated, altered or kept intact to reflect these changes, maintaining the accuracy, association, and relevance of the annotations. Simultaneously, the system may enforce automated, predefined, or user-defined rules regarding who can make alterations to those design elements and/or associated annotations, based on user roles and permissions, thereby preserving the integrity of the design plan, and facilitating a collaborative yet controlled design environment.

According to some embodiments of the present invention, a two-dimensional reference 121, such as a design plan, floorplan, blueprint, or other document includes a pictorial representation 122 of at least a portion of a building. The pictorial representation 122 may include, for example, a portable document format (PDF) document, jpeg, PNG, or other important non-dynamic file format, or a hardcopy document. The pictorial representation 122 includes an image descriptive of architectural aspects of the building, such as, by way of non-limiting example, one or more of: walls, doors, doorways, hallways, rooms, residential units, office units, bathrooms, stairs, stairwells, windows, fixtures, real estate accouterments, and the like.

The two-dimensional reference 121 may be electronically provided to a controller 123 running an AI engine and a GAN engine. The controller 123 may include, for example, one or more of: a cloud server, an onsite server, a network server, or other computing device, capable of running executable software and thereby activating the AI engine. Presentation of the two-dimensional reference may include, for example, scanning a hardcopy version of the two-dimensional document into electronic format and transmitting the electronic format to the controller 123 running the AI engine.

According to the present invention, the AI engine may use raw data, manipulated data, interpreted data, new data and data types generated from existing data. Data may include one or more of: text, image, numerical, pixel patterns, polygons, vectors, molecular, neural, digital, and analog data modalities.

Data sources may include, one or more of: a user portal; Internet accessible resources; shipping data, fuel use tracking; manufacturer data; product data sheet; geolocation device, or other receptacle or generator of data related to material used in a building or other construction project.

AI engine processing may include one more of: converting image data to pixel patterns and/or polygon patterns, manipulating pixel patterns and/or polygon patterns, analyzing pixel patterns and/or polygon patterns, optical character recognition, alphanumeric analysis, symbol recognition and the like. Proposed action strategies, protocols and opportunities may be associated with an ascertained state.

The present invention provides for the deployment of computational frameworks combining disparate aspects of technology to perform tasks that are beyond the ability of traditional design and build systems or human intelligence. These systems aggregate large volumes of disparate data that may or may not be intuitively linked to building design, carbon footprint, eco-friendliness, compliance codes, supply chain availability, anticipated ambient climate conditions, measured ambient climate conditions, building activities, or other data source, and utilize multiple modalities data manipulation, algorithms, and statistical models to generate proposed action strategies for a patient (or group of similarly situated patients). Modalities of data manipulation may include, but are not limited to:

- Machine Learning (ML): A subset of AI where systems learn from data. Instead of being explicitly programmed, they adjust their operations to optimize for a certain outcome based on the input they receive.
- Deep Learning: A subfield of ML using neural networks with many layers (hence "deep") to analyze various factors of data, such as, for example, convolutional neural networks (CNNs) used in image recognition. For example, convolutional neural networks may receive as input image data from scans of various types and generate pixel patterns representative of the scans. The pixel patterns may be compared to a library of other pixel patterns and/or manipulated to emulate progression of a disease state and/or a treatment protocol over time.
- Natural Language Processing (NLP): Allows systems to understand, interpret, and generate human language. NLP may provide interpretations of voice data. Voice data may be made accessible, for example, via recording made during design plan review and assessment and/or during supply chain activities.
- Robotics: Robots may operate using AI principles, enabling the robots to perform tasks in accurate, specific, and consistent ways. Robots may also be utilized during data collection, such as during building scans (e.g., 3D image acquisition scans), as built measurement acquisition, infrared heat image acquisition and the like.
- Knowledge Representation: The methods and apparatus taught herein may receive data in a native or enhanced state and manipulate and transform the received data into a machine learning understandable form.
- Reasoning: The methods and apparatus taught herein may solve or deploy logical deduction via expert systems and the like to facilitate decision-making.
- Perception: The methods and apparatus taught herein may use algorithms and complex relational processes that allow machines to interpret disparate data sets, including image data, sound data, and alphanumeric data.

Apparatus and methods may be arranged to form one or more of: Neural Networks; Genetic Algorithms; Expert Systems; and Reinforcement Learning.

In some embodiments, GPUs may be used to accomplish large-scale machine-learning models using parallel processing capabilities. Hardware accelerators may be utilized for deep learning tasks. In some embodiments, tensor processing units and/or neuromorphic computing mechanisms may be used to analyze data sets. Cloud platforms may be used with AI processes, such as deep learning that require significant computational resources.

Electronic and/or electromechanical apparatus may provide data to be processed using the methods and apparatus presented herein. Apparatus may include, by way of a non-limiting example, one or more of: three-dimensional (3D) image scans, heat imaging acquisition, design plan scanners, building monitoring electronic sensors, drone-based electronic scans, satellite-based data acquisition or other means of acquiring data that may be transformed into digital and/or analog data sets.

Some AI Engine generated treatment strategies may include suggested courses of action that may be weighted based upon one or more of: projected effectiveness; timing, geographic location, and a material's ability to be transported; cost; and project criticality, including timeline relative to other actions and/or tasks that must be completed, such as for example, a sequence of construction steps, inspections, and financing requirements.

The controller is operative to generate a collaborative user interface 125 on a user computing device 126. The user computing device may include a smart device, workstation, tablet, laptop or other user equipment with a processor, storage, and display.

The user interface 125 includes a reproduction of the pictorial representation 122 and an overlay 124 with one or more user-manipulatable components, such as, by way of non-limiting examples: boundaries, line segments, polygons, images, icons, points, and the like. The line segments may have calculated lengths that may be mathematically manipulated and/or summarized. Aspects such as polygons, line segments, shapes, icons, and points may be counted, added, subtracted, extrapolated, and have other functions performed on them.

In addition, renditions of the user interface 125 may be created and saved, and/or communicated to other users, or controllers, compared to subsequent interface renditions, archived and/or submitted to additional AI analysis.

In some embodiments, a first user interface 125 rendition may be modified by a user to create a second user interface 125 and submitted to AI analysis to perform tasks including assisting users in adding better annotations to a selected design element. This assistance is based on the AI's analysis of the selected design element and a historical review of similar annotations associated with such design elements. The AI engine continuously learns from the ways users add annotations to different types of design elements, enabling it to suggest the most relevant and useful annotations for any given element. This learning process allows the AI engine to provide tailored suggestions that improve over time, reflecting the collective experience and insights of the user community on the collaborative platform of the present invention. By leveraging past annotation patterns, the AI facilitates a more intuitive and efficient annotation process, enhancing the collaborative design effort.

In the context of the present invention, design elements may also refer to the various components that contribute to the overall layout, functionality, and aesthetic appeal of a building or space. These elements include, but are not limited to, rooms, walls, doors, windows, staircases, partitions, fixtures, furniture, and finishes. Rooms may be designated for specific functions, such as living rooms, bedrooms, kitchens, or bathrooms, with their size and shape tailored to the intended use. Walls define the boundaries of spaces and may serve structural, aesthetic, or privacy functions, while partitions provide flexible divisions within open areas. Doors and windows are important for access, ventilation, natural light, and aesthetics, with their placement affecting the flow and usability of a space. Fixtures, such as sinks, toilets, lighting, and built-in cabinetry, are important for the functionality of spaces like bathrooms and kitchens. Furniture placement, including beds, desks, sofas, and dining tables, defines how a space will be used, enhancing comfort and practicality. Additionally, design elements may include aesthetic features such as color schemes, textures, flooring materials, and decorative finishes, which contribute to the visual and tactile experience within a space. These elements are also configured to comply with spatial and functional requirements, user preferences, and environmental factors such as lighting, acoustics, and air circulation, all of which are considered in the design plan generated by the system.

Figure 1C:
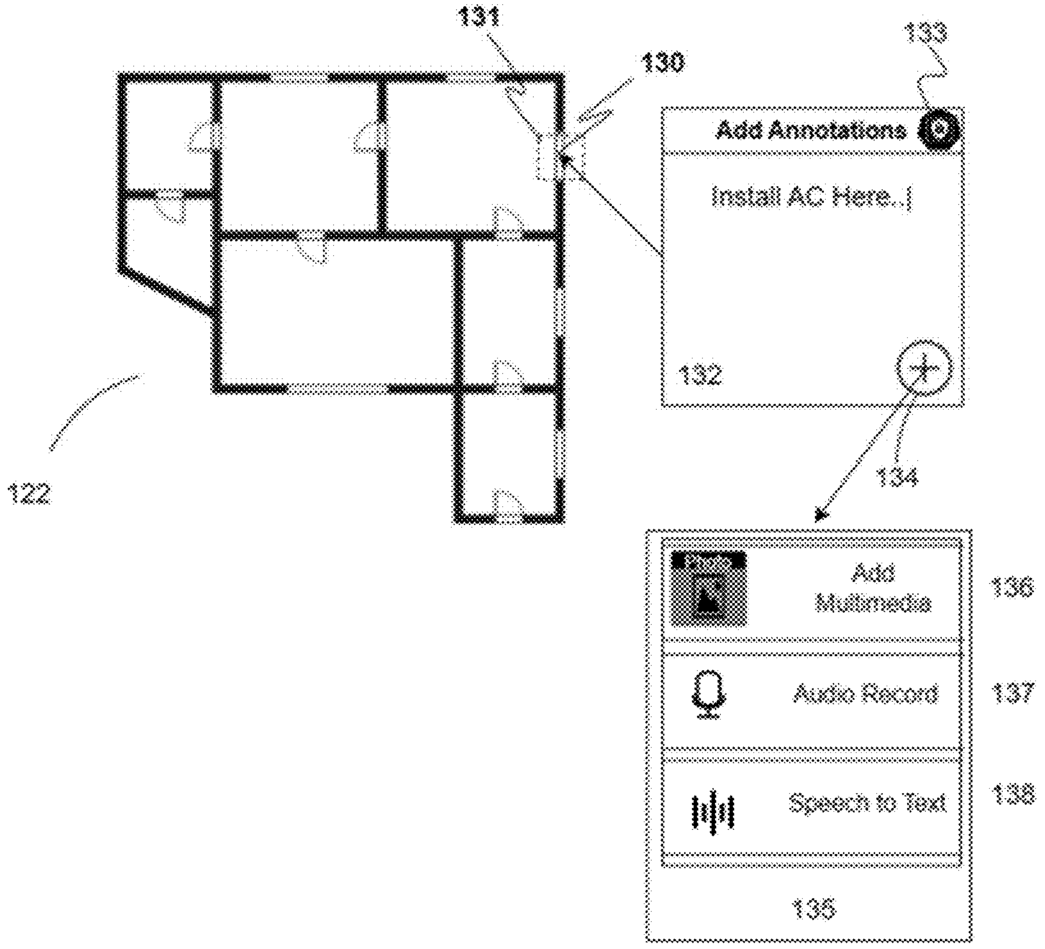
FIG. 1C illustrates an exemplary method for annotating a design element on the design plan in the collaborative environment of the present invention.

Referring now to FIG. 1C, the illustration showcases an exemplary aspect of the present invention's collaborative environment, demonstrating how a user may annotate a design element on a design plan. In this exemplary embodiment, the user interface 125 displays a static pictorial representation 122 of a design plan, containing various dynamic design elements such as lines, polygons, rooms, walls, and boundaries. A user may initiate the annotation process by selecting 131 a design element 130 on the design plan 122, which can be done by marking on or around the desired design element 130 or by simply double-clicking on the design element 130.

Upon selection, a pop-up window 132 appears, providing a space where the user can type in text annotations that will be linked with the chosen design element 130. Alongside the text entry field, the pop-up window 132 may also include an additional options button 134. This button 134, when selected, unveils a suite of annotation tools 135, offering a range of methods to enrich the annotations.

For example, the user can choose to attach multimedia content 136, like photos or video clips, which may serve as a visual supplement to the textual annotations for the selected design element 130. If the user wishes to add an audio note, they can do so using the audio record function 137, capturing their verbal instructions or comments directly via a microphone. Moreover, the user also has the convenience of using a speech-to-text feature 138, where spoken words are transcribed into written text annotations. This functionality simplifies the process of adding detailed descriptions or instructions, as the user's voice is automatically converted to text and associated with the selected design element 130 as an annotation.

In some embodiments of the present invention, the interactive user interface may be engineered to offer an intuitive mechanism for annotating within a shared design plan. When a user selects a design element, such as a polygon, a line, a room or a wall, the system may respond by presenting a context-sensitive annotation interface. This interface is contextually programmed to suggest annotation tools and options relevant to the type of design element selected. For example, upon selecting an area where an air conditioning unit is to be installed, the interface may prioritize or suggest multimedia annotations that provide visual cues or installation guidelines.

Figure 1D:
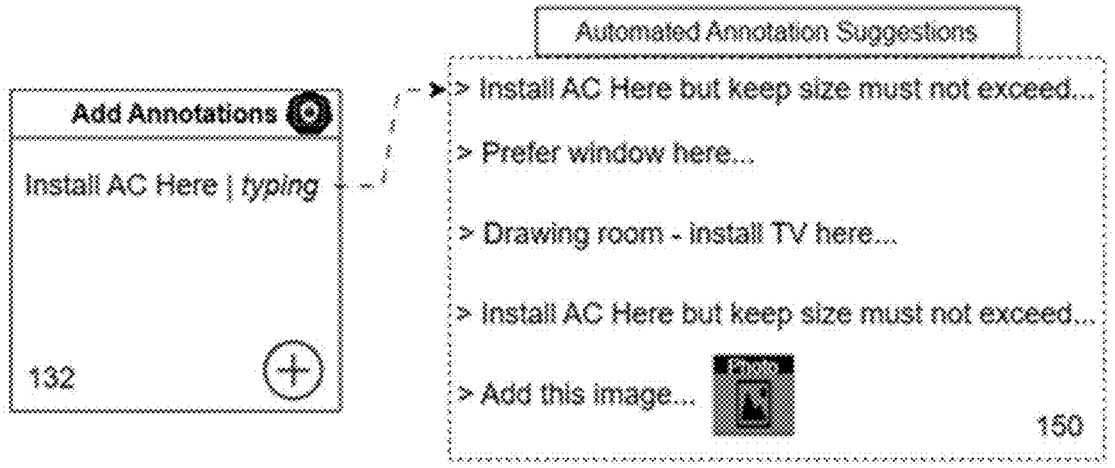
FIG. 1D illustrates an exemplary interface for providing automated annotation suggestions to users during the annotation process.

Referring now to FIG. 1D, the diagram illustrates an exemplary feature of the present invention's interface, specifically designed to aid users in the annotation process. The figure displays a user actively engaging with an annotation pop-up window 132 for a selected design element within the collaborative platform. As the user begins to type, for example, "Install AC Here," the system's AI engine intervenes with automated annotation suggestions as shown in an automated annotation suggestions window 150.

These suggestions, shown in the automated annotation suggestions window 150, are generated based on a variety of factors, including the current context of the design element, the user's typing activity, and historical data collected from past user interactions with similar design elements. The exemplary annotation suggestions may include but are not limited to: "Install AC Here but size must not exceed . . . ", "Prefer window here . . . ", or other recommendations like "Drawing room—install TV here . . . ". Each suggestion aims to prompt the user with common annotations or considerations that align with the selected design element's purpose and location.

Additionally, the interface may also facilitate inclusion of multimedia annotations, as evidenced by the "Add this image . . . " option accompanied by a photo icon for a recommended photo extracted from an annotation database to be associated with the annotation. This interactive feature suggests that users can enrich their annotations with visual aids directly related to the selected design element, which may include images or diagrams relevant to the installation or positioning instructions (i.e., annotations) being entered.

This automated annotation suggestions feature showcases the system's dynamic response to user input, effectively marrying the AI's predictive capabilities with the user's manual annotations. It enhances user experience by minimizing repetitive typing, guiding users through a library of common annotations, and providing quick-access options for multimedia attachments. This intelligent assistance is indicative of the platform's design to expedite the annotation process, reduce potential errors, and facilitate consistency in documentation throughout the collaborative design environment.

In some embodiments of the present invention, the system's AI engine utilizes an extensive annotation database to provide automated annotation suggestions that may also include a multimedia library. When a user initiates an annotation-adding process for a selected design element, the AI engine queries this library to retrieve and suggest one or more images (or maybe video clips) that are relevant to the design element in question. This library comprises a collection of images and video clips previously used in annotations, which have been tagged and indexed according to the design elements they correspond to.

Furthermore, the AI is capable of generating automated images and video clips based on its historical analysis of similar past annotations. It uses learned patterns and user behavior to predict and present the most pertinent visual aids that could enhance the current annotation. This predictive ability is grounded in the AI's continuous learning process, where it assimilates information from each annotation interaction, gradually refining the relevance and precision of its image suggestions.

Such an embodiment streamlines the annotation process by providing users with quick access to a curated set of images and video clips, reducing the need for manual searches and facilitating a high level of consistency and detail in the annotations associated with specific design elements. Whether the user is specifying installation details, highlighting design features, or indicating modifications, the AI engine's integration with a multimedia library enriches the collaborative experience and aids in the conveyance of clear, concise, and visually supported information.

By way of non-limiting examples, according to the present invention, a design plan may be received as a static image two-dimensional reference. The design plan may be described using lines and arcs, and represent architectural layouts in a simplified geometrical way. In such a representation, architectural elements, such as, by way of non-limiting examples: walls, doors, windows, and architectural details, may be shown using straight lines (for linear elements) and arcs (for curved elements). A floorplan interpreted in terms of lines and arcs and/or patterns of pixels may include one or more of:

Exterior Walls: typically represented by thick lines. The thickness of a line may indicate the wall's thickness.

Interior Walls: which may be shown as slightly thinner lines compared to exterior walls, representing partitions or dividers within a space or other interior area.

Hinged Doors: a straight line representing a door's location and an arc showing the door's swing direction and extent.

Sliding Doors: two parallel lines (representing door panels) may include an arrow or dashed line indicating a sliding direction.

Double Doors: two straight lines representing door panels with arcs indicating each door's swing direction.

Which may, for example, be represented as thin lines or breaks in walls, sometimes with a zigzag line to indicate a window's presence or with a double line indicating a double-pane window.

Straight Stairs: a series of parallel lines showing steps. Often, an arrow may be used to indicate the upward direction.

Spiral Stairs: may be represented using concentric arcs or circles, showing the curvature of the stairwell.

Cabinets, Countertops, Islands: straight lines and arcs may represent a shape and placement of cabinets, countertops, and islands.

Sinks, bathtubs: may typically be represented using a combination of lines and arcs to depict their shapes.

Rounded Corners: instead of sharp, angular intersections between walls, arcs are used to show the curve.

Circular Rooms or Features: may be represented using full circles or arcs.

Electrical: may be shown with dotted lines or specific symbols indicating outlets, switches, and fixtures.

Plumbing: may be represented via dotted or dashed lines to represent hidden plumbing within walls or under floors.

When interpreting or representing a floorplan using lines and arcs, conventions used in architectural drawings may be referenced. In some embodiments, a legend or key that describes what each line, arc, or symbol means, may facilitate clarity in understanding the design.

Figure 1E:
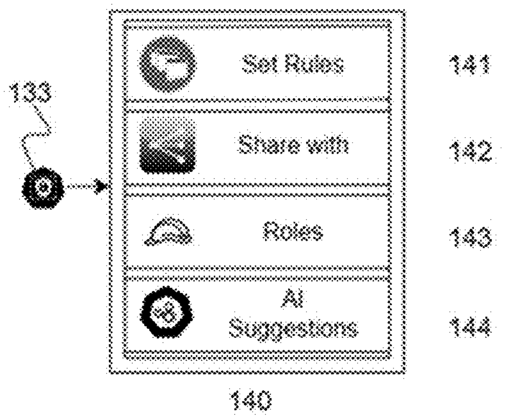
FIG. 1E illustrates an exemplary settings window with various setting options as per some embodiments of the present invention.

FIG. 1E shows a settings window 140 that emerges when a user engages with the settings option 133 on the annotations pop-up window 132. This settings window 140 serves as a control panel for managing the collaborative and interactive features of the platform tailored to user annotations and design elements.

The "Set Rules" function 141 enables users to establish comprehensive guidelines for managing interactions with the design plan. Users can define protocols for editing, altering, deleting, or relocating both design elements and their associated annotations within the collaborative platform. Serving as a robust governance mechanism, this function facilitates that any modifications to the design plan or its components are consistent with predefined conditions. These conditions may be customized to meet the unique demands of a specific project, cater to individual user preferences, align with organizational policies, or comply with applicable best practices and regulations. Furthermore, the "Set Rules" 141 feature is designed to be flexible, allowing for an automated or manual adjustment of rules as the project evolves or as new information becomes available to the AI engine, facilitating ongoing relevance and adherence to the latest standards and practices.

In some embodiments of the present invention, the settings window may be a nexus of innovative controls that adapt to the intricate dynamics of the collaborative design environment. The "Set Rules" feature 141 may be engineered with an algorithm that can predict and propose rule sets based on the project type, historical data, and individual user performance, thus preempting the need for manual input, and offering a starting point for rule customization. The "Set Rules" option 141 may allow users to construct a detailed matrix of permissions, specifying who can make edits, how elements can be adjusted, and under what circumstances annotations can be moved or deleted. This rule-setting may go beyond general restrictions, offering granular control, such as time-bound editing rights or element-specific permissions that facilitate changes are made responsibly and in accordance with the project's lifecycle or phase-specific requirements.

With the "Share with" option 142, users can distribute the annotations and design elements to selected team members or stakeholders. Beyond standard methods like email, the system may incorporate features such as direct in-platform tagging, integration with project management tools for task assignments, or even using unique identifiers like QR codes that, when scanned, grant access to specific annotations or design elements. In some embodiments of the present invention, the "Share with" function 142 may employ machine learning algorithms to suggest potential team members for collaboration based on their past contributions, expertise, and current availability, going beyond manual tagging and email sharing. This feature may integrate with organizational calendars and resource planning tools to automatically suggest the best times and team members for collaborative sessions within the platform.

The "Share with" feature 142 may extend collaboration by integrating with advanced user identification systems, enabling sharing through biometric recognitions, such as fingerprint or retina scans, for high-security projects. It may also incorporate smart notifications that alert users when a relevant component is shared with them, streamlining the review and feedback process.

The "Roles" setting 143 is designed to define and assign specific permissions to different users or team members. This feature not only controls who can change or approve annotations but also can extend to defining hierarchies of approval, enabling tiered levels of access where senior designers or project managers may have override capabilities or exclusive editing rights. In some embodiments of the present invention, for "Roles" setting 143, the system may dynamically suggest role changes for users by analyzing their interaction patterns with the platform. For example, if a user frequently adds substantial contributions to a particular design element, the system may suggest elevating their role for that element or similar elements, streamlining the workflow and empowering effective contributors.

Lastly, the "AI Suggestions" option 144 may provide users with the ability to influence the AI engine's learning path, particularly concerning the relevance of automated annotation suggestions. Users can give feedback on the AI's suggestions to enhance its future performance. For example, a senior architect may train the AI to recognize and suggest energy efficiency tips for certain design elements, or an engineer may focus the AI's learning on structural integrity notes. Additionally, depending on their authority, users may influence the AI's learning on a personal level for individualized suggestions or on a collective level to improve the engine's utility for the entire team.

In some embodiments of the present invention, the "AI Suggestions" option 144 may include a feedback loop where the AI engine not only learns from the annotations made but also from the user's response to its suggestions, including ignored, accepted, or modified inputs. This allows the AI engine to refine its suggestion accuracy, not just in the context of the current project but across similar future projects. Additionally, the AI engine may offer versioning control suggestions, advising on the ideal moments to create new versions of the design plan, design element and annotations based on the volume and significance of recent annotations and changes.

Figure 1F:
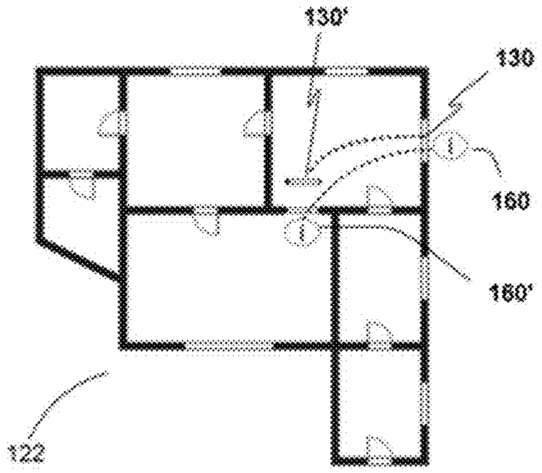
FIG. 1F illustrates an exemplary method for relocating a design element from one position to another on a design plan in some embodiments of the present invention.

Referring now to FIG. 1F, an exemplary process is illustrated wherein a user engages with the collaborative platform to relocate a design element 130 which carries an associated annotation 160. Upon moving the design element to a new position, now indicated as 130', the system's AI engine automatically relocates the associated annotation to 160' associated with the moved design element 130', maintaining the contextual link between the annotation and the design element.

In some embodiments, the AI engine is equipped to not only move the annotation but also to assess and implement slight adjustments to the annotation's content or presentation. These modifications may be based on factors such as the nature of the movement, the final placement of the design element, or the spatial relationship to other design elements and annotations. For example, if a window, originally on the north-facing wall, is moved to a south-facing wall, the annotation may be updated to reflect the change in sunlight exposure.

Additionally, the AI engine may provide visual cues to indicate that an element has been moved, such as highlighting the original and new locations or creating a trail from the original to the new position. In some other embodiments, the AI engine may suggest updates to related annotations based on the element's new location, such as recommending changes in material or dimensions that are more suited to the new position within the structure or building.

Furthermore, the system may track the movement history, allowing users to view and revert to previous positions if needed. This feature supports iterative design processes where relocation decisions are explored and evaluated in real time. It may also aid in maintaining a comprehensive audit trail that can be invaluable during the review stages or in post-project analyses.

Figure 1G:
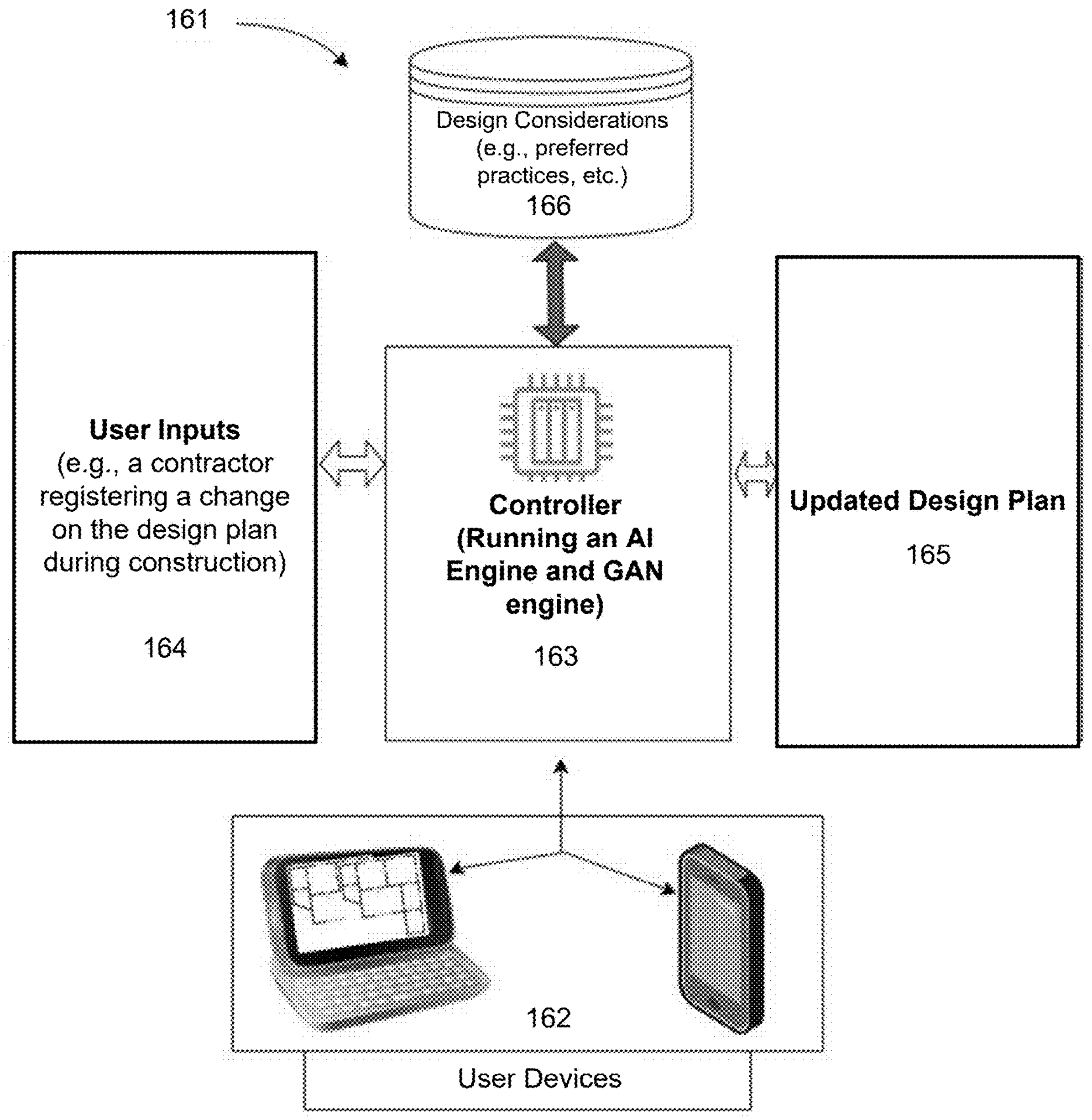
FIG. 1G illustrates an exemplary system for registering a change to a design plan during construction in accordance with the present invention.

Referring now to FIG. 1G, an exemplary system 161 for registering changes to a design plan during construction is shown in accordance with the present invention. The system 161 addresses the dynamic nature of construction, where changes to the initial design plan may become necessary due to various site conditions or evolving client requirements. As part of this process, contractors and other users can engage with the design plan via user devices 162, which allow for real-time interaction and updating of the building's design. This interaction is facilitated by a controller 163, which may utilize one or both an Artificial Intelligence (AI) engine and a Generative Adversarial Network (GAN) engine to analyze and update the design plan based on user inputs 164 and/or broader design considerations 166.

During construction, contractors regularly consult the design plan—typically presented as a two-dimensional reference (e.g., 121 shown in FIG. 1B) of the building—so that their work aligns with the original specifications. User devices 162 may include a wide range of digital tools used on construction sites, such as tablets, laptops, or mobile phones. For example, a contractor may use a tablet with a high-resolution display to view a detailed section of the building plan, zooming in to examine structural elements or wiring schematics. Another contractor may use a ruggedized laptop designed for harsh site conditions, enabling them to input or register modifications directly into the system 161 without needing to return to the office. In some cases, smart devices such as augmented reality (AR) glasses could be used to superimpose the digital design plan onto the physical construction site, providing an immersive and interactive method for reviewing the design plan in real-time.

Each user device 162 may be equipped with a display screen to present the interactive user interface, such as the interface 125 shown in FIG. 1B. The user interface serves as the primary platform for contractors to interact with the system 161, allowing them to view, modify, and update the design plan as needed. Beyond the display, the user device 162 may also comprise a digital storage medium containing executable software that allows for real-time processing and updates. Additionally, the user device 162 may include integrated sensors, such as GPS for location tracking on larger construction sites, cameras for capturing images of specific work areas, and even tools to scan QR codes or other markers that link physical objects to their digital counterparts on the design plan.

The controller 163, embedded within or connected to the user device 162, operates one or both of an AI engine and a GAN engine. The AI engine is responsible for analyzing changes made to the design plan, assessing the impact of these changes on other aspects of the building, and suggesting potential improvements. The GAN engine further enhances this functionality by generating alternative design solutions based on the user's input 164, effectively proposing new configurations that might better suit the updated conditions on the construction site. The controller 163 may comprise a processor that executes the software code, enabling seamless communication between the user's inputs 164 and the system's AI-driven analyses. In some cases, the user device 162 may also include augmented input methods, such as voice recognition or gesture-based controls, making it easier for contractors to register changes in hands-free or hands-busy environments.

A contractor often needs to refer to the design plan of a building during construction. However, as construction progresses, the need for modifications may arise for several reasons. For example, site conditions such as uneven terrain, unforeseen structural issues, or conflicts between different building systems (e.g., HVAC ducts conflicting with electrical wiring) may require the contractor to make adjustments. Additionally, client-driven changes, such as a preference for different materials, an updated room layout, or new fixtures, may also necessitate revisions to the design plan. Another common reason for modifications arises when discrepancies are found between the design plan and the actual physical environment—such as incorrect measurements or unaccounted-for structural obstacles—that prevent the original plan from being fully executed.

Once these changes are physically performed on-site, it becomes important to register them in the design plan to maintain an up-to-date and accurate reflection of the building as it is being constructed. This process of updating the design plan is important for several reasons. First, without recording the modifications in the design plan, other contractors—such as electricians or plumbers—who rely on this information to perform their work might encounter conflicts that can delay the project. For example, an electrician unaware that a wall has been moved might attempt to install wiring in an area where it is no longer viable. Second, the changes must be recorded for the sake of transparency when turning the building over to the client. The client may request to know precisely how the final structure differs from the initial design, and these updates provide a clear and traceable record of any deviations made during construction.

The system 161 allows contractors to register these on-site changes quickly and efficiently. After or before physically performing a modification at the construction site, the contractor (sometimes referred to as the user) can select the relevant spot on the design plan—such as a two-dimensional reference 121 using the user device 162. The system 161 may respond by generating a pop-up window on the interactive user interface 125—prompting the contractor to provide user inputs 164. These inputs 164 may typically include details about the nature of the change, such as whether the contractor is moving a wall, relocating a fixture, or altering the placement of plumbing lines. For example, if a structural element, such as a support beam, needs to be shifted, the contractor can specify the new position and dimensions of the beam in the pop-up window. In some instances, if an HVAC unit is being relocated to avoid interfering with electrical conduits, the contractor can provide details about the new HVAC routing and the reasons for the change. This input not only updates the design plan but also helps to create a record of why certain decisions were made during the construction process.

Once the contractor submits their inputs, the controller 163 may analyze the required change by comparing it against pre-existing design considerations 166 stored in the system 161. The design considerations 166 may include preferred building practices, compliance with building deployment objectives, or specific client preferences. For example, the system 161 may have stored information about the client's desire for open spaces with minimal structural columns, or it may consider energy efficiency standards that require specific spacing for HVAC systems. By comparing the change to these considerations, the controller 163 may evaluate whether the proposed modification aligns with the overarching design principles and objectives of the project.

The controller 163 may also evaluate the consequences that the change may have on other elements of the design plan. For example, if a wall is moved, the system 161 will assess how this affects nearby electrical wiring, plumbing lines, and HVAC ductwork. It will analyze whether the new configuration creates conflicts, such as electrical conduits that now run through areas designated for plumbing, or if it reduces the efficiency of the building's systems. The controller 163 provides a detailed analysis of these potential issues, helping the contractor make informed decisions about the change. For example, if a window is moved to a new location, the system 161 will highlight how this impacts natural lighting, thermal insulation, and any nearby structural supports. Similarly, if a load-bearing wall is removed, the system 161 may warn of potential structural weaknesses and propose alternative solutions.

In some cases, the controller 163 may provide automated alternative suggestions that resolve conflicts or improve the overall design. For example, if moving an HVAC unit creates a conflict with plumbing lines, the controller 163 may suggest rerouting the plumbing through a different section of the building or adjusting the HVAC layout to avoid the issue. These automated suggestions may be generated by the GAN engine, which uses its training to predict optimal configurations based on past data and the current design constraints. The contractor can review these suggestions and decide whether to implement them. For example, the system 161 may propose that a window be relocated slightly to optimize sunlight exposure while maintaining the structural integrity of the surrounding walls.

Alternatively, if the contractor prefers to stick with their original plan (change decision), they may bypass the automated suggestions and may manually draw the change on the design plan using the user device 162. The system 161 accommodates this flexibility, allowing users to take full control of the design when required. In this case, the contractor can override the AI's suggestions and input their own measurements and configurations directly into the system 161. For example, if the contractor is confident that moving a structural column will not affect the building's integrity, or that moving the structural column is indispensable, they may proceed with their plan, while the system 161 still updates the design plan to reflect the new column placement in the updated design plan 165.

Once the contractor finalizes the changes, the updated design plan 165 is stored and synchronized across the system 161. The updated design plan 165 reflects the latest version of the building's structure, incorporating all registered changes. The updated plan 165 is immediately accessible to all relevant parties, including other contractors, project managers, and the client. For example, if an electrician is scheduled to install wiring in a room where the wall layout has changed, they can access the latest version of the design plan via their user device 162, so that they have the correct information before beginning their work. This real-time synchronization reduces the risk of errors or miscommunications during the construction process.

The updated design plan 165 serves as a historical record of all changes made during the project. Each modification is logged, complete with details about who made the change, when it was made, and why it was necessary. This record is especially useful during the turnover process 174 when the building is handed over to the client. The client can review the final design plan, complete with a comprehensive history of all modifications, providing transparency and accountability throughout the construction process. For example, if the client queries why a particular room ended up smaller than originally planned, they can refer to the design log to see that a structural beam had to be moved due to site conditions, or that this change was necessary to comply with design considerations.

In some embodiments of the present invention, the system 161 provides a comprehensive suite of tools on the user interface of the user devices 162, enabling contractors to register required or performed changes on the design plan during construction. These tools offer flexibility for contractors to engage with the design plan in various ways, depending on the nature of the change they wish to make. For example, contractors may use freehand drawing tools to sketch changes directly on selected spots on the design plan. This may include drawing lines, shapes, or other elements that indicate a modification in structural elements, the repositioning of fixtures, or the addition of new components. If a contractor decides to widen a doorway or adjust the placement of a wall, they can sketch the new dimensions directly onto the design plan, providing a visual representation of the proposed change.

The controller 163, equipped with an AI engine and/or GAN engine, interprets these hand-drawn elements and automatically generates an updated design plan 165 that reflects the changes. The system 161 may analyze the contractor's drawings, determining whether they correspond to known architectural elements such as walls, doors, or windows. For example, if the contractor draws a rectangle to represent the relocation of a window, the controller 163 recognizes the shape as a window and updates the design plan to include the new window placement, adjusting nearby elements like wall openings and trim accordingly. The GAN engine may further enhance this process by suggesting potential configurations based on the contractor's sketch, predicting optimal placements for nearby electrical wiring, plumbing, or HVAC ducts that could be affected by the window's new position.

These tools may also include a set of predefined icons or elements, such as, but not limited to doors, windows, appliances, and fixtures, which the contractor can drag and drop onto the selected spot in the design plan. For example, if the contractor is installing a new door, they can simply select a door icon from the tool palette and drag it to the appropriate location on the design plan. The system 161 responds by adjusting the structural layout to accommodate the new door, updating nearby wall sections, and accounting for any other affected systems, such as electrical outlets or HVAC vents. Similarly, if a contractor is tasked with adding a new appliance, such as a refrigerator or oven, they can drag an appliance icon onto the design plan, and the controller 163 will analyze how the new appliance affects nearby plumbing, gas lines, and electrical circuits. For example, the system 161 may automatically adjust the plumbing lines to supply water to a water closet area, or electrical wiring layout.

In addition to dragging and dropping elements onto the design plan, contractors can use the tools to select existing elements on the design plan for removal, deletion, or relocation. For example, if a wall is being demolished as part of a renovation, the contractor can select the wall on the design plan and mark it for deletion. The system 161 then may update the design plan automatically by removing the wall and adjusting other connected elements, such as ceilings, floors, and adjacent walls, to account for the change. Similarly, if a fixture, such as a sink needs to be relocated due to a new bathroom layout, the contractor can select the sink on the design plan, specify its new location, and the system 161 will automatically update the plumbing layout to connect the relocated fixture to the water supply and drainage systems.

In some cases, contractors may choose not to interact directly with the visual tools but instead provide detailed user inputs 164 describing the changes. For example, a contractor might specify that a window needs to be moved three feet to the left, without drawing the change directly on the design plan. In this case, the system 161 prompts the contractor to input the relevant details, such as the dimensions of the window, its new position, and any other pertinent information. The controller 163 processes this input and automatically reflects the changes to the design plan. The updated plan shows the window in its new position, with all nearby elements adjusted accordingly, such as wall openings, trim, and potentially even the placement of nearby electrical outlets or HVAC vents.

For more complex changes, such as altering the layout of an entire room, the contractor might input a series of detailed specifications about what needs to be changed. For example, in a kitchen renovation, the contractor may specify the relocation of appliances, changes to cabinetry, and the addition of a new island. Based on this input, the system 161 would update the design plan, adjusting not only the placement of the appliances but also the electrical circuits, plumbing lines, and ventilation systems associated with them. The contractor can specify the dimensions of the new island, the materials used for countertops, and the types of appliances being installed (e.g., gas or electric stovetops), and the controller 163 will automatically adjust the kitchen layout to reflect these updates, facilitating proper spacing between appliances, outlets, and plumbing fixtures.

The tools on the user interface may be designed to facilitate quick and efficient modifications, even in cases where multiple systems, such as structural, electrical, and plumbing, are impacted by a single change. For example, if a contractor drags a new washing machine icon onto a laundry room in the design plan, the system 161 may not only reflect the addition of the appliance but may also automatically reroute plumbing lines to supply water to the machine, add an appropriate drainage connection, so that the electrical outlet meets the required voltage for the appliance. This level of integration helps streamline the construction process, reducing the potential for miscommunication between different contractors working on various aspects of the project.

Another tool available on the user interface may include a measuring tool (e.g., a scale 217 shown in FIG. 2B), allowing contractors to precisely measure distances between elements on the design plan. This may especially be useful when placing fixtures or appliances that must comply with specific building guidelines or objectives for spacing. For example, when adding electrical outlets in a kitchen, contractors can use the measuring tool to determine whether outlets are spaced according to building deployment objectives, typically within a certain distance from the countertop or adjacent appliances. Once the contractor verifies the measurements, the controller 163 automatically adjusts the design plan to reflect these placements, so that all systems—such as wiring, plumbing, or structural elements—are properly integrated and aligned with the newly placed components.

In some embodiments, the measuring tool provides real-time dynamic feedback. As the contractor draws or places elements, such as electrical outlets, lighting fixtures, or plumbing components, the controller 163 automatically updates the design plan with live measurements, reflecting the precise distance between elements as they are being positioned. For example, if a contractor is laying out kitchen appliances like a refrigerator and oven, the measuring tool will display the exact distances between these appliances and adjacent walls, outlets, or plumbing lines as the elements are dragged or drawn onto the design plan. This real-time feedback not only helps contractors comply with spacing requirements but also improves the accuracy of the entire construction process by minimizing manual errors. The dynamic measuring capability makes the design process faster and more efficient, allowing contractors to immediately visualize and adjust placements without needing to revert to manual measurement processes, while the system 161 instantly integrates all updates into the overall design.

The system 161 may also include tools for managing more specialized elements, such as HVAC systems, plumbing fixtures, and electrical wiring. For example, if a contractor is tasked with relocating an air conditioning unit, they can use the HVAC-specific tools to move the unit on the design plan, and the system 161 will automatically adjust the associated ductwork, so that airflow is maintained throughout the building. Similarly, if plumbing lines need to be rerouted to accommodate a new bathroom layout, the contractor can use the plumbing tools to draw the new pipe routes, and the controller 163 may automatically adjust the design plan to show the updated plumbing system. This not only saves time but also reduces the risk of errors, as the system 161 facilitates that all related components are updated to reflect the change.

The drag-and-drop functionality may also extend to more intricate elements, such as electrical fixtures and lighting. For example, if a contractor is installing recessed lighting in a ceiling, they can select a lighting icon from the toolset and place it in the desired location. The system 161 will automatically adjust the electrical layout, adding the required wiring so that the light is connected to the appropriate circuit. If the contractor needs to move the light fixture later, they can simply drag it to the new location, and the system 161 will update the electrical plan accordingly.

Additionally, the system 161 may include an undo/redo functionality, allowing contractors to experiment with different configurations before finalizing their changes. For example, if a contractor moves a door to a new location but later decides it interferes with the flow of the room, they can easily undo the change and try a different placement. The system 161 keeps track of all changes and allows the contractor to revert to previous versions of the design plan if needed. This flexibility is particularly useful in complex construction projects where multiple changes are being made simultaneously, and contractors need the ability to adapt quickly to new information or client preferences.

In some embodiments, the system 161 may also support multi-user collaboration, allowing different contractors to make changes to the design plan in real time. For example, while one contractor is updating the plumbing layout, another may be working on the electrical system, and both changes are reflected in the same design plan. The system 161 synchronizes these updates automatically, preventing conflicts between different systems. For example, if the plumbing contractor moves a sink, the system 161 will notify the electrical contractor that the location of nearby electrical outlets needs to be adjusted accordingly.

The controller 163 plays an important role in analyzing the impact of these changes on other systems. For example, if a contractor adds a new window to a room, the controller 163 will analyze how the new window affects the building's energy efficiency, lighting, and thermal performance. The controller 163 may suggest alternative placements for the window or recommend adding insulation to maintain energy efficiency. Similarly, if a contractor moves a door, the controller 163 will analyze how the new location impacts the building's traffic flow and may suggest changes to the layout of adjacent rooms to optimize movement within the building.

In addition to these automated analyses, the controller 163 may provide detailed reports on the consequences of each change, helping contractors and project managers understand the broader implications of their decisions. For example, if a contractor adds a new appliance to a kitchen, the controller 163 will generate a report detailing how the change affects the building's electrical load, plumbing requirements, and ventilation. This report can be shared with other contractors so that all systems are updated accordingly.

In some embodiments, beyond user inputs 164, the controller 163 also considers design considerations 166 when generating or modifying the design plan while registering a physical change. Design considerations 166 may include a variety of factors that govern the functionality, aesthetics, and regulatory compliance of the building. These considerations can be drawn from a database that stores preferred practices, building deployment objectives, structural guidelines, wellness principles, building codes, or other relevant standards. For example, in a project where energy efficiency is a priority, the design considerations 166 may include guidelines on optimizing natural light, reducing energy consumption through insulation, and placing windows and ventilation systems in optimal positions.

In some embodiments, the design considerations 166 may also factor in building deployment objectives, such as maximizing space efficiency in high-traffic commercial environments. For example, a retail store may need wide open areas for customer movement, while a corporate office may prioritize efficient use of space for cubicles and private offices. The system may automatically adjust room layouts, entrance locations, and aisle widths based on these objectives, so that the design meets both the functional needs of the client, and the architectural best practices stored in the design consideration database 166.

Design considerations 166 can also incorporate cultural or traditional guidelines, such as, Victorian, Elizabethan, Modern, Vastu Shastra or Feng Shui, which dictate room placement and building orientation based on spiritual or philosophical principles. For example, in a project where Vastu Shastra principles are applied, the system 161 may orient the kitchen to the southeast and position the master bedroom in the southwest corner of the building. The AI engine and GAN engine work together to incorporate these traditional guidelines into the modern design framework, creating or modifying a design plan that aligns with both functional and cultural requirements.

Design considerations 166 may include a wide range of compliance standards to be considered for determining if the design plan adheres to various regulations and best practices. These include (but are not limited to):

ADA (Americans with Disabilities Act) compliance, which regulates that buildings are accessible to individuals with disabilities by including features such as wide doorways, ramps, and accessible bathrooms.

Fire safety codes, which regulate the placement of fire exits, stairwells, fire-rated doors, and sprinkler systems to provide safe evacuation routes and fire prevention measures.

Building codes and structural regulations, which govern aspects like wall thickness, ceiling height, and load-bearing capacities to provide structural integrity and safety.

Energy efficiency standards, such as LEED certification, promote sustainable building practices by optimizing insulation, lighting, and HVAC systems to reduce energy consumption.

Occupancy and safety codes, which specify room sizes, ventilation, and egress paths based on the number of occupants to facilitate comfort and safety.

Environmental regulations, which require the use of sustainable materials, renewable energy sources, and minimal environmental impact.

Plumbing and electrical codes, regulating proper installation and safety of plumbing, drainage, and electrical systems.

Cultural or traditional guidelines, such as Vastu Shastra or Feng Shui, influence room placement and building orientation based on cultural beliefs.

These design considerations 166 may work in conjunction with user inputs 164 to register changes to the design plans that meet legal, functional, and aesthetic expectations.

The controller 163 continuously references one or both of: the user inputs 164 and design considerations 166 throughout the design modification process. This allows the system 161 to balance user input with standardized guidelines and personal preferences. For example, a client may request a specific aesthetic, such as modern minimalism, which would be considered alongside design best practices related to space utilization, lighting, and material choices. The system 161 then generates a design plan that satisfies both the client's preferences and the broader architectural principles stored in the design consideration database.

In some embodiments, the system 161 may offer real-time feedback to the user as they input their design preferences. For example, if the user requests to shift a bedroom to the northwest corner of the house, the system 161 may determine whether this aligns with Vastu Shastra guidelines and suggests an alternative placement, if required. The controller 163 can also present visual representations of the modified design plan, allowing users to review and adjust elements dynamically. For example, if a user resizes a room, the system 161 can instantly update the layout on the display screen of the user device 162, showing how the change affects the overall floor plan.

The system's use of GAN engine capabilities further enhances the design process by generating multiple optimized layouts based on the inputs provided. For example, a user may input dimensions and specifications for a room or a fixture to be added, but the GAN engine may generate several layout options that optimize space usage and light exposure. The user can then choose from these options or further modify a suggested design based on additional preferences.

In addition to user-driven design, the system 161 may also incorporate automated optimization based on external factors, such as environmental conditions. For example, if the system 161 is designing a building in a hot climate, it may automatically factor in the need for natural ventilation and shading, suggesting room layouts that minimize sun exposure while maximizing airflow. The AI engine evaluates these environmental factors in conjunction with the client's inputs and preferences, resulting in a balanced, optimized design. In such embodiment, the system 161 may also be fed with location information of the proposed building. In some cases, the system 161 may automatically determine the location of the proposed building, for example, based on GPS of the user devices 162, postal code of the proposed building, or accessed from a database. This location may then be used for determining the environmental factors to be considered in the design plan modification processes for registering real-time changes during construction.

Furthermore, the system 161 is designed to handle complex design iterations, where multiple layers of input are combined to modify a design plan. For example, in a large-scale commercial project, multiple stakeholders may input design preferences (i.e., collaborative system), such as the building owner requesting a focus on aesthetic appeal, while the architects prioritize space efficiency for workstations. The system 161 seamlessly integrates these varying inputs, cross-referencing them with applicable design considerations and client requirements to produce a cohesive final design plan.

The system 161 can also facilitate design validation through automated checks for compliance with building regulations or industry-specific standards. For example, if a hospital is being designed, the system 161 may apply healthcare facility standards, determining if hallways are wide enough for gurney movement, and operating rooms are properly ventilated and isolated. The controller 163 may access a database (e.g., 166) of regulatory requirements, cross-referencing them with the design considerations to determine if the modified design meets all required criteria.

In some embodiments, the user devices 162 may also include augmented reality (AR) or virtual reality (VR) capabilities, allowing users to visualize the design plan in an immersive environment. For example, a client may use a VR headset to virtually walk through their future building, experiencing the spatial layout and design elements in a highly realistic manner. This immersive interaction provides a deeper level of engagement and allows for more informed design modifications.

Additionally, the system 161 is designed to adapt to iterative feedback. As users continue to input modifications, the controller 163 refines the design plan by learning from previous adjustments, improving the AI engine's capacity to predict user preferences and optimize layouts. For example, if a user repeatedly adjusts room dimensions in favor of larger communal spaces, the system may prioritize similar space allocations in future iterations.

The system 161 may also function as a collaborative system, facilitating real-time interaction between multiple users across different locations. This collaborative capability enables architects, designers, clients, engineers, and other stakeholders to participate in the design generation and modification process simultaneously, making it easier to coordinate and incorporate feedback from all parties involved. Through the user devices 162, each participant can contribute inputs, make annotations, and provide suggestions, which the system 161 processes in real-time through the controller 163 running the AI engine and GAN engine.

For example, an architect in one location can modify the structural layout of a building while a project manager in another location can add budget-related constraints or deadlines. Meanwhile, the client can review the proposed design and provide immediate feedback, such as requesting changes to room sizes or aesthetic features. The system 161 processes all of these inputs collaboratively, integrating them into a unified design plan that reflects the needs and priorities of each stakeholder.

The collaborative nature of the system 161 also enables efficient version control and design iteration. Multiple users can access the design plan simultaneously, and any changes made by one user are immediately visible to the others, so that everyone is working with the most up-to-date version. This real-time collaboration streamlines communication, reduces the risk of misinterpretation, and speeds up the overall design process. Furthermore, the system 161 can store different iterations of the design plan, allowing users to track changes, compare previous versions, and revert to earlier designs if required.

Figure 1H:
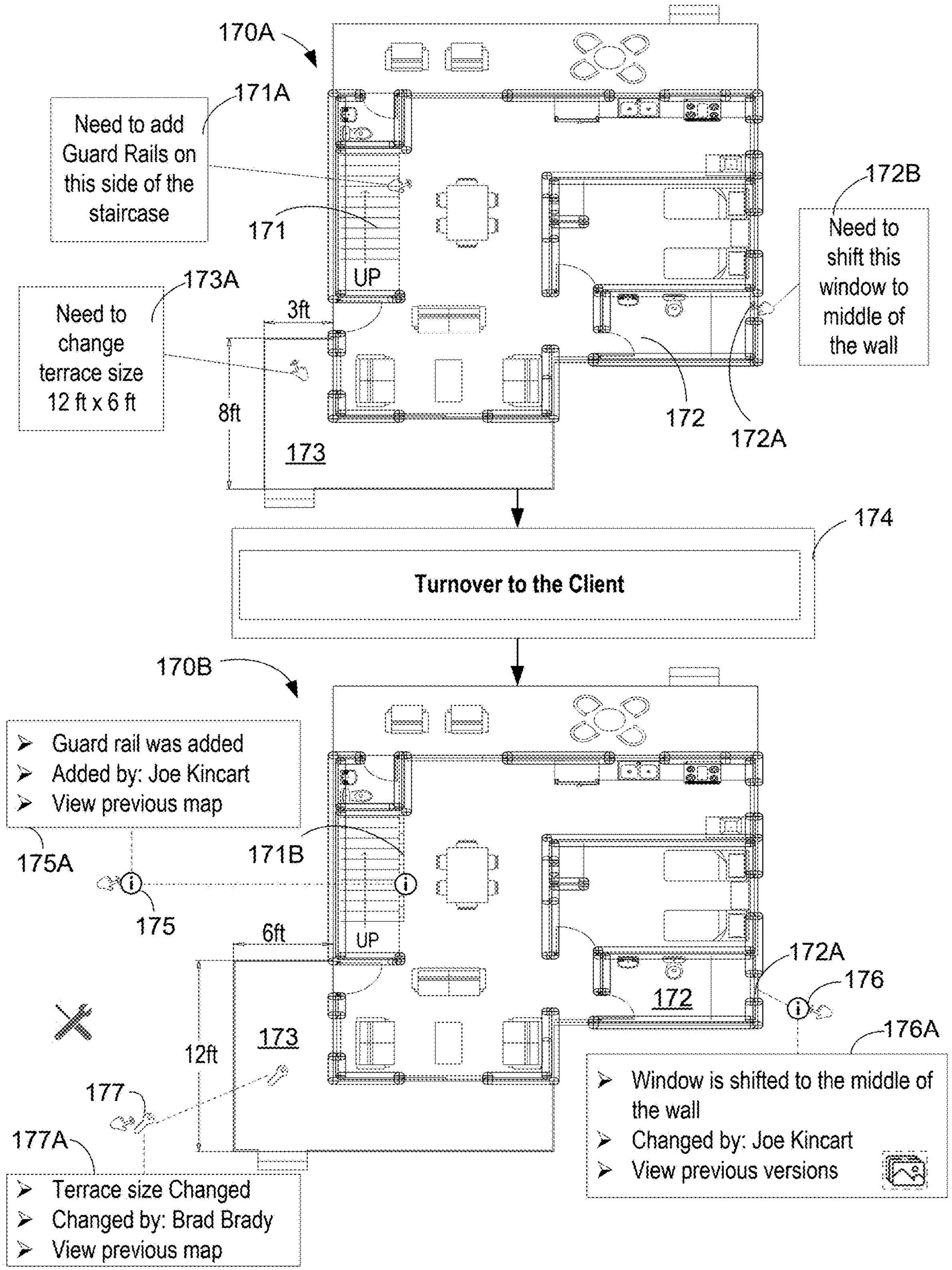
FIG. 1H illustrates an exemplary process for registering a change to the design plan during construction of a building in accordance with the present invention.

Referring now to FIG. 1H, an exemplary process for registering a change to the design plan during the construction of a building is illustrated in accordance with the present invention. FIG. 1H represents an initial design plan 170A of a building that is currently under construction. As construction progresses, a contractor or user may find the need to make changes to one or more elements of the building due to site conditions, updated client requirements, or unforeseen challenges. The contractor may belong to different disciplines depending on the nature of the work. For example, the contractor could be a builder responsible for the structural elements of the building, an electrician tasked with laying out the wiring and electrical systems, a plumber managing the plumbing layout, or an HVAC technician overseeing the heating and cooling systems. Each contractor interacts with the building's design plan in specific ways that align with their areas of expertise, often requiring modifications to the plan as work proceeds.

In this particular embodiment, a contractor identifies the need to add a guard rail along a staircase 171 that is being built in the physical structure. This change is not originally part of the design plan 170A but becomes necessary during construction to enhance safety or meet building deployment guidelines or design considerations. To register this change in the design plan 170A, the contractor would select the appropriate spot on the digital design plan 170A, specifically along the corresponding staircase 171. This could be done using a digital device such as a tablet, laptop, or smartphone, (e.g., user devices 162 as shown in FIG. 1G), where the contractor interacts with the digital representation of the building through an intuitive user interface.

Once the contractor selects the spot along the staircase 171, a popup window 171A may appear on the interactive user interface, prompting the contractor to input the details of the required change. In this example, the contractor may describe the need for a guard rail to be added on the side of the staircase 171. The contractor may also provide additional information such as the height and material of the guard rail, or any specific safety features it must include. The popup window 171A may allow the contractor to input these details using written descriptions, audio commands using microphone, select from a list of predefined elements, or even upload sketches or images to clarify the intended modification.

The controller, such as 163 shown in FIG. 1G, analyzes the input provided by the contractor in the popup window 171A. This analysis may involve determining whether the addition of the guard rail affects any other components of the design plan 170A. For example, the controller may assess whether the new guard rail interferes with the placement of nearby fixtures, doors, or windows. Additionally, the controller may evaluate whether the structural integrity of the staircase 171 is impacted by the added weight or material of the guard rail. If the staircase 171 is adjacent to a wall or other structural elements, the controller may check for potential conflicts, such as the guard rail obstructing the opening of a nearby door or the need to shift the position of electrical outlets along the wall.

Moreover, the controller 163 may correlate the proposed change with the design considerations 166 stored within the system. These design considerations may include safety standards, aesthetic guidelines, or specific client preferences that were established at the beginning of the project. In some examples, the controller may cross-reference the dimensions and materials of the guard rail with relevant building deployment objectives to verify that the change adheres to regulatory requirements. If the design considerations 166 specify a particular style or material for fixtures in the building, the controller will determine if the added guard rail matches these preferences, preventing inconsistencies in the final structure.

Beyond immediate analysis, the controller may also evaluate potential future implications of the change. For example, the controller may determine that adding the guard rail in the specified location limits the ability to install other elements in the future, such as additional handrails, lighting fixtures, or even decorative components. For example, if the contractor installs a bulky guard rail, the controller may predict that this addition restricts the placement of future wall-mounted light fixtures, which could affect both the safety and aesthetics of the space. In such cases, the controller may prompt the contractor to reconsider the guard rail's dimensions or material to allow for more flexibility in future construction or interior design.

The controller may also be capable of generating automated alternative suggestions based on the required change and any potential conflicts with the existing design. For example, if the original placement of the guard rail interferes with a nearby window or limits space on the staircase, the controller may suggest alternative locations for the guard rail or recommend a different design that better fits the available space. These suggestions may be generated using the AI engine and/or GAN engine of the controller, which have been trained on large datasets of construction scenarios to provide optimal design solutions. The contractor can review these alternatives and may select one that meets both the immediate needs of the project and any long-term goals for the space.

In some situations, the controller may require further details to fully understand the context of the input provided by the contractor. If the input in the popup window 171A is unclear or lacks necessary information, the contractor may prompt the contractor to provide additional specifications. This may involve asking for the exact dimensions of the guard rail, the type of material being used, or whether any custom features (e.g., decorative elements or built-in lighting) need to be included. Alternatively, the system may request more information to store a comprehensive log of the change, so that all relevant data is captured for future reference.

Once the contractor has provided the necessary information, either through written, verbal, or gesture-based inputs, or using the available tools on the user interface (such as hand-drawn sketches or drag-and-drop elements), the controller updates the initial design plan 170A. In this case, the controller adds the guard rail 171B along the staircase 171 in the updated design plan 170B, fully reflecting the contractor's change in the physical building. Along with this update, the system also adds a change indicator 175, such as an information icon or a wrench icon, to visually mark the spot where the physical change has occurred. The change indicator 175 is an important part of the process, as it highlights areas of the design that have been modified, allowing other contractors, stakeholders, or clients to quickly identify changes made in the physical building.

The contractor may also associate additional annotations with the change indicator 175. These annotations may include text descriptions, images, videos, or even audio recordings that provide more context about the change. For example, the contractor may upload images of the guard rail installation to show how it looks in the physical space, or they might add a video explaining why the change was necessary and how it impacts the overall design. These multimedia annotations create a rich, detailed record of the modification, which can be invaluable for future contractors, building inspectors, or the client when they need to understand the reasoning behind the change. In some embodiments, the contractor may also upload before and after images of the selected slot.

Later, when another contractor or the client reviews the updated design plan 170B, they can click on the indicator 175 to access the detailed change information 175A. This information includes all the relevant details about the guard rail addition, such as who made the change, when it was made, and why it was necessary. For example, clicking on the change indicator 175 may reveal a pop-up window 175A that includes the contractor's notes explaining that the guard rail was added to comply with safety standards for staircases in residential buildings. The pop-up 175A may also include a gallery of images showing the guard rail before, during, and after installation, as well as any associated documents like compliance certificates or material specifications.

Similarly, the contractor may encounter the need to relocate, resize, or alter the design of a building element during construction. For example, in the example provided in FIG. 1H, the contractor may need to relocate a window 172A situated in the toilet room 172. This change requirement might arise due to site conditions, such as an obstruction behind the wall, or to better meet the client's revised preferences, such as increasing natural light in the toilet room 172 by shifting the window 172A to a more central position. To register this change on the design plan 170A, the contractor begins by selecting the existing window 172A on the design plan 170A. Once the window is selected, a popup window 172B appears on the user interface, prompting the contractor to provide details about the required change.

In the popup window 172B, the contractor may specify that the window needs to be relocated to the middle of the wall in the toilet room 172. The contractor may also input details such as the window's new dimensions, the distance from the adjacent walls, or the new window model being used. Alternatively, rather than inputting text-based details, the contractor may opt to use a drag-and-drop function on the user interface to directly move the window 172A to its new position. By simply clicking, holding, and dragging the window 172A across the design plan 170A to its new location, the system can instantly reflect the relocation of the window 172A on the updated design plan 170B. This real-time, interactive method of updating the design plan gives the contractor flexibility in how they choose to make the modification.

Once the change has been made, the updated design plan 170B reflects the relocated window 172A, now shown in the center of the wall in the toilet room 172. Along with this update, the system adds a change indicator 176, which is placed next to the newly relocated window 172A on the updated design plan 170B. The change indicator 176 visually marks the spot where the change occurred, alerting the client or other contractors to the modification. After the building is handed over to the client, they can click on the change indicator 176 to access more information about the window's relocation. When clicked, a popup window 176A appears, displaying the full details or additional information of the change. This popup may include text-based annotations explaining why the window was moved, images of the window both before and after the change, and any technical specifications, such as the new dimensions or the type of window that was installed. By providing this level of detail, the system makes it easier for the client to understand the reasoning behind the modification, facilitating transparency during the turnover process 174.

Similarly, the contractor may need to register a change in the size of a terrace 173 in the physical building. Initially, on the design plan 170A, the terrace 173 is marked as 3 feet by 8 feet, but due to construction requirements or client preferences, the terrace 173 may need to be resized to 6 feet by 12 feet. To register this change, the contractor selects the terrace 173 on the initial design plan 170A and inputs the details of the modification in a popup window 173A. The contractor may also provide additional context for the change, such as the need for more outdoor space or the discovery of additional structural capacity for a larger terrace.

In the updated design plan 170B, the terrace 173 is shown with its new dimensions, reflecting the change from 3 feet by 8 feet to 6 feet by 12 feet. A change indicator 177 is placed next to the resized terrace 173 to highlight the modification. Just like with the window relocation, this indicator serves as a visual cue for the client or other contractors, signaling that the terrace 173 was changed or resized during construction. After the building is completed and turned over 174 to the client or another contractor, they can click on the indicator 177 to open a detailed change information window 177A comprising additional information related to the registered change. This window provides the full details of the terrace's resizing, including any annotations from the contractor explaining why the change was made, as well as before-and-after images showing the terrace's original and updated sizes.

This system of registering changes and associating detailed annotations with visual indicators greatly enhances the transparency and traceability of modifications made during construction. For the client, this process simplifies the handover of the building, as they can easily review all changes made to the original design without needing to sift through complex documents or construction logs. Instead, they simply navigate the digital design plan, clicking on indicators to learn more about each modification. This level of detail facilitates the client's full understanding of what has been done to the building and why, facilitating smoother decision-making during future renovations or maintenance efforts.

In some embodiments of the present invention, multiple contractors may be responsible for constructing different sections, elements, or systems of a building. This division of labor is particularly common in large or complex construction projects where specialized skills are required for different aspects of the building's development. For example, in the construction of high-rise office buildings, hospitals, or multi-wing residential complexes, different contractors may be assigned to oversee specific parts of the building, such as the structural framework, interior layouts, electrical wiring, plumbing systems, ventilation systems, or external architectural features. Each contractor is typically authorized to modify and register changes only within the scope of their assigned section or system of the building. This restriction facilitates that changes are properly managed and coordinated between contractors, preventing conflicts or unauthorized modifications across the broader construction project.

Referring again to FIG. 1H, an exemplary contractor, for example, Joe Kincart is responsible for constructing the internal layout of the building. As such, Joe can only register changes made within the interior of the building. For example, if during construction Joe decides to add a guard rail 171B to the staircase 171 for safety purposes, he can register this physical (As-Built) change on the design plan 170A. Joe selects the relevant spot on the staircase 171 in the design plan 170A and inputs the required change in the popup window 171A. This action is represented by the change indicator 175 in the updated design plan 170B, where the details of the modification are stored, including the contractor's name, in this case, Joe Kincart. Similarly, if Joe finds it necessary to relocate the window 172A in the toilet room 172 to the center of the wall, he can register this change on the design plan 170A as well. The relocation of the window 172A is displayed with a corresponding change indicator 176, allowing users (other contractors or clients) to view the details of the change, such as the person responsible (Joe Kincart) and the specific modification made to the window 172A.

In contrast, another exemplary contractor, for example, Brad Brady is responsible for the construction of the building's exterior, including elements such as terraces, patios, and external structural features. Therefore, Brad can only register changes related to the outer parts of the building, such as resizing the terrace 173. During construction, if Brad determines that the terrace 173 needs to be resized from its original dimensions of 3 feet by 8 feet to 6 feet by 12 feet due to client specifications or site conditions, he can select the relevant spot on the design plan 170A and input the change in a popup window 173A. This change is reflected in the updated design plan 170B with the addition of a change indicator 177 next to the resized terrace 173, where details of the modification are recorded, including the name of the contractor, Brad Brady, who performed the physical alteration.

The division of responsibilities between contractors, as exemplified in FIG. 1H, prevents any individual contractor from registering changes to sections of the building for which they are not authorized. This compartmentalization of authority facilitates that each contractor can only register changes related to their assigned scope of work, thereby maintaining the integrity of the design plan and reducing the likelihood of conflicts. For example, Joe Kincart, who is responsible for the interior layout, is not authorized to make changes to the terrace 173, as this section of the building falls under Brad Brady's responsibility. If Joe were to attempt to register a change in the size or layout of the terrace 173, the system would display an error or warning message, indicating that he is not permitted to modify that particular section of the building. The same restriction applies to Brad, who cannot register changes to interior elements such as the window 172A or the staircase guard rail 171B, as these are within Joe's jurisdiction.

In these embodiments, the system automatically enforces these boundaries by linking each contractor's permissions to specific areas or components of the design plan. When a contractor selects a spot on the design plan to register a change, the system verifies whether the selected spot falls within the contractor's authorized area of responsibility. For example, if Brad attempts to move the window 172A in the toilet room 172, which is outside his permitted section, the system will block this action and present a warning message, notifying Brad that he is not authorized to make changes to that part of the design plan. Conversely, if Joe attempts to resize the terrace 173, the system will also display an error, indicating that this modification is outside the scope of his authority.

This embodiment may particularly be useful in large-scale projects where multiple contractors are working concurrently on different parts of the building. For example, in the construction of a hospital, the contractor responsible for installing the electrical systems would not be allowed to modify the structural layout of patient rooms, which would be the responsibility of another contractor specialized in structural design. Similarly, the contractor managing the installation of plumbing systems would not be authorized to make changes to the HVAC systems, as this would fall under the jurisdiction of an HVAC contractor. The system's ability to compartmentalize responsibilities and prevent unauthorized changes helps streamline the construction process, so that each contractor works within their expertise while maintaining the overall coherence of the building's design.

Furthermore, the system tracks and logs every change made to the design plan, associating each change with the specific contractor responsible for the modification. As shown in FIG. 1H, the change indicators 175, 176, and 177 not only highlight where changes have occurred but also display the name of the contractor who performed the physical alteration. This level of transparency and accountability may be useful during the turnover process 174 when the building is handed over to the client. The client can easily click on any of the change indicators 175-177 to view a detailed log of the changes, including who made the change, when it was made, and why it was necessary. This feature facilitates that the client is fully informed about all modifications made during construction, facilitating better communication and project management.

In some embodiments, the system may also include role-based access controls (e.g., as discussed in FIG. 1E), where each contractor is assigned specific permissions based on their role in the project. These permissions dictate not only which parts of the design plan a contractor can modify but also the types of changes they are allowed to register. For example, an electrician may be permitted to modify the design plan to add or move electrical outlets but may not be allowed to make structural changes to walls or floors. Conversely, a structural contractor may be authorized to modify walls or floors but cannot change the placement of electrical systems. These access controls further streamline the construction process by facilitating that each contractor works within the boundaries of their expertise while preventing unauthorized or unintended modifications to other systems in the building.

This embodiment also supports collaborative workflows where different contractors work in parallel on various sections of the building. For example, while Joe Kincart is updating the interior layout of the building, Brad Brady can simultaneously be working on the exterior, resizing the terrace or modifying other outdoor features. Both contractors are able to register their changes in real-time without interfering with each other's work, and the system synchronizes all updates in the design plan, facilitating that the latest version is always available to all parties involved.

In some embodiments, a method enables a comprehensive approach to registering physical changes on a building's design plan by leveraging a controller with advanced AI and GAN capabilities. Initially, the controller receives a design plan for the building or a specific section within it. Upon reception, the controller interprets the design plan and extracts architectural and system components, such as walls, fixtures, and essential utilities (HVAC, plumbing, and electrical elements). This analysis may be powered by AI, allowing for the generation of an interactive user interface that visualizes the design plan and enables users to interact with and modify its components.

The interactive user interface provides an intuitive way for contractors, stakeholders, or clients to view, select, and manipulate elements on the design plan. For example, a contractor responsible for electrical work may select a conduit path to register a change, such as a relocation due to unforeseen structural requirements. When the user selects an element, such as a wall or fixture, they can proceed to enter details of the physical change they intend to implement. This detailed input may include the nature of the change, such as resizing, relocating, or completely removing the selected component, as well as any associated materials or equipment specifications.

Once a change is registered or is about to be registered, the controller automatically analyzes its implications on adjacent elements within the design plan. For example, if a user intends to add a new HVAC duct in a densely constructed area, the controller assesses whether this addition would affect other systems, such as electrical conduits or plumbing paths. The AI engine identifies potential conflicts and presents a prompt to the user with recommendations for avoiding these conflicts. These recommendations may include adjustments to the proposed placement or resizing suggestions to maintain the integrity of other building systems.

To support user decisions, a prompt message generated by the controller may include several interactive options. For example, a warning message may notify the user of potential conflicts with existing utilities. At the same time, the system provides alternative layouts or configurations generated by the GAN engine, which the user can select or modify. This GAN-generated alternative design may be particularly useful for subcontractors who may need to do subsequent work or may be responsible for affected areas.

For added flexibility, users can also draw changes directly onto the design plan within the user interface (e.g., in FIG. 2F), allowing freeform modification based on on-site requirements. When a user draws a shape indicating the addition of a new partition wall, the controller recognizes and interprets the drawn shape as a wall, instantly calculating its dimensions using a preset scale on the design plan. This scale allows the controller to maintain accuracy in representing the physical attributes of added or modified components, even when inputted manually.

Annotations may also be automatically associated with the registered physical changes, giving users real-time feedback or suggestions. For example, if a wall addition reduces room space below a minimum required size, the AI engine may annotate the change with a warning about potential space constraints. These annotations serve as a digital record and include details about the contractor responsible, date and time of the modification, and further contextual information like maintenance schedules, warranties, and brand or model information for newly added equipment.

Another aspect of the method allows the AI engine to draw on historical interactions stored within the system to provide more informed suggestions. For example, if similar changes have been registered in other areas, the controller leverages that data to guide future modifications in related areas, adapting its responses to incorporate lessons learned from previous interactions. This enables the controller to refine recommendations continuously and align them with established patterns of user behavior and project-specific needs.

For automated change detection, the system may incorporate live camera feeds from the construction site, allowing the controller to identify modifications that have already occurred. In such cases, the controller automatically registers these changes on the design plan based on the visual data. If discrepancies are detected between the design plan and the physical structure, the system can prompt users to confirm or adjust the auto-registered modifications. For example, if an HVAC vent appears in a location not indicated on the design plan, the controller notifies the user, who can then review the modification and adjust any dimensions or specifications as required.

Safety and compliance are also integrated into the system. When an electrical change, such as adding a new circuit, is registered, the AI engine automatically checks for load distribution and assesses whether the current capacity can handle the added circuit. If the change presents a risk, the system notifies the user with potential solutions, such as redistributing the load across other circuits.

The user interface is equipped with tools to resize or relocate components, and the controller calculates dimensions in real-time. If a contractor resizes a doorway, the controller recalculates its width, height, and the impact on adjacent walls based on the scale established in the system. This real-time calculation feature enhances precision, so that the design plan accurately reflects physical changes.

Additionally, a question section on the user interface allows users to query the feasibility of changes. For example, a user may ask if a new equipment rack could fit within a mechanical room. The controller responds by analyzing the spatial constraints, offering solutions or alternatives based on the design plan layout, and considering compliance requirements.

In another embodiment, when multiple contractors register changes in a shared area, the controller updates all interconnected design layouts, such as HVAC, plumbing, or electrical systems, to reflect the combined modifications. For example, if a contractor relocates a support column, this update will prompt other contractors to review their related designs for alignment.

Figure 1I:
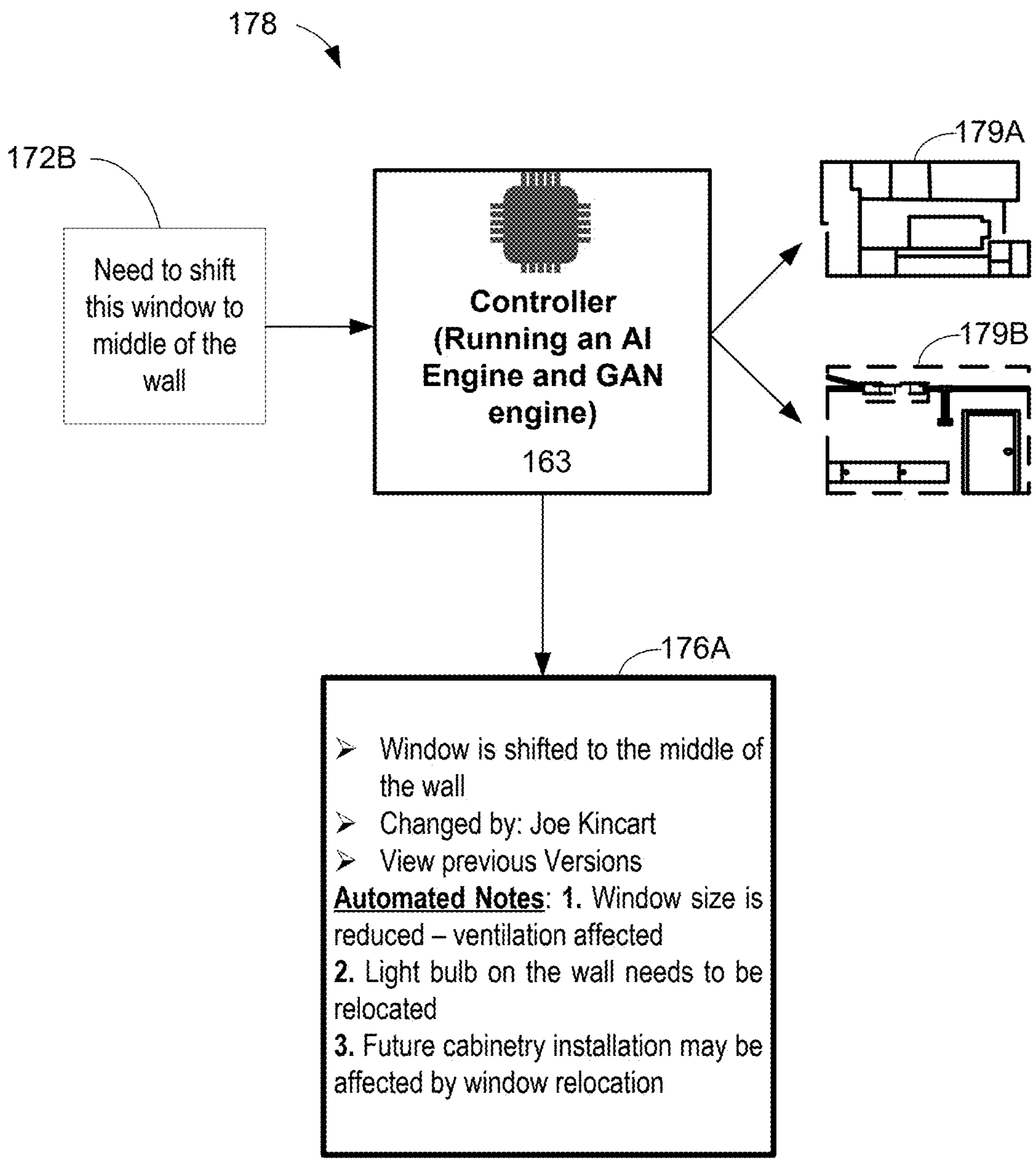
FIG. 1I illustrates an exemplary system providing automated design suggestions and annotations based on a change registered on the design plan in some implementations of the present invention.

Referring now to FIG. 1I, an exemplary system 178 provides automated design suggestions and annotations based on a change registered in the design plan during construction, in accordance with some implementations of the present invention. FIG. 1I highlights how the system 178, which includes the controller 163 running the AI engine and/or the GAN engine, processes changes in the design plan and automatically generates design updates for other affected systems of the building. These updates may include revised layouts for systems such as electrical wiring, plumbing, HVAC, or even structural components, depending on the nature of the registered change.

For example, as shown in FIG. 1H, the contractor has registered a change to shift the window 172A in the toilet room 172. This change, documented through a popup window 172B, involves moving the window 172A to the middle of the wall, as reflected in the updated design plan 170B. Once the change is input, the controller 163 processes the modification and evaluates how it impacts other systems in the building. Since moving a window often affects nearby electrical wiring, lighting fixtures, or even ventilation systems, the controller 163 must determine how these changes influence other elements in the design.

The controller 163 is capable of automatically generating new design plans for affected systems. For example, shifting the window 172A to the middle of the wall may necessitate adjustments to the building's electrical layout, especially if there are light switches, outlets, or wiring that run along the wall where the window 172A was originally placed or shifted. As shown in FIG. 1I, the controller 163 generates an automated electrical layout 179A (e.g., in a prompt message)

that reflects these changes. This updated electrical layout 179A facilitates that any wiring, switches, or outlets are repositioned to accommodate the new placement of the window 172A. For example, if a light bulb or electrical outlet was previously located under the window's new position, the system 178 will automatically relocate these elements to another section of the wall in the automatically generated electrical layout 179A, so that the electrical system is both safe and functional.

Similarly, the shift of the window 172A may affect the plumbing layout if there are water lines or ventilation pipes running through the wall. For example, in the case of a bathroom or kitchen window, the wall may contain pipes or ducts for plumbing or ventilation that are now in conflict with the new window location. The controller 163 generates an automated plumbing layout 179B (e.g., in a prompt message) that reflects these necessary adjustments. In this example, if a change in a location of a window 172A interrupts a plumbing line, the system 178 may reroute the pipes in the automated plumbing layout 179B, so that the change does not cause any structural or functional problems. This automated plumbing layout 179B takes into consideration not only the new window position but also the optimal rerouting of the plumbing to maintain system efficiency and compliance with design considerations 166.

Once these automated design plans 179A (electrical layout) and 179B (plumbing layout) are generated, they may be sent to the respective contractors responsible for implementing these systems (179A-179B) in the building. In large construction projects, where multiple contractors are working on different systems (e.g., electricians and plumbers), it is important that each contractor receives updated information about changes that affect their scope of work. For example, the electrical contractor may receive the updated electrical layout 179A, while the plumbing contractor may receive the revised plumbing layout 179B. These updates facilitate that each contractor is aware of the necessary modifications to their system, allowing them to proceed with their work efficiently and in sync with the latest changes to the building's overall design.

In some embodiments, the automated design plans 179A and 179B may be directly associated with the specific change that triggered them, in this case, the shifting of the window 172A. After the building's structural construction is complete, and the updated design plan 170B is turned over to the respective contractors (e.g., electricians, plumbers), they will be able to access these associated automated design plans 179A-179B. For example, when the electrician receives the updated design plan 170A, they can see that the window 172A was moved and review the corresponding automated electrical layout 179A to understand how the change affects the electrical wiring in that area. Similarly, the plumber can access the updated plumbing layout 179B and view how the shift in the window 172A impacts any nearby water lines or ventilation ducts.

This system of automatically generating and associating updated design plans 179A-179B with specific changes may particularly be valuable in complex construction projects, where changes to one part of the design can have cascading effects on other systems. For example, in a multi-story building, moving a window in one room may affect not only the electrical wiring in that room but also the wiring in adjacent rooms or even different floors. The controller 163, through its AI and GAN engines, is capable of analyzing these complex interactions and providing the necessary design updates in a seamless and efficient manner.

Furthermore, the system 178 is capable of providing automated annotations that may further explain the consequences of a registered change in real time, enhancing the level of detail available to contractors, other stakeholders, or clients after turnover. When a change is registered in the design plan, such as the shifting of window 172A, the controller 163 automatically analyzes the potential impacts of this modification on various aspects of the building's systems and may add automated notes in the popup window 176A. These automated annotations serve to guide contractors, provide insights on potential issues, and predict future ramifications that may result from the change.

For example, when the window 172A is shifted from its original location to the middle of the wall in toilet room 172, the controller 163 may detect that the relocation impacts the room's ventilation. The size or placement of the window 172A may be reduced or altered to fit within the new section of the wall, which could lead to a decrease in airflow or natural light into the room. Based on its analysis, the controller 163 may generate or add automated notes in popup window 176A, explaining these specific consequences. The automated note may state: "Window size reduced—ventilation affected," which informs the contractor that the relocation has affected the intended airflow in the toilet room 172. This predictive annotation helps the contractor understand that while the window 172A was successfully relocated, further adjustments might be needed to maintain adequate ventilation, such as adding a new air vent or expanding the window's size to compensate for the reduced airflow.

The system's analysis is not limited to current conditions; it can also provide predictive insights into how the change might affect future construction or modifications. For example, the controller 163 may generate a second automated note: "Light bulb on the wall needs to be relocated." This note indicates that the new position of the window 172A conflicts with the existing placement of a light fixture. The system 178 predicts that if the window 172A is installed in the middle of the wall, the light bulb may either block the window 172A or be positioned too close, reducing its effectiveness. As a result, the automated note advises the contractor (e.g., electrician) to move the light bulb to another location on the wall. This type of predictive annotation saves time and prevents future conflicts by addressing potential issues before they arise during construction.

The controller 163 makes these automated predictions based on several factors. First, it analyzes the spatial relationships between different components of the design plan. For example, it calculates the distance between the new window position and nearby elements like electrical outlets, light fixtures, and structural components. Using advanced AI algorithms, the controller 163 identifies whether these distances meet design and safety guidelines, and whether the new window placement could interfere with the operation of nearby systems. If the system 178 detects a potential conflict, such as the proximity of a light fixture, it generates an automated annotation advising the contractor on how to resolve the issue.

Moreover, the controller 163 can take future building modifications or additions into account when generating automated notes. For example, if the client plans to add built-in cabinetry along the same wall where the window 172A is being relocated, the controller 163 may predict that the new window placement will limit the available space for the cabinetry. In this case, the system 178 may generate an automated annotation warning that "Future cabinetry installation may be affected by window relocation," advising the contractor to adjust the window placement accordingly or plan for alternative cabinetry solutions. These predictive capabilities enable contractors to make informed decisions that align with both current and future construction requirements.

In addition to analyzing the direct consequences of a single registered change, the controller 163 is capable of processing and generating automated annotations for other changes registered in the design plan 170A. For example, if a contractor resizes the terrace 173 from 3 feet by 8 feet to 6 feet by 12 feet, as shown in FIG. 1H, the controller 163 may generate automated notes explaining how this change affects the building's overall structural integrity, drainage systems, or outdoor lighting. The popup window 177A corresponding to the resized terrace 173 may include annotations such as: "Increased terrace size—structural support may need reinforcement," indicating that the terrace's expansion may require additional support beams or foundations to provide stability. The controller 163 may also generate another annotation stating: "Outdoor lighting affected—additional fixtures required," suggesting that the increased terrace size may necessitate extra lighting to maintain visibility and safety in the larger space.

Furthermore, when multiple changes are registered in different sections of the building, the controller 163 is capable of cross-referencing these modifications to detect how they interact with each other. For example, if the window 172A in the toilet room 172 is relocated while the terrace 173 is expanded, the controller 163 may detect that both changes affect the building's ventilation or drainage systems. The system 178 can generate automated notes or annotations in both pop-ups 176A and 177A that explain these interactions. An annotation might state: "Ventilation affected by both window relocation and terrace expansion—additional air vents recommended," advising the contractor that these two changes, although seemingly unrelated, both impact the overall airflow in the building, necessitating further adjustments.

In another scenario, the controller 163 may process a change related to the installation of a new HVAC system. If a contractor registers the addition of an HVAC unit in one section of the building, the system 178 may analyze how this affects both the structural design and the electrical layout. Automated notes may be generated in the popup window for the HVAC system, explaining that "New HVAC unit requires additional structural support" and "Electrical wiring may need to be rerouted for HVAC installation." These annotations help contractors coordinate their efforts across different systems and facilitate that the building's design plan is updated in a cohesive and functional manner.

The automated annotations generated by the controller 163 may particularly be useful during the final turnover process when the building is handed over to the client or other contractors. By clicking on the change indicators in the updated design plan (e.g., 170B), the client can review all the automated notes associated with each modification, gaining a comprehensive understanding of how the building has evolved throughout the construction process. For example, the client may review the automated annotations related to the window 172A and see not only that it was relocated but also that this relocation affected the room's ventilation and required the light bulb to be moved. Similarly, the client can view the annotations for the terrace 173 and understand why additional structural support or lighting fixtures were required or changed.

The automated annotations provided by the system 178 offer a detailed and predictive analysis of the consequences of registered changes. The controller 163 processes each modification—such as shifting a window or resizing a terrace and generates relevant notes that explain how these changes impact other building systems, both in the present and in the future. These annotations assist contractors or clients in making informed decisions, so that each change is properly integrated into the overall design plan while preventing potential conflicts or issues from arising during later stages of construction or renovation.

Figure 1J:
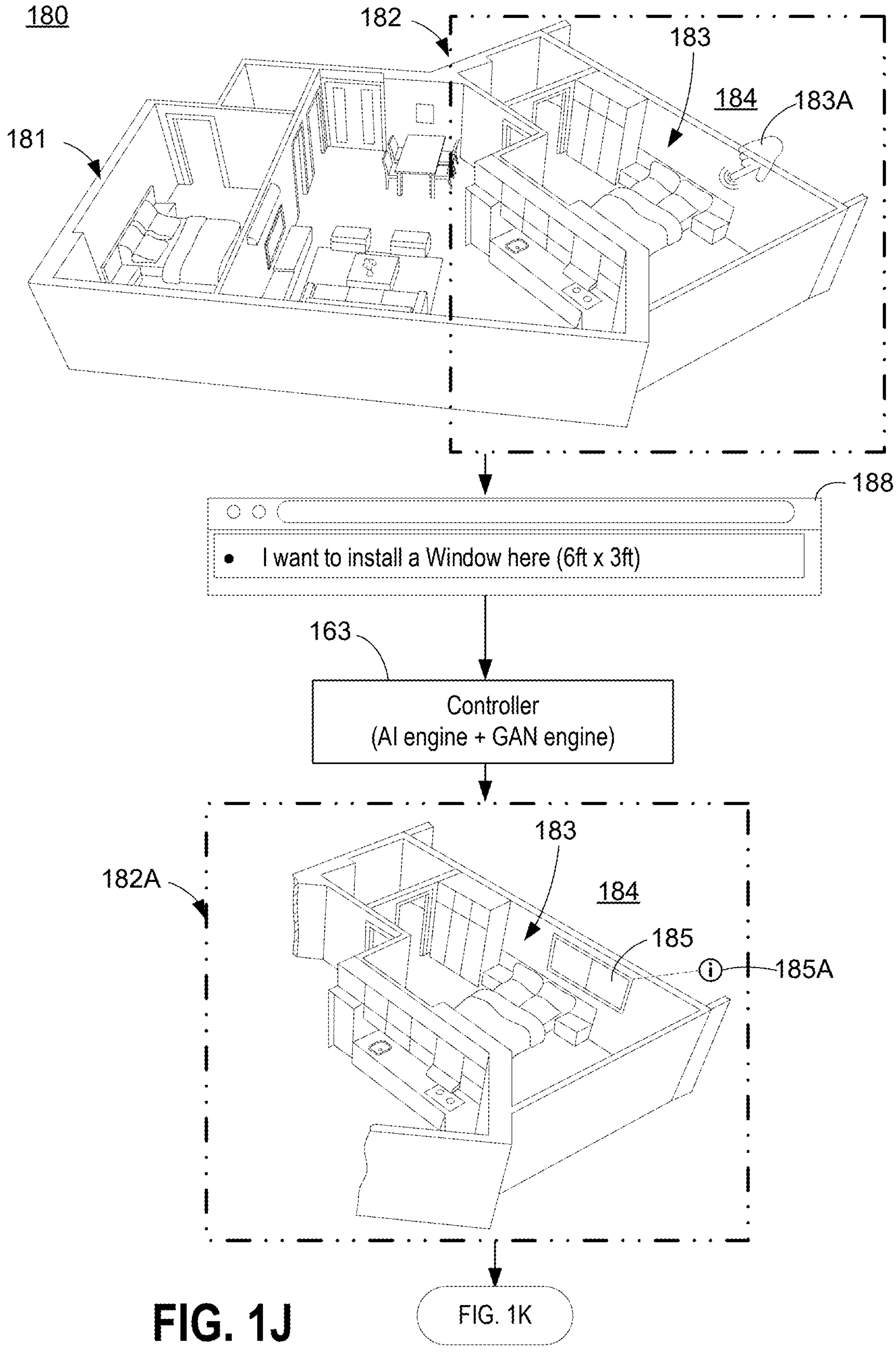
FIGS. 1J-1K illustrate another exemplary system for registering a change on the design plan during construction of a building in accordance with the present invention.
Figure 1K:
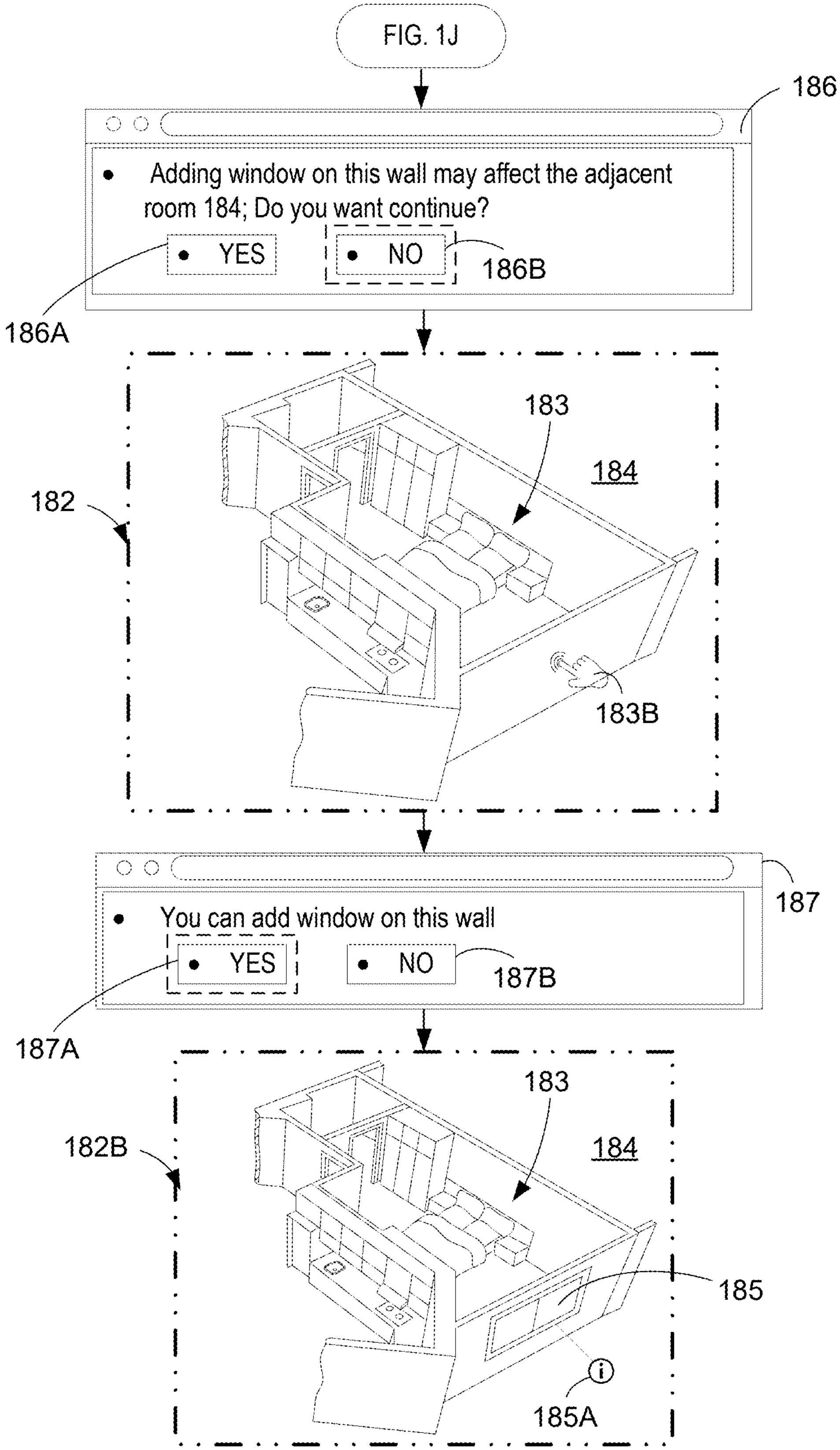

Referring now to FIGS. 1J-1K, these figures illustrate an exemplary system 180 for registering changes on a design plan during the construction of a building, according to some embodiments of the present invention. FIG. 1J represents an initial design plan that is divided into multiple sections, such as section 181 and section 182, which are under construction. Each section of the building may be assigned to different contractors who are responsible for implementing and overseeing construction in their respective sections.

During the construction process, contractors working on these sections may need to make changes to the design, such as adding, resizing, relocating, or removing elements that relate to the physical structure of the building or its internal systems. These changes might involve structural modifications, such as adjusting wall placements, expanding or reducing the size of rooms, or adding windows or doors. Alternatively, the modifications may involve altering electrical wiring, plumbing systems, or HVAC installations, all of which are important to the building's functionality. For example, the contractor working on section 181 may decide to move an internal wall to accommodate new client requirements, while the contractor handling section 182 may need to adjust electrical wiring to fit new locations for lighting fixtures or power outlets.

A key challenge arises when changes made in one section of the building, such as section 181, affect the work being done in another section, such as section 182. For example, moving a wall in section 181 might interfere with the placement of electrical wiring or plumbing systems that run between the sections. The contractor responsible for section 181 may not be immediately aware of how their changes impact section 182, and the contractor working in section 182 may not realize that changes are occurring in the adjacent section (181). This lack of communication between sections can lead to significant delays, errors, and inefficiencies, as contractors work in isolation without knowing how their modifications affect other parts of the building.

The present invention solves this problem by providing real-time updates to the design plan for all stakeholders involved in the construction process. In some embodiments of the present invention, when a contractor working on section 181 registers a change, such as the relocation of a structural wall or resizing of a window, the system 180 automatically updates the design plan for all other sections, including section 182. This real-time synchronization facilitates that all contractors, regardless of their area of responsibility, are immediately notified of any modifications that might impact their work. For example, if a wall is moved in section 181, the system 180 updates the design plan for section 182, allowing the electrical or plumbing contractor working in that section to adjust their installations accordingly.

In practice, this real-time updating process operates through a centralized controller (e.g., 163), which is responsible for managing all changes across the different sections of the building. For example, the contractor working in section 181 may use a tablet or laptop to access the digital design plan, where they register a change related to the relocation of a wall. This change is then processed by the controller, which runs an AI engine and a GAN engine, similar to the setup in previous figures. The controller evaluates how this change affects other sections, such as section 182, and updates the design plan for that section in real time. The contractor responsible for section 182 is immediately notified of the change, either through an alert or by viewing the updated design plan on their own device.

In some embodiments, the contractor responsible for section 182 may need to physically install a window on a wall of room 183. This scenario is illustrated in FIG. 1J, where the contractor managing section 182 is tasked with making structural changes. In this case, the contractor may decide that a window should be installed in a particular spot on the wall of room 183 to allow additional light or ventilation into the space. However, the contractor may not be aware that the wall separating room 183 from the adjacent room 184 also falls under the responsibility of another contractor for the adjacent room 184. The wall is shared between room 182 and the adjacent room 184, which could be under the purview of a contractor overseeing different parts of the building, such as electrical installations or plumbing in room 184.

Before physically installing the window in the wall, the contractor may select a specific spot 183A on the wall using the system's user interface. The system 180 automatically generates a pop-up window 188, prompting the contractor to provide details about the proposed change. In the pop-up window 188, the contractor can specify that they wish to install a window of particular dimensions, 6 feet by 3 feet, for instance, on the selected spot 183A. Additionally, the contractor may input further details about the window's type, such as whether it is a sliding window, an energy-efficient window, or a window designed for soundproofing. The pop-up window 188 allows for a detailed description of the proposed change, so that all relevant information is captured.

Once the contractor has entered the description in the pop-up window 188, the system's controller 163, which operates using both an AI engine and a GAN engine, processes the request and generates an updated design plan. In this particular instance, the controller 163 generates an intermediatory design plan 182A for section 182, reflecting the proposed installation of the window 185. The intermediatory design plan 182A provides an immediate visual representation of how the change will look in the construction plan before the physical work begins. This step may be useful for assessing potential impacts on other areas of the building, especially adjacent rooms like 184, where another contractor may be working or have specific design responsibilities.

The intermediatory design plan 182A clearly shows the window 185 installed at the selected spot 183A on the wall separating rooms 183 and 184. This change is marked with a change indicator 185A, which serves as a visual marker for all stakeholders, including contractors from other sections, that a modification has been made to the wall. The change indicator 185A provides additional details about the window installation, such as who initiated the change, the dimensions of the window, and any other relevant notes from the contractor. This indicator serves not only as a record of the change but also as a communication tool for other contractors or clients who may need to be aware of the alteration.

This process facilitates that even before the physical change is carried out, all the necessary stakeholders are informed, and the potential impact of the change on other parts of the building is assessed. For example, installing a window on a wall between rooms 183 and 184 may affect the layout of electrical wiring, plumbing, or other elements in room 184, which fall under the responsibility of a different contractor. The controller 163 performs an analysis to identify whether this change will interfere with any existing installations in the adjacent room 184. For example, if there are electrical outlets or plumbing pipes in the wall between rooms 183 and 184, the system will generate alerts or recommendations to relocate these components to avoid conflicts with the new window installation.

Furthermore, the system 180 automatically updates the design plans for all relevant sections, so that any contractor responsible for adjacent sections, such as the contractor managing room 184, is notified of the change. This real-time coordination between contractors allows for seamless collaboration and prevents issues that might arise from one contractor making modifications without informing others. In this case, the contractor responsible for room 184 will be able to see the updated intermediatory design plan 182A, which reflects the installation of the window 185 in room 183. They can then adjust their own plans accordingly, whether that means relocating electrical wiring, adjusting lighting fixtures, or rerouting ventilation systems to accommodate the new window.

In some embodiments, as illustrated in FIG. 1K, the controller 163 may provide a warning 186 (prompt message) to prompt the contractor to confirm whether they actually intend to install a window 185 on the wall separating rooms 183 and 184. This warning 186 serves as a safeguard to prevent unintended or problematic design changes from being implemented without proper consideration. The controller 163 generates this warning after analyzing the potential impacts of installing the window on this particular wall, which separates two rooms 183-184, raising several important issues that the contractor needs to review.

For example, installing a window between two internal rooms, such as rooms 183 and 184, is generally uncommon and may cause privacy concerns. If both rooms are used as private spaces, such as bedrooms or offices, having a window between them may infringe on the occupants' privacy, compromising the functionality and usability of the spaces. Additionally, the window could interfere with noise control, creating unwanted sound transmission between rooms. The warning 186 generated by the controller 163 may outline these potential issues, such as "Installing a window on this wall may cause privacy issues between rooms 183 and 184" or "This window may result in noise transmission between these spaces." Other considerations that may be included in the warning 186 may be design aesthetics, structural integrity, or ventilation-related impacts.

The warning 186 may present the contractor with two options: 186A ("Yes") and 186B ("No"). These options are presented to gather confirmation from the contractor as to whether they still wish to proceed with the installation despite the potential drawbacks. If the contractor selects option 186A ("Yes"), indicating that they either want to proceed with the window installation or have already physically installed it and want to register on the design plan, the controller 163 proceeds to update the design plan for section 182. As shown in FIG. 1J, the controller 163 updates the design plan to reflect the addition of the window 185 on the wall between rooms 183 and 184. This update would include a change indicator icon 185A to indicate where the modification was made, and the updated design plan 182A is made available for all stakeholders to access.

On the other hand, if the contractor selects option 186B ("No"), based on the concerns raised by the controller 163 in the warning 186, indicating that they do not wish to install the window in that location, the controller 163 may then suggest alternative actions. In some embodiments, the controller 163 may automatically generate suggestions for alternative spots on the same or other walls where the window could be installed without causing the identified issues. For example, the controller 163 may suggest installing the window on another wall in room 183 that does not border room 184, such as at spot 183B. This alternative placement would address the contractor's initial intention of adding a window while mitigating the concerns related to privacy or noise.

In some embodiments, the contractor may have the option to manually select a different spot for the window installation if they do not want to follow the automated suggestions provided by the controller 163. For example, the contractor may select spot 183B on a different wall of room 183. After the contractor selects this new spot, the controller 163 performs an analysis similar to the one done for the original spot 183A. The controller 163 checks for any potential impacts on adjacent spaces, such as room 184, and reviews the new location against any applicable design considerations, such as structural integrity, ventilation, or electrical system configurations.

If the analysis shows that the new spot 183B is suitable for the window installation and does not conflict with any other building elements or design considerations, the controller 163 provides a go-ahead signal. This go-ahead signal may be in the form of a prompt window or a prompt message 187, which includes a message indicating that the contractor can proceed with the window installation at the newly selected spot 183B. The message in the prompt window 187 may state, "You can add a window on this wall," accompanied by two options: 187A ("Yes") and 187B ("No"). If the contractor selects option 187A ("Yes"), the controller 163 proceeds to update the design plan 182 to reflect the new location of the window 185 at spot 183B. The updated design plan 182B is created, including the window 185 on the selected spot 183B with a change indicator icon 185A marking the new installation.

In the updated design plan 182B, the window 185 is now shown in its new location, and all relevant contractors and stakeholders are notified of the change through the updated design files. The change indicator 185A may provide additional context and details about the modification, so that all parties are aware of the adjustment and can account for it in their respective areas of responsibility. This includes potential modifications to related systems, such as adjusting electrical wiring, rerouting ventilation systems, or reinforcing structural elements.

Alternatively, if the contractor chooses option 187B ("No") in the prompt window 187, they may wish to amend their input or reconsider the installation altogether. Upon selecting this option, the controller 163 may present the contractor with the ability to modify the original input through a subsequent pop-up window, such as 188. This window allows the contractor to change specific details of the request, such as the window's size, location, or type, and then re-submit the modification for further analysis. The controller 163 will process the amended input and repeat the analysis to determine whether the new proposal is suitable for the building's design and adjacent spaces.

This level of flexibility and the iterative process facilitated by the controller 163 allows contractors to make informed decisions during the construction process. By providing automated feedback, impact analysis, and alternative suggestions, the system 180 supports a collaborative and dynamic construction workflow, facilitating that all modifications are properly evaluated before implementation. This reduces the risk of unintended conflicts, design errors, or unnecessary rework, thereby improving the efficiency and effectiveness of the construction process.

Figure 2A:
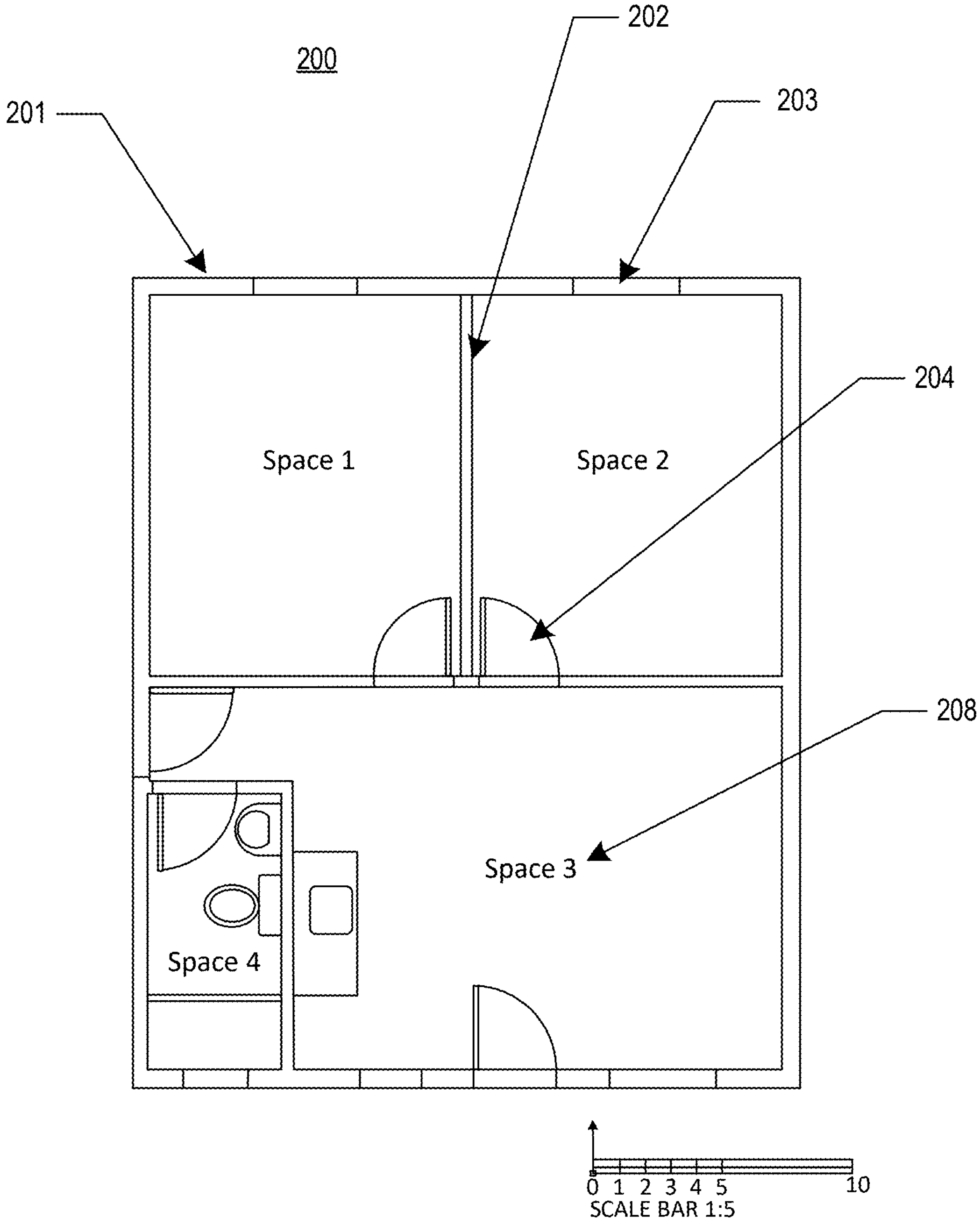
FIGS. 2A, 2B, 2C and 2D illustrate a static representation of a floor plan and an AI analysis of the same to assess boundaries and design elements.
Figure 2B:
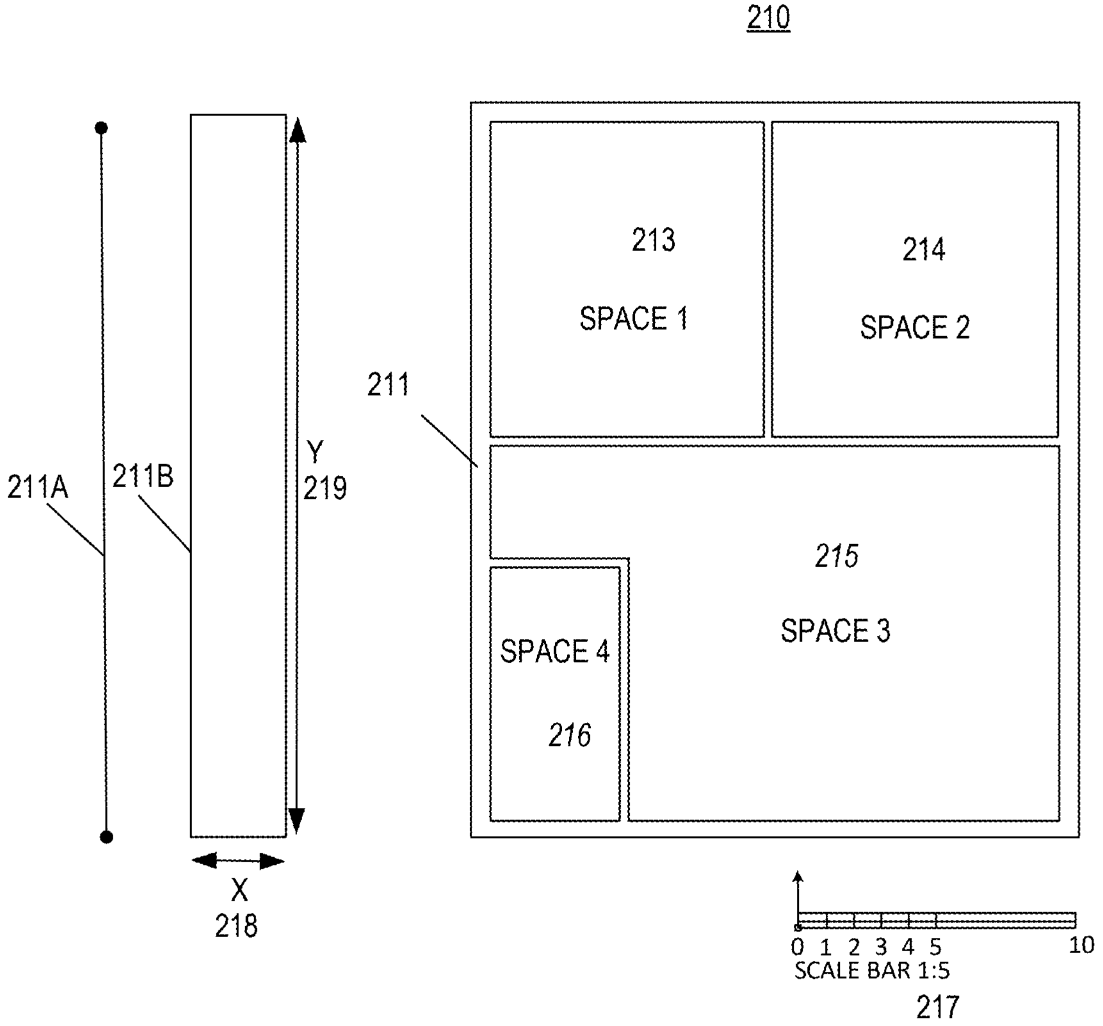

Referring now to FIG. 2A, a given two-dimensional reference 200 may have a number of elements that an observer and/or an AI engine may classify as features 201-209 such as, for example, one or more of: exterior walls 201; interior walls 202; doorways 204; windows 203; plumbing components, such as sinks 205, toilets 206, showers 207, water closets or other water or gas related items; kitchen counters 209 and the like. The two-dimensional references 200 may also include narrative or text 208 of various kinds throughout the two-dimensional references.

Identification and characterization of various features 201-209 and/or text may be included in the input two-dimensional references. Generation of values for variables included in generating a bid may be facilitated by splitting features into groups called 'disparate features' 201-209 and boundary definitions and generation of a numerical value associated with the features, wherein numerical values may include one or more of: a quantity of a particular type of feature; size parameters associated with features, such as the square area of a wall or floor; complexity of features (e.g. a number of angles or curves included in a perimeter of an area; a type of hardware that may be used to construct a portion of a building, a quantity of a type of hardware that may be used to construct a portion of the building; or other variable value.

In some embodiments, a recognition step may function to replace or ignore a feature. For example, for a task goal of the result shown in FIG. 2B, features such as windows 203, and doorways, 204, may be recognized and replaced with other features consistent with exterior walls 201 or interior walls 202 (as shown in FIG. 2A). Other features may be removed, such as the text 208, the plumbing features and other internal appliances and furniture which may be shown on drawings used as input to the processing. Again, such feature recognition may be useful to accomplish other goals, but for a goal of boundary 211 definition that delineates a floorplan 210 as illustrated in FIG. 2B a pictorial representation may be purposefully devoid of such features, as illustrated.

Referring now to FIG. 2B, a boundary 211 is illustrated around a grouping of defined spaces 213-216. Spaces are areas within a boundary (which may include but are not limited to rooms, hallways, stairwells etc.).

FIG. 2B illustrates an AI predicted boundary 211 based upon an analysis of the floorplan 210 illustrated in FIG. 2A. A transition from FIG. 2A to FIG. 2B illustrates how an AI engine successfully distinguishes between wall features and other features such as a shower 207, kitchen counter 209, toilet 206, bathroom sink 205, etc. shown in FIG. 2A.

In another aspect, in some embodiments, a boundary may include a polygon 211B. A polygon may be any shape that is consistent with a design submitted for AI analysis. For example, a rectangular polygon 211B may be based upon a wall segment 211A and have a width X 218 and a length Y 219. Boundaries that include polygons are useful, for example, in creating a three-dimensional representation of a design plan.

According to the present invention, a boundary may be represented on a user interface as one or both of: one or more line segments, and one or more polygons. In addition, a feature may be represented as a single point, a polygon, an icon, or a set of polygons. In some embodiments, a point may be placed in a centroid position for the feature and the centroid points may be counted, summarized, subtracted, averaged, or otherwise included in mathematical processes.

In some embodiments, an analytical use for a boundary may influence how a boundary is represented. For example, determination of a length of a wall section, or size of a feature may be supported via a boundary that includes a line segment. A count of feature type may be supported with a boundary that includes a single point or predefined polygon or set of polygons. Extrapolation of a two-dimensional reference into a three-dimensional representation may be supported with a boundary that includes polygons.

In one embodiment of the present invention, the AI engine is adept at analyzing a static representation of a floor plan to identify and generate a selectable array of editable components, such as walls, doors, and fixtures. These dynamic elements are then presented in an interactive user interface, where users can effortlessly select specific design elements to add annotations or to modify those elements directly. For example, a user can choose a window on the digital floor plan and opt to change its dimensions or select a wall to annotate with instructions for material specifications. The AI's analytical prowess facilitates that these selections and subsequent modifications are intelligently integrated within the overall design framework, enabling a fluid and intuitive design alteration experience that supports real-time collaboration and planning accuracy.

A scale 217 may be used to indicate a size of features included in a technical drawing included in the two-dimensional reference. As indicated above, executable software may be operative with a controller to count pixels on an image and apply a scale to a bitmapped image. Alternatively, a user may input a drawing scale for a particular image, drawing or other two-dimensional reference. Typical units referenced in a scale include inches: feet, centimeters: meters, or any other appropriate unit.

In some embodiments, a scale 217 may be determined by manually measuring a room, a component, or other empirical basis for assessing a relative size. Examples therefore include a scale included as a printed parameter on two-dimensional reference or obtained from dimensioned features in the drawing. For example, if it is known that a particular wall is thirty feet in length, a scale may be based upon a length of the wall in a particular rendition of the two-dimensional reference and proportioned according to that length.

Figure 2C:
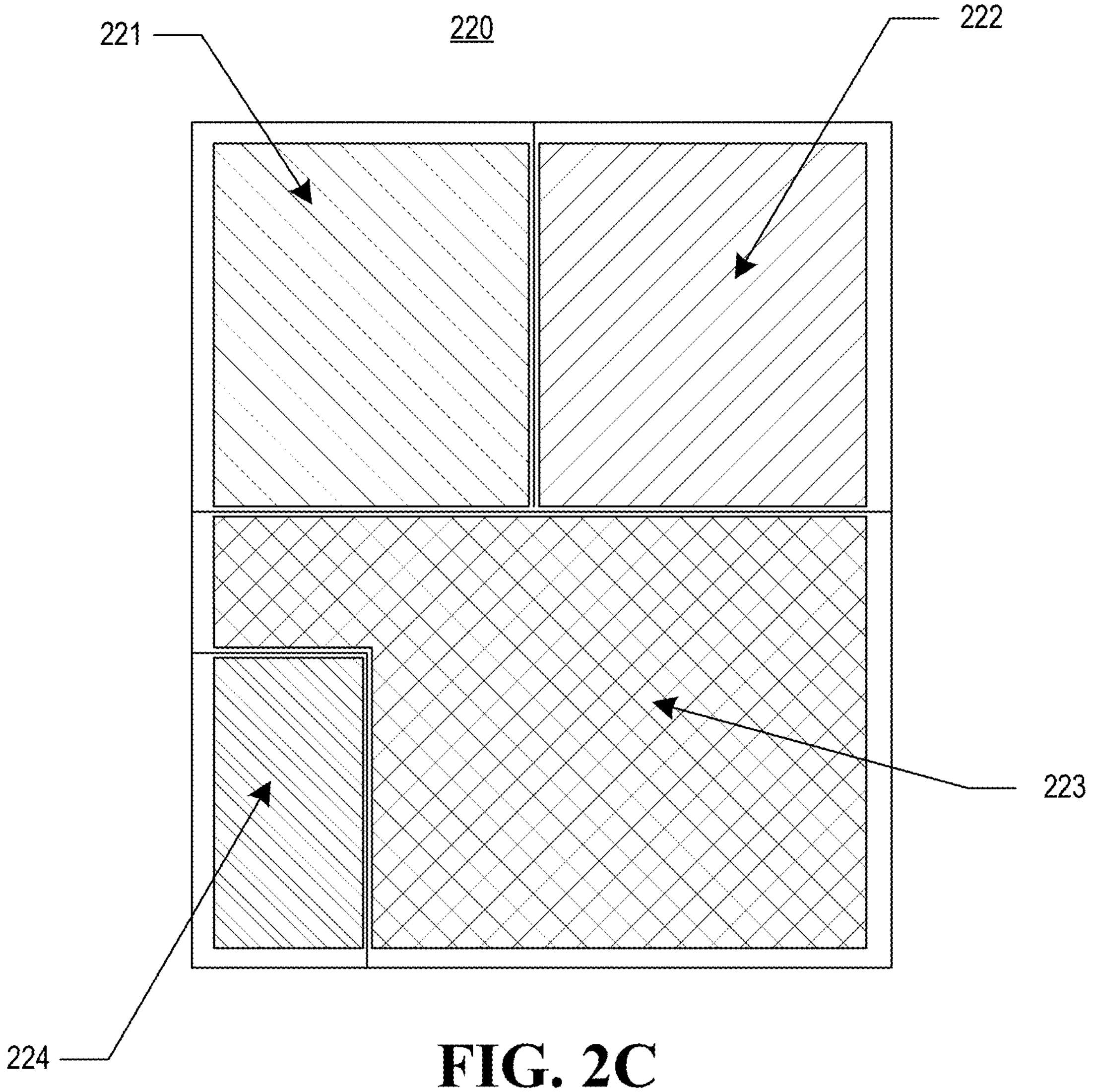

Referring now to FIG. 2C, a user interface 220 is illustrated with multiple regions 221-224. The multiple regions 221-224 may be presented via different hatch representations or other distinguishing pattern (in some embodiments regions may also be represented as various colors etc.). During training of AI engines, and in some embodiments, when a submitted design drawing includes highly customized or unique features, a user may wish to adjust an automated identification of boundaries and automated filling of space within the boundaries.

During training of processes executed by a controller, such as those included in an AI engine made operative by the controller, and in some embodiments, when a submitted design drawing includes highly customized or unique features, an automated identification of boundaries and automated filling of space within the boundaries may be included in the interactive user interface may not be according to a particular need of a user. Therefore, in some embodiments of the present invention, an interactive user interface may be generated that presents a user with a display of one or more boundaries and pattern or color filled areas arranged as a reproduction of a two-dimensional reference input into the AI engine.

In some embodiments, the controller may generate a user interface 220 that includes indications of assigned vertices and boundaries, and one or more filled areas or regions with user changeable editing features to allow the user to modify the vertices and boundaries. For example, the user interface may enable a user to transition an element such as a vertex to a different location, change an arc of a curve, move a boundary, or change an aspect of polylines, polygons, arcs, circles, ellipses, splines, NURBS or predefined subsets of the interface. The user can thereby "correct" an assignment error made by the AI engine, or simply rearrange aspects included in the interface for a particular purpose or liking.

In some embodiments, modifications and/or corrections of this type can be documented and included in training datasets of the AI model, also in processes described in later portions of the specification.

Discrete regions may be regions associated with an estimation function. A region that is contained within a defined wall feature may be treated in different ways such as ignoring all areas within a boundary, to counting all areas within a boundary (even though regions do not include boundaries). If the AI engine counts the area, it may also make an automated decision on how to allocate the region to an adjacent region or regions that the region defines.

Figure 2D:
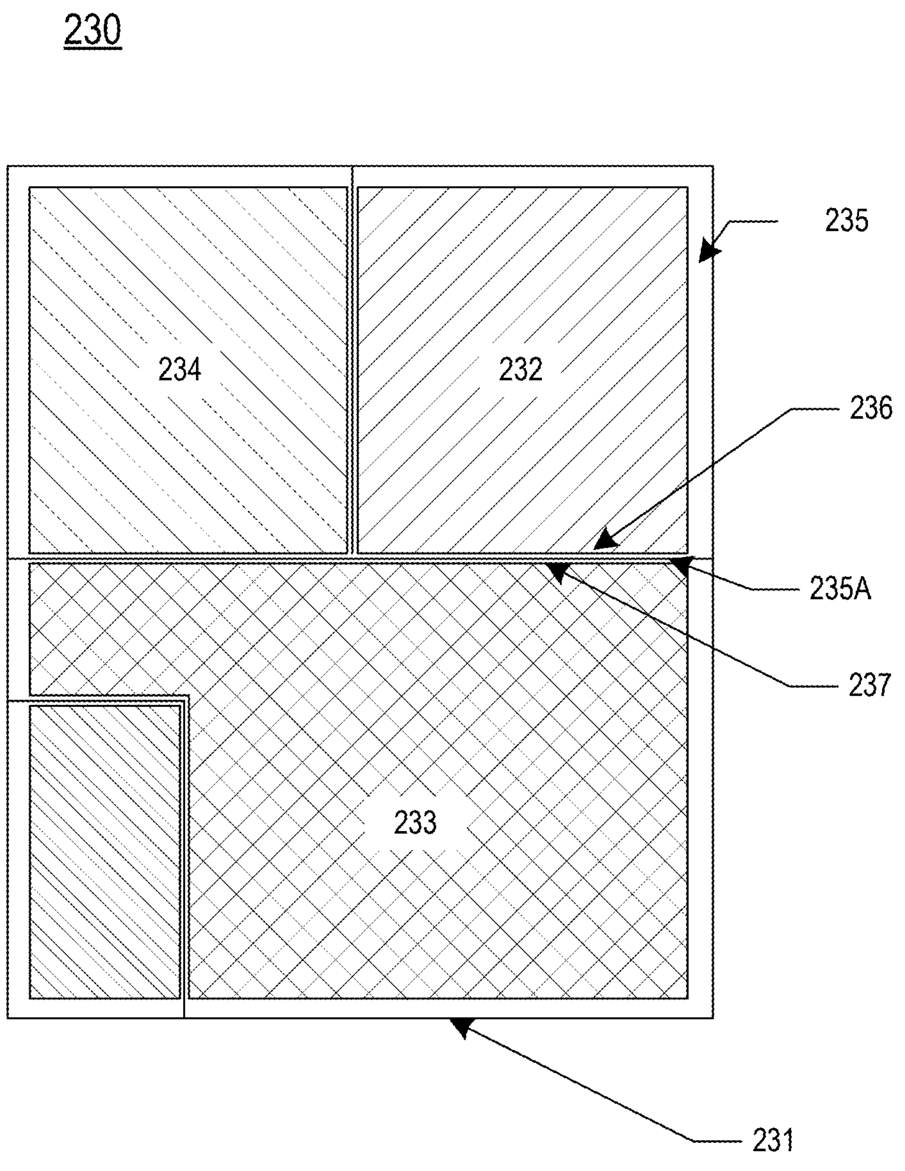

Referring to FIG. 2D, an exemplary user interface 230 illustrates a user interface floorplan model 231 with boundaries 236-237 between adjacent regions 233-234 with interior boundaries 236-237 that may be included in an appropriate region of a dynamic component. The AI may incorporate a hierarchy where some types of regions may be dominant over others, as described in more detail in later sections. Regions with similar dominance ranks may share space, or regions with higher dominance ranks may be automatically assigned to a boundary. In general, a dominance ranking schema will result in an area being allocated to the space with the higher dominance rank. In some embodiments, a dominance rank will allocate an area that may be used in determining an occupancy load. Moreover, in those embodiments that analyze a dynamic file (such as, for example, a Revit® compatible file) a dominance rank may be included, or added to, one or more dynamic features and be modified as the dynamic feature is modified. In some embodiments, the incorporation of a dominance rank may be instrumental in delivering automated suggestions for the revision of design plans. The dominance rank may serve as a strategic guide, steering the focus towards regions (or design elements) of higher dominance rank. For example, regions with a higher dominance rank are recommended to remain as unchanged as possible in the suggested revisions besides making sure that the revised designs of the regions comply with the best practices. The annotation process related to the selected design elements or dynamic components may also be presented based on the dominance rank of regions, dynamic components representing the regions, and the selected design elements on the design plans. This approach scrutinizes the annotations added to the regions or design elements with a higher dominance rank on the overall design, facilitating that modifications align with both regulatory requirements and the foundational elements that contribute significantly to the design's integrity.

In some embodiments, an area 235A between interior boundaries 236-237 and an exterior boundary 235 may be fully assigned to an adjacent region 232-234. An area 235A between interior boundaries 236-237 may be divided between adjacent regions 232-234 to the interior boundaries 236-237. In some embodiments, an area 235A between boundaries 236-237 may be allocated equally, or it may be allocated based upon a dominance scheme where one type of area is parametrically assessed as dominant based upon parameters such as its area, its perimeter, its exterior perimeter, its interior perimeter, and the like. Parameters may also be based upon items that are automatically counted using AI analysis of pixel patterns that identify a pattern as an item, such as, by way of non-limiting example, one or more of: doors or other paths of egress; plumbing fixtures; fixed obstacles; stairs; inclines; and declines.

In some examples, a boundary 235-237 and associated area 235A may be allocated to a region 232-234 according to an allocation schema, such as, for example, an area dominance hierarchy, to prioritize a kitchen over a bathroom, or a larger space over a smaller space. In some embodiments, user selectable parameters (e.g., a bathroom having parameters such as two showers and two sinks may be more dominant over a kitchen having parameters of a single sink with no dishwasher). These parameters may be used to determine boundary and/or area dominance. A resulting computed floorplan model may include a designation of an area associated with a region as illustrated in FIG. 2D. In various embodiments, different calculated features are included in a user interface floorplan model 231 such as features representing aspects of a wall, such as, for example, center lines, the extent of the walls, zones where doors open and the like, and these features may be displayed in selected circumstances.

Some embodiments may also include AI analysis of a dynamic file, such as a Revit or Revit compatible file and/or a raster file with patterns of dots, the AI may generate a likelihood that a region or area represented by one or both of a polygon or pattern of dots, includes a common path or dead end or an area definable for determining an occupancy load, egress capacity, travel distance and/or other factor that may influence annotation process as discussed above for FIG. 1A.

Once boundaries have been defined a variety of calculations may be made by the system. A controller may be operative to perform method steps resulting in calculation of a variable representative of a floorplan area, which in some embodiments may be performed by integrating areas between different line features that define the regions.

Alternatively, or in addition to method steps operative to calculate a value for a variable representative of an area, a controller may be operative to generate a value for element lengths, which values may also be calculated. For example, if ceiling heights are measured, presented in drawings, or otherwise determined, then volume for the room and surface area calculations for the walls may be made. There may be numerous dimensional calculations that may be made based on the different types of model output and the user-inputted calibration factors and other parameters entered by the user.

Figure 2E:
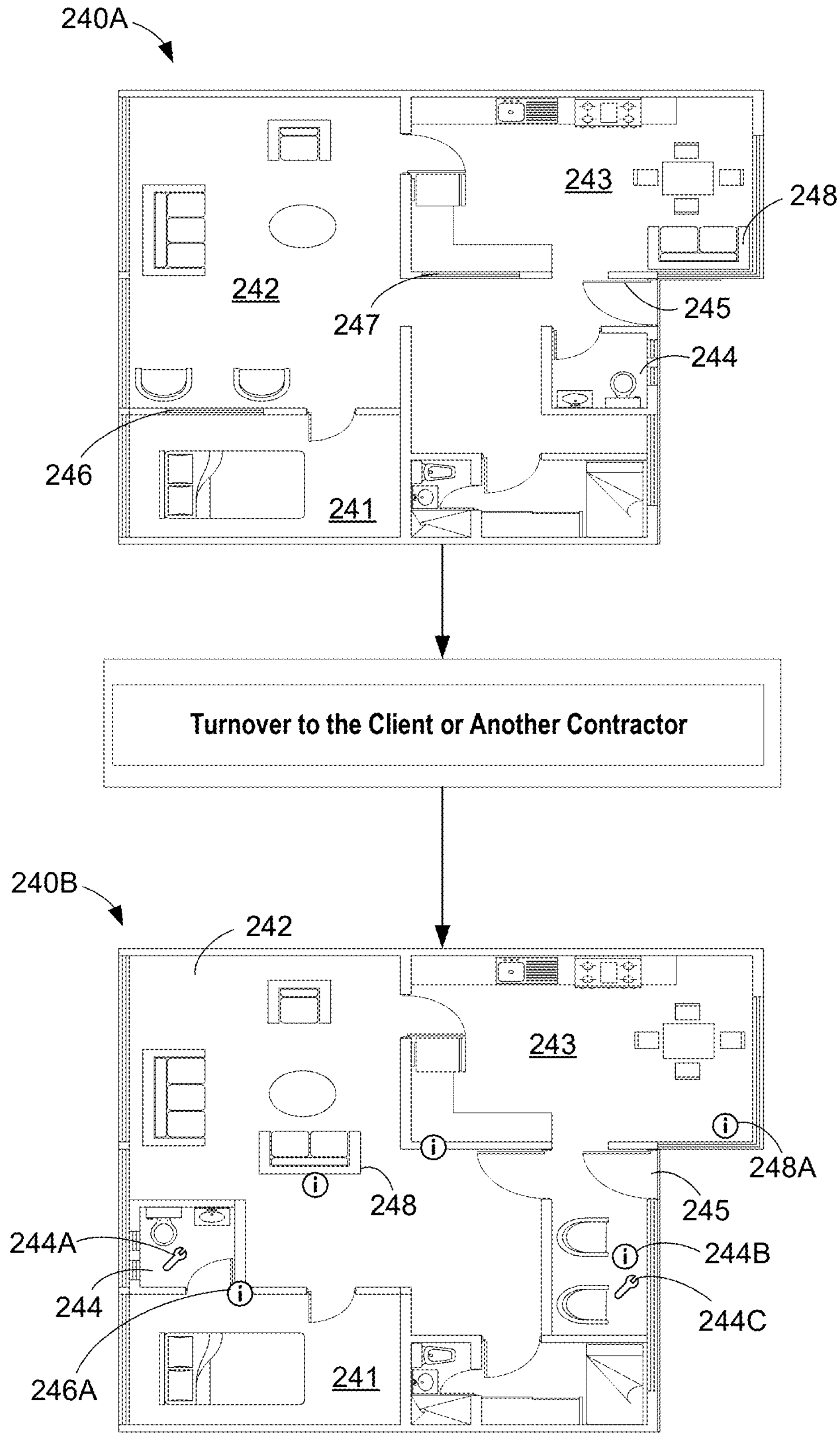
FIG. 2E illustrates another exemplary design plan turn over process in accordance with the present invention.

Referring now to FIG. 2E, it illustrates an exemplary design plan turn over process by updating a building's design plan during construction, in accordance with the present invention. An initial design plan 240A represents the original layout of a building under construction, including several key areas, such as a bedroom 241, a living room 242, a dining area 243, and an open space adjacent to the main door 245 that contains a common bathroom 244. During the construction process, it is often necessary for the contractor to make physical changes that were not initially part of the original design plan 240A. These changes can arise for a variety of reasons, such as client preferences, design flaws, or unforeseen structural limitations. Once these physical modifications are made, the contractor is responsible for registering the changes to the design plan, either before or after the physical alterations are completed, as previously described in FIGS. 1G-1K.

The system described in the present invention allows for a real-time update of the design plan 240A, reflecting these modifications. Once the changes are registered and the design plan 240A is updated to reflect the actual state of the construction, the updated design plan 240B is then turned over to the client or to another contractor responsible for subsequent tasks in the building's construction. The updated plan 240B is useful for communication between different contractors or between the contractor and the client to facilitate that all stakeholders are aware of the modifications made during construction.

In the illustrated embodiment, one significant modification may be the relocation of the bathroom 244. Originally, the common bathroom 244 was located in the open space near the main door 245, as shown in the initial design plan 240A. However, during construction, the contractor relocated the bathroom 244 into the bedroom 241, thereby converting it into a master bedroom with an attached bathroom, as seen in the updated design plan 240B. The change is marked with a wrench icon 244A, which serves as a change indicator showing that a physical change was made to the layout. This icon provides an important reference during the turnover process, as it allows the client or subsequent contractors to easily review the modifications made to the building. Clicking on the wrench icon 244A would provide detailed information about the nature of the change, such as who authorized a change order, when a change was performed, and why a change was implemented, Documented authorization may also be used to allocate an additional cost, or cost savings associated with a change order. Coss for changes may be aggregated, organized, and summarized into a final tally of additional monies that may need to be exchanged.

Similarly, the system allows for marking areas where elements were removed or added during construction. In the updated design plan 240B, an info icon 244B indicates that the original bathroom 244 was removed from its location near the main door 245. By clicking on this icon, the client or contractor can access detailed information regarding the removal, including why the bathroom 244 was moved and what replaced it. In this case, the updated design plan 240B shows that a sitting area was added in place of the former bathroom. This addition is marked by a change indicator 244C, which signifies that something was newly added to the design. By interacting with this icon (244C), stakeholders can obtain further information about the added sitting area, such as its dimensions, materials used, and any other relevant design considerations.

The process of registering these changes and providing updated design plans facilitates that all modifications are meticulously documented and traceable. This may especially be useful when transferring the design plan to another contractor who may need to work on subsequent construction tasks. For example, the next contractor responsible for installing electrical systems or interior finishes would be aware that the bathroom 244 was relocated and a sitting area was added, allowing them to make necessary adjustments to their work without causing conflicts or delays.

Beyond the major relocation of the bathroom 244, the updated design plan 240B also reflects several other modifications. For example, the change indicator 246A represents that a window 246 was removed from the bedroom 241 during construction. The reason for the removal could be due to structural constraints, client preferences, or a need for privacy. By clicking on the change indicator 246A, the client or contractor can access the relevant information explaining why the window 246 was removed, providing transparency and clarity during the turnover process.

Another significant modification shown in the updated design plan 240B involves the relocation of a sofa 248. Originally, the sofa 248 was placed in the dining area 243, as shown in the initial design plan 240A. However, during construction, the contractor moved the sofa 248 into the living room 242, as represented in the updated design plan 240B. This change is marked by a change indicator 248A, which allows users to click on it to receive detailed information about the move. The system provides a full audit trail of such changes, including the contractor responsible for making the relocation, the rationale behind the decision, and any related implications for the room layout.

Additionally, the updated design plan 240B may display other change indicators that reflect various alterations made during the construction process. For example, a window 247 may have been removed from the dining area 243, and this removal would be marked with a corresponding change indicator to inform the client or subsequent contractors of the alteration. These indicators not only provide a visual cue to indicate where changes have been made but also serve as a point of access to detailed logs and descriptions associated with each modification. This feature enhances the transparency of the construction process and facilitates smoother transitions between different phases of the building's development.

The embodiment illustrated in FIG. 2E showcases the importance of maintaining an up-to-date design plan throughout the construction process. By allowing contractors to register changes in real time and automatically update the design plan accordingly, the system provides a comprehensive record of the construction's progression. This record is invaluable for clients, as it allows them to see exactly what modifications were made and why. Moreover, the updated design plan 240B can be seamlessly handed over to other contractors, providing continuity and coordination across different stages of construction.

For example, if the client or a contractor responsible for subsequent work reviews the updated design plan 240B, they can easily identify which changes were made and understand how the building's layout has evolved since the initial design 240A. They would be able to see that the bathroom 244 was moved, a sitting area was added, a window (246 or 247) was removed, and the sofa 248 was relocated, all without needing to compare the updated plan 240B to the original. The change indicators provide a clear and accessible way to view all the modifications made to the building.

In some embodiments of the present invention, the system may provide automated suggested design layouts for areas of the building that are affected by changes registered during the construction process. When a contractor or user modifies the design plan 240A such as relocating a bathroom, adding a window, or removing a structural element, the system analyzes the impact of these changes and automatically generates design suggestions for subsequent work in the affected areas. For example, if the bathroom 244 is relocated from the open space near the main door 245 to the master bedroom 241, the system may suggest optimal placements for plumbing, electrical wiring, or new fixtures required for the relocated bathroom. These automated design suggestions (e.g., as discussed in FIG. 1I) facilitate that any additional work required to accommodate the changes is planned efficiently, without conflicting with existing structures or systems.

The automated suggested design layouts generated by the system are not limited to immediate construction needs; they can also be accessed at any time in the future, even after the construction is completed. For example, when the client or another authorized user accesses the updated design plan 240B, whether for renovation, retrofitting, or maintenance purposes, the system can provide automated suggestions for potential future modifications. These suggestions may include recommendations on what the client can add or remove in the building. For example, the system may analyze the layout and suggest adding an extra window in the dining area 243 to increase natural light or recommend removing an internal wall between the living room and dining room to create an open-plan space.

The system's automated suggestions are generated using AI and/or GAN engines that take into account the current layout, the materials used, structural integrity, and any design constraints. The system may also factor in the client's preferences, which can be entered into the system during initial construction or at any point afterward. These preferences may include aesthetic choices, such as modern or traditional design styles, as well as functional considerations, such as energy efficiency, ventilation, or accessibility requirements. For example, the system may suggest replacing a standard window with an energy-efficient model based on the client's preference for sustainable building practices.

In some embodiments, the client or an authorized user can actively interact with the updated design plan 240B to query the system for specific recommendations. For example, after the turnover process, the client may want to make additional changes to the building and can interact with the design plan 240B through a pop-up window similar to those shown in FIG. 1H (171A and 172B). The client may select a specific area on the design plan 240B, for example, the living room 242 or bedroom 241, and initiate a query by typing or selecting from a predefined list of questions. The query could ask, "What changes can I make to improve natural light in this room?" or "What options do I have for expanding this space?" The system then processes the query and provides automated suggestions for modifications, which may include adding new windows, knocking down a wall, or extending the room's footprint.

The interaction with the system is not limited to written inputs; in some embodiments, the client may provide verbal inputs or even gesture-based commands if the system is integrated with smart devices. For example, the client may point to a wall on a smart display or tablet (e.g., user devices 162 in FIG. 1G) and verbally ask the system, "Can this wall be removed?" The system will analyze the structural integrity of the wall, check if the wall is load bearing or contains required systems like plumbing or electrical wiring, and then provide feedback in real time, offering either an affirmative answer or a set of alternative suggestions, such as reinforcing the wall or rerouting certain systems to make the change feasible.

Furthermore, these automated design plan suggestions are not restricted to structural elements. They may also include interior design recommendations, such as furniture placement or appliance integration. For example, the system may suggest optimal placements for new kitchen appliances based on the updated layout of the dining area 243. It may also recommend the removal or rearrangement of furniture, such as suggesting that the sofa 248 be relocated to another part of the room to create a more functional or aesthetically pleasing space. These suggestions are generated based on factors such as room dimensions, traffic flow, and the intended use of the space, so that the client has a range of options that align with both practical and aesthetic considerations.

In some scenarios, the client may wish to remove certain elements from the building. For example, the client may query the system about the feasibility of removing the window 246 from the bedroom 241. The system will analyze the impact of removing the window on natural light, ventilation, and energy consumption and provide the client with a detailed assessment of the consequences. If the removal is feasible, the system will offer suggestions on how to compensate for the loss of light or airflow, such as adding an alternative light source or adjusting the HVAC system to improve ventilation.

The flexibility offered by the system allows the client or authorized users to explore a wide range of modifications, whether they involve small-scale changes, like furniture re-arrangement, or larger construction projects, like expanding rooms or adding new spaces. By interacting with the design plan and receiving detailed feedback from the system, the client can confidently make decisions about the future of the building, knowing that the system's automated suggestions are based on thorough analysis and consideration of all relevant factors.

Figure 2F:
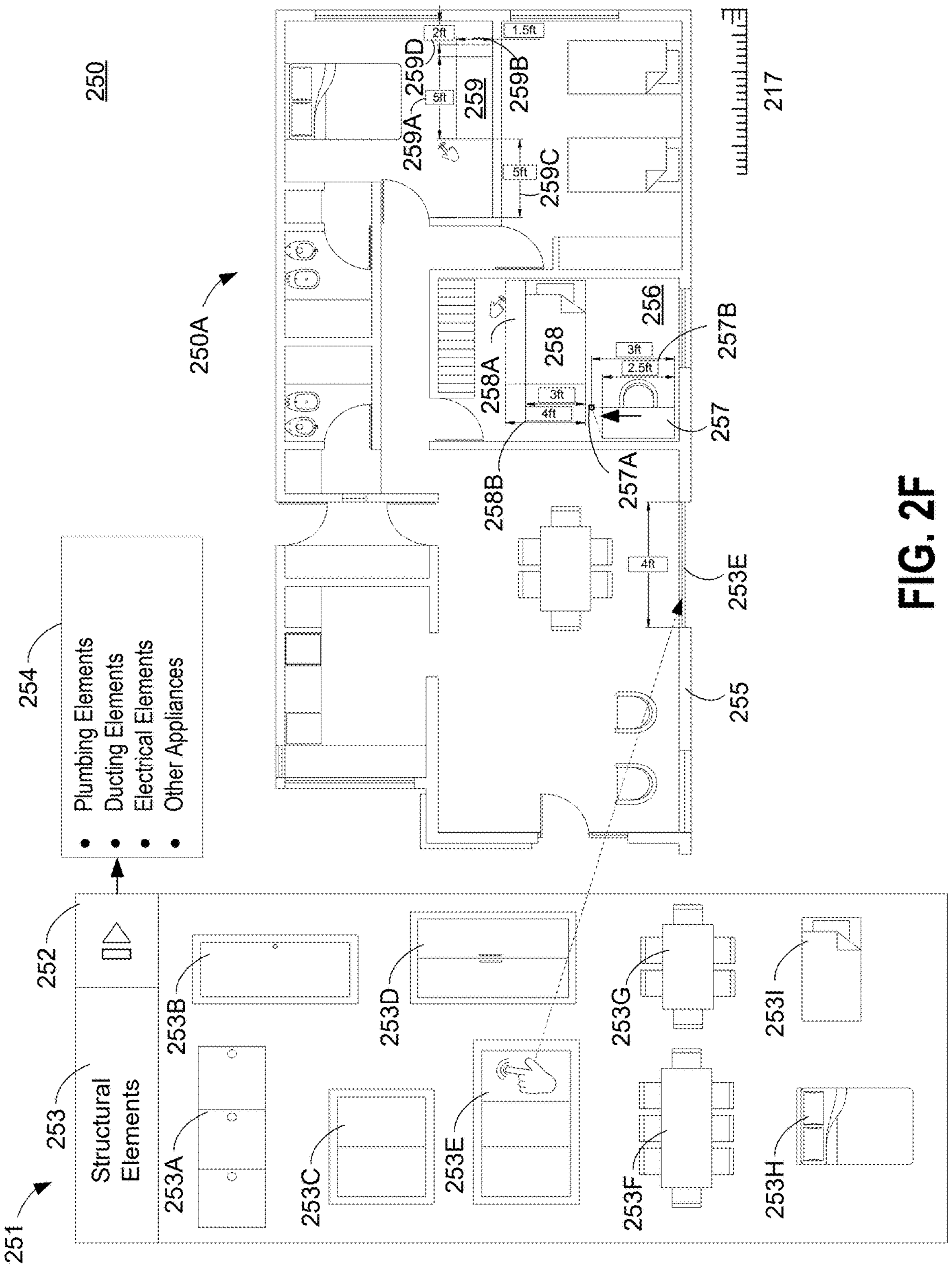
FIG. 2F illustrates an exemplary system and method for registering physical changes on the design plan in accordance with the present invention.

Referring now to FIG. 2F, it illustrates an exemplary system and method for registering physical changes on the design plan during the construction of a building, in accordance with the present invention. FIG. 2F shows a first interactive user interface 250, which represents a design plan 250A of a portion of a building that is under construction. The user interface 250 provides a range of digital tools 251 that a contractor can use to register physical changes made to the building directly on the design plan 250A. These tools enable the contractor to efficiently document modifications, such as the addition, relocation, or removal of structural, electrical, plumbing, or other construction elements, facilitating that the digital design plan 250A accurately reflects the physical or As-Built state of the building during construction.

The digital tools 251 are presented to the contractor as a set of selectable elements, organized within various categories. The contractor can access these tools by interacting with a drop-down selection icon 252, which allows them to choose from different types of construction elements that may need to be registered (or added). These construction elements may include structural elements such as windows, doors, cabins, furniture, and appliances, among others. In the illustrated example, the structural elements 253 category is highlighted, displaying a plurality of selectable options, such as 253A-253I, which represent various structural components that can be added and modified in the design plan 250A.

For example, the structural elements 253 category may include a standard double sink, which can be selected and added to a kitchen or bathroom area of the design plan 250A. If the contractor physically installs a double sink during construction, they can select a similar standard double sink from the tools 251 and place it on the design plan 250A in the appropriate location to register the change. Similarly, the structural elements 253 may include but are not limited to: a kitchen cabinet 253A, a standard door 253B, a window 253C, a cupboard 253D, a large window 253E, sitting arrangements 253F-253G, and beds 253H-253I. If these elements are physically installed or relocated during construction, the contractor can use the user interface 250 to reflect these changes on the digital design plan 251A. The contractor may drag and drop these elements onto the design plan 250A to accurately document their physical installation or relocation within the physical building.

In addition to structural elements, the digital tools 251 may also provide options for adding, modifying, or removing other important building systems via a separate category of elements. These categories are organized in the other options 254, which may include plumbing elements, ducting elements, electrical elements, and other appliances. When the contractor selects the plumbing elements category, for example, they may be able to choose from a variety of plumbing components such as pipes, sinks, faucets, or toilets, which can be added or updated in the design plan 250A. If the contractor physically installs or reroutes plumbing during construction, these changes can be registered using the relevant digital tools from this category. For example, if the contractor wants to add a toilet, they can select the corresponding toilet icon from the plumbing tools and place it in the desired location on the digital design plan 250A.

Similarly, the ducting elements category may include components like HVAC vents, air ducts, or exhaust fans, which are important for the building's ventilation system. If the contractor installs new ductwork or modifies existing ventilation routes, they can use the appropriate tools in this category to reflect these changes in the design plan 250A. For example, selecting an HVAC vent from the tools 251 and placing it in the design plan 250A allows the contractor to document the installation or relocation of this component.

The electrical elements category within the other options 254 may include electrical outlets, switches, lights, breaker panels, and other related components. During construction, the contractor responsible for the electrical work may need to document the installation of new outlets or the relocation of existing ones. By selecting the appropriate electrical element from the digital tools 251, such as an electrical outlet, the contractor can accurately place it on the design plan 250A in the correct location, facilitating that the digital record matches the physical installation. Additionally, the contractor can use this category to document any changes to the electrical system, such as adding new circuits or modifying existing wiring routes.

Beyond the main structural, plumbing, ducting, and electrical components, the system may also provide options for adding or modifying other appliances in the building. This may include selecting and placing appliances like stoves, refrigerators, dishwashers, or microwave ovens. For example, if a contractor installs a new refrigerator in the kitchen, they can select the corresponding appliance from the tools 251 and place it on the design plan 250A to register its location.

The interaction between the contractor and the design plan 250A is facilitated by the drag-and-drop functionality (252) of the digital tools 251. This allows the contractor to easily place the selected elements in the correct locations on the design plan 250A, mimicking their physical installation in the building. If the contractor installs a new sofa in the living room, they can select the sofa icon from the structural elements and drag it to the correct position in the design plan 250A. The sofa may then be registered as part of the updated design plan, reflecting the physical layout of the building.

Similarly, if the contractor adds or modifies any of the plumbing, ducting, electrical, or appliance elements in the building, the system provides a streamlined way to document these changes in real time. For example, if new electrical outlets are installed along a wall, the contractor can select the appropriate electrical element from the tools 251 and place it on the design plan 250A, so that the digital record reflects the changes accurately.

In some embodiments, the system may also provide additional functionalities, such as the ability to annotate specific elements with notes, comments, or multimedia. For example, if a contractor adds an electrical panel, they may add a note explaining why the panel was added, moved or specifying any related adjustments, such as new wiring routes or updated safety measures. These annotations can be accessed by other stakeholders, including future contractors or the client, providing valuable context for the registered changes.

In some embodiments, as illustrated in FIG. 2F, a contractor responsible for updating or modifying elements in the physical building may need to register the addition of a window (e.g., 253E) on the wall 255 of the design plan 250A. The system enables the contractor to select the window icon 253E from the digital tools 251 and drag and drop it onto the wall 255 on the design plan 250A to reflect the installation of a new window in the physical building. Once the window 253E is placed in the design plan 250A, the contractor can further modify the window's dimensions to match the actual physical window that has been installed on-site. The contractor may achieve this by selecting the window icon 253E on the design plan 250A and expanding or contracting the window 253E using selectable points, which may appear at the corners or edges of the window icon 253E. This allows the contractor to adjust the window's width and height in the design plan 250A to match its physical installation in the building.

To achieve the precise positioning of the window 253E on the wall 255, the system allows the contractor to measure its location relative to nearby walls or other components. By doing so, the contractor can confirm that the window is accurately placed on the design plan 250A, reflecting the correct dimensions and distance from adjacent structural elements. For example, the contractor may verify that the window 253E is placed 2 feet from the corner of the room or 1.5 feet above the floor. The system automatically calculates these real-time distances using the integrated scale 217 on the design plan 250A, which helps determine accurate measurements automatically. The scale 217 may work by calculating dimensions based on pixel count, by using a reference measurement provided by the user, or based on a known measurement of a component on the design plan, allowing the system to adjust the scale 217 and display accurate real-world dimensions.

Similarly, the contractor may need to register the addition of furniture or fixtures in other areas of the building, such as a workstation 257 and a bed 258 in the bedroom 256. The contractor can use the digital tools 251 to select the corresponding icons for the workstation 257 and bed 258, dragging and dropping them into the appropriate locations in the bedroom 256 on the design plan 250A. Once placed, the contractor can expand or compress the icons (257-258) to match the actual dimensions of the workstation 256 and the bed 258 that have been physically installed in the building. For example, the contractor can drag the edges of the workstation 257 to expand it to its full length and width, adjusting it to the actual dimensions.

As the contractor modifies the size of the workstation 257, the system (or controller 163) dynamically displays the real-time dimensions on the user interface 250. These dimensions are calculated using the same scale 217 mentioned earlier, which interprets the pixel count (or other methods) and translates it into real-world measurements. The contractor can adjust the workstation's position and size to reflect its actual placement in the room 256, facilitating that the digital design plan 250A accurately represents the physical layout. For example, the contractor may expand the workstation 257 to position 257A, and the system (or controller 163) automatically updates or displays the workstation's dimensions in real-time based on the scale 217, displaying the length and width as they are expanded. The system dynamically shows the updated dimensions 257B, providing precision in the digital design plan 250A.

Similarly, the contractor can register the actual dimensions of the bed 258 in bedroom 256 by selecting and expanding the icon for the bed to match its physical size. For example, the contractor may expand the bed's length 258A and width 258B to reflect the exact dimensions of the installed bed. As the contractor adjusts the bed's size, the system dynamically displays the updated measurements on the user interface 250, using the integrated scale 217 to calculate the real-world dimensions based on the design plan's scale. This allows the contractor to precisely document the bed's actual placement and size in the room 256.

The system's ability to display real-time measurements while expanding or contracting these elements on the design plan 250A offers an efficient and accurate method for contractors to register physical modifications made to the building. The scale 217 serves as a fundamental tool for determining and confirming that the dimensions displayed on the design plan 250A match those in the physical environment. The scale 217 can either be predetermined by the system based on the drawing's pixel density, entered manually by the contractor, or calculated based on a known distance of a component, allowing the system to calculate the measurements accordingly. For example, if the contractor inputs that 1 inch on the design plan 250A equals 4 feet in real life, the system will use this ratio to determine the dimensions of the expanded or contracted elements with precision and display on the user interface 250 in real-time for the contractor to confirm.

By using the interactive user interface 250, contractors can maintain an accurate, up-to-date design plan that reflects all physical changes made during the construction process. The ability to register the exact dimensions of windows, workstations, beds, and other elements facilitates that the digital representation (e.g., 250A) of the building remains consistent with its physical As-Built counterpart. This method of registering physical changes not only improves communication between contractors but also provides the client with a precise and comprehensive record of the building's development.

In some embodiments, the user interface 250 may also provide the contractor with the ability to draw elements directly onto the design plan 250A to register physical changes that have either already been made or are planned for the building. The contractor can use a computer mouse, a stylus, or even gesture-based tools on a touchscreen device to draw an element that was added, relocated, or modified in the physical building. For example, if the contractor has either already installed a TV wall or plans to add it during the construction process, they can draw the TV wall 259 directly on the design plan 250A to accurately document this physical change.

The system allows the contractor to draw the TV wall 259 by selecting a drawing tool from the digital toolset (e.g., 251) available in the user interface 250. The contractor can then click and drag on the design plan 250A to draw the outline of the TV wall 259 in its exact location. As the contractor draws the TV wall 259, the system automatically calculates its length 259A, width 259B, and the distances 259C-259D from adjacent walls or other elements. These real-time calculations are based on the scale 217 integrated into the system. The scale 217 allows the system to provide accurate measurements for the drawn element, converting the pixel-based representation on the design plan 250A into real-world dimensions that reflect the actual installation in the physical building.

For example, as the contractor draws the TV wall 259, the system may display real-time feedback showing that the TV wall 259 is 5 feet in length (259A) and 1.5 feet wide (259B), facilitating that the digital representation accurately reflects the physical installation. The system will also display the distances from the TV wall 259 to nearby structural elements, such as adjacent walls or furniture. For example, the TV wall 259 may be shown to be 5 feet away from a first side wall (259C) and 2 feet away from another side wall (259D). These dynamic distances are important for confirming that the TV wall 259 is installed correctly and that there are no conflicts with surrounding elements.

The ability to dynamically calculate and display measurements allows the contractor to confirm the precise positioning and dimensions of the drawn element, so that it matches the physical structure in the building. If the contractor finds any discrepancies, they can easily adjust the dimensions or position of the drawn element using the digital tools 251, making real-time corrections that are reflected on the design plan 250A. For example, if the TV wall 259 is meant to be 2 feet wide instead of 1.5 feet, the contractor can expand the drawn element (259) until the width measurement 259B reflects the correct dimension.

Moreover, the system's drawing capabilities are not limited to walls. Contractors can use the drawing tool to register any number of custom elements, such as shelving units, built-in cabinets, or partition walls, allowing for a flexible and comprehensive approach to documenting physical changes. As the contractor draws each custom element, the system continues to update the design plan 250A in real time, automatically adjusting other components if required by the contractor. For example, if the contractor draws a partition wall between two rooms, the system may automatically adjust the size and layout of the rooms, as well as any nearby windows, doors, or other features, facilitating that the entire design plan 250A remains consistent with the changes.

In some embodiments, the controller 163, equipped with its AI and GAN capabilities, can automatically refine any manually drawn elements, such as the TV wall 259, so that the final digital representation is precise and free from any artifacts that may arise due to manual drawing. For example, when a contractor draws the outline of the TV wall 259 using freehand tools, slight inaccuracies or distortions could occur, such as uneven lines or misaligned angles. The controller 163 processes these inputs in real time, analyzing the drawn shape to detect and correct any irregularities. Using its GAN capabilities, the controller 163 can predict the ideal form and structure of the element based on the surrounding context and automatically smoothen edges, align dimensions, and eliminate any unintended artifacts. This results in a refined and accurate representation of the TV wall 259, with clean lines, proper scaling, and correct positioning, making the drawn element indistinguishable from pre-defined components in the design plan 250A. Additionally, the system's AI engine continuously learns from these refinements, enhancing future drawing precision and reducing the need for manual corrections.

In some embodiments, an apparatus provides a robust system for registering and managing physical changes on a building's design plan, facilitating streamlined project turnover to various contractors, stakeholders, and clients. The apparatus includes a display screen for visualizing and interacting with the design plan, a digital storage medium containing executable software code, and a controller equipped with an AI engine and, optionally, a GAN engine to enhance design adaptation capabilities.

When a user accesses the apparatus, the controller receives the design plan, allowing the user to engage with various components on the interactive user interface. By leveraging AI, the controller interprets the design plan's elements—walls, doors, electrical systems, and HVAC layouts, and arranges them as interactive components. The interactive user interface allows the user to select a specific component, such as an electrical outlet or a support beam, and register any physical changes as they occur during construction. For example, a contractor may select an HVAC vent to relocate it based on on-site conditions. The user can input details of the change, specifying the new location and dimensions, and the AI analyzes the impact on surrounding systems.

Once a change is selected and details are added, the controller analyzes the implications of the change on nearby building elements, identifying potential conflicts with other systems. For example, if a contractor relocates a plumbing line, the controller assesses its effect on existing walls, electrical wiring, and HVAC ducts, presenting a prompt message to the user. This prompt may include suggestions for adjustments, potential warnings regarding space constraints or compliance issues, and recommendations for alternative configurations. The user can either confirm or make further adjustments, benefiting from real-time guidance that prevents costly errors.

The interactive user interface enhances collaboration by allowing users to upload multimedia annotations for each registered change. These annotations, which may include photos, videos, and voice notes, document the physical state of elements, providing a detailed visual record. For example, if a contractor installs new lighting, they can upload photos showing the installation and add notes about wattage, energy efficiency ratings, and maintenance schedules. These annotations are accessible to stakeholders, helping them verify the accuracy of registered changes.

The controller further supports seamless communication by notifying other contractors working in adjacent areas about registered changes that may affect their work. For example, if a wall is shifted in one room, the controller automatically alerts contractors responsible for neighboring areas, providing suggestions on adjustments they may need to make. This capability minimizes rework and facilitates that all contractors are aware of dependencies, such as shared walls, structural supports, or connected plumbing lines, that require coordination.

To avoid structural or functional conflicts, the AI engine detects if a registered change creates an obstruction or structural issue and prompts the user with alternatives. For example, if a user tries to add a large duct in a congested ceiling area, the AI engine suggests a smaller duct or alternative routing to prevent airflow issues or physical congestion. This adaptive functionality facilitates continued maintenance of the structural integrity and efficiency of the building's systems regardless of registered changes.

In cases where a registered change directly conflicts with other building systems, the controller generates an error window on the user interface, highlighting the specific conflict. If a registered change to an electrical component affects an adjacent water line, for instance, the error window provides details of the risk, allowing the contractor to make informed decisions before proceeding. By identifying conflicts in real time, the system prevents safety risks and unnecessary rework.

Additionally, the controller generates alternative layouts when a registered change impacts other systems. If the installation of a large AC vent necessitates rerouting nearby electrical wiring, the controller automatically creates a proposed wiring layout that complies with best practices and design considerations. The user can review and approve these alternatives, saving time and providing compliance with design considerations.

Each registered change is marked on the design plan with a change indicator icon, which provides a visual reference to users. When the user clicks on the icon, they see details about the change, including the contractor's name, the date of the change, and any compliance or inspection notes. This marking system creates a clear visual map of modifications, helping stakeholders track alterations and understand the rationale behind each one.

For security, the controller restricts access to authorized contractors only. Each contractor has designated areas within which they can register changes, so that they don't interfere with areas outside their responsibility. For example, a plumbing contractor accessing a design plan can only modify plumbing components within designated bathroom and kitchen areas, while an HVAC contractor can modify elements within duct spaces but cannot alter electrical layouts.

When a change is registered by a contractor in one area that impacts another, the controller dynamically updates affected areas within the design plan and selectively shares this information with other relevant contractors. For example, if an HVAC change reduces ceiling space for a neighboring room's lighting layout, the system automatically alerts the electrical contractor to adjust their plans accordingly. This dynamic update feature facilitates a coordinated workflow across different trades, minimizing disruptions and overlap.

Finally, upon project completion or a defined turnover stage, the controller generates a comprehensive turnover package that consolidates the design plan, registered changes, and associated annotations. This turnover package is then delivered to authorized stakeholders, including contractors, owners, and clients. It includes detailed records of all registered changes, their timestamps, and any compliance data, so that the final design plan reflects the true as-built state of the building. This package becomes a permanent record that stakeholders can refer to for maintenance, compliance tracking, and future renovations.

Figure 2G:
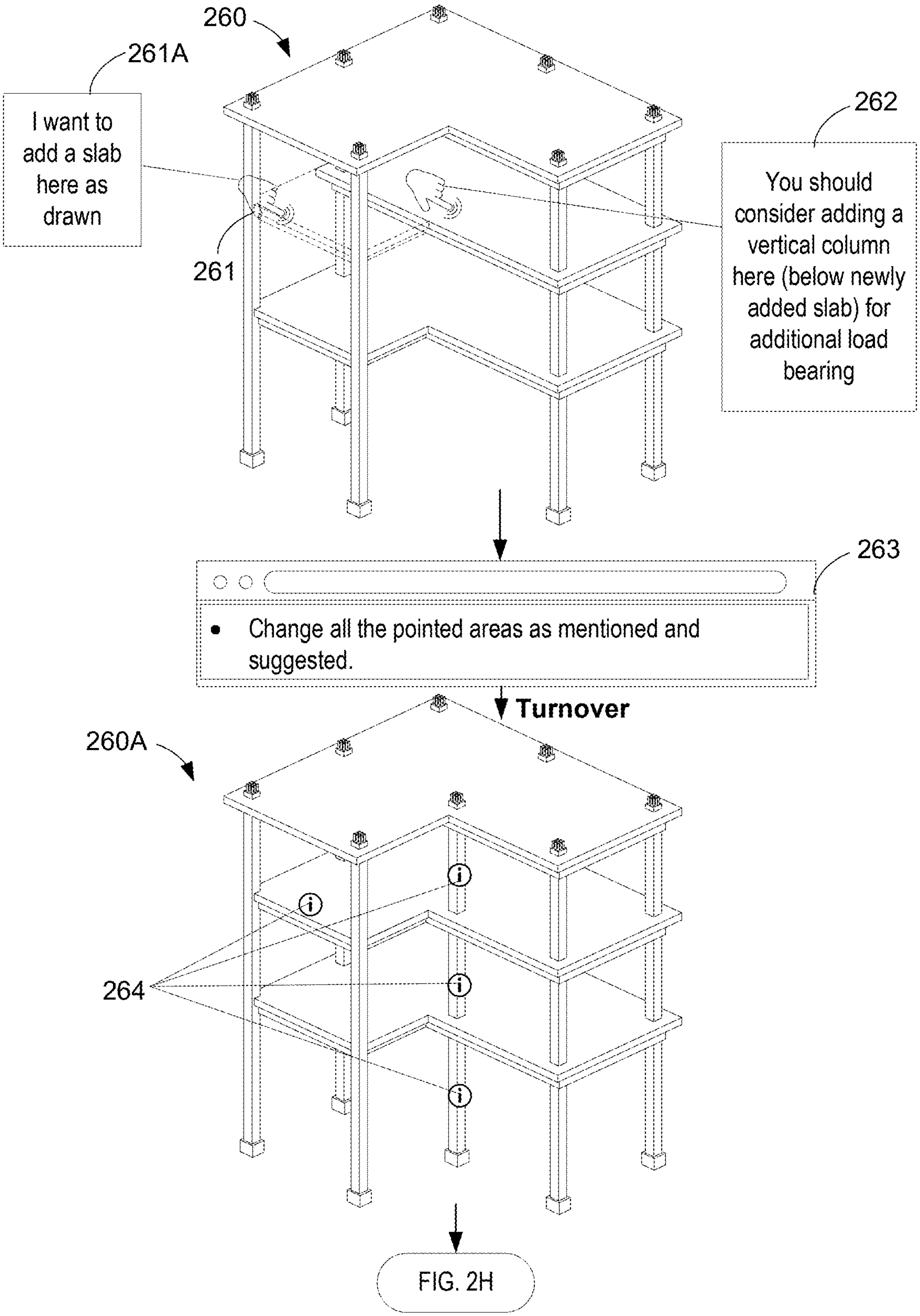
FIGS. 2G-2H illustrate additional systems and methods for registering physical changes on the design plan in accordance with the present invention.

Referring now to FIG. 2G, it illustrates an exemplary method for manually drawing design elements on a design plan 260 of a building to log changes corresponding to physical modifications made (As-Built) during the construction process. In this embodiment, the contractor may be tasked with physically adding a new slab 261 to the building. To register this modification on the design plan 260, the contractor can manually draw the slab 261 using an interactive drawing tool available in the system (as discussed in FIG. 2F). Once the contractor completes the drawing, a pop-up window 261A may appear, allowing the contractor to input additional details regarding the slab change, such as the exact dimensions of the slab 261, the material used, and the reason for adding the slab. The system may prompt the contractor to confirm these details to register the change accurately.

As the contractor registers the change by drawing the slab 261, the system's controller 163, powered by AI and GAN capabilities, may automatically analyze the impact that this newly added slab 261 will have on other structural elements of the building. For example, based on the analysis, the system may detect that the newly added slab 261 will increase the load on the structure and, therefore, may require additional support. To assist the contractor in complying with building safety standards and/or design guidelines, the system provides automated suggestions via a second pop-up window 262 (prompt message). In this case, the system suggests that the contractor should consider adding a vertical column beneath the newly added slab 261 for additional load-bearing capacity. The system may base this suggestion on load-bearing calculations, structural integrity checks, and other relevant design considerations, facilitating that the new slab 261 does not compromise the building's overall stability.

The contractor may be presented with the option to accept or modify the automated suggestions (262). In pop-up window 263, the system offers the contractor a way to confirm the changes that have been manually registered (e.g., the addition of the slab 261) as well as any automated suggestions that have been made (e.g., the vertical column for load-bearing support). If the contractor agrees with both the manually registered changes and the system's suggestions, they can proceed to confirm the update. Upon confirmation, the system generates an updated design plan 260A, which incorporates the newly added slab 261 along with the recommended structural changes, such as the vertical column.

The updated design plan 260A may comprise change indicator icons 264, which represent the modifications that have been made during construction. These icons serve as markers, allowing other contractors, engineers, or the client to quickly identify what changes have occurred and where they have been implemented. For example, clicking on the change indicator associated with the slab may reveal additional details such as the dimensions of the slab, number of rebars added, type or diameters of the rebars, who made the change, and any associated load-bearing adjustments like the addition of the vertical column.

Once the updated design plan 260A is complete, it may be turned over to another contractor or subcontractor responsible for subsequent work in the building. For example, if the addition of the slab 261 required adjustments to electrical wiring or plumbing, the updated design plan 260A can be provided to an electrician or plumber so that they can take these changes into account while performing their tasks. The system facilitates a smooth transition between different phases of construction, facilitating that each stakeholder has access to the most current design plan, complete with all necessary modifications and recommendations.

By leveraging AI and GAN technologies, the system also dynamically adapts to new information, constantly analyzing the broader impact of any structural or design changes made. This feature may be particularly useful when managing large construction projects where multiple contractors are responsible for various components of the building. The system's ability to provide real-time design updates and suggestions helps prevent potential issues such as structural weaknesses or non-compliance with design considerations. Additionally, the use of change indicator icons allows for easy navigation and review of the modifications that have been made throughout the construction process.

Figure 2H:
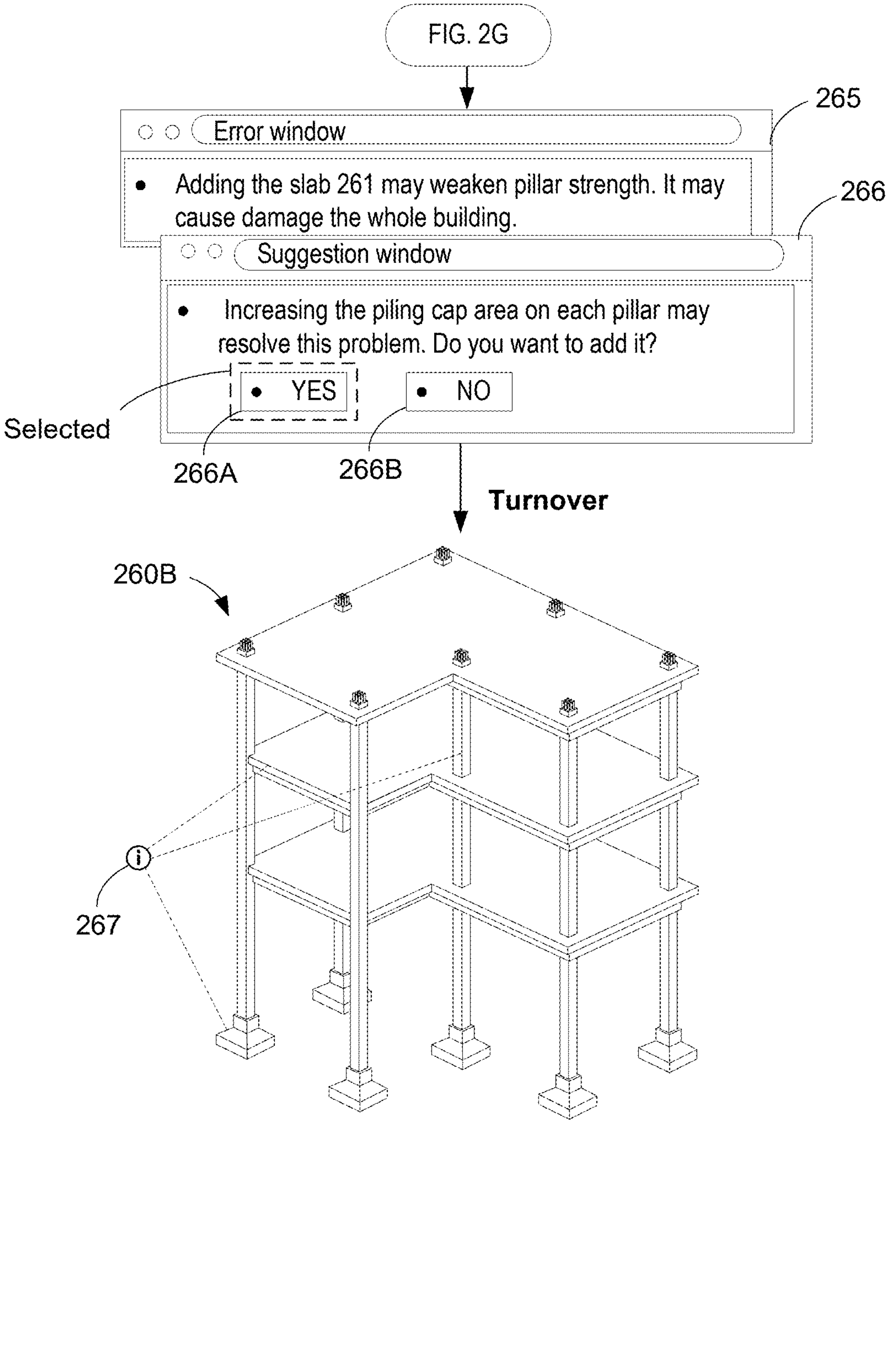

Referring now to FIG. 2H, it illustrates additional steps that the system may perform to further analyze the updated design plan 260A after a physical change has been registered, such as the addition of the slab 261. After the contractor has manually added the slab 261 or made other modifications, the system automatically performs an analysis to determine if these changes might cause any structural, electrical, or functional issues within the building. This analysis may be presented in an Error Window 265 (prompt message), which notifies the contractor or project manager of any potential problems related to the new elements added to the structure.

For example, the system may detect that the newly added slab 261 could potentially weaken the pillar strength in the building, especially if it adds excess load on the existing support structure. The Error Window 265 may display a message indicating that "Adding the slab 261 may weaken the pillar strength. It may cause damage to the whole building." This alert serves as an important notice to the contractor, preventing them from proceeding with the modification without addressing the potential risks. The system's capability to detect such issues may be powered by its AI engine and GAN, which continuously assess the structural integrity of the entire building design, taking into account all the modifications made during the construction process.

In response to the detected issue, the system does not only point out the problem but may also provide automated suggestions 266 (e.g., in a prompt message) that can help resolve the issue. For example, in this case, the system may suggest increasing the piling cap area on each pillar to compensate for the additional load imposed by the new slab 261. The Suggestion Window 266 may prompt the contractor with a question such as, "Increasing the piling cap area on each pillar may resolve this problem. Do you want to add it?" The contractor may then be given the option to either accept or reject this suggestion, represented by options 266A (Yes) and 266B (No), respectively.

If the contractor selects 266A (Yes), the system proceeds to generate an additional update to the design plan, referred to as updated design plan 260B. This version of the design plan incorporates the automated changes suggested by the system, such as the enlargement of the piling cap area. The new elements are also logged in the system and change indicators 267 are added to the updated design plan 260B, marking the locations where the new modifications have been implemented. These change indicators, when clicked, may display further information about the adjustments, such as why they were necessary, who authorized them (e.g., contractor name and/or automated suggestion), and what impact they have on the rest of the structure.

For example, in this embodiment, the updated design plan 260B may show that the piling caps below the new slab have been expanded to support the additional load, facilitating that the structure can now handle the increased weight. Each change indicator 267 represents a visual marker of these new or modified elements, allowing future contractors or project stakeholders to quickly identify the modifications made and understand their purpose. These indicators may be color-coded or accompanied by icons, helping differentiate between structural, electrical, plumbing, or other types of changes.

The system's ability to dynamically adjust the design plan based on real-time analysis helps prevent unforeseen complications during construction. For example, if a future contractor needed to add a new element, such as electrical wiring or plumbing that might interact with the slab and pillar structure, they could quickly refer to the updated design plan 260B and see all recent changes, so that they avoid areas that may have been structurally reinforced or altered. By keeping an updated and annotated design plan, the system streamlines communication and coordination between multiple contractors, reducing the risk of misalignment or errors that could arise due to unseen modifications.

The AI and GAN capabilities of the system also allow it to predict long-term consequences of the registered changes. For example, it may assess the impact of the added slab not only on the current construction phase but also in the context of potential future renovations or additions. The system may prompt the user with suggestions about how the current change could affect future building flexibility or structural expansions. For example, it may note that enlarging the piling caps in response to the new slab could limit the potential for future basement development or additional load-bearing floors.

This iterative feedback loop, where changes are analyzed, potential issues are detected, and automated suggestions are provided, allows for a more comprehensive and forward-thinking construction process. Contractors are no longer limited to reactive changes; they can make informed decisions that account for both immediate structural needs and future project goals.

By maintaining a continuous and detailed log of changes and suggestions, the system also facilitates handover between different teams working on the project. For example, once the slab and related modifications have been incorporated into the updated design plan 260B, the contractor responsible for electrical work can access the same design and adjust the wiring layout accordingly. Change indicators 267 would notify the electrical contractor of recent modifications in the structure, allowing them to accommodate any new structural elements that might interfere with their wiring plans.

In some embodiments, the system also keeps track of rejected suggestions. For example, if the contractor had selected 266B (No), declining the suggestion to increase the piling cap area, the system may log this decision, along with a rationale for why the suggestion was rejected. This feature allows future stakeholders to review previous decisions and understand the thought process behind certain changes or lack thereof. The system may also provide further warnings in the future if the rejected changes lead to complications down the line.

The final updated design plan 260B, with its change indicators 267 and suggestions log, can be turned over to the next contractor or the client. The turnover process is streamlined by providing a comprehensive, annotated record of all changes, facilitating that every modification is documented and easily accessible for future reference. The system facilitates a seamless transition between different phases of construction and among various teams working on the project, helping maintain the structural integrity and design coherence of the entire building.

By integrating real-time analysis, error detection, and automated suggestions, the system enables contractors to not only document changes but also make informed decisions that keep the construction process on track and compliant with overall project goals.

In some embodiments, the system allows multiple contractors to register changes simultaneously while working on different parts of the building. For example, a contractor responsible for the structural framework may be adding new support beams to one section of the building, while another contractor handling plumbing could be simultaneously installing new pipework in a different section. Each contractor can access the interactive user interface through their respective devices, register their changes in real time, and input relevant details, such as dimensions or materials. The system's AI engine and GAN capabilities allow it to process these simultaneous inputs, updating the overall design plan without conflict.

As each contractor logs their changes, the system dynamically integrates them into the master design plan, while keeping track of individual modifications with change indicators specific to each section. For example, the support beams in one part of the building and the pipework in another are both registered and reflected in real-time updates. The system also performs automated checks, facilitating crosschecks that the changes made in one part of the building do not negatively affect the work being done in another section. By supporting simultaneous multi-user inputs, the system facilitates seamless collaboration across different trades, so that the design plan remains cohesive and up to date.

Figure 3A:
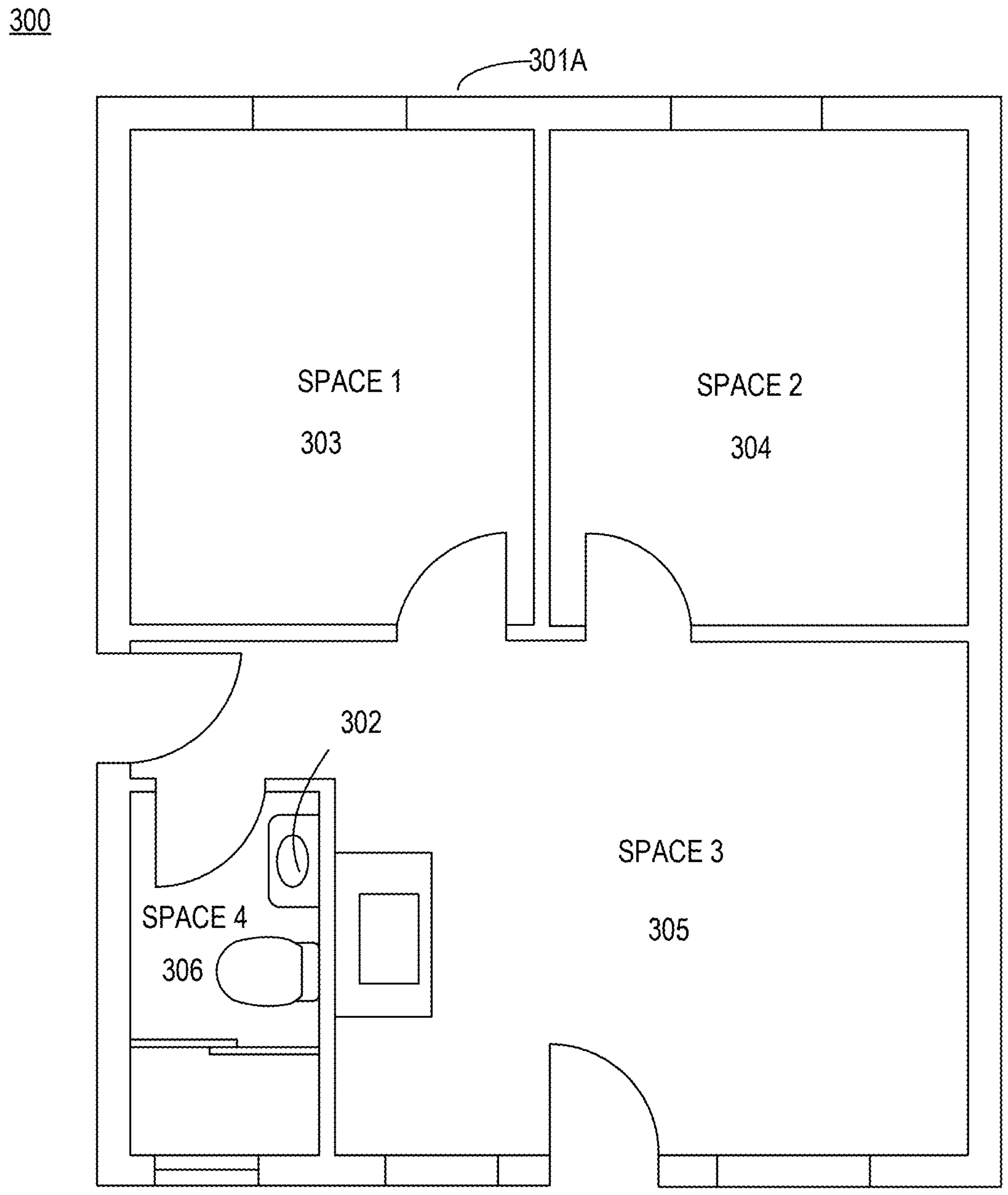
Figure 3B:
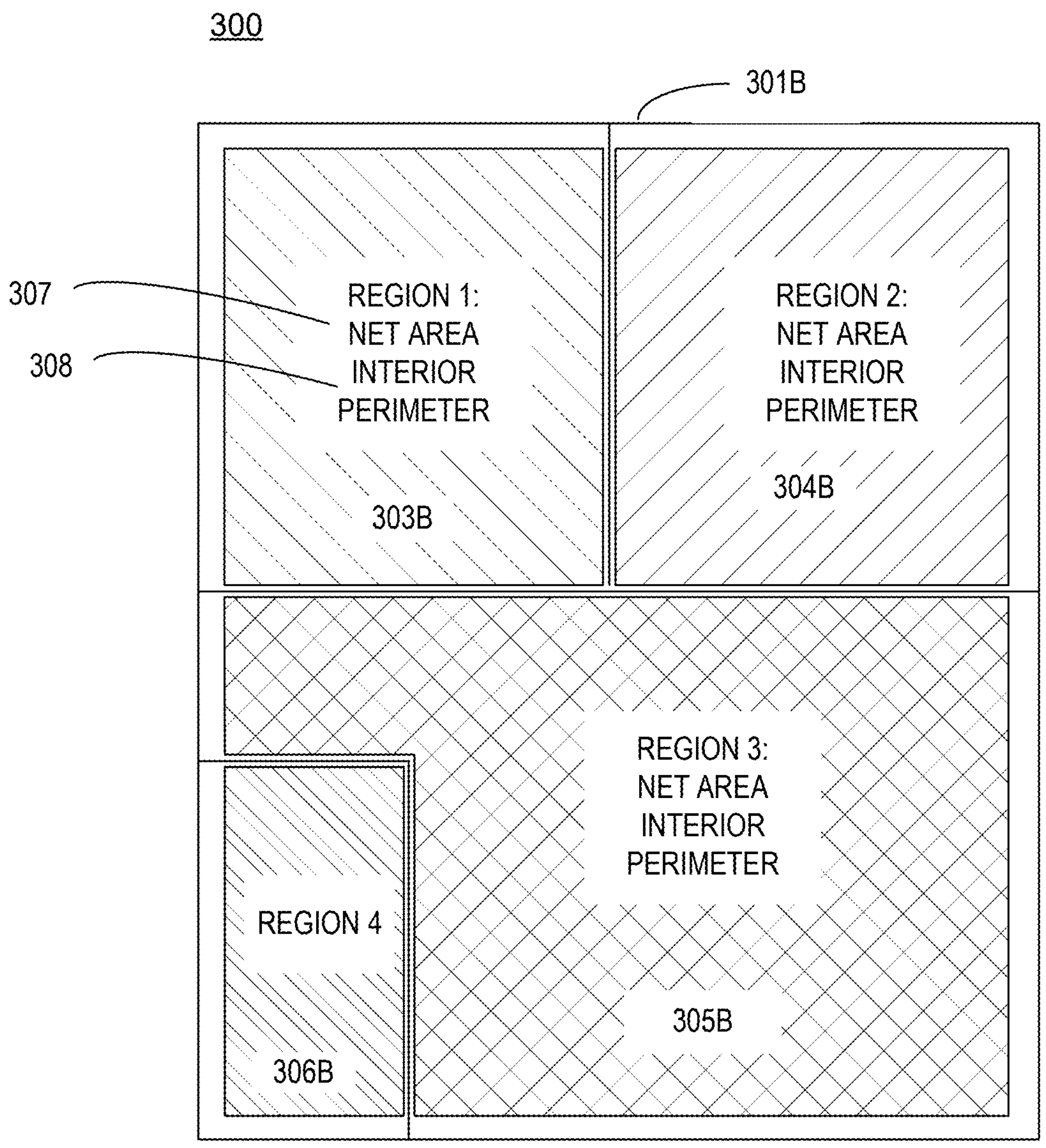
Figure 3C:
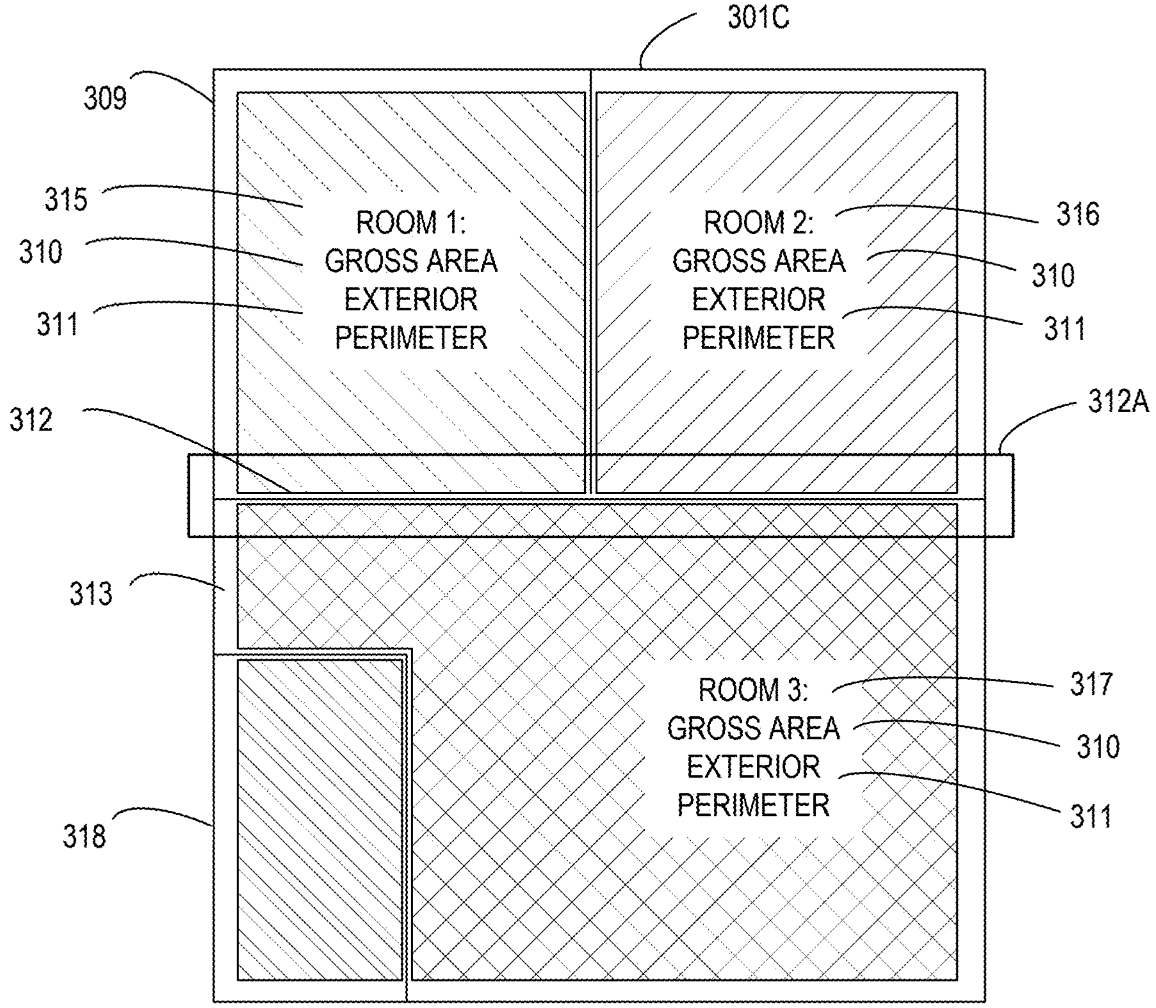

Referring now to FIGS. 3A-3C a user interface 300 may generate multiple different user views, each view has different aspects related to the two-dimensional reference drawing inputted. For example, referring now to FIG. 3A, a user interface 300 with a replication view 301A may include replication of an original floor plan represented by a two-dimensional reference, without any controller-added features, vectors, lines, or polygons integrated or overlaid into the floorplan. The replication view 301A includes various spaces 303-306 that are undefined in the replication view 301A but may be defined during the processes described herein. For example, some or all of a space 303-306 may correlate to a region in a region view 301B.

The replication view 301A, may also include one or more fixtures 302. A rasterized version (or pixel version) of the fixtures 302 may be identified via an AI engine. If a pattern is present that is not identified as a fixture 302, a user may train the AI engine to recognize the pattern as a fixture of a particular type. The controller may generate a tally of multiple fixtures 302 identified in the two-dimensional reference. The tally of multiple fixtures 302 may include some or all of the fixtures identified in the two-dimensional reference and may be used to generate an estimate for completion of a project illustrated by, or otherwise represented by, the two-dimensional reference.

Referring now to FIG. 3B, in the user interface 300 a user may specify to a controller that one of multiple views available is to be presented via the interface. For example, a user may designate via an interactive portion of a screen displaying the user interface 300 that a region view 301B be presented. The region view 301B may identify one or more regions and/or spaces 303B-306B identified via processing by a controller, such as, for example, via an AI engine running on the controller. The region view 301B may include information about one or more regions 303-306 delineated in the region view 301B of the user interface 300. For example, the controller may automatically generate and/or display information descriptive of one or more of: user displays, printouts or summary reports showing a net interior area 307 (e.g., a calculation of square footage available to an occupant of a region), an interior perimeter 308, a type of use a region 303B-306B will be deployed for, or a particular material to be used in the region 303B-306B. For example, Region 4 306B may be designated for use as a bathroom; and flooring and wallboard associated with Region 4 may be designated as needing to be waterproof material.

Referring now to FIG. 3C a gross area region view 301C and 309 is illustrated. As illustrated in FIG. 3B, a user interface may include interactive devices for display of additional parameters, such as, for example, one or more of: a net interior area 307 may generate a designation of a value that is in contrast to a gross area 310 and exterior perimeter 311. The selection of gross area 310 may be more useful to a proprietor charging for a leased space, but may be less useful to an occupant than a net interior area 307 and interior perimeter 308. One or more of the net interior areas 307, interior perimeter 308 gross area 310 and exterior perimeter 311 may be calculated based upon analysis by an AI engine of a two-dimensional reference.

In addition, a height for a region may also be made available to the controller and/or an AI engine, then the controller may generate a net interior volume and vertical wall surface areas (interior and/or exterior).

In some embodiments, an output, such as a user interface of a computing device, smart device, tablet and the like, or a printout or other hardcopy, may illustrate one or both of: a gross area 310 and/or an exterior perimeter 311. Either output may include automatically populated information, such as the gross area of one or more rooms (based upon the above boundary computations) or exterior perimeters of one or more rooms.

In some embodiments, the present invention calculates an area bounded within a series of polygon elements (such as, for example, using mathematical principals or via pixel counting processes), and/or line segments.

In some embodiments, in an area of a bounded by lines intersecting at vertices, the vertices may be ordered such that they proceed in a single direction such as clockwise around the bounded area. The area may then be determined by cycling through the list of vertices and calculating an area between two points as the area of a rectangle between the lower coordinate point and an associated axis and the area of the triangle between the two points. When a path around the vertices reverses direction, the area calculations may be performed in the same manner, but the resulting area is subtracted from the total until the original vertex is reached. Other numerical methods may be employed to calculate areas, perimeters, volumes, and the like.

These views may be used in generating estimation analysis documents. Estimation analysis documents may rely on fixtures, region area, or other details. By assisting in generating net area, estimation documents may be generated more accurately and quickly than is possible through human-engendered estimation parameters.

With reference now again to FIGS. 3B and 3C, regions 303B-306B defined by an AI engine may include one or more Rooms in FIG. 3B subsequently have regions assigned as "Rooms" in FIG. 3C.

Referring now to FIG. 3D, a table is illustrated containing hierarchical relationships between area types 322-327 that may be defined in and/or by an AI engine and/or via the user interface. The area types 322-327 may be associated with dominance relationship values in relation to adjacent areas. For example, a border region 312-313 (as illustrated in FIG. 3C) will have an area associated with it. According to the present invention, an area 315-318 associated with the border region 312-313 may have an area type 322-327 associated with the area 315-318. An area 312A included in the border region 312-313 may be allocated according to a ratio based upon a dominance ranking of one feature as compared to another feature, which may be represented as a hierarchical relationship between the features, such as, for example, adjacent areas (e.g., area 315 and area 317 or area 317 and area 318), the hierarchical relationship may be used to generate a dominance ranking of one area over another area, or to ascertain factors useful in one or both of: annotating a design element or modifying a design element. For example, a dominance ranking may allocate space used to calculate one or more of: an occupancy load; a width and/or area of an egress path; a width and/or area of a common path; a length of a dead-end; egress capacity; and travel distance from a furthest point. In this context, regions assigned a higher dominance ranking are designated to be inherently associated with elevated safety standards.

Some embodiments of the present invention allocate one or more areas according to a user input (wherein the user input may be programmed to override and automated hierarchical relationship or be subservient to the automated hierarchical relationship). For example, as indicated in the table, a private office located adjacent to a private office may have an area in a border region split between the two adjacent areas in a 50/50 ratio, but a private office adjacent to a general office space may be allocated 60 percent of an area included in a border region, and so on.

Dominance associated with various areas or regions may be systemic throughout a project, according to customer preference, indicated on a two-dimensional reference by two-dimensional reference basis or another defined basis.

Figure 4A:
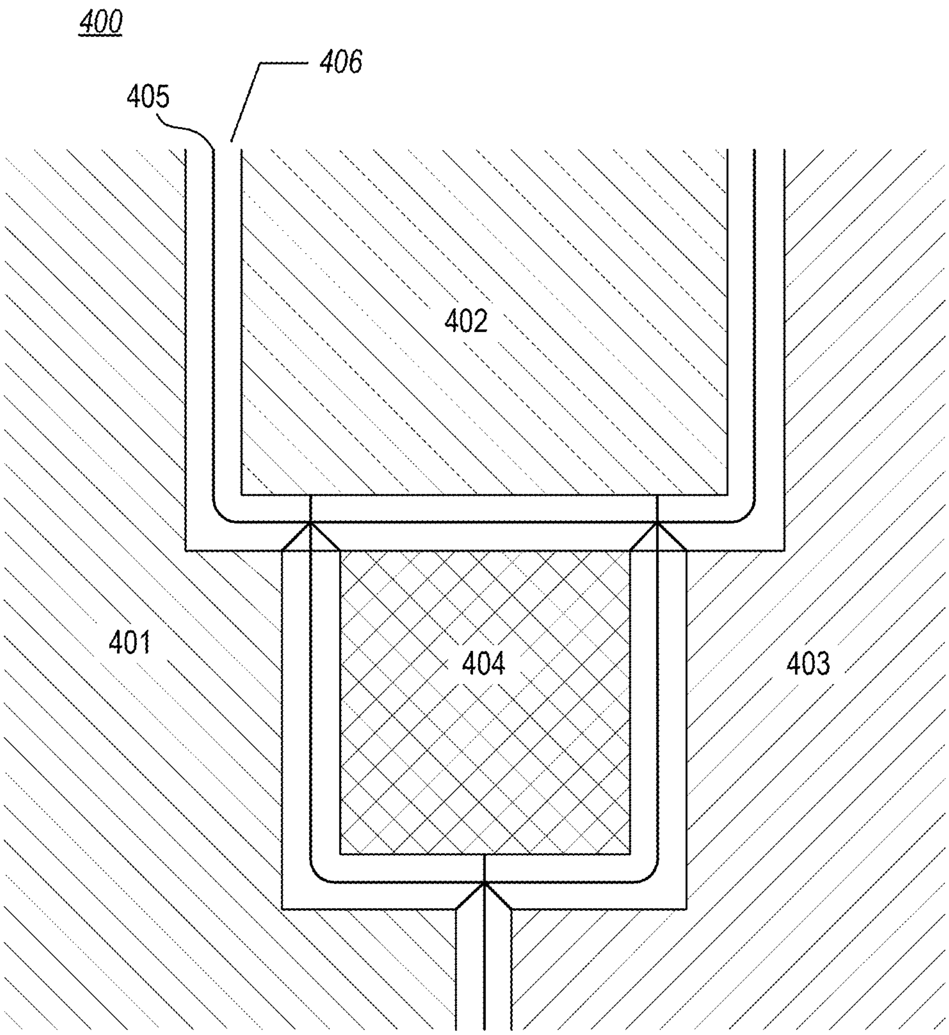

Referring now to FIG. 4A, an exemplary user interface 400 may include boundaries (which, as discussed above, may include one or more of: line segments, polygons, and icons) and regions overlaid on aspects included in a two-dimensional reference is illustrated. A defined space within a boundary (sometimes referred to as a region or area) may include an entire area within perimeters of a structure.

For example, a controller running an AI engine may determine locations of boundaries, edges, and inflections of neighboring and/or adjacent areas 401-404. There may be portions of boundary regions 405 and 406 that are initially not associated with an adjacent area 401-404. The controller may be operative via executing software in the AI engine to determine the nature of respective adjacent areas 401-404 on either side of a boundary, and apply a dominance-based ranking upon an area type, or an allocation of respective areas 401-404. Different classes or types of spaces or areas may be scored to be equal to, dominant (e.g., above) others or subservient (e.g., below) others.

Referring now to FIG. 4B, an exemplary table A indicating classes of space types and their associated ranks 411-413. In some embodiments, a controller may be operative via execution of software to determine relative ranks associated with a region on one or either side of a boundary. For example, area 402 may represent office space and area 404 may represent a stairwell. An associated rank lookup value for office space may be found at rank 411, and the associated rank lookup value for stairwells may be found at rank 413. Since the rank 412 of stairwells may be higher, or dominant, over the rank 411 of office space then the boundary space may be associated with the dominant stairs 412 or stairwell space. In some embodiments, a dominant rank may be allocated to an entirety of boundary space at an interface region. In other examples, more complicated allocations may be made where the dominant rank may get a larger share of boundary space than another rank allocated by some functional relationship. In still other examples (Table B), controller may execute logical code to be operative to assign pre-established work costs to elements identified within boundaries.

In some embodiments, a boundary region may transition from one set of interface neighbors to a different set. For example, again in FIG. 4A, a boundary 405 between office region 402 and stairwell 404 may transition to a boundary region between office region 402 and unallocated space 403. The unallocated space may have a rank associated with the unallocated space 403 that is dominant. Accordingly, the nature of allocated boundary space 405 may change at such transitions where one space may receive allocation of boundary space in one pairing and not in a neighboring region. The allocation of the boundary space 405 may support numerous downstream functionalities and provide an input to various application programs. Summary reports may be generated and/or included in an interface based upon a result after incorporation of assignment of boundary areas.

In another aspect, in FIG. 4B, a table 422 illustrates fields 414 that may have variable values 415-421 designated by an AI engine or other process run by a controller based upon the two-dimensional reference, such as a floor plan, design plan or architectural blueprint. For example, as illustrated, variables 415-421 may include a unit 415, a work type 416, work quantity 417, work hours 418, additional cost 419, expedite cost 420, and line-item cost 421. In some embodiments, the variables 415-421 may include aspects that may affect one or more of: one or both of: annotating a design element, modifying a design element, or modifying a physical version of the design element. In other embodiments, the variables 415-421 may include design considerations for the fields 414.

The determination of boundary definitions for a given inputted design plan, which may be a single drawing or set of drawings or other image, has many important uses and aspects as has been described. However, it can also be important for a supporting process executed by a controller, such as an AI algorithm to take boundary definitions and area definitions and generate classifications of a space. As mentioned, this can be important to support processes executed by a controller that assigns boundary areas based on dominance of these classifications.

Classification of areas can also be important for further aggregations of space. In a non-limiting example, accurate automatic classification of room spaces may allow for a combination of all interior spaces to be made and presented to a user. Overlays and boundary displays can accordingly be displayed for such aggregations. There may be numerous functionalities and purposes for automatic classification of regions from an input drawing.

An AI engine or other process executed by a controller may be refined, trained, or otherwise instructed to utilize a number of recognized characteristics to accomplish area classification. For example, an AI engine may base predictions for a type "/" category" of a region with a starting point of the determination that a region exists from the previous predictions by the segmentation engine.

In some embodiments, a type may be inferred from text located on an input drawing or other two-dimensional reference. An AI engine may utilize a combination of factors to classify a region, but it may be clear that the context of recognized text may provide direct evidence upon which to infer a decision. For example, a recognized textual comment in a region may directly identify the space as a bedroom, which may allow the AI engine to make a set of hierarchical assignments to space and neighboring spaces, such as adjoining bathrooms, closets, and the like.

Classification may also be influenced by, and use, a geometric shape of a predicted region. Common shapes of certain spaces may allow a training set to train a relevant AI engine to classify a space with added accuracy. Furthermore, certain space classes may typically fall into ranges of areas which also may aid in the identification of a region's class. Accordingly, it may be important to influence the makeup of training sets for classification that contain common examples of various classes as well as common variations on that theme.

Figure 5A:
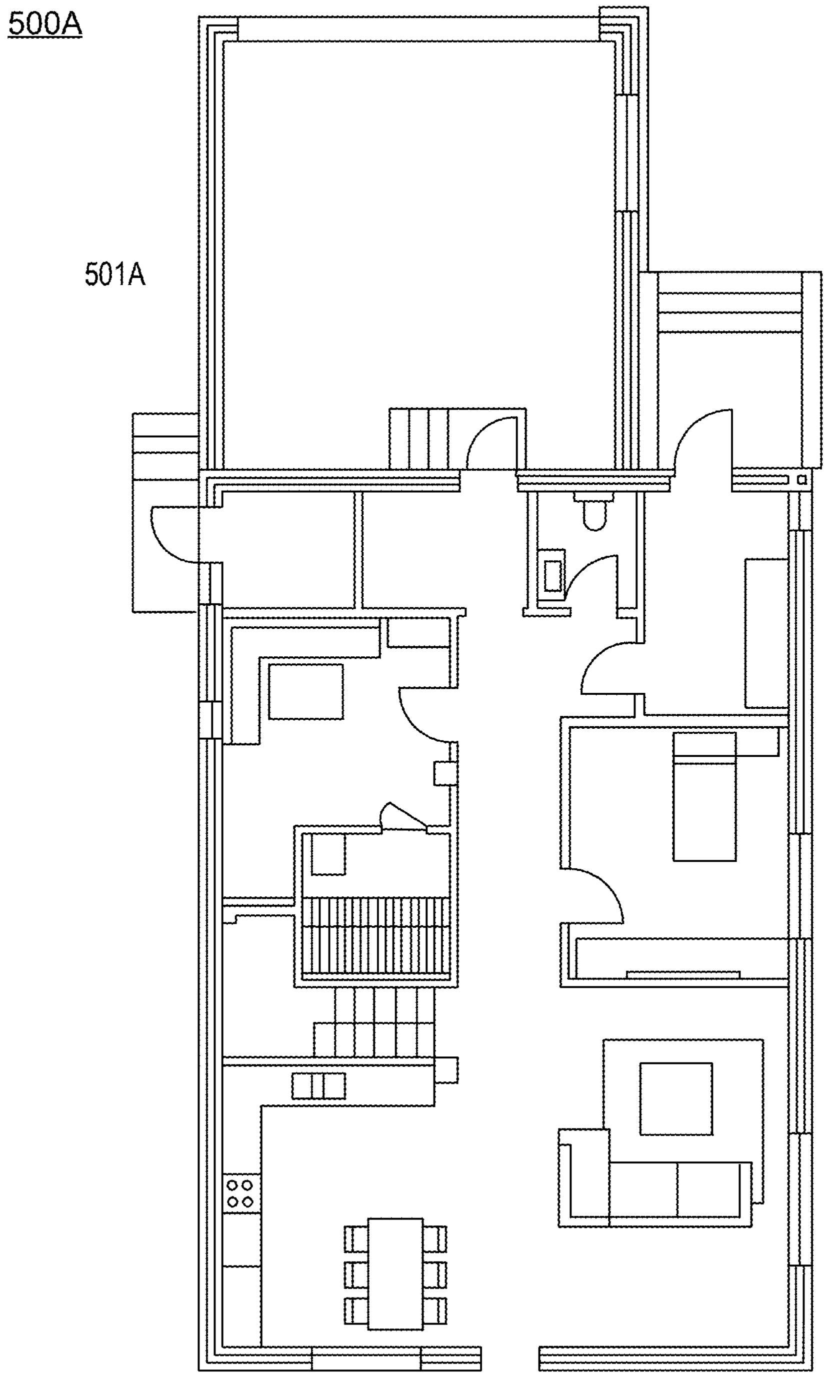
FIGS. 5A-5D illustrate various aspects of region identification and area allocation.

Referring now to FIGS. 5A-5D, a progressive series of outputs that may be included in various user interfaces are illustrated and provide examples of a recognition process that may be implemented in some embodiments of the present invention. Referring now to FIG. 5A, a relatively complex drawing of a floorplan may be input as a design plan 501A into a controller running an AI engine. The two-dimensional reference 501 may be included in an initial user interface 500A.

Figure 5B:
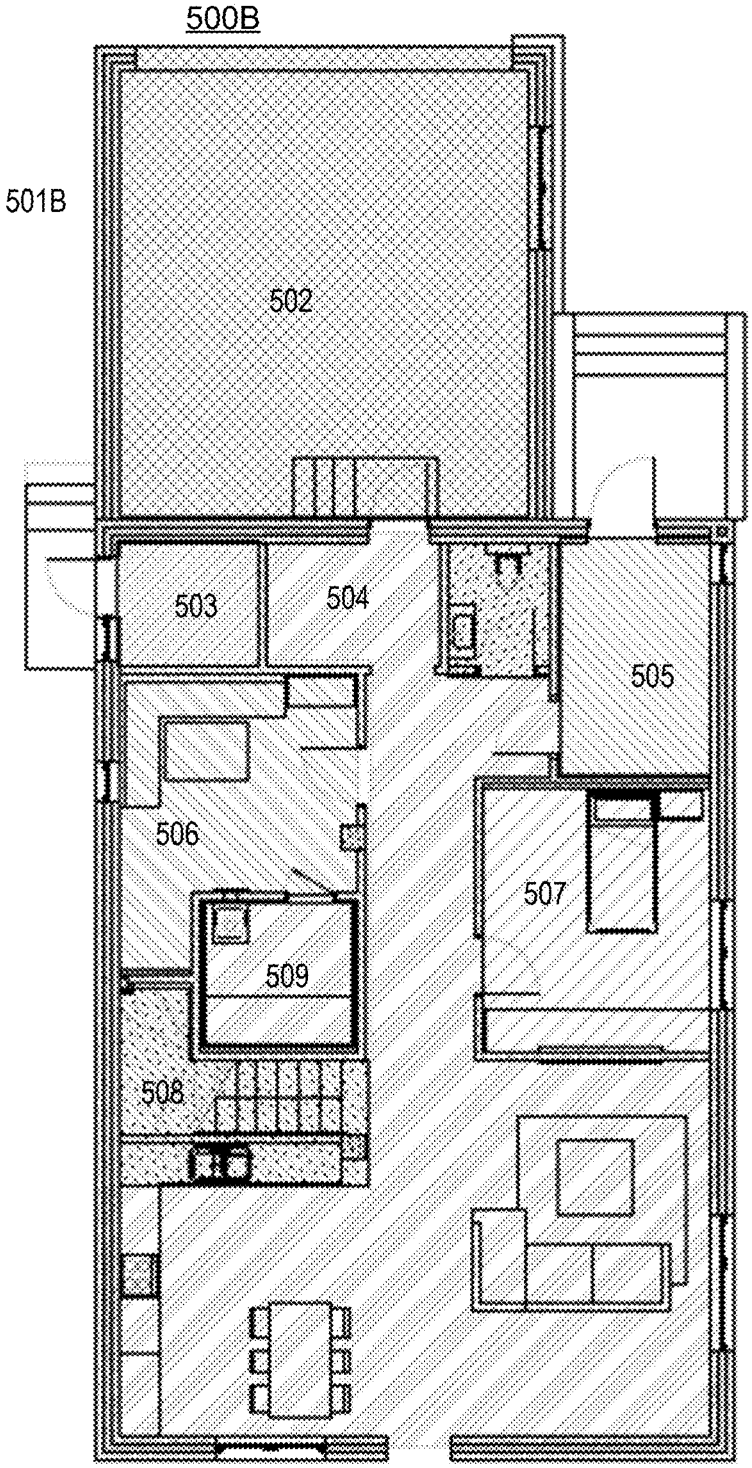

An AI engine based automated recognition process executes method steps via a controller, such as a cloud server, and identifies multiple disparate regions 502-509. Designation of the regions 502-509 may be integrated according to a shape and scale of the two-dimensional reference and presented as a region view 501B user interface 500B, with symbolic hatches or colors etc., as shown in FIG. 5B.

The region view 501B may include the multiple regions 502-509 identified by the AI engine arranged based upon a size and shape and relative position derived from the two-dimensional reference 501.

Figure 5C:
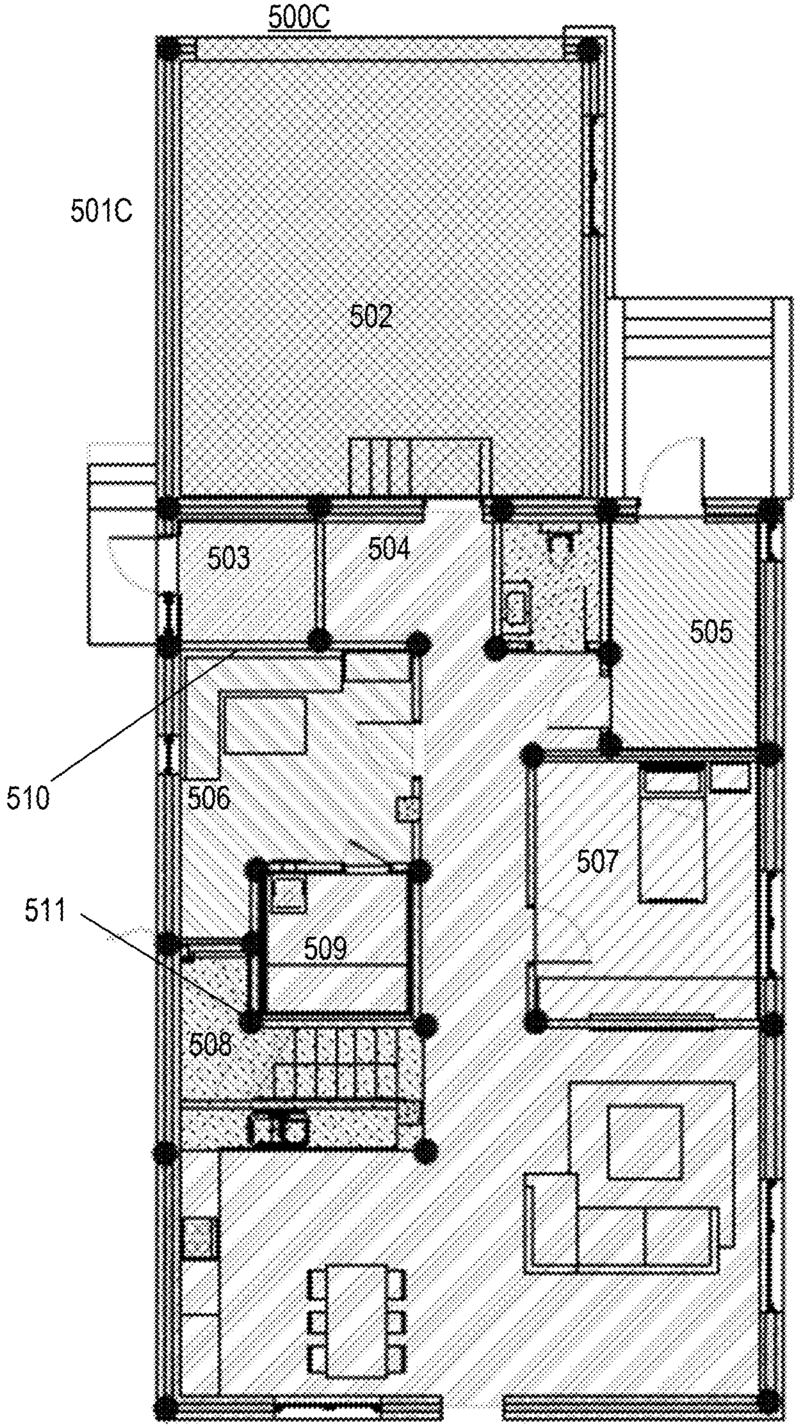

Referring now to FIG. 5C, a line segment view 501C may include identified boundary line segments 510 and vertices 511 may also be presented as an overlay of the regions 502-509 illustrated as delineated symbolic hatches or colors etc., as illustrated in FIG. 5C. Said line segments 510 may also be represented as symbols such as but not limited to dots. Such an interactive user interface 500C may allow a user to review and correct assignments in some cases. A component of the AI engine may further be trained to recognize aggregations of regions 502-509 spaces, or areas, such as in a non-limiting sense the aggregation of internal regions 502-509, spaces or areas.

Figure 5D:
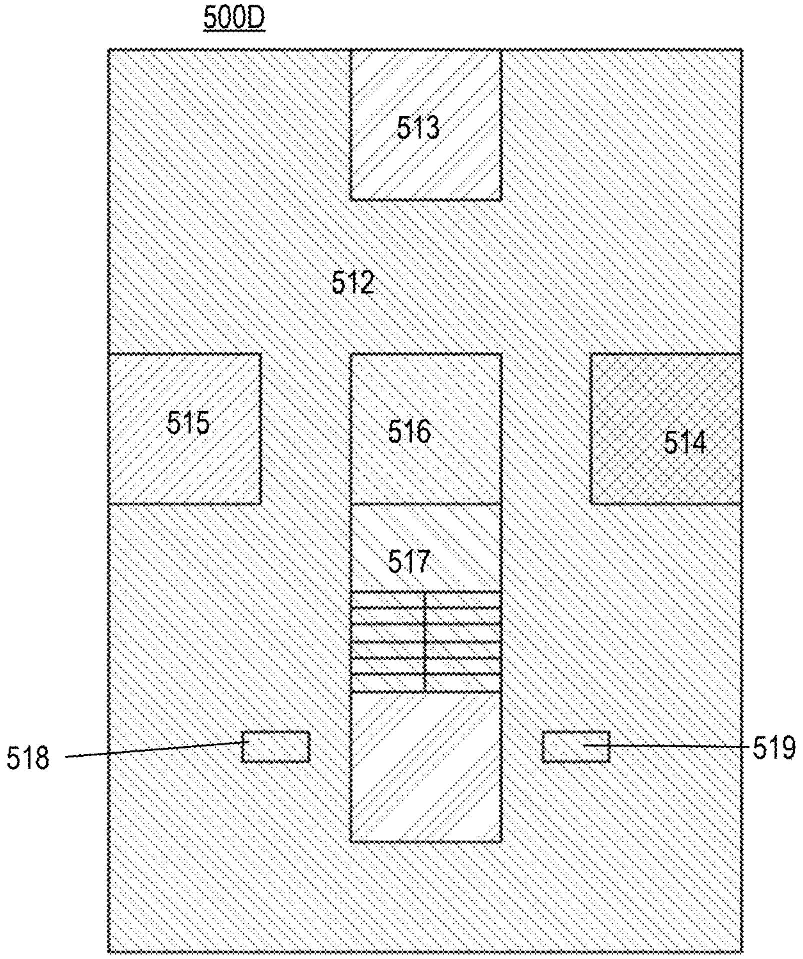

Referring now to FIG. 5D, an illustration of exemplary aggregation of regions 512-519 is provided where a user interface 500D includes patterned portions 512-519 and the patterned portions 512-519 may be representative of regions, spaces, or areas, such as, for example, aggregated interior living spaces.

In some embodiments, integrated and/or overlaid aggregations of some or all: of regions; spaces; patterned portions; line segments; polygons; symbols; icons or other portions of the user interfaces may be assembled and presented in a user output and our user interface, or as input into another automated process. In some embodiments, selection or marking of the desired segments or design elements may be incorporated on the user interfaces 500A-500D as shown in FIGS. 5A-5D.

Figure 6A:
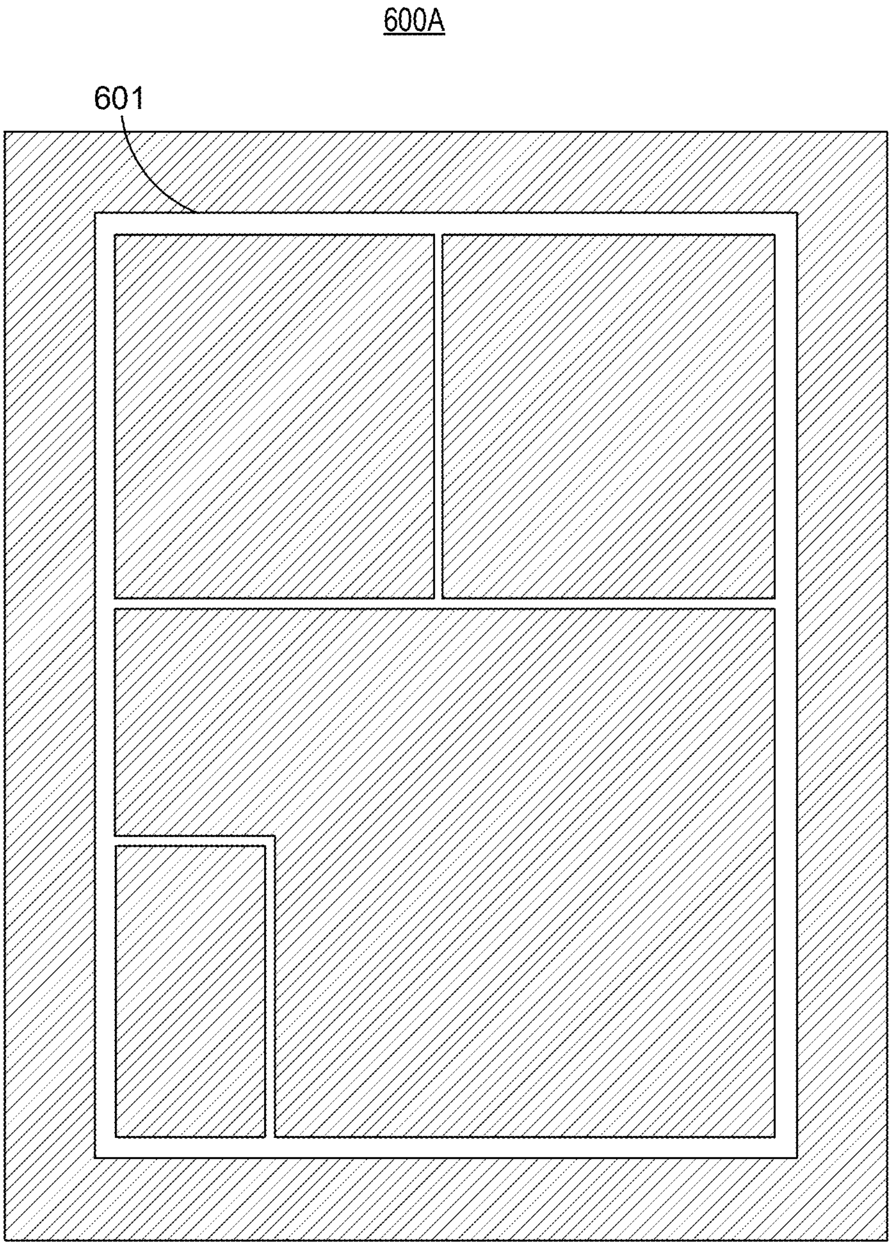
FIGS. 6A-6C illustrate various aspects of boundary segmentation and classification.
Figure 6B:
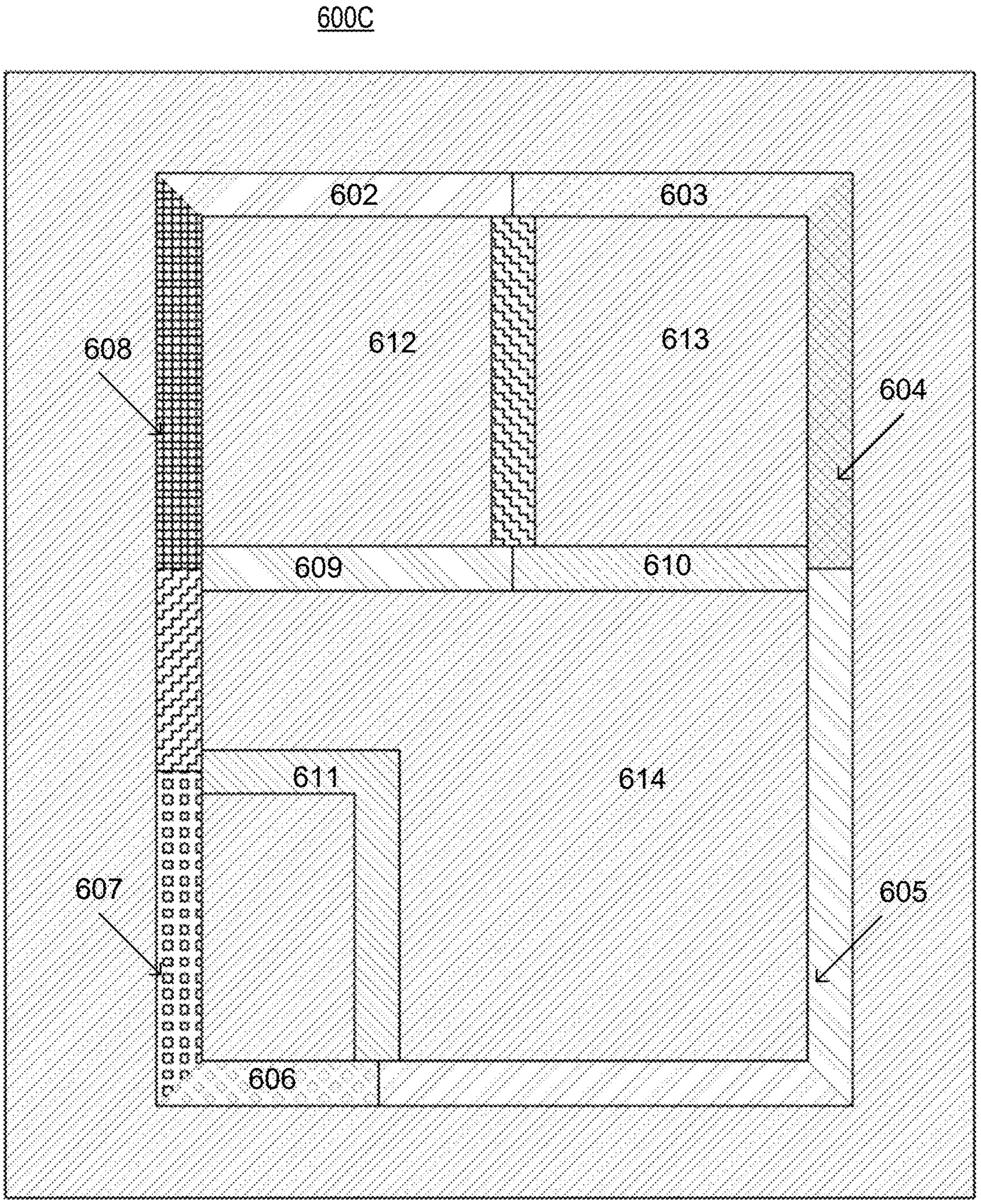
Figure 6C:
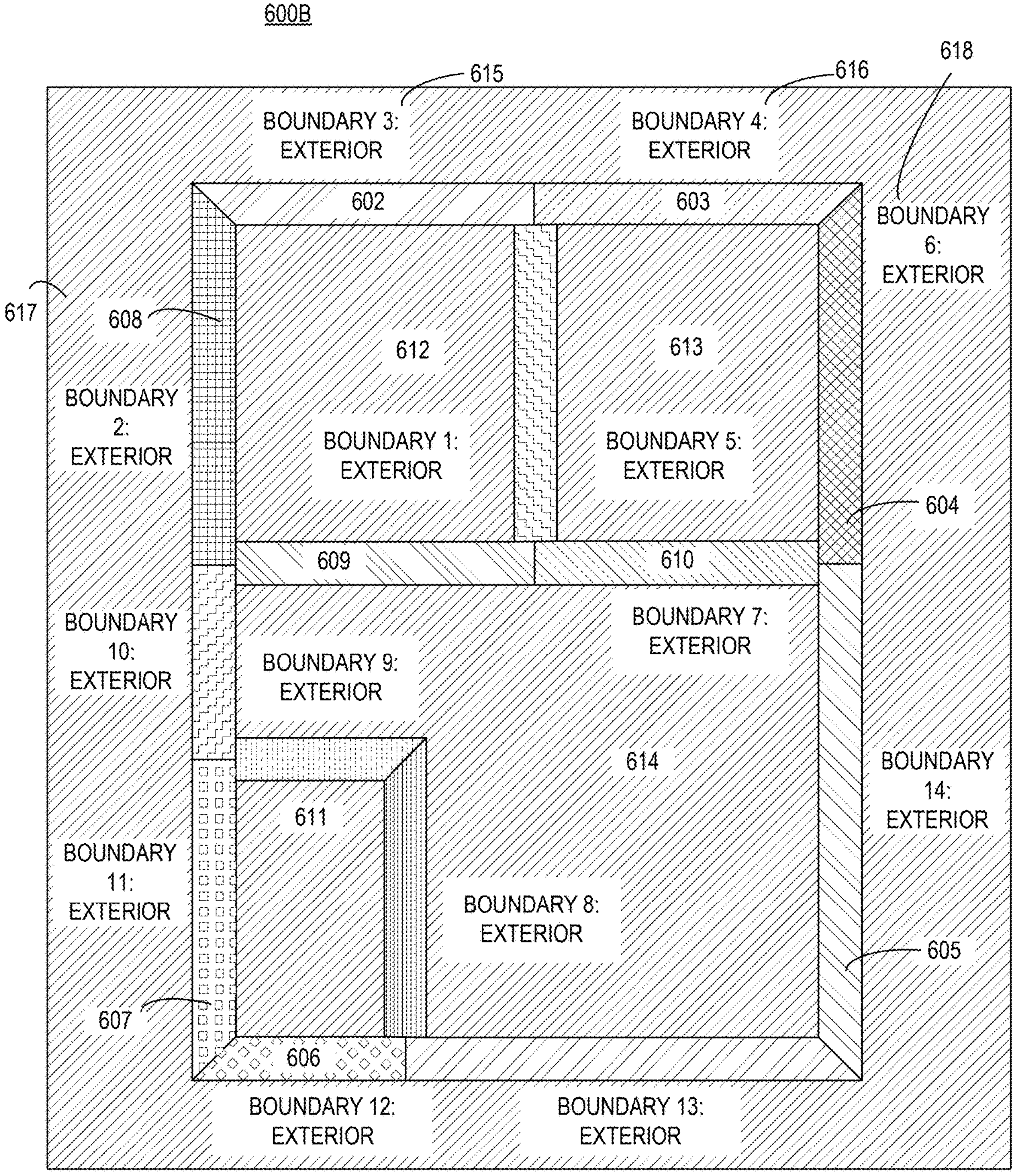

Referring now to FIGS. 6A-6C, in some embodiments, automated and/or user-initiated processes may include refinement of regions, spaces, or areas may involve one or both of a user and a controller identifying individual wall segments 211A from previously defined boundaries.

For example, in some embodiments, a controller running an AI engine may execute processes that are operative to divide a previously predicted boundary into individual wall segments. In FIG. 6A, a user interface 600A includes a representation of a design plan with an original boundary 601 defined from an inputted design.

In FIG. 6B, an AI engine may be operative to take one or more original boundaries 601 and isolate one or more individual line segments 602-611 as shown by different hatching symbols in an illustrated user interface 600B. The identification of individual line segments 602-611 of a boundary 601 enables one or both of a controller and a user to assign and/or retrieve information about the individual line segment 602-611 such as, for example, one or more of: the length of the segment 602-611, a type of wall segment 211A, materials used in the wall segment 211A, parameters of the segment 602-611, height of the segment 602-611, width of the segment 602-611, allocation of the segment 602-611 to a region 612-614 or another, and almost any digital content relevant to the segment.

Referring now to FIG. 6C, in some embodiments, a controller executing an AI engine or other method steps, may be operative, in some embodiments, to classify individual line segments 602-611 of a boundary 601 and present a user interface 600C indicating the classified individual line segments 602-611. The AI engine may be trained, and subsequently operative, to classify individual line segments 602-611 included in a boundary 601 in different classes. As a non-limiting example, an AI engine may classify walls as interior walls, exterior walls and/or demising walls that separate internal spaces.

As illustrated in FIG. 6C, in some embodiments, an individual line segment 602-611 may be classified by the AI engine and an indication of the classification 615-618, such as alphanumeric or symbolic content, may be associated with the individual line segment 602-611 and presented in the user interface 600C.

In some embodiments, functionality may be allocated to classified individual line segments 602-611, such as, by way of non-limiting example, a process that generates an estimated materials list for a region or an area defined by a boundary, based on the regions or area's characteristics and its classification. In some embodiments, selection or marking of the desired segments or design elements may be incorporated on the user interfaces 600A-600C as shown in FIGS. 6A-6C.

Figure 7:
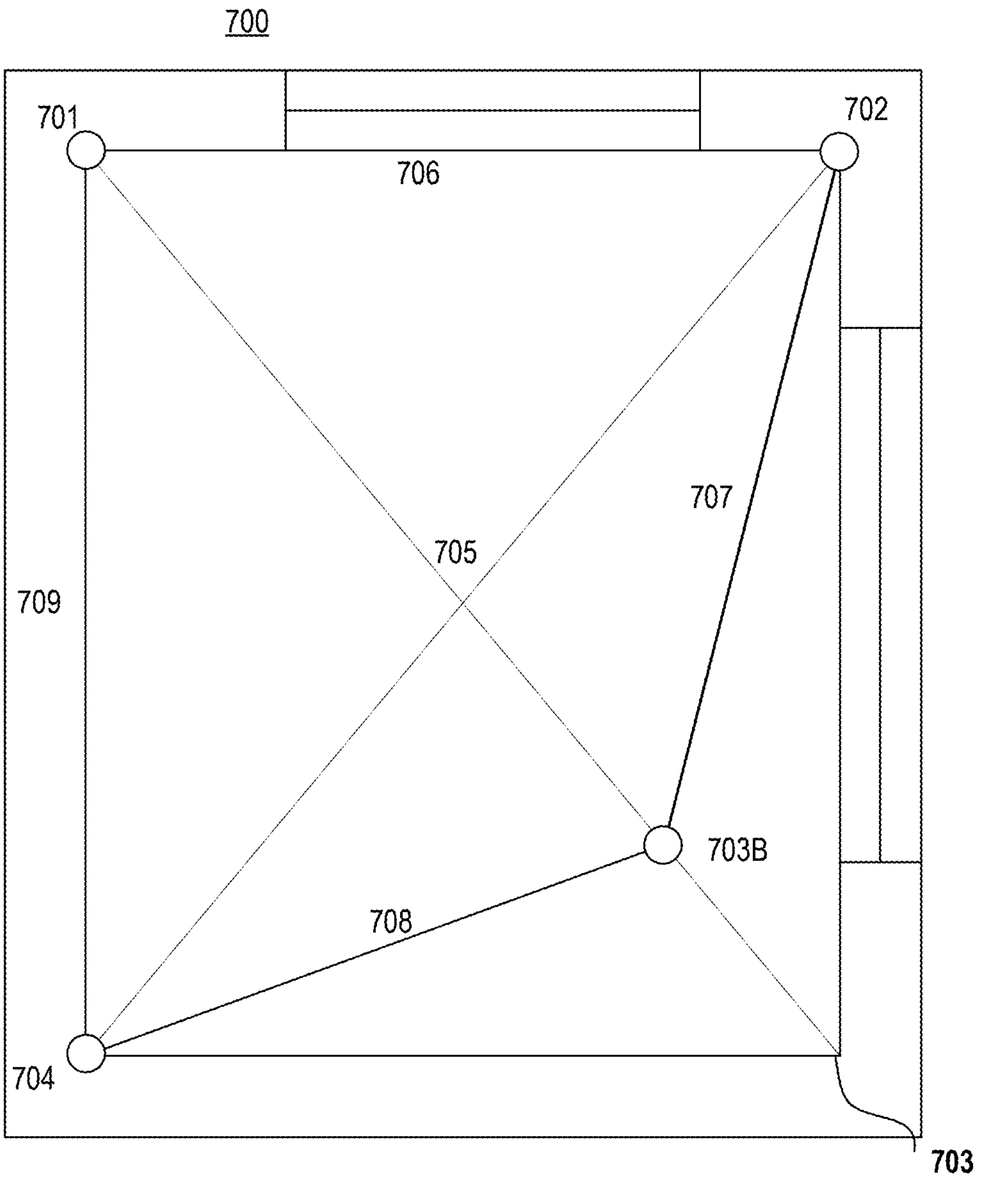
FIG. 7 illustrates aspects of correction protocols and an exemplary method for making changes to a design element of the design plan.

Referring now to FIG. 7, in some embodiments, a user interface 700 may include user interactive controls operative to execute process steps described herein (e.g. make a boundary determination, region classification, segmentation decision or the like) in an automated process (e.g. via an AI routine) and also be able to receive an instruction (e.g. from a user via a user interface, or a controller operative via executable software to perform a process) that modify one or more boundary segments.

For example, a user interface may include one or more vertex 701-704 (e.g., points where two or more line segments meet) that may be user interactive such that a user may position the one or more vertex 701-704 at a user selected position. User positioning may include, for example, user drag and drop of the one or more vertex 701-704 at a desired location or entering a desired position, such as via coordinates. A new position for a vertex 703B may allow an area 705 bounded by user defined boundaries 706-709 User interactive portions of a user interface 700 are not limited to vertex 701-704 and can be any other item 701-709 in the user interface 700 that may facilitate achievement of a purpose by allowing one or both of: the user, and the controller, to control dynamic sizing and/or placement of a feature or other item 701-709.

Still further, in some embodiments, user interaction involving positioning of a vertex 701-704 or modification of an item 705-709 may be used to train an AI engine to improve performance. Additionally, in some embodiments, user interaction involving positioning of a vertex 701-704 may comprise selection of a desired segment or design element in a design plan by marking and combining a plurality of vertex points similar to vertex 701-704.

An important aspect of the operation of the systems as have been described is the training of the AI engines that perform the functions as have been defined. A training dataset may involve a set of input drawings associated with a corresponding set of verified outputs. In some embodiments, a historical database of drawings may be analyzed by personnel with expertise in the field. user, including in some embodiments experts in a particular field of endeavor may manipulate dynamic features of a design plan or other aspects of a user interface to be used to train an AI engine, such as by creating or adding to an AI referenced database.

In some other examples, a trained version of an AI engine may produce user interfaces and/or other outputs based on the trained version of the AI engine. Teams of experts may review the results of the AI processing and make corrections as required. Corrected drawings may be provided to the AI engine for renewed training.

Aspects that are determined by a controller running an AI engine to be represented in a design plan may be used to generate an estimate of what will be required to complete a project. For example, according to various embodiments of the present invention, an AI engine may receive as input a two-dimensional reference and generate one or more of: boundaries, areas, fixtures, architectural components, perimeters, linear lengths, distances, volumes, and the like may be determined by a controller running an AI engine to be required to be required to complete a project.

For example, a derived area or region comprising a room and/or a boundary, perimeter or other beginning and end indicator may allow for a building estimate that may integrate choices of materials with associated raw materials costs and with labor estimates all scaled with the derived parameters. The boundary determination function may be integrated with other standard construction estimation software and feed its calculated parameters through APIs. In other examples, the boundary determination function may be supplemented with the equivalent functions of construction estimation to directly provide parametric input to an estimation function. For example, the parameters derived by the boundary determinations may result in estimation of needed quantities like cement, lumber, steel, wallboard, floor treatments, carpeting, and the like. Associated labor estimates may also be calculated.

As described herein, a controller executing an AI engine may be functional to perform pattern recognition and recognize features or other aspects that are present within an input two-dimensional reference or other graphic design. In a segmentation phase used to determine boundaries of regions or other space features, aspects that are recognized as some artifact other than a boundary may be replaced or deleted from the image. An AI engine and/or user modified resulting boundary determination can be used in additional pattern recognition processing to facilitate accurate recognition of the non-wall features present in the graphic.

For example, in some embodiments, a set of architectural drawings may include many elements depicted such as, by way of non-limiting example, one or more of: windows, exterior doors, interior doors, hallways, elevators, stairs, electrical outlets, wiring paths, floor treatments, lighting, appliances, and the like. In some two-dimensional references, furniture, desks, beds, and the like may be depicted in designated spaces. AI pattern recognition capabilities can also be trained to recognize each of these features and many other such features commonly included in design drawings. In some embodiments, a list of all the recognized image features may be created and also used in the cost estimation protocols as have been described.

Figure 8:
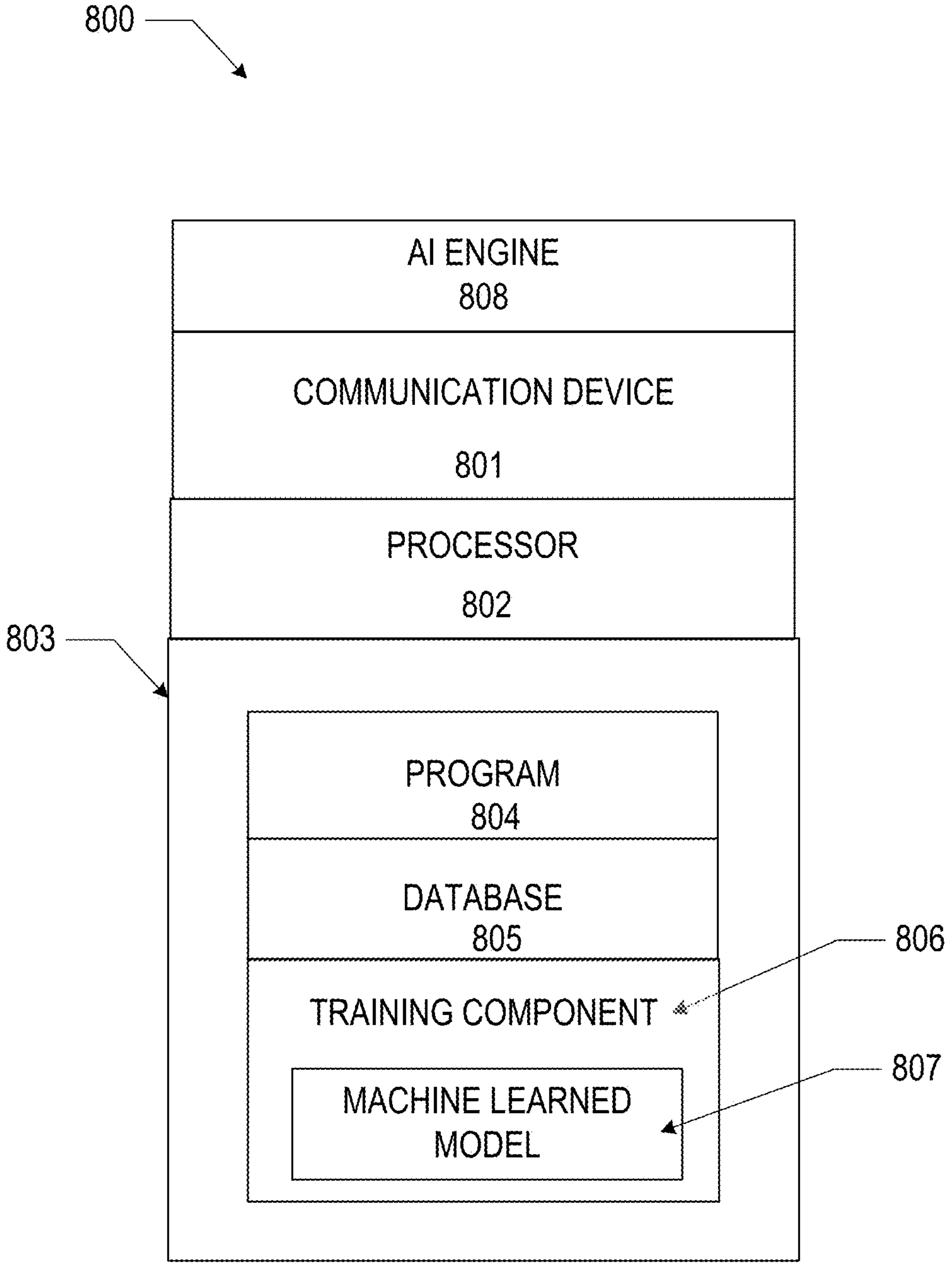
FIG. 8 illustrates exemplary processor architecture for use with the present disclosure.

Referring now to FIG. 8 an automated controller is illustrated that may be used to implement various aspects of the present disclosure, in various embodiments, and for various aspects of the present disclosure, controller 800 may be included in one or more of: a wireless tablet or handheld device, a server, a rack mounted processor unit. The controller may be included in one or more of the apparatuses described above, such as a Server, and a Network Access Device. The controller 800 includes a processor unit 802, such as one or more semiconductor-based processors, coupled to a communication device 801 configured to communicate via a communication network (not shown in FIG. 8). The communication device 801 may be used to communicate, for example, with one or more online devices, such as a personal computer, laptop, or a handheld device.

The processor 802 is also in communication with a storage device 803. The storage device 803 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 803 can store a software program 804 with executable logic for controlling the processor 802. The processor 802 performs instructions of the software program 804, and thereby operates in accordance with the present disclosure. In some embodiments, the processor may be supplemented with a specialized processor for AI related processing. The processor 802 may also cause the communication device 801 to transmit information, including, in some instances, control commands to operate apparatus to implement the processes described above. The storage device 803 can additionally store related data in a database 805. The processor and storage devices may access an AI training component 806 and database, as needed which may also include storage of machine-learned models 807.

In some embodiments, a controller 800 run an AI engine 808 that may include one or both of a GAN, and vision encoder. A vision encoder, may include, for example, Vision Transformers (ViT) models, or other modules, to convert images into a form the AI Engine 808 may better understand. For example, in some processes, an scanned image, such as a design plan may be divided into patches. One or more patches may be transformed into one or more embedding vectors. The embedding vectors may be processed using transformer-based layers that capture spatial relationships and features included in the image.

An encoded image may be combined with text, lines, polygons, or other input types. In some embodiments, the controller 800 may use cross-attention mechanisms to align visual features with linguistic inputs (e.g., a question about the image). Alignment may enable the controller to perform tasks such as, for example, without limitation, one or more of: image captioning, visual question answering, and image-text matching.

For specific applications, such as, for example, one or more of: identifying objects, describing scenes, or analyzing diagrams). In some embodiments, a controller may access fine-tuned on curated datasets, such as for example design plans or portions of design plans. A model run the controller learns how to interpret images in these domains and respond accordingly.

An AI engine 808 may be executable to provide reasoning, not just recognition, such that the controller may: infer relationships between objects. It may also support chain-of-thought-style reasoning based on visual context. For example, given access to previous design plans and a question, it can analyze trends, make inferences, and justify answers in natural language. I addition, it may generate one or more of: diagrams showing revised plans, new plans, compliance with a set of given requirements, quantities of specified items, pricing for items included in a design plan, alternatives to design plan specifications, and other user requests or requirements specified. In some embodiments, image generation and editing may be paired with tools.

A Vision Transformer (ViT) may include a deep learning model architecture that applies the transformer architecture (originally designed for natural language processing) to image data. Instead of using convolutional layers such as, in CNNs, a controller running ViTs may treat images more such as, sequences of data, similar to words in a sentence.

In some embodiments, Vision Transformers run by a controller, may include one or more of the following:

Image Patching: An input image (e.g., 224×224 pixels) may be split into fixed-size patches, such as 16×16 pixels. Each patch may be flattened into a 1D vector—for example, a 16×16 RGB patch becomes a 768-dimensional vector (16×16×3).

Linear Embedding (Embedding Layer): Multiple patch vectors may be passed through a linear layer (fully connected layer) to map it into an embedding space, such in a process similar to word embeddings in NLP.

Positional Encoding: Transformers may be position-agnostic (they do not require an inherent sense of spatial location), ViTs add positional encodings to each patch embedding. This helps the model understand where each patch may be located in the image.

Transformer Encoder: Multiple patch embeddings (now with positional info) may be passed through multiple layers of transformer encoders. Layers include may include multi-head self-attention, which lets the model weigh the importance of each patch in relation to others. This may be useful for capturing long-range dependencies, such as, for example, understanding that a toilet and a sink belong to a same area within a design plan.

Classification or Task Output: A [CLS] token (classification token) may be prepended to the input sequence, and its output embedding after all transformer layers may be used for classification or other downstream tasks. For image-to-text tasks, patch embeddings may be passed to a decoder or used directly with cross-modal attention.

ViTs may produce tokenized representations of images, making it easier to integrate with text-based models. Self-attention allows the controller to reason across both image and text tokens holistically. ViTs can handle high-level reasoning (e.g., spatial relationships, object interaction) with increased flexibility.

Figure 9:
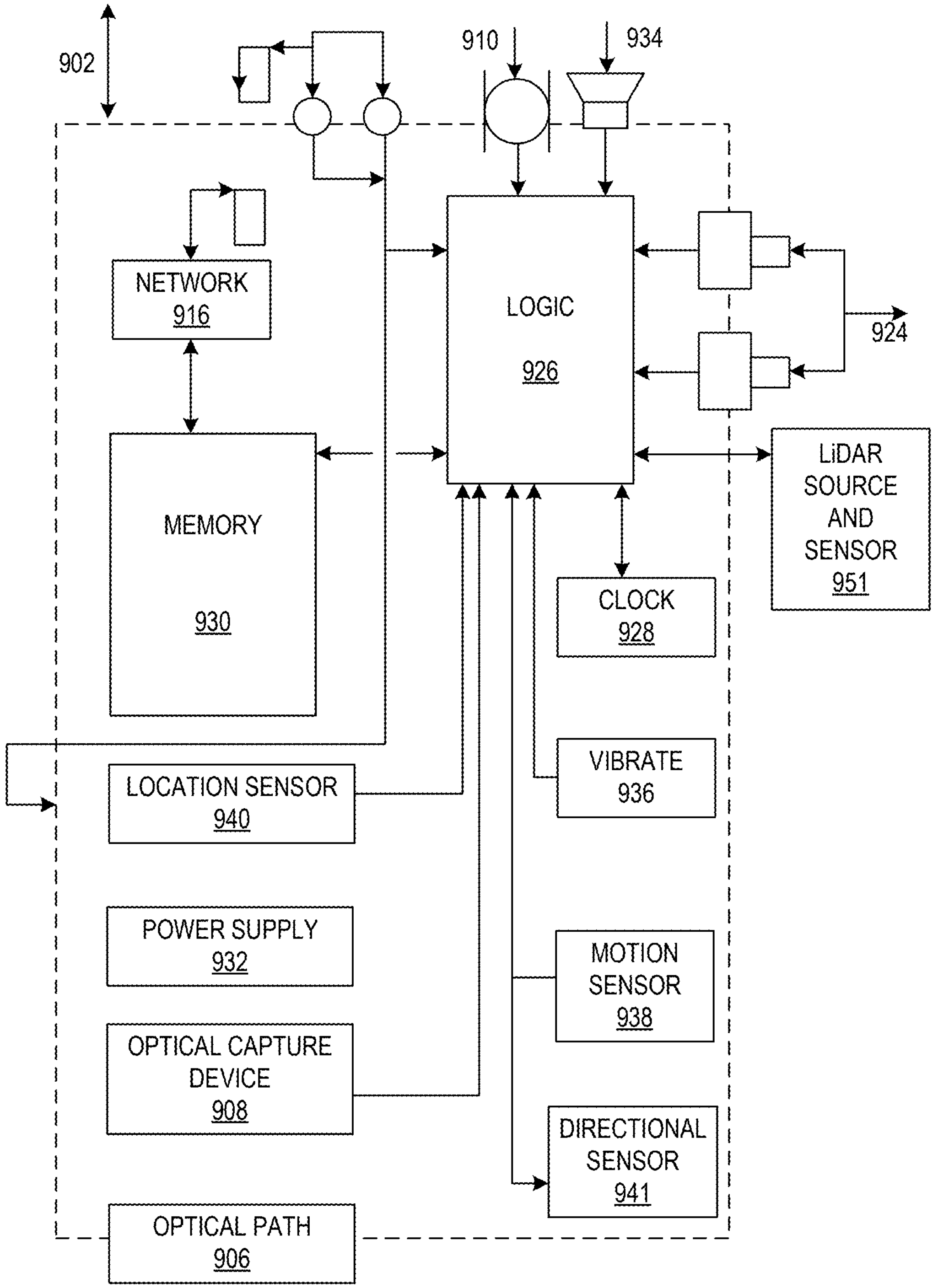
FIG. 9 illustrates exemplary mobile device architecture for use with the present disclosure.

Referring now to FIG. 9, a block diagram of an exemplary mobile device 902 is illustrated. The mobile device 902 comprises an optical capture device 908 to capture an image and convert it to machine-compatible data, and an optical path 906, typically a lens, an aperture, or an image conduit to convey the image from the rendered document to the optical capture device 908. The optical capture device 908 may incorporate a Charge-Coupled Device (CCD), a Complementary Metal Oxide Semiconductor (CMOS) imaging device, or an optical Sensor 924 of another type.

A microphone 910 and associated circuitry may convert the sound of the environment, including spoken words, into machine-compatible signals. The microphone 910 may also be utilized by users to provide audio annotations (or for speech-to-text annotations) of the present invention. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible feedback 934 may come from a loudspeaker or other audio transducer. Tactile feedback may come from a vibrate module 936.

A motion Sensor 938 and associated circuitry convert the motion of the mobile device 902 into machine-compatible signals. The motion Sensor 938 may comprise an accelerometer that may be used to sense measurable physical acceleration, orientation, vibration, and other movements. In some embodiments, motion Sensor 938 may include a gyroscope or other device to sense different motions.

A location Sensor 940 and associated circuitry may be used to determine the location of the device. The location Sensor 940 may detect Global Position System (GPS) radio signals from satellites or may also use assisted GPS where the mobile device may use a cellular network to decrease the time required to determine location.

The mobile device 902 comprises logic 926 to interact with the various other components, possibly processing the received signals into different formats and/or interpretations. Logic 926 may be operable to read and write data and program instructions stored in associated storage or memory 930 such as RAM, ROM, flash, or other suitable memory. It may read a time signal from the clock unit 928. In some embodiments, the mobile device 902 may have an on-board power supply 932. In other embodiments, the mobile device 902 may be powered from a tethered connection to another device, such as a Universal Serial Bus (USB) connection.

The mobile device 902 also includes a network interface 916 to communicate data to a network and/or an associated computing device. Network interface 916 may provide two-way data communication. For example, network interface 916 may operate according to the internet protocol. As another example, network interface 916 may be a local area network (LAN) card allowing a data communication connection to a compatible LAN. As another example, network interface 916 may be a cellular antenna and associated circuitry which may allow the mobile device to communicate over standard wireless data communication networks. In some implementations, network interface 916 may include a Universal Serial Bus (USB) to supply power or transmit data. In some embodiments, other wireless links may also be implemented.

As an example of one use of mobile device 902, a reader may scan an input drawing with the mobile device 902. In some embodiments, the scan may include a bit-mapped image via the optical capture device 908. Logic 926 causes the bit-mapped image to be stored in memory 930 with an associated timestamp read from the clock unit 928. Logic 926 may also perform optical character recognition (OCR) or other post-scan processing on the bit-mapped image to convert it to text.

A directional sensor 941 may also be incorporated into the mobile device 902. The directional device may be a compass and be based upon a magnetic reading or based upon network settings.

A LiDAR sensing system 951 may also be incorporated into the mobile device 902. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the mobile device 902. In some embodiments, as have been described herein, a 2-dimensional drawing or representation may be used as the input data source and vector representations in various forms may be utilized as a fundamental or alternative input data source. Moreover, in some embodiments, files which may be classified as BIM input files may be directly used as a source on which method steps may be performed. BIM and CAD file formats may include, by way of non-limiting example, one or more of: BIM, RVT, NWD, DWG, IFC and COBie. Features in the BIM or CAD datafile may already have defined boundary aspects having innate definitions such as walls and ceilings and the like. An interactive interface may be generated that receives input from a user indicating a user choice of types of innate boundary aspects a user provides instruction to the controller to perform subsequent processing on.

In some embodiments, a controller may receive user input, enabling input data from either a design plan format or similar such formats, or also allowing the user to access BIM or CAD formats. Artificial intelligence may be used to assess boundaries in different manners depending on the type of input data that is initially inputted. Subsequently, similar processing may be performed to segment defined spaces in useable manners as have been discussed. The segmented spaces may also be processed to determine classifications of the spaces.

As has been described, a system may operate (and AI Training aspects may be focused upon) recognition of lines or vectors as a basic element within an input design plan. However, in some embodiments, other elements may be used as a fundamental element, such as, for example, a polygon and/or series of polygons. The one or more polygons may be assembled to define an area with a boundary, as compared, in some embodiments, with an assembly of line segments or vectors, which together may define a boundary which may be used to define an area. Polygons may include different vertices; however common examples may include triangular facets and quadrilateral polygons. In some embodiments, AI training may be carried out with a singular type of polygonal primitive element (e.g., rectangles), other embodiments will use a more sophisticated model. In some other examples, AI engine training may involve characterizing spaces where the algorithms are allowed to access multiple diverse types of polygons simultaneously. In some embodiments, a system may be allowed to represent boundary conditions as combinations of both polygons and line elements or vectors.

Depending upon one or more factors, such as processing time, a complexity of the feature spaces defined, and a purpose for AI analysis, simplification protocols may be performed as have been described herein. In some embodiments, object recognition, space definition or general simplification may be aided by various object recognition algorithms. In some embodiments, Hough type algorithms may be used to extract diverse types of features from a representation of a space. In other examples, Watershed algorithms may be useful to infer division boundaries between segmented spaces. Other feature recognition algorithms may be useful in determining boundary definitions from building drawings or representations.

In some embodiments, the user may be given access to movement of boundary elements and vertices of boundary elements. In examples where lines or vectors are used to represent boundaries and surrounding areas, a user may move vertices between lines or center points of lines (which may move multiple vertices). In other examples, elements of polygons such as the user may move vertices, sides, and center points. In some embodiments, the determined elements of the space representation may be bundled together in a single layer. In other examples, multiple layers may be used to distinguish distinct aspects. For example, one layer may include the AI optimized boundary elements, another layer may represent area and segmentation aspects, and still another layer may include object elements. In some embodiments, when the user moves an element such as a vertex the effects may be limited only to elements within its own layer. In some examples, a user may elect to move multiple or all layers in an equivalent manner. In still further examples, all elements may be assigned to a single layer and treated equivalently. In some embodiments, users may be given multiple menu options to select disparate elements for processing and adjustment. Features of elements such as color and shading and stylizing aspects may be user selectable. A user may be presented with a user interface that includes dynamic representations of a feature or other aspects of a design plan, and associated values and changes may be input by a user. In some embodiments, an algorithm and processor may present (for example via a user interface) comparisons of various aspects within a single model or between different models. Accordingly, in various embodiments, a controller and a user may manipulate aspects of a user interface and AI engine.

Figure 10A:
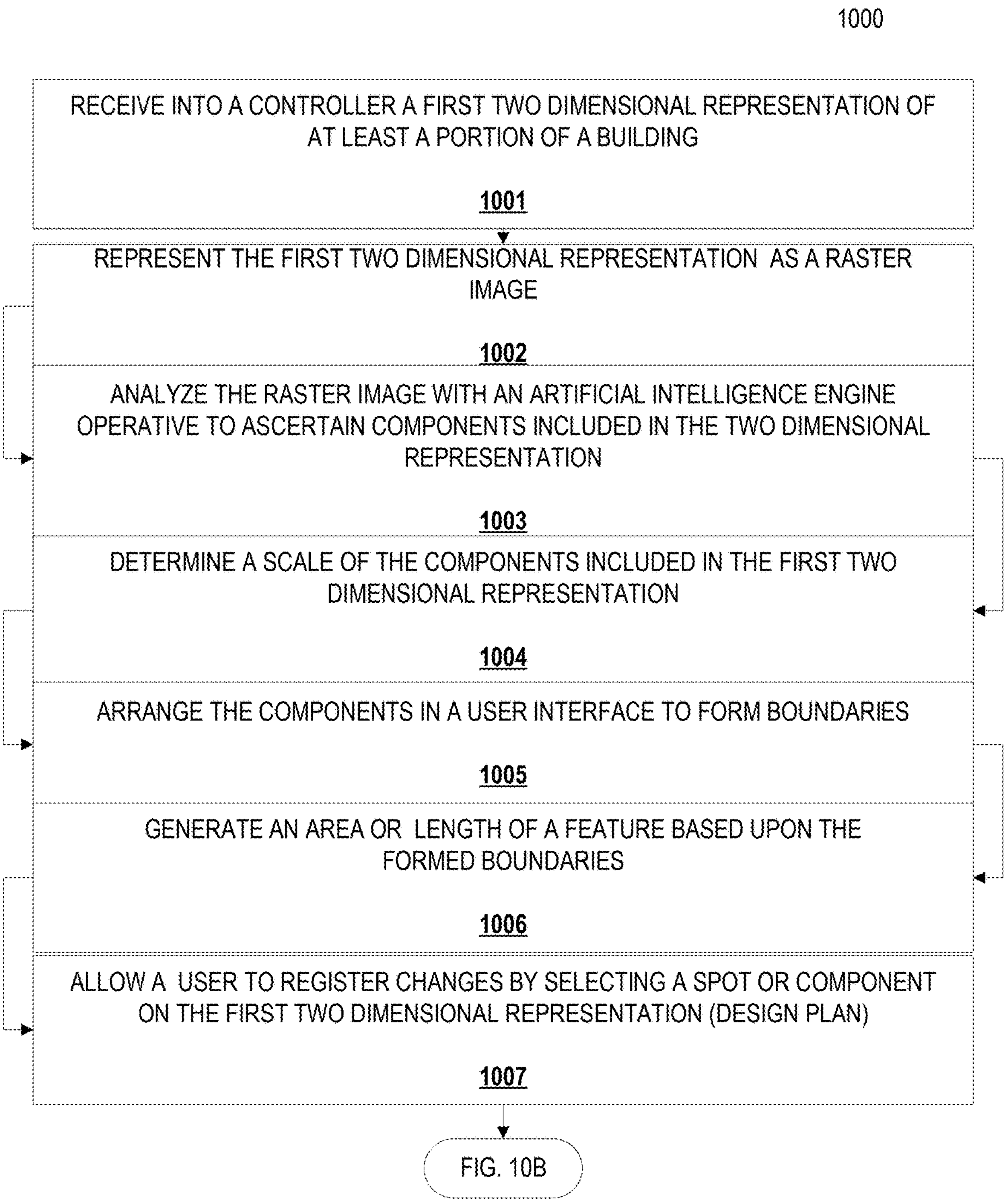
FIGS. 10A-10B illustrate exemplary method steps that may be executed in some embodiments of the present invention.
Figure 10B:
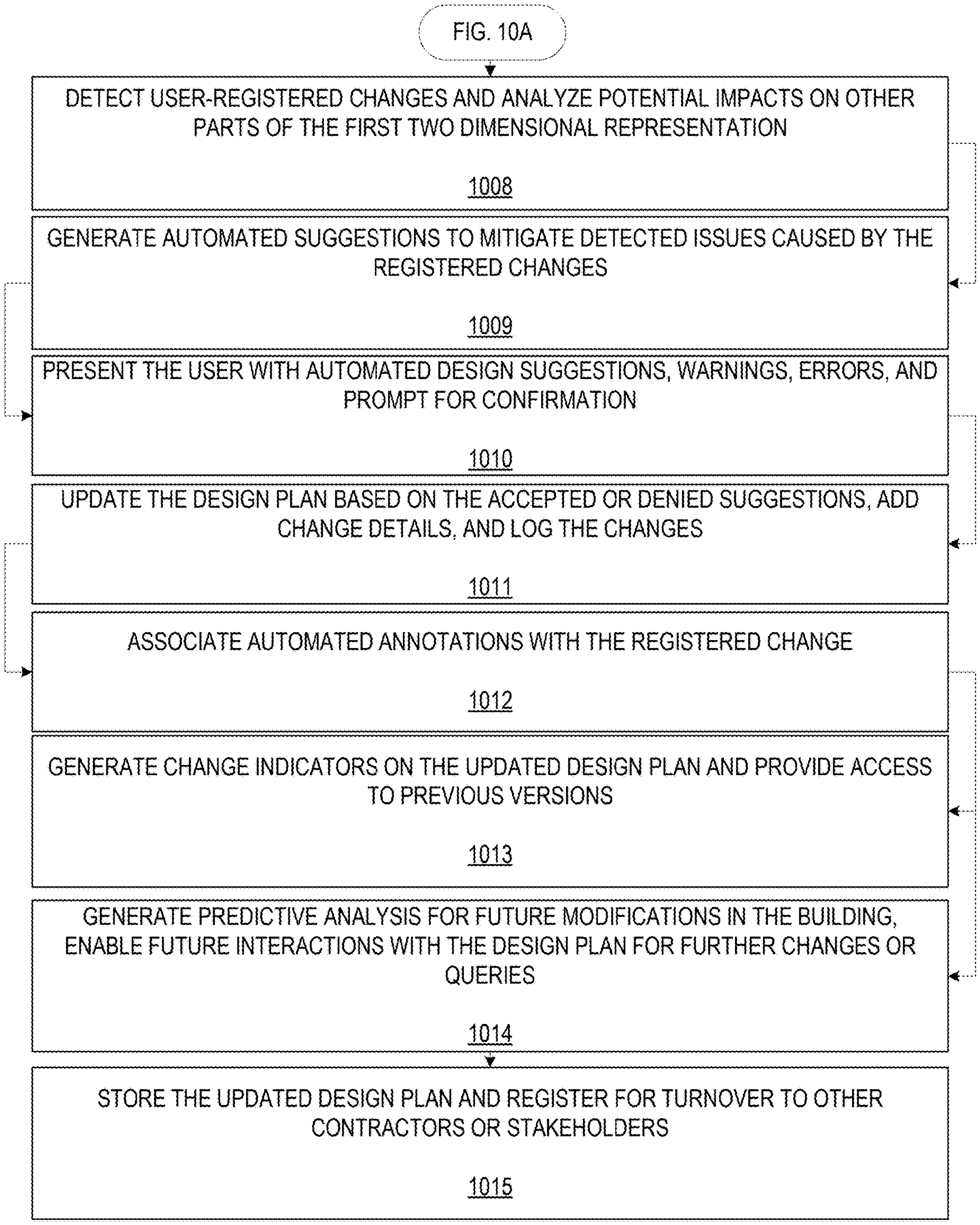

Referring now to FIGS. 10A-10B, method steps are illustrated for registering a physical change to a design plan in some implementations of the present invention.

At step 1001, the process begins by receiving into a controller a first two-dimensional representation of at least a portion of a building. This two-dimensional representation may come from a variety of sources, including a design file from a CAD system, a scanned architectural drawing, or even a hand-drawn sketch. For example, a user may submit a blueprint of a residential building or a commercial floor plan. This step is the starting point where the controller accesses the design that forms the basis of all further modifications and analysis. The input file can be in various formats, such as DWG, DXF, PDF, JPEG, or even TIFF, representing different types of drawings, including technical schematics or hand-rendered layouts. This initial submission is vital for the controller's analysis because it provides the spatial framework, dimensions, and elements that the system will work with throughout the process.

At step 1002, the controller processes the received two-dimensional representation by converting it into a raster image. This conversion is important when the input file is in vector format, such as a DWG or DXF file, which stores data as geometric shapes, lines, and curves. Rasterization turns these elements into pixels, allowing the controller to work with a detailed grid-based representation of the design. This step is important for enabling the AI engine to interpret the design in a way that supports component recognition, boundary formation, and further manipulation of the design. For example, if the design includes multiple walls and doorways in vector format, they will be translated into a raster image composed of pixels that represent those elements. This step enables the system to analyze the plan as an image, which becomes the basis for AI-driven analysis in subsequent steps.

At step 1003, the controller employs an artificial intelligence engine to analyze the rasterized image and identify architectural components. These components may include elements such as walls, doors, windows, columns, and other features present in the design. For example, if the input file contains a blueprint of a house, the AI engine recognizes where walls begin and end, the placement of windows, and the dimensions of rooms. This process may involve segmentation techniques where the AI divides the image into distinct regions based on pixel patterns and contrast. This segmentation allows the system to discern individual components in the design and associate them with specific architectural elements. The system may also rely on a pre-trained model, which has been trained on thousands of architectural designs to recognize common features. Once the components are identified, they are tagged and categorized for use in later steps.

At step 1004, the system determines the scale of the components identified in the two-dimensional representation. Scaling is important because architectural drawings are often reduced or enlarged for presentation purposes, and the system needs to work with real-world dimensions. The controller may extract scale information directly from the input file, such as a dimension line or a scale bar included in the original drawing. If no scale information is present, the user may be prompted to provide known dimensions, such as the width of a doorway or the length of a wall. For example, the user could input that a doorway is three feet wide, and the system would use that information to proportionally calculate the size of all other elements in the design. This step is useful for conversion of pixel-based data into accurate real-world measurements, allowing the system to manipulate the design with precision.

At step 1005, the controller arranges the identified components into a user interface to form boundaries between various spaces in the design. For example, walls identified by the AI engine in step 1003 are used to define the boundaries of rooms, hallways, and other architectural spaces. These boundaries are presented in the user interface, allowing the user to visualize how the different components relate to each other spatially. For example, in the design of an office floor plan, the system would use wall elements to separate individual office spaces, meeting rooms, and common areas. These boundaries are dynamic and can be adjusted by the user if needed. The user can interact with the interface by selecting boundaries to modify them, such as moving a wall or expanding a room, and the system will automatically update the design in real time based on those inputs.

At step 1006, the system generates an area or length for a feature based upon the boundaries that have been formed. Once the boundaries of rooms, hallways, and other spaces are defined, the system calculates the area of each enclosed space. For example, in a residential floor plan, the system will calculate the square footage of each bedroom, living area, kitchen, and other rooms. This information is important for both the user and the system, as it provides real-time feedback about the dimensions and proportions of spaces within the design. The system can use this area information to facilitate that the design adheres to user-specified requirements or spatial constraints, such as facilitating that a room meets minimum size requirements for comfort or function. The user can then adjust the layout if the calculated areas do not meet their expectations.

At step 1007, the system allows a user, such as a contractor, architect, or project manager, to register changes by selecting a spot or a specific component on the first two-dimensional representation (design plan). This interaction is facilitated through the user interface, where the system or controller (e.g., powered by an AI engine and/or GAN engine) provides an interactive design environment for seamless registration of changes during the construction or renovation process.

The user can begin by identifying the area on the design plan where a physical modification or change has been made or is intended to be made. This may involve selecting a specific spot, such as a wall, room boundary, or structural element (like a door, window, or fixture), that needs to be adjusted, relocated, or added. The controller is capable of interpreting these inputs and assists in registering these changes on the digital design plan in real time.

For example, the user may want to add a new window to the design plan. By clicking on the relevant spot on the wall in the interactive user interface, the system prompts the user to either add a pre-configured window from the component library or draw the new element manually. The controller provides various tools, such as drag-and-drop functionality or drawing tools, allowing the user to input the desired component. If the window is manually drawn, the system automatically calculates the dimensions and distances of the new window based on the scale of the design plan. The controller will then dynamically update the design plan, adjusting the layout accordingly.

In addition to adding new components, the user can also modify or relocate existing elements in the design plan. For example, the user may select an existing door and choose to move it from one wall to another. After selecting the spot on the door to relocate, the controller interprets the command and calculates the impact of the move on other building systems (e.g., electrical wiring or plumbing that might be affected by the door's new position). The system then visually represents the new location of the door and provides real-time feedback on how the change will affect the overall design.

The controller may also present additional input options in a pop-up window that appears once the user selects a spot or component. This window may allow the user to provide further details about the change, such as dimensions, material choices, installation notes, warranty information, maintenance schedule, and any other relevant information. For example, if the user is adding a structural beam, the pop-up may prompt the user to enter load-bearing specifications or dimensions of the beam. Once these details are entered, the system integrates the new information and reflects the change to the design plan.

Additionally, the system can support changes involving multiple components at once. For example, if a contractor is upgrading a section of the building's HVAC system, the user can select multiple spots corresponding to air ducts and vents to register their relocation or replacement. The controller then adjusts the design plan to incorporate these HVAC elements, providing suggestions for placement or conflict resolution if required (such as avoiding overlaps with structural beams or electrical conduits).

At step 1008, after a user registers changes to the design plan by selecting a spot or component, the controller automatically detects these changes. The AI engine embedded in the system then analyzes the potential impacts that the registered change may have on other parts of the building's design. For example, if a contractor relocates a door, the system will analyze how the new position of the door impacts structural elements such as load-bearing walls or beams. Additionally, it checks the effects on related systems like electrical wiring or plumbing layouts, which may need adjustment. The controller uses predefined building guidelines and preferred practices to evaluate the ripple effect of the change across other building components, facilitating that everything aligns with the overall design logic.

Once the controller identifies potential conflicts or impacts from the registered changes, at step 1009, it generates automated suggestions to address or mitigate those issues. For example, if the system detects that adding a new window in a wall reduces the structural integrity of that wall, it may suggest adding reinforcement beams or adjusting the location of other elements such as vents or electrical sockets. These suggestions may be designed to help the user resolve any design conflicts caused by the changes they intend to make, improving the overall functionality of the building's design. The AI-driven suggestions may be based on a combination of building deployment objectives, design considerations, best practices, and real-time analytics provided by the system.

At step 1010, the system presents the user with the results of the analysis. This may include warnings, errors, or automated design suggestions for resolving the conflicts. The user may receive these in the form of a pop-up window, where they can review the issues, suggested solutions, and any possible implications. For example, a contractor who attempts to remove a structural column may receive an error indicating that the column is required for the stability of the building. Alongside this error, the system may suggest an alternative solution, such as shifting the column slightly or adding additional supports. The user may be prompted to either confirm the suggestion, modify the registered changes, or reject the suggestion entirely.

Once the user has reviewed the suggestions, warnings, or errors, and made their decision, at step 1011, the system updates the design plan accordingly. If the user accepts the system's automated suggestions, the design plan will be revised to reflect the accepted changes, incorporating all necessary adjustments. Similarly, if the user denies or modifies a suggestion, the controller will log those actions and apply only the agreed-upon modifications. The system keeps a detailed log of all changes made, including the reason for the change, the user who registered the modification, and the date and time of the alteration. This log may be helpful for future reference, especially for turnover to the client or subsequent contractors.

At step 1012, the system may add automated annotations to the design plan related to the registered change. These annotations may serve as additional metadata that provides more context for the change, helping future contractors, clients, or architects understand the rationale behind the modification. For example, if a wall was reinforced to accommodate a large window, an automated annotation may explain the structural importance of the change and specify the type of reinforcement used. The annotations may also include automated notes that reflect building objectives, material specifications, or performance-related information.

At step 1013, the system generates change indicators for all modified areas on the updated design plan. These indicators may take the form of icons or symbols that highlight where alterations have been made. For example, a wrench icon may be used to indicate a new mechanical system installation, while a light bulb icon may signify changes to the electrical layout. Users can click on these icons to view detailed descriptions of the changes, access annotations, or review the registered modifications. Additionally, the system allows users to access previous versions of the design plan, enabling them to compare the current version with earlier iterations and track the evolution of the project.

At step 1014, the system leverages the power of AI to conduct predictive analysis on the design plan. This predictive capability helps anticipate potential issues or needs for future modifications, offering proactive design suggestions based on ongoing construction trends or detected patterns in the building's design. For example, the system may suggest reinforcing a particular section of the building where multiple load-bearing modifications have been made. Additionally, the system remains open for future interactions; the client or authorized users can query the design plan for potential modifications, such as adding new fixtures or extending certain areas. The predictive analysis makes the system flexible and adaptable for future development. In some cases, predictive analysis may comprise automated information on what future modifications would be possible and what others may not be possible based on the registered change made in the physical building.

Finally, at step 1015, the system stores the fully updated design plan in its repository and registers it for turnover to the next contractor, project manager, or client. The stored design plan includes all the registered changes, accepted suggestions, and automated annotations, facilitating that subsequent stakeholders have access to the most recent version of the plan. This step is important for handing over the project seamlessly, whether it's to another contractor responsible for a different aspect of the construction (e.g., plumbing, electrical, or HVAC) or to the client for final review. The system's robust change logging and version control features facilitate that the transition between different project phases is smooth and well-documented In some embodiments of the present invention, when registering changes to the design plan, the system may also prompt the user to input additional important information about the newly added or modified components. This additional information can include, but is not limited to, warranty details, maintenance schedules, brand names, model numbers, serial numbers, and installation dates of any equipment or fixtures added during construction. For example, if a contractor installs a new HVAC system, the system may request the brand name (e.g., "Carrier"), the model number, and the warranty period (e.g., "5-year parts warranty"). This information is vital for future maintenance and operational continuity.

Moreover, the maintenance schedule can be included, facilitating that future service, repair teams, or clients are aware of when the equipment needs regular checkups, helping to avoid premature failure due to missed maintenance. By logging serial numbers, installation dates, and warranty periods, the system allows the client or future contractors to quickly reference important details about each installed item, avoiding unnecessary delays during repairs or replacements. For example, if a light fixture or a mechanical system malfunctions after the building's completion, the maintenance team or client can quickly assess if it is still under warranty, what type of replacement part is needed, and what brand of equipment was used. These records provide a smooth handover and operation of the building post-construction, reducing operational risks and downtime in the long run. Additionally, the system may provide alerts or reminders when a warranty is about to expire or when scheduled maintenance is due, so that the building's components function efficiently over time.

Figure 11:
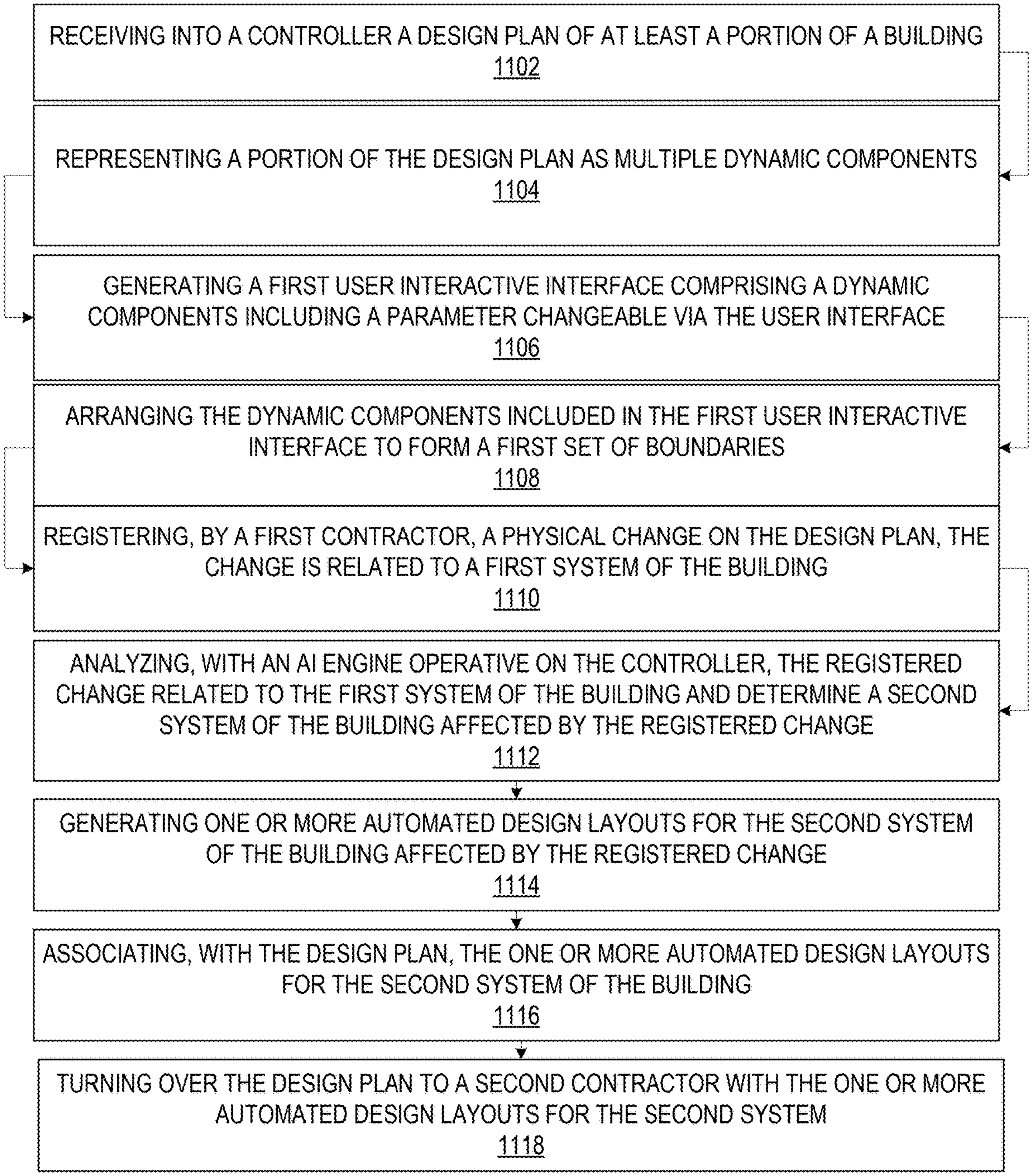
FIG. 11 illustrates additional method steps that may be executed in some embodiments of the present invention.

Referring now to FIG. 11, it illustrates an exemplary flowchart depicting the method steps involved in updating and turning over a design plan during building construction or renovation, in accordance with the present invention. The process begins with receiving a design plan of a portion of a building into a controller, which represents the design as multiple dynamic components. The method involves the generation of a user interactive interface that allows contractors to register physical changes on the design plan. As a contractor makes adjustments related to one system of the building, such as plumbing or electrical, the controller's AI engine analyzes the impacts of the changes on other building systems. The system generates automated design layouts for any affected systems, facilitating that the design plan reflects all modifications. These updated design layouts are then associated with the primary design plan and turned over to the next contractor responsible for continuing construction, with all modifications and suggestions seamlessly integrated into the evolving design.

At step 1102, the process begins by receiving into a controller a design plan that represents at least a portion of the building that is either under construction or undergoing modification. The design plan can be in various file formats (e.g., DWG, DXF, PDF) and may originate from CAD or BIM software, representing various building systems such as structural layouts, electrical schematics, plumbing diagrams, or HVAC plans. This step may involve the system scanning or importing an existing floor plan or building schematic and analyzing the input for further processing. In one example, a contractor working on the foundation layout of a building submits the foundation's design plan to the system, which is then stored and processed by the controller to coordinate future updates or modifications related to this design.

At step 1104, the system then represents a portion of the design plan as multiple dynamic components. This step involves transforming the static elements of the design plan into dynamic, changeable components that can be manipulated, updated, or adjusted as construction progresses. These components may include but are not limited to doors, windows, beams, plumbing lines, or electrical circuits, each of which has parameters that are modifiable via the user interface. For example, a window may be represented as a dynamic component with properties such as height, width, material, and position. The dynamic nature of the components allows contractors to register changes as they occur in the field, so that the design plan accurately reflects the physical construction.

At step 1106, the system generates a first user interactive interface comprising the dynamic components that were created in step 1104. The user interface allows contractors and other authorized users to interact with the design plan directly. Each dynamic component includes a parameter that can be changed via the interface. For example, a contractor responsible for installing HVAC systems can select an air duct component and adjust its dimensions, position, or connection points. The system may provide various tools for drag-and-drop actions, manual drawing, or detailed data input fields where the user can adjust dimensions and attributes of each component. This interactivity simplifies how contractors modify the design plan to reflect real-time changes during the construction phase.

At step 1108, the dynamic components included in the interactive user interface are arranged to form a first set of boundaries. These boundaries may define physical spaces such as rooms, walls, or structural sections. The boundaries are important because they dictate how the various components interact with each other in the design plan. For example, if a contractor adds a new partition wall, the boundaries of that room are adjusted to account for the wall's location and height. Each boundary has its own attributes and can affect how other dynamic components, like doorways or windows, are placed or adjusted. The system may calculate these boundaries based on the user's inputs, facilitating that all components fit cohesively within the design framework.

At step 1110, a first contractor working on the building registers a physical change on the design plan. The change may be related to a first system of the building, which could be the structural layout, plumbing system, electrical system, or HVAC network. For example, a contractor installing plumbing lines may modify the position of a sink or add new water supply lines. The system logs these modifications, registering them as new data points on the design plan. The contractor can select a spot on the plan, input the change details, and the system will update the plan accordingly. This real-time updating allows all stakeholders, including future contractors, to work with the most up-to-date version of the plan.

At step 1112, the controller, which operates an AI engine and/or GAN engine, analyzes the registered change to the first system of the building and determines whether the change affects a second system of the building. This is an important step because many systems in a building are interconnected. For example, if the first system involves shifting the location of a water pipe (a plumbing change), the second system, such as electrical wiring, may also need to be adjusted to prevent interference or overlap. The controller scans the design plan, analyzes how the new component impacts the surrounding components, and flags any issues that require attention.

At step 1114, based on the analysis in step 1112, the controller generates one or more automated design layouts for the second system affected by the registered change. For example, if moving a plumbing pipe requires relocating electrical conduits, the controller will automatically create an updated electrical layout that reflects the necessary adjustments. This automated feature saves time and reduces human error, as it eliminates the need for manual re-design of interdependent systems. The generated design layouts are stored and associated with the primary design plan, so that all changes are centrally tracked.

At step 1116, the system associates the automated design layouts for the second system with the overall design plan. This means that any time a change is made to the primary design, the related systems are also updated and linked, creating a comprehensive and cohesive view of the building's design. For example, if a contractor updates the HVAC system layout, the associated electrical wiring and plumbing configurations are either automatically adjusted to reflect these changes or linked as automatically generated design layouts. These layouts are integrated with the design plan or specifically associated with the portion of the plan where the change was registered. This allows the next contractor responsible for electrical or plumbing work to easily reference the updated information, facilitating that all interdependent systems remain coordinated and reducing the potential for conflicts or misalignment during subsequent construction phases.

At step 1118, the system turns over the updated design plan to the second contractor responsible for the next phase of construction. For example, if the first contractor was working on plumbing, the updated design plan, along with any automated layouts, is now provided to the electrical contractor so they can proceed with the next set of tasks. The turnover process is important for maintaining communication between different teams working on the same building project, allowing each contractor to work from the most recent, accurate version of the design plan. In some cases, the system may provide access to a revision history, so the second contractor can review any changes made and understand their implications before proceeding with their work.

In the context of the present invention, architectural features may also refer to the core elements of a building's design that define its structural, aesthetic, and functional characteristics. These features include fundamental components such as load-bearing walls, columns, beams, and floors, which provide the required structural support for the building. Roofs and ceilings, as part of the architectural features, define the upper boundary of the space, contributing to both protection from environmental factors and the overall aesthetic. Windows and doors, though part of design elements, are also considered architectural features due to their impact on light, ventilation, access, and exterior appearance. Staircases, balconies, and terraces are additional architectural features that connect different levels or offer outdoor space. Building facades, whether decorative or functional, contribute to the exterior identity of the structure. Features like arches, cornices, pilasters, and moldings add to the architectural style, while materials such as glass, concrete, wood, or brick define the texture and durability of the building. Skylights, courtyards, and atriums introduce natural light and openness to the interior design. Additionally, specialized features such as domes, spires, or overhangs may reflect cultural or regional influences, while HVAC systems, ductwork, and mechanical shafts integrate the building's functional needs. These architectural features work together to create both the physical integrity and visual coherence of the design plan, which the system evaluates and modifies to optimize performance, user preferences, and compliance with design considerations.

Some embodiments of the present invention enable the collaborative platform to serve not just as a static repository of design plans but as a dynamic, intelligent system that guides users through the annotation process, helps maintain compliance, and facilitates a more efficient design workflow. For example, upon selecting a staircase element (design element), the system may suggest annotations regarding tread depth standards, highlight potential accessibility issues, or even propose alternative designs that are better suited to the overall building layout. This intelligent guidance may serve to streamline the collaborative process, making the system invaluable to architects, engineers, and other stakeholders involved in the design and building process.

In some embodiments of the present invention, the system's capabilities extend beyond the creation and management of annotations within design plans. The AI engine, through an integrated and responsive user interface, may offer intelligent equipment recommendations based on selected design elements, annotations context, or modifications within the design plan.

Upon selection of a design element for annotation or modification, the AI engine may analyze the context and specifics of the change, such as the function of the space, dimensions of the design element, or materials specified in annotations. Leveraging this information, the AI may then suggest equipment(s) that is optimally compatible with the design requirements. These suggestions may include a variety of equipment(s) from different brands, along with detailed pricing information.

The system may also integrate with third-party vendor databases to pull real-time pricing and availability data, providing users with a possible comprehensive shopping experience within the platform. Users can review these recommendations, compare options, and even access reviews or ratings within the same interface.

For example, if a user annotates a design element to convert a space into a high-traffic area, the AI engine may recommend durable flooring options available from specific brands and present the cost implications directly within the interface. If the annotation specifies the need for an eco-friendly HVAC system, the system may suggest several models that meet the latest environmental standards, complete with efficiency ratings and prices.

Moreover, the platform may also offer a feature to directly add the recommended equipment to a virtual cart, facilitating immediate or later purchases. The platform may also automatically update a takeoff, material list, workforce requirements, project budget or other related project aspect. Platform integration into such associated functions may streamline bidding, procurement, labor engagement, supply chain, and other related processes, facilitating project planning and execution phases that are closely aligned. Required resources may be accounted for and procured efficiently.

Figure 12:
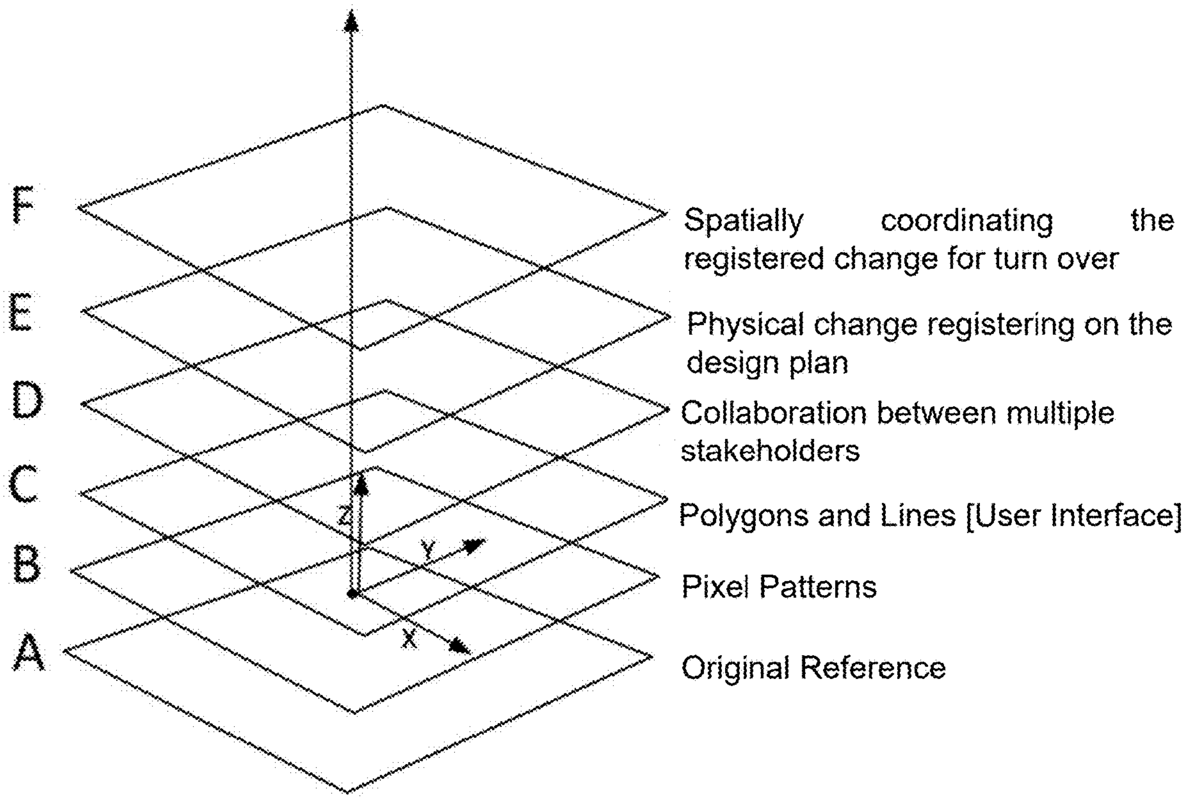
FIG. 12 illustrates a conceptual framework showing multiple layers involved in the AI-powered collaborative system for registering physical changes on a design plan in accordance with the present invention.

Referring now to FIG. 12, it illustrates a multi-layered conceptual framework for registering, analyzing, and refining changes made on a design plan during the construction or renovation of a building, in accordance with the present invention. The layers A through F represent different stages and processes that occur when physical modifications are registered on the design plan, using an AI-powered system for real-time collaboration and spatial coordination.

At Level A, the system receives the original reference—which could be a two-dimensional architectural drawing, a CAD file, or any form of design input representing the building or a portion of it. This reference serves as the foundational layer for all further analyses and registered modifications. The design plan is processed to prepare it for manipulation and interpretation by the controller, allowing contractors and other stakeholders to make changes during construction. For example, a contractor may upload a floor plan showing structural elements like walls and beams, serving as the reference point for future changes.

At Level B, the original reference is transformed into pixel patterns, allowing the system's AI engine to interpret and process the finer details of the design plan. The pixel patterns enable the system to identify the spatial configuration of the building, such as rooms, fixtures, and boundaries. This transformation facilitates the system's ability to recognize and analyze even minute changes that may affect the overall structure. For example, the AI engine may detect windows, doorways, or other structural elements, converting them into actionable data for further analysis.

At Level C, the system organizes these pixel patterns into polygons and lines within the user interface, creating dynamic and interactive components that users can manipulate. These components represent the physical features of the building, such as walls, windows, or appliances, and are fully adjustable by contractors. A contractor may, for instance, drag and drop a window onto a wall, and the system may recognize this as a dynamic component subject to further analysis. The interactive nature of the user interface allows stakeholders to interact directly with the design plan, making required adjustments as construction progresses.

At Level D, the system supports collaboration between multiple stakeholders by allowing real-time updates and modifications from different contractors working on various parts of the building. For example, a plumbing contractor and an electrician can make simultaneous changes to their respective areas of the design plan. These modifications are instantly synchronized across the system, facilitating that all contractors are working with the most up-to-date design. This layer greatly enhances collaboration, as any change in one part of the design plan that affects other systems is automatically reflected for all users involved.

At Level E, the system coordinates physical change registering on the design plan, providing a comprehensive spatial overview of how registered changes impact other parts of the building. The controller analyzes these modifications, detecting any conflicts between systems such as HVAC, electrical, or plumbing, and provides automated suggestions or warnings. For example, adding a new window in a room might affect electrical wiring or ductwork, and the system would flag these areas for further review. The registered changes are spatially coordinated so that all elements remain aligned with the overall design goals.

At Level F, the system focuses on spatially coordinating the registered change for turnover to other contractors or stakeholders. The controller, using its AI and GAN engines, facilitates that each registered change is fully integrated into the design plan before it is passed on to the next party responsible for subsequent work on the building, or finally to the client. For example, after an HVAC contractor registers a change, the design plan is updated and turned over to the electrical contractor, who can then proceed with their work based on the modified layout. The spatial coordination between different elements and systems is maintained throughout the construction process, reducing errors and inefficiencies during turnover.

The conceptual layers described in FIG. 12 provide a robust framework for efficiently managing design plan modifications during construction, enabling seamless collaboration, real-time updates, and automated suggestions for resolving any conflicts between systems.

Figure 13:
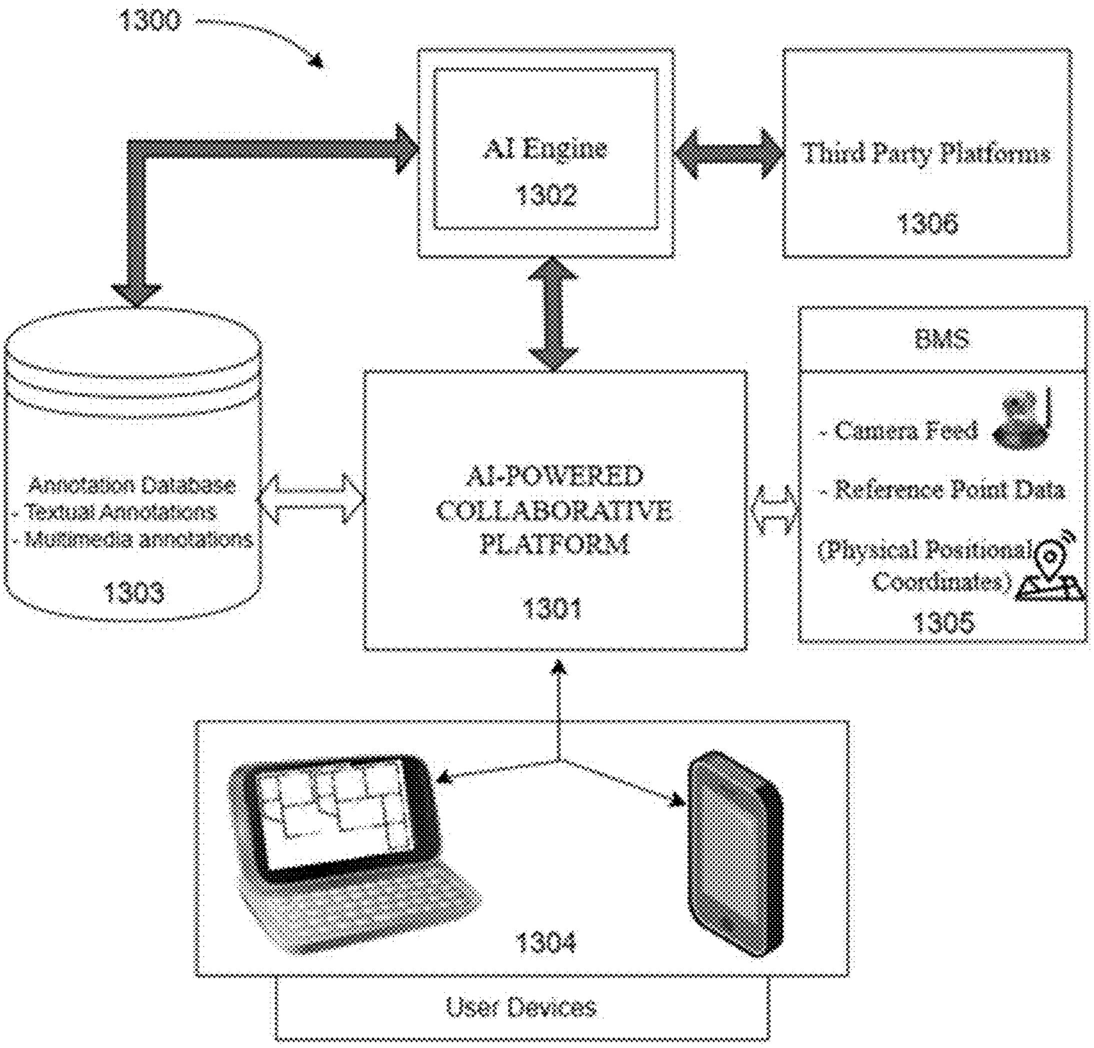
FIG. 13 illustrates an exemplary AI-powered system in accordance with the present invention.

FIG. 13 illustrates an exemplary system 1300 which constitutes an AI-powered collaborative platform 1301 that integrates various data sources, user devices, and building management systems (BMS 1305) to automatically register physical changes on a design plan based on live inputs from the construction site. The AI engine 1302 processes data and provides automated analysis for compliance, conflict resolution, and future predictive changes.

The platform 1301 operates by interfacing with an Annotation Database 1303, which stores textual annotations, multimedia annotations (e.g., images, videos), and other details related to the building design plan and physical changes registered to the design plan. Annotation Database 1303 may also store compliance logs, which register updates related to physical changes at the construction site that have been automatically captured by cameras (shown in BMS 1305) installed on the site. These annotations help in both real-time monitoring and reviewing changes made by various contractors.

The AI-powered collaborative platform 1301 receives live data from the Building Management System (BMS) 1305, which may include camera feeds and reference point data from cameras or sensors installed at the construction site. These live feeds are used to detect and automatically register any physical changes made to the building. For example, if a contractor physically adds a new column or adjusts the size of a window, the camera integrated into BMS 1305 detects this alteration. The AI engine 1302 may then automatically updates the design plan on the platform 1301 to reflect the new physical change, aligning it with real-world coordinates based on reference point data provided by the BMS 1305.

The AI engine 1302 also interfaces with third-party platforms 1306, such as databases of building objectives, material sourcing platforms, or construction industry compliance systems. This integration allows the system 1300 to generate real-time, automated suggestions when physical changes are registered. For example, if the live feed from the BMS 1305 detects that a contractor has added a wall or a new fixture, the AI engine 1302 checks for compliance with relevant design considerations (e.g., fire safety, electrical layout compatibility). In case of non-compliance, the platform 1301 generates warnings and suggests alternate solutions to bring the physical construction in line with regulatory requirements.

The system 1300 is operated and accessed via user devices 1304, which may include tablets, smartphones, or laptops. These devices allow contractors or authorized personnel to monitor changes being registered in real-time through the AI-powered collaborative platform 1301. For example, a contractor at the site can receive an alert on their tablet when the live camera feed registers a physical change, such as the addition of a door. The contractor can verify or adjust the registered change by interacting with the design plan on their device. This live interaction between the physical construction site and the digital design plan increases accuracy and decreases the chances of errors in updating the design plan.

An example of how this system works: A contractor installs a new window at the construction site, which is captured by the live camera feed through the BMS 1305. The platform 1301 automatically registers the window's addition on the digital design plan, updating the layout and adjusting surrounding systems, such as electrical wiring or HVAC, based on the location of the window. The contractor can then review the automatically updated design plan on their tablet device 1304, confirming or making further changes as required.

In some embodiments of the present invention, the system 1300, with its live camera feed integration via the BMS 1305, may automatically register changes on the digital design plan based on real-time visuals from the construction site. However, due to limitations such as lighting conditions, camera angles, obstructions, or environmental factors, the automatically registered change might not be fully accurate. For example, if a new fixture like a small duct or minor structural element is partially obscured or shadowed in the camera feed, the AI engine 1302 may register an approximate change in the design plan without exact details or dimensions. Similarly, movements or visual interferences around a construction site may cause the system to interpret objects or structural modifications imprecisely.

When the system 1300 registers such automated changes, it may flag these modifications on the digital design plan with a distinct marking or icon to indicate that they were captured automatically and may require verification or further input. This marking serves as a prompt to the contractor, facilitating that they are aware of any approximations or pending details. For example, if a wall's exact position or a window's dimensions are not accurately reflected, the system 1300 may display a note or icon over that component, signaling to the contractor that further details are recommended to make the registration complete and precise.

This approach is advantageous as it reduces the cognitive load on the contractor, allowing them to focus on the physical construction without constantly monitoring and logging every change. Later, when the contractor has time, they can review these flagged changes, adjust dimensions to precisely match the actual installation, and provide supplementary information such as warranty details, maintenance schedules, material types, or supplier details. The system 1300 may also send periodic reminders or pop-ups to the contractor's device, asking if they would like to confirm or correct these auto-registered entries.

For example, suppose a contractor installs a custom-sized column that is detected by the system 1300 as a generic structural element. The system 1300 may automatically register this column on the design plan but leave a note for the contractor to confirm the exact dimensions, load-bearing capacity, and specific materials used. The contractor can later update these specifics, so that the design plan aligns accurately with the physical structure.

Moreover, the system 1300 may provide an option to view a summary of all automated registrations for review, offering contractors a consolidated list of flagged elements. By using this feature, contractors can efficiently address all pending registrations at once, so that the digital plan is accurate without interrupting their workflow. This functionality enhances the practicality of automated registration, making it a valuable tool for on-site management while maintaining high fidelity in the digital representation of the ongoing construction.

Furthermore, as users interact with the design plan through their devices, the AI Engine 1302 can learn their preferences, for example, automatically suggesting a particular brand of fixtures known to meet the user's quality standards or cost targets, based on previous selections stored in third party platforms 1306.

Moreover, the system can be integrated with augmented reality (AR), where a user points their device at a space, and the AR overlays the digital annotations and design elements onto the live camera feed, allowing for an immersive and interactive experience.

In some embodiments of the present invention, the system may further encompass an advanced cost estimation and vendor integration module. This module is designed to provide users with an extensive analysis of the total costs associated with the installation of equipment, the required labor count, and the associated labor costs. Upon the selection and annotation of design elements that necessitate equipment installations or modifications, the AI engine comprehensively evaluates the scope of work and calculates an estimated cost.

The AI engine may tap into a database (including from third-party platforms) of historical installation costs, labor rates, and time-to-completion metrics to predict the overall expenses. It may factor in current market trends, seasonal labor availability, and even regional economic conditions to enhance the accuracy of the estimation.

For a more competitive and economical approach, the system may include a feature that facilitates the integration of multiple vendor platforms, enabling a bidding process for the contract of work. Users can submit a portion of the design plan along with specifications and annotations to a network of potential contractors and vendors who, in turn, can provide their quotes directly through the platform.

Additionally, the system may offer a project timeline simulation based on the selected equipment and labor projections, allowing users to visualize the potential project flow and make informed decisions about scheduling and resource allocation.

In a more advanced implementation, the system may also integrate with electronic procurement and project management tools, automating the process of request for proposals (RFPs), bid collection, and contract management. It may also feature smart alerts for users when bids are received, or deadlines for bid submission are approaching.

Furthermore, the system may provide a sustainability index score by analyzing the selected equipment and materials against environmental standards, giving users insight into the environmental impact of their choices and the potential for green building certifications.

By encompassing these features, the embodiment underscores the platform's role not just as a design tool but as an integral component of the project management ecosystem, streamlining workflows from conceptual design to the final stages of construction and installation.

Figure 14A:
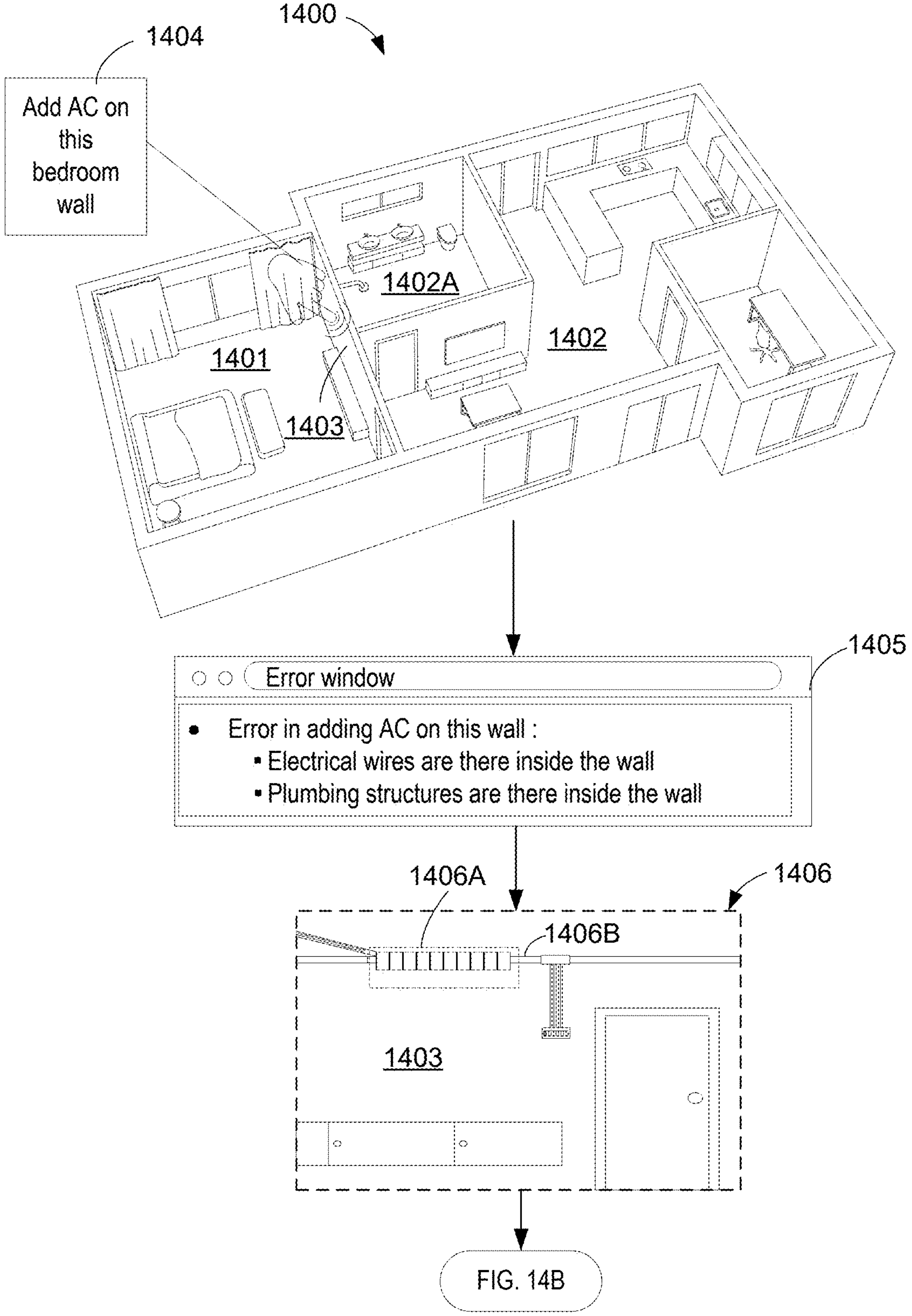
FIGS. 14A-14B illustrates an exemplary design plan turned over to a contractor or client in accordance with the present invention.

Referring now to FIG. 14A, it illustrates an exemplary design plan 1400 which has been turned over to either a contractor or one or more clients in accordance with the present invention. The design plan 1400 represents a portion of a building that has undergone initial structural construction and is now ready for additional modifications or installations by subsequent contractors or by occupants. The design plan 1400 comprises a first space 1401, designated as a bedroom, and a second space 1402, which includes an attached washroom 1403. In some embodiments, space 1401 and space 1402 may represent distinct units or rooms owned or managed by different individuals. For example, in a rental apartment scenario, space 1401 could belong to a first tenant, while space 1402 belongs to a second tenant. In other embodiments, these spaces may be assigned to different contractors responsible for separate aspects of the project, such as interior finishing or electrical work.

In one embodiment, the design plan 1400 may be turned over in its entirety to both the first user (e.g., the occupant or contractor responsible for space 1401) and the second user (occupant or contractor for space 1402). Providing both users with the comprehensive design plan 1400 allows each party to be fully informed about all current installations, structural layouts, and existing elements within the shared building. This comprehensive handover is particularly beneficial for users who may wish to undertake modifications or installations within their designated areas. By having full visibility into the design plan 1400, users can evaluate how changes in their designated space may impact adjoining spaces, thus promoting coordinated decision-making. For example, if the first user in space 1401 intends to install heavy fixtures or modify the wall structure, they can assess if these changes will impact space 1402 or interfere with the second user's setup.

Alternatively, in other embodiments, the design plan 1400 may be divided and turned over to users based solely on their specific area of responsibility or ownership. In this configuration, the layout of space 1401 may exclusively be shared with the first user, and the layout of space 1402 may exclusively be shared with the second user. This segmented approach can be advantageous in maintaining privacy, especially in multi-tenant buildings or cooperative spaces where occupants may not need to or want to be aware of the structural specifics behind their walls. By limiting the visibility to each user's respective space, the system supports individualized control over modifications, reducing concerns about privacy or unauthorized access to structural details.

However, such segmented distribution can introduce challenges when modifications in one area may impact another. For example, if the first user in space 1401 decides to install an air conditioning (AC) unit on a shared wall 1403 that separates space 1401 and space 1402, they may not realize that this installation could impact the infrastructure of space 1402. Before making any physical alterations, the first user (either a subcontractor or a client) can select a spot on wall 1403 within space 1401, initiating a pop-up query 1404 from the system. This pop-up window 1404 prompts the first user to specify the intended modification—in this case, the installation of an AC unit.

Upon receiving this input, the controller within the present system initiates an analysis to assess the feasibility of the requested modification and identify any potential impacts on space 1402. This assessment may be helpful in shared buildings where structural changes may have cross-sectional implications. In this example, if the installation of an AC on wall 1403 is determined to interfere with elements in space 1402, such as electrical wiring or plumbing conduits, the controller triggers a warning notification 1405 to inform the first user of the potential issue. The warning window 1405 may include detailed information on the infrastructure within wall 1403, alerting the first user to hidden elements such as electrical wires or plumbing structures that could be compromised by the AC installation.

To provide further clarity, the controller may generate a visual representation of the impacted elements, such as an electrical design layout 1406, which reveals the specific configurations within wall 1403. In this example, the layout 1406 includes representations of wiring paths 1406A and 1406B, visually highlighting the locations of electrical conduits that the first user should avoid when installing the AC. By displaying this wiring layout, the controller offers the first user precise guidance on areas to avoid or modify, thereby reducing the likelihood of accidental interference with the electrical system in space 1402.

This embodiment may particularly be advantageous for contractors or users unfamiliar with the hidden infrastructure within walls, as it mitigates risks associated with blind installations. For example, the first user might have assumed that wall 1403 was clear of obstructions, unaware that the electrical system for space 1402 runs through this partition. By providing detailed infrastructure layouts and warnings, the system effectively bridges the knowledge gap, enabling users to make informed decisions while safeguarding the structural integrity of adjacent spaces.

In some cases, the system may offer additional suggestions or alternative solutions. For example, if wall 1403 is deemed unsuitable for the AC installation due to electrical constraints, the controller may recommend alternative walls within space 1401 where the AC could be installed without interference. Alternatively, the system may suggest repositioning the AC unit on wall 1403 at a height or location that minimizes impact on the wiring paths 1406A and 1406B.

In embodiments where multiple users or contractors work on adjacent spaces, the system facilitates collaborative planning and coordinated modifications. For example, if the second user in space 1402 also plans to install fixtures on their side of wall 1403, the system can notify both users of each other's planned modifications. This notification allows them to coordinate installation points and prevent conflicts, such as overlapping electrical installations or mutually obstructive placements.

The system's capacity to analyze potential issues and provide infrastructure visualizations facilitates that all modifications are performed with a clear understanding of structural limitations. Additionally, by automating the warning and suggestion process, the system minimizes the need for manual inspections or expert consultations, streamlining the planning process and reducing overall project time. Once the first user has reviewed the warning and adjusted their installation plans accordingly, they can proceed with the AC installation, confident that their actions are aligned with the system's assessments.

In some embodiments, the system can save all interactions and warnings related to such installations as part of the digital design plan history. This history serves as a reference for future occupants, contractors, or inspectors, enabling them to understand prior modifications and identify potential areas of concern. For example, if a future user intends to upgrade the AC unit in space 1401, they can review past warnings related to wall 1403 and determine the safest way to implement their upgrades without disrupting existing electrical configurations. In such cases where the history of warnings is associated with the design plan 1400 or with the selected spot or wall 1403, the controller may not need to re-analyze the impact of similar changes required in space 1401, thereby streamlining future modifications. For example, if another contractor or occupant later decides to add an additional fixture or make similar adjustments on wall 1403, the controller can instantly retrieve the previous analysis, warnings, and suggestions from the historical log. This process saves time and computational resources by eliminating redundant assessments, allowing the system to prompt the user with previously identified risks, constraints, and solutions relevant to that particular wall. Furthermore, the history log can also serve as a compliance record, providing future contractors and inspectors with a documented rationale for the design constraints associated with wall 1403, thereby facilitating that all parties are informed of potential issues based on past interactions with that structural element.

Figure 14B:
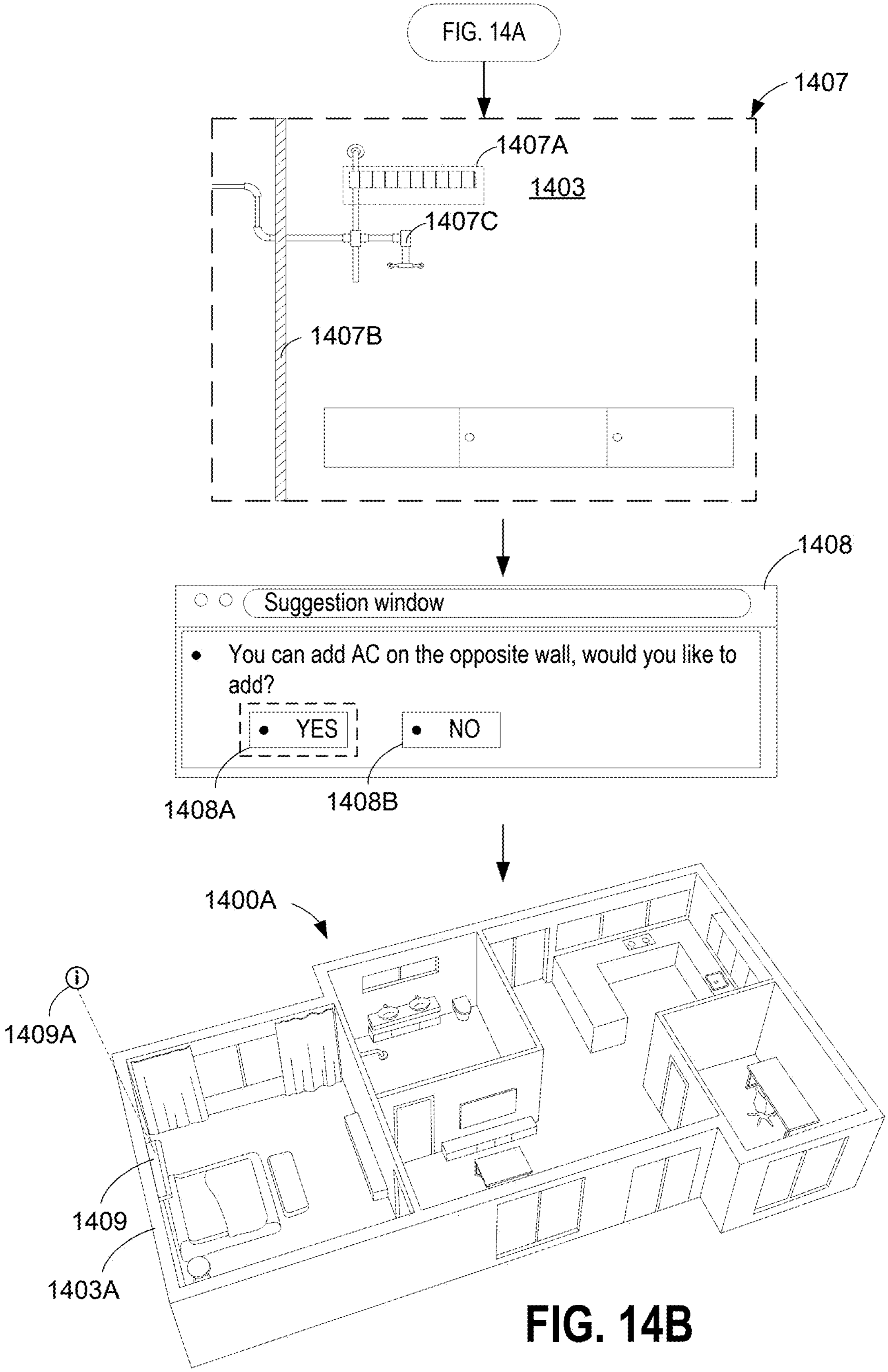

Referring now to FIG. 14B, the figure illustrates additional functionalities of the controller in managing and suggesting modifications for the design plan 1400. Continuing from the scenario in FIG. 14A, where the user initially intended to install an AC on wall 1403, the controller may identify additional complications due to the presence of both electrical wiring and plumbing structures behind the wall 1403. In particular, the shared wall 1403 in FIG. 14B may also include a plumbing layout 1407 due to the proximity of bathroom 1402A, which is located on the opposite side of the wall 1403. The plumbing layout 1407 consists of plumbing structures 1407A, 1407B, and 1407C, which might be pipes, drains, or water supply lines integrated within the wall 1403. This layout 1407 makes it challenging to install additional fixtures like an AC without interfering with the embedded plumbing network.

Recognizing this constraint, the controller may provide an automated suggestion window 1408 with an alternative. Rather than prompting the user to attempt the installation on wall 1403, the controller recommends an alternative wall 1403A. The suggestion window 1408 may display a prompt with options 1408A ("YES") and 1408B ("NO"). If the user selects option 1408A ("YES"), the controller not only registers the decision to install the AC on wall 1403A but may also perform real-time adjustments to reflect this choice in the updated design plan 1400A.

With this decision, the controller assists the user by virtually placing the AC unit 1409 on the designated wall 1403A. To facilitate tracking and future reference, the controller generates a change indicator 1409A on the updated design plan 1400A. This change indicator 1409A serves as a marker, visibly denoting that an AC unit (1409) has been installed on wall 1403A. Such indicators are helpful in complex construction or renovation projects where multiple contractors or future occupants might need to make additional modifications to the structure. The presence of change indicator 1409A helps subsequent users understand that an AC unit (1409) has been added, preventing accidental damage or interference with the AC unit 1409 during future alterations.

The inclusion of the change indicator 1409A also allows the controller to account for this addition in any subsequent analyses or suggestions involving wall 1403A. For example, if another contractor in the future decides to install shelving, ductwork, or another appliance on the opposite side of wall 1403A, the controller would be able to recognize the presence of the newly installed AC unit 1409 and advise against any modifications that might affect it. Furthermore, this setup allows the controller to conduct a contextual compliance check before suggesting new changes, as it can retrieve historical records of previously registered alterations, such as the installation of AC unit 1409.

In some embodiments, the controller's suggestion feature, as demonstrated in suggestion window 1408, may incorporate additional information about potential benefits of selecting wall 1403A over wall 1403, such as enhanced ventilation or easier access for maintenance. This feature thus goes beyond mere change registration, actively guiding users to make informed, context-aware decisions during the design process.

Figure 15:
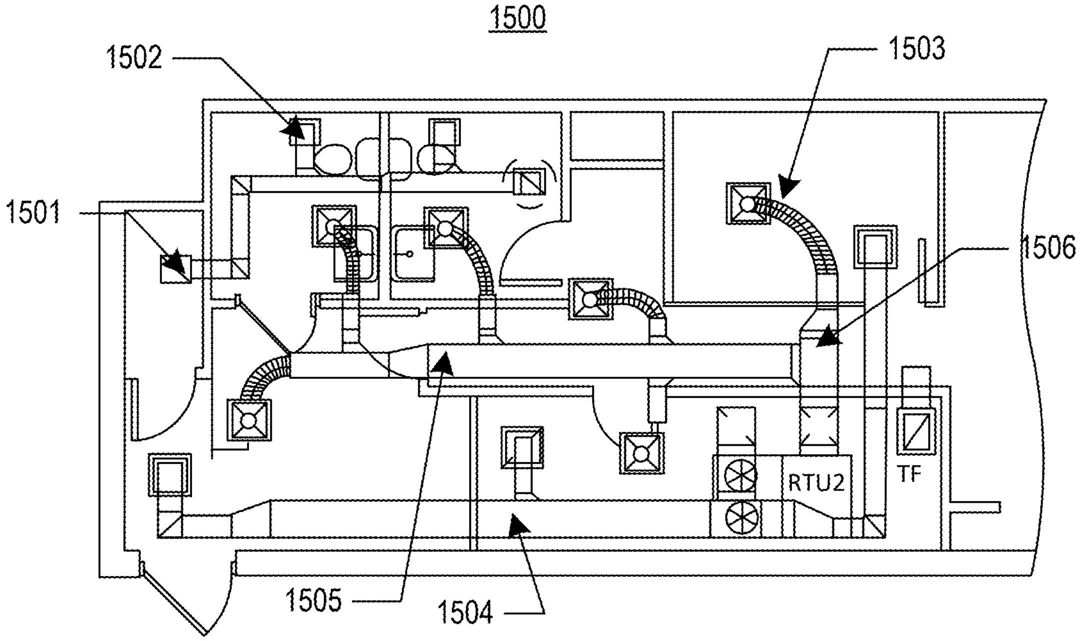
FIG. 15 illustrates an exemplary HVAC design plan for registering changes in HVAC system, and analyzing impacts on or by HVAC layout during change registration.

Referring now to FIG. 15, the figure illustrates an exemplary HVAC layout 1500 for a building, showing various airflow paths 1501 through 1506, which represent different components and directions of airflow within the HVAC system. In the context of the present invention, the HVAC layout 1500 is not only a representation of the airflow system but also serves as an interactive design component that can be modified, updated, and analyzed in response to user-registered changes or construction adjustments occurring in other parts of the building. The system, utilizing an AI engine and collaborative platform, enables contractors and users to register changes to the HVAC layout 1500 and analyze how these modifications impact other interconnected systems, so that the HVAC layout remains responsive to the dynamic construction environment.

For example, airflow path 1505 may represent the main supply duct delivering air to various zones of the building. If a contractor decides to relocate a wall or add a new partition in one of these zones, the system may prompt an analysis to assess how such changes might obstruct or alter the efficiency of airflow path 1505. The system may suggest adjusting the path to accommodate the new room layout, which may involve rerouting the duct or increasing the duct size to maintain proper air distribution. This interactive approach allows for real-time feedback and facilitates that any physical alterations in the building structure are met with a corresponding and necessary modification in the HVAC design.

In another embodiment, the airflow path 1502 may represent the return air duct responsible for drawing air back to the central HVAC unit. If a registered change affects the room configurations or the volume of air in specific zones, the AI-powered system may automatically prompt the user to consider resizing or repositioning airflow path 1502 to meet the new requirements. For example, if an additional room is created by splitting an existing one, the HVAC system will need to handle the increased load effectively. The system can analyze this requirement and suggest adding extra return ducts or increasing the size of the existing return duct for better circulation.

Airflow path 1503 may involve the routing of cooled air to spaces where temperature control is required, such as server rooms or high-traffic areas. If the user registers a change indicating an increase in equipment load or a higher occupancy rate in these areas, the controller will analyze the potential impact on the cooling requirements. In response, it may recommend adjustments to the path, like augmenting the duct diameter, enhancing insulation, or introducing additional cooling vents. This proactive approach minimizes the risk of inadequate cooling capacity and provides targeted solutions based on the specific requirements of each zone within the building.

Similarly, airflow paths like 1501 and 1504 can represent dedicated ventilation paths for spaces that need continuous airflow, such as bathrooms or storage rooms. In cases where these areas undergo modification, such as adding walls or altering layouts, the system evaluates how these changes impact the HVAC system's efficiency. For example, if a bathroom is expanded, the AI engine may determine that the existing ventilation capacity is insufficient and may propose resizing airflow path 1504 or incorporating an additional vent to enhance air quality and odor control. Such functionality facilitates that the HVAC design remains in harmony with the architectural changes made during construction or renovation.

Airflow path 1506 may be specific to heating needs in colder climates, where warmer air is circulated to maintain comfort levels. If the user registers a change that impacts insulation or introduces an external-facing wall, the system will analyze the effect on heating efficiency and propose adaptations. This may involve rerouting the path 1506 to avoid heat loss areas or increasing the airflow volume to compensate for potential temperature drops. The AI engine can even simulate the heating patterns based on these adjustments to provide the user with a clear understanding of how the changes will impact energy efficiency and comfort.

The collaborative platform also enables different stakeholders, including HVAC technicians, architects, and contractors, to work together on the HVAC layout. For example, if one team registers a change that requires adjusting airflow path 1501, the system will notify other stakeholders, such as electrical or plumbing contractors, to consider how these adjustments might affect their layouts. This integrated approach minimizes conflicts between systems, fostering a more seamless construction process. The system can also store these collaborative inputs, creating a record of adjustments that can be valuable for future maintenance or renovation projects.

Moreover, compliance with design considerations and HVAC standards may also be integrated into the analysis of each airflow path (1501-1506). For example, when a user attempts to modify airflow path 1504 in a way that may violate airflow regulations in commercial spaces, the system will alert the user and suggest compliant alternatives. This regulatory guidance is particularly helpful in determining if complex HVAC modifications are in line with health and safety standards, energy efficiency goals, and environmental guidelines. This automated compliance check reduces the likelihood of errors that may arise from manual code checks, thus streamlining the approval process.

In addition, the system's ability to register changes in HVAC layouts provides predictive analysis capabilities. For example, the system can monitor changes over time, learning from past modifications and suggesting proactive measures. If the system detects a trend where airflow path 1502 frequently needs resizing due to space adjustments, it can anticipate similar needs for future projects and offer suggestions accordingly. This predictive approach enables users to adopt best practices and anticipate HVAC requirements before construction even begins.

Furthermore, the AI-powered system allows users to query potential modifications to the HVAC layout based on anticipated changes in building usage. For example, if the building owner plans to repurpose a section of the building, they can input these intended changes, and the system will project the impact on airflow paths 1501-1506. The AI engine can then provide suggestions on how to reconfigure the HVAC layout to suit the new usage, taking into account factors such as occupancy levels, room dimensions, and ventilation requirements.

Additionally, the system can simulate how external weather conditions will affect the internal HVAC system based on the building's geographical location. For example, if path 1501 is exposed to outdoor walls, the system can predict seasonal temperature fluctuations and propose insulation enhancements or path rerouting to minimize energy loss. These simulations allow the user to adopt a preventive approach, where adjustments are made ahead of seasonal changes, optimizing the building's overall energy efficiency.

Figure 16:
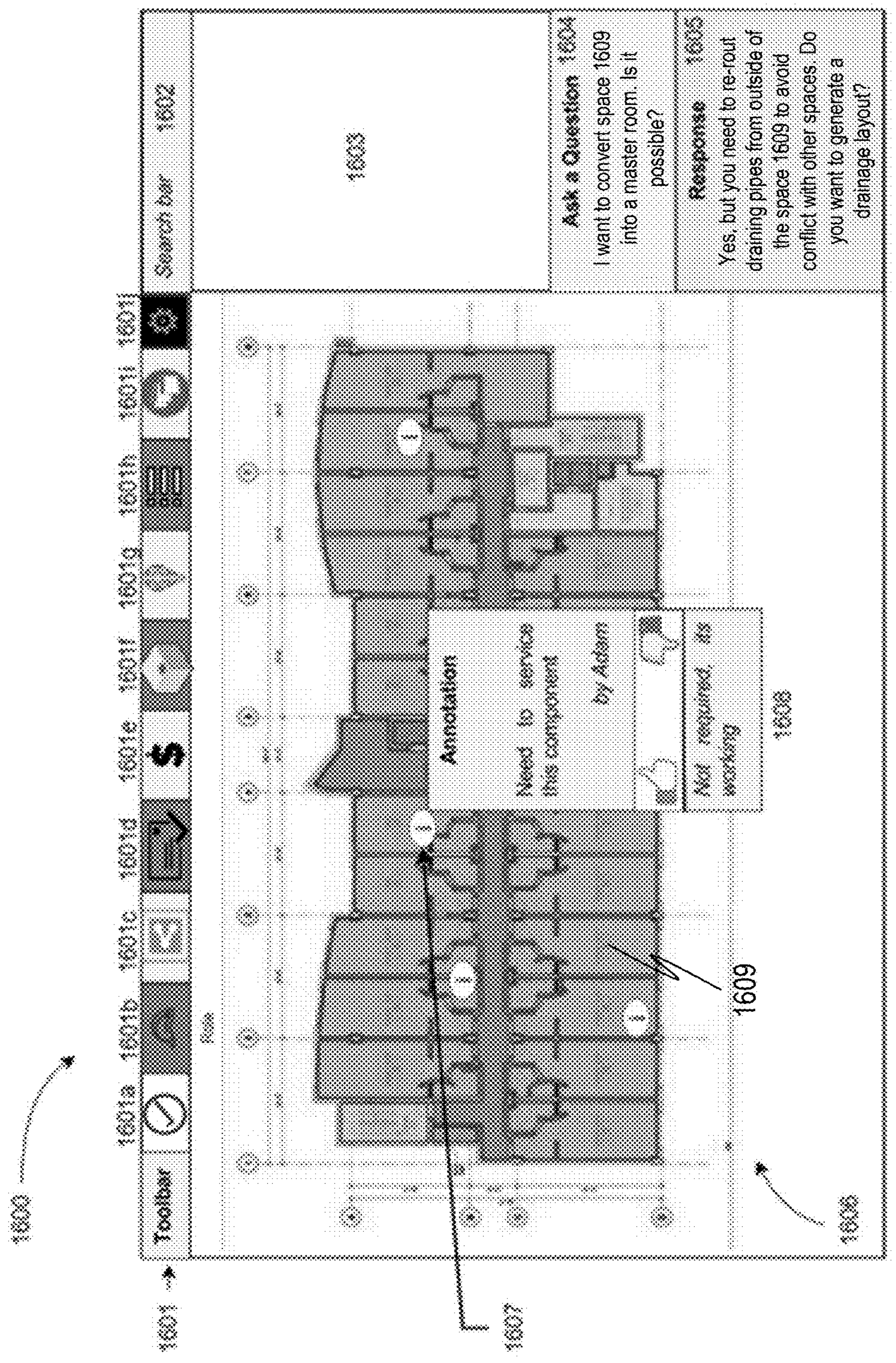
FIG. 16 illustrates an exemplary interactive user interface allowing users to interact with a design plan, ask questions, and search within the design plan in some embodiments of the AI-based collaborative system of the present invention.

Referring now to FIG. 16, an exemplary interactive and collaborative user interface 1600 of the present invention is shown, which is designed to streamline the process of change registration, communication, and compliance tracking during construction and the post-turnover phase. The user interface 1600 enables both contractors during the construction phase and clients after the turnover of the design plan 1606 to interact with the layout and register changes, raise inquiries, or review modifications performed by different contractors. In this collaborative environment, each feature of the user interface 1600 is tailored to support real-time project management, compliance analysis, and information retrieval related to building components and modifications.

A toolbar 1601 provides a suite of tools 1601*a*-1601*j* that enhance project management capabilities. For example, tool 1601*a* allows users to select components on the design plan 1606, enabling a contractor to pinpoint specific areas for annotations or change registration. Tool 1601*b* reveals the roles and responsibilities assigned to team members, facilitating clear delegation and tracking of tasks. In a construction context, a project manager may use this tool to assign tasks to specific contractors or trades, facilitating that responsibilities are well-documented and easily accessible. This functionality also assists users post-turnover by identifying which contractor executed a particular modification or installation.

A question section 1604 provides a mechanism for users to inquire about specific changes or potential modifications to the building layout. A contractor or client may ask if it is feasible to convert space 1609 into a master room, and the system generates an automated response 1605 based on an analysis of relevant architectural and compliance constraints. For example, the system may advise that drainage pipes need to be rerouted for the conversion to be possible. The interface 1600 then offers an option to generate a suggested drainage layout if needed, demonstrating the system's ability to analyze and suggest feasible adjustments in real-time.

In addition to feasibility inquiries like converting a space, the question section 1604 of the interactive interface 1600 enables users to delve into multiple aspects of the building layout and construction history, facilitating a dynamic interaction with the system. For example, users can ask detailed questions about specific areas of the design, such as which contractor previously worked on certain modifications or if certain materials were used in a particular wall or floor. The system can respond with details such as contractor information, timestamps of registered changes, and even images or annotations linked to those changes, providing a comprehensive historical record for review.

Users may also inquire about compliance and safety requirements directly through 1604. For example, if a contractor is unsure whether adding a new window in space 1609 meets lighting or ventilation codes, the system can assess the layout's compliance against design considerations, identifying any potential issues and offering suggestions for code-compliant adjustments. Additionally, the question section 1604 enables users to ask about structural dependencies. If a client wants to remove a wall, they can query the system to verify if it is load-bearing, and the system can indicate structural requirements or suggest alternative solutions, such as reinforcing adjacent walls.

Moreover, the question section 1604 allows users to explore optimization suggestions, including cost-saving alternatives or energy-efficient modifications. A user might ask, for instance, if installing insulation in specific areas would impact the overall energy consumption. The system can analyze the layout in conjunction with environmental data and suggest placements for insulation or energy-efficient windows, effectively using AI-driven insights to support environmentally conscious decision-making.

A search bar 1602 further augments the collaborative interface by allowing users to quickly locate elements, such as walls that were recently modified or areas pending inspection. For example, a project manager may input "plumbing sections" and retrieve all related areas (within a search results section 1603) in need of attention, while a client may search for "windows" to confirm where changes were implemented. This search functionality may be enhanced with filters that enable users to narrow results by criteria such as installation date, modification history, or associated contractors. Such capabilities streamline project oversight, especially on large-scale or multi-phase constructions where tracking numerous design elements is challenging.

Annotations within the design plan 1606 are represented by annotation icons 1607, each linking to an annotation window 1608 that provides further context about registered changes. The annotation icons 1607 may also represent physical changes registered on the design plan 1606. In the case of an HVAC component marked for service, the annotation may display instructions left by the HVAC contractor, noting that service is currently functional. The system allows other contractors to view these annotations during their own modifications, preventing conflicts such as obstructing access to components that need regular servicing. Additionally, post-turnover clients can refer to these annotations to understand the status and maintenance needs of specific installations, aiding in long-term asset management.

The collaborative platform also includes a compliance check tool 1601*d*, which allows users to verify that modifications adhere to required building objectives and preferences. For example, if a contractor attempts to install a new structural element, this tool can review the proposed change against safety, accessibility, and zoning regulations. If a conflict is detected, such as a wall obstructing an emergency exit, the system issues a compliance warning and proposes adjustments to bring the layout in line with regulations. This feature reduces the risk of costly reworks and project delays by facilitating compliance checks at each stage of the construction process.

For financial oversight, tool 1601*e* handles cost management, offering real-time cost adjustments based on the modifications registered within the system. When a client decides to upgrade or change flooring materials, the tool recalculates material and labor costs instantly, providing a clear picture of the financial implications. This feature is particularly valuable during post-turnover, as clients can explore renovation or expansion scenarios within budget constraints. Procurement may also be integrated into this tool, enabling direct communication with vendors and seamless ordering of additional materials.

Further, another feature of the interface 1600 is 3D visualization 1601*f*, which allows users to view the design plan 1606 in three dimensions, enhancing spatial understanding. Coupled with real-time camera feeds from the construction site, this tool may enable virtual walkthroughs, where stakeholders can monitor progress remotely, assess spatial arrangements, and visualize completed sections against the 3D model. For example, an architect can verify that wall placements align with design considerations (e.g., 166 in FIG. 1G) by comparing the on-site view with the digital model, detecting any deviations that may impact future installations.

The system's AI engine 1601*g* continuously analyzes user interactions, learning from decisions and responses to provide more accurate suggestions. For example, if multiple users indicate that a specific layout adjustment improves airflow, the AI engine 1601*g* can suggest similar changes in future projects. Integration with third-party platforms 1601*h*, such as material suppliers and regulatory databases, enables automated sourcing of materials and streamlined compliance verification. A construction lead can request specific materials, such as soundproofing panels, and receive supplier options, estimated costs, and delivery timelines directly within the interface.

Tool 1601*i* serves as an annotation center, where users can review, respond to, and manage all annotations related to the project. Clients and contractors alike can use this tool to track modifications, so that every change is accounted for. Tool 1601*j* provides customization options, allowing users to tailor the interface layout, notification preferences, and role-based access, optimizing the user experience based on their specific project needs.

Tool 1601*c* provides a powerful sharing feature within the collaborative interface 1600, allowing users to distribute the latest version of the design plan 1606 to various stakeholders, including subcontractors or users post-turnover. Through this tool, a contractor can easily send an updated layout that reflects all registered changes, annotations, and compliance adjustments directly to a subcontractor responsible for a specific area of the project, or to a client after the construction phase has concluded. For example, if an electrical subcontractor is hired to make adjustments based on recent changes in the HVAC layout, they can receive the most current version of the design plan 1606 with marked airflow paths, wiring layouts, and any relevant annotations that might impact their work. Similarly, when the project is handed over to the client, tool 1601*c* allows for a streamlined turnover process, where the client receives a design plan that includes not only the final architectural layout but also embedded data on modifications, warranties, and service notes for each element. This capability fosters transparent communication and facilitates that every involved party is operating from the most accurate, up-to-date information, which is required for ongoing maintenance, future renovations, or compliance verification.

In some embodiments of the present invention, an AI-powered collaborative platform is provided for spatial annotation process within architectural and construction projects. Initially, a controller receives a detailed two-dimensional or three-dimensional static representation of a building's design plan. An AI engine, integral to this system, delves into the representation, identifying various architectural elements and their spatial arrangements as depicted through a complex pattern of pixels. This initial analysis lays the groundwork for an interactive user interface that showcases these elements, making them ready for user interaction and annotation.

Users engage with this interface, selecting design elements to annotate, thereby infusing the digital blueprint with valuable insights and specifications. The AI engine plays a pivotal role, determining the precise spatial coordinates of each annotated element, effectively bridging the gap between digital annotation and physical reality. These annotations are dynamically linked to their corresponding elements, facilitating real-time updates across the collaborative environment for all participants.

Further sophistication is introduced as the platform accommodates the movement of both digital and physical versions of design elements. When an element's position is adjusted within the building's layout or the actual construction site, its associated annotations are automatically realigned within the two-dimensional or three-dimensional static representation, maintaining an unwavering accuracy and relevance of the project documentation.

An innovative question-and-answer feature empowers users to inquire about various project aspects directly through the interface. Leveraging the latest data, including recent changes or updates, the AI engine responds with precise, automated answers, effectively serving as an intelligent assistant.

Through the integration of third-party platforms, the system extends its utility beyond mere annotation. It facilitates material procurement, compliance checks, and even labor hiring, streamlining project management tasks and facilitating adherence to relevant standards and regulations.

In some embodiments of the present invention, the method additionally comprises determining a scale of the components included in the design plan and/or generating a user interface including user interactive areas to change at least one of: a size and shape of at least one of the dynamic components, the dynamic components may include, by way of non-limiting example, one or more of: architectural features, polygons or arcuate shapes; regions, areas, spaces, travel paths, egress paths, dominance hierarchies, occupancy loads, doorways, stairs, or other portion of a design plan that may be modified.

In some embodiments, dynamic components may include a polygon and/or arcuate shape. A method of practice of the present invention may further include the steps of: receiving an instruction via the interactive user interface to modify a parameter of the polygon and modifying the parameter of the polygon based upon the instruction received via the interactive user interface. The parameter modified may include one or both of: an area of the polygon; and a shape of the polygon.

In another aspect a dynamic component may include a line segment and/or arcuate segment, and methods of practice may include one or more of: receiving an instruction via an interactive user interface to modify a parameter of the line segment, and the method further includes the step of modifying the parameter of the line segment based upon the instruction received via the interactive user interface. The parameter of the line segment may include a length of the line segment, and the method may additionally include modifying a length of a wall based upon the modifying the length of the line segment.

The parameter modified may additionally include a direction of the line segment and the method may additionally include modifying an area of a room based upon the modifying of the length and direction of the line segment. A boundary may be set based upon reference to a boundary allocation hierarchy.

In another aspect, a price may be associated with each of the quantities of items to be included in construction of the building. In addition, a type of labor associated with at least one of the items to be included in construction of the building may be designated based upon AI analysis of the first two-dimensional reference (i.e., first design plan) and the second two-dimensional reference (i.e., second design plan), respectively.

Methods of practice may additionally include the steps of: determining whether a design plan received into the controller includes a vector image, and if one of the first and the second design plans received into the controller includes a vector image, converting at least a portion of the vector image into a raster image. Implementations of the described techniques may include hardware, a method or process, or computer software on a computer-accessible medium.

A dynamic component may include a line segment and/or vector, and the method may further include the steps of: receiving an instruction via the interactive user interface to modify a parameter of the line segment and/or vector and modifying the parameter of the line segment and/or vector based upon the instruction received via the interactive user interface. The modified parameter may include a magnitude of the line segment and/or vector and/or a direction of the vector.

The method may additionally include the step of training the AI engine based upon a human identifying portions of a design plan to indicate that it includes a particular type of item; or to identify portions of the design plan that include a boundary. The AI engine via may also be trained by reference to a boundary allocation hierarchy.

The methods may additionally include the steps of: determining whether the design plans received into the controller includes a vector image, and if the design plan received into the controller does include a vector image converting at least a portion of the vector image into a raster image; and/or whether a design plan includes a vector image format. Implementations of the described techniques and method steps may include hardware (such as a controller and/or computer server), a method or process, or computer software on a computer-accessible medium.

Still further, in some embodiments, the controller may assess how assignment of different classes of space to one or more designated areas may alter conformance of a design with a specified code. Furthermore, in some embodiments, particular attributes of a building may be analyzed based upon laws or regulations in effect within a geopolitical boundary encompassing the building. In some embodiments, multiple disparate user interfaces may be used to communicate calculated parameters associated with determined attributes.

There may be alternative methods of receiving data from various sources that can be used to generate a design or to supplement a design created in the manners as have been described previously. For example, the system may receive an architectural file with intelligent features of various kinds which will be discussed in further detail herein. The present system may operate in concert with a BIM or CAD design system, for example, as an add-in to these design systems and then the present system may have access to design elements, location data and the like directly. In other examples, the present system may access BIM or CAD design system data by loading data files from said systems. In still further examples, the present system may operate to capture data from display screens that are displaying designs from the said BIM or CAD design systems. As an additional example, the present compliance assessment system exhibits its versatility by harmoniously integrating with prominent design frameworks like BIM or CAD. This integration facilitates a proactive approach to evaluate the compliance of building designs in the nascent or initial stages of the creative process, considering an array of potential best practices. This early-stage assessment not only facilitates that the design in progress aligns with regulatory standards but also serves as a strategic time-saving measure, optimizing the efficiency of the overall design workflow. A synergy between compliance analysis and design systems not only enhances the precision of the evaluation at early stages, but also contributes to a more streamlined and resource-efficient architectural and engineering endeavour.

In a non-limiting example, the present system may receive a file in one of the REVIT native formats such as files of types RVT, RFA, RTE and RFT. Embodiments may also include receiving non-Revit compatible file formats, such as, one or more of: BMP, PNG, JPG, JPEG, and TIF.

Figure 17:
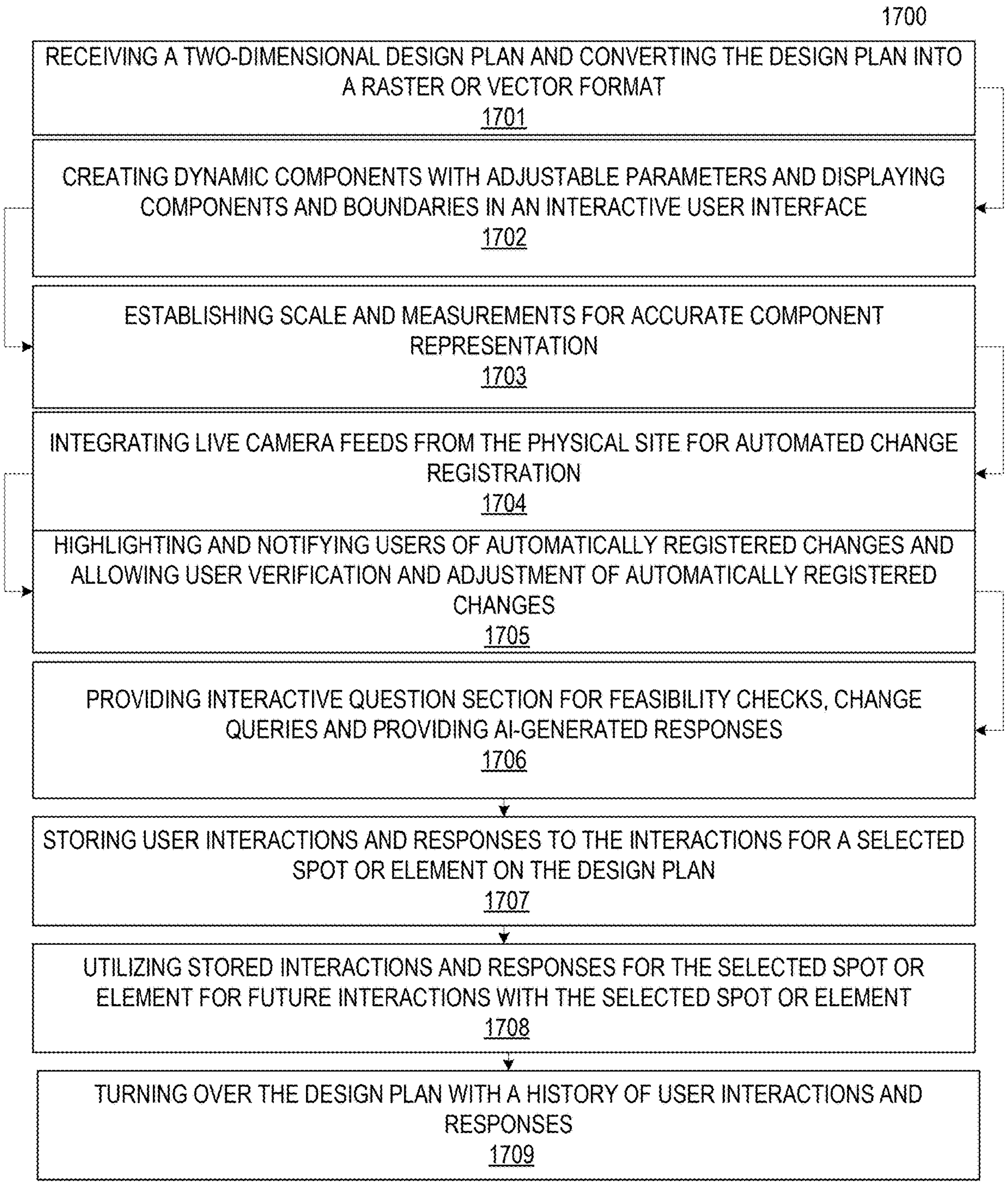
FIG. 17 illustrates exemplary method steps that may be executed in some embodiments of the present invention.

Referring now to FIG. 17, an exemplary flow chart 1700 is illustrated, outlining a systematic approach for dynamically interacting with, updating, and utilizing a two-dimensional design plan for construction and/or renovation purposes in accordance with the present invention. The flow chart 1700 demonstrates how a two-dimensional design plan can be effectively converted, enhanced with dynamic and adjustable elements, continuously updated with real-time changes, and utilized as a reference tool with historical interaction data. The system enables a smooth and informed turnover process to clients, contractors, or sub-contractors, equipped with an interactive, intelligent design plan that stores the history of interactions and responses for future reference.

At step 1701, the system begins by receiving a two-dimensional design plan and converting the design plan into a raster or vector format. This foundational step involves transforming traditional design formats into digital formats that can be processed by the AI-powered system, such as raster images or vector files. This conversion facilitates the system's capability to analyze, adjust, and build upon the design plan's components accurately. For example, a paper-based floor plan for a residential building can be scanned and converted to a digital raster format, allowing the system to recognize elements like walls, doors, and windows at the pixel level, while a vector format may be used to define elements through precise paths and coordinates, enabling more granular manipulation.

At step 1702, the system creates dynamic components with adjustable parameters and displays dynamic components and boundaries in an interactive user interface which allows users to interact directly with the design elements within the digital design plan. The dynamic components can include walls, doors, HVAC ducts, electrical conduits, and other building elements, each with parameters that can be adjusted based on user interactions. For example, a contractor may click on a wall component to resize or reposition it, adjusting the wall length or modifying its location based on project requirements at construction site. These interactive components enable the user to simulate real-world changes on the design plan, such as adding or removing fixtures or altering structural elements, and to view how these adjustments impact the overall layout in real time.

At step 1703, the system establishes scale and measurements for accurate component representation to enable precise placement and sizing of each element on the design plan. This step involves calibrating the dimensions of the design plan so that measurements on the digital platform correspond directly to physical measurements in the actual construction. For example, the system may use a predefined scale (e.g., one pixel equals one inch) or calibrate based on user-defined reference points to facilitate that all changes and additions are dimensionally accurate. This capability may particularly be beneficial for contractors who need to verify that structural elements meet specifications, such as confirming that the distance between load-bearing walls aligns with engineering standards.

At step 1704, the system includes integrating live camera feeds from the physical site for automated change registration. In some embodiments, live camera feeds from strategically placed cameras on the construction site capture physical modifications in real time. The system utilizes image recognition algorithms to detect and register changes on the digital design plan based on the live feed. For example, if a new wall is erected on-site, the AI engine, based on camera feed, identifies this addition and automatically marks it on the digital design plan. This integration significantly reduces manual entry, as the system can autonomously track and update physical progress, so that the design plan reflects the most current construction status.

At step 1705, the system facilitates highlighting and notifying users of automatically registered changes and allowing user verification and adjustment of automatically registered changes. This step is useful for maintaining accuracy, as some automatically registered changes may require user validation to confirm the system's interpretation. For example, if the system detects (based on camera feed) that a door has been added to a wall, it may notify the contractor or architect or highlight the change on the design plan for further attention by the contractor. The contractor can then verify if the detected modification is correct or, if required, add more details and adjust the positioning or dimensions to align with project requirements.

At step 1706, the system provides an interactive question section for feasibility checks, change queries (e.g., querying about what has been changed during construction), and providing AI-generated responses as an intelligent assistance feature within the user interface. Users can inquire about the feasibility of certain modifications, ask specific questions regarding elements on the plan, or seek system-generated suggestions for adjustments. For example, a user may ask if adding an air conditioning unit in a particular room would affect the load-bearing structure. The AI engine then analyzes the question against the design plan, providing a response that outlines the architectural feasibility and potential adjustments needed to accommodate the change.

At step 1707, the system stores user interactions and responses to the interactions for a selected spot or element on the design plan to enable the system to build a comprehensive record of each modification, query, or suggestion related to the design elements. This stored data forms a historical log that can be accessed later, providing a timeline of decisions and changes made during construction. For example, if a user modifies a plumbing route on the design plan, the system logs this adjustment, along with any relevant user comments or compliance warnings. This data storage is invaluable for tracking decision-making processes, particularly in complex projects where multiple stakeholders are involved.

At step 1708, the system utilizes the stored data by utilizing stored interactions and responses for the selected spot or element for future interactions with the selected spot or element. This means that whenever a user revisits a specific component or area in the design plan, the system can retrieve historical data associated with that spot, offering context-aware suggestions or highlighting past challenges encountered with similar changes. For example, if a user previously moved an HVAC duct in response to a structural issue, the system can provide this information the next time the ductwork is accessed, enabling more informed decisions.

Finally, at step 1709, the system completes the process by turning over the design plan with a history of user interactions and responses to other contractors, stakeholders, or the client. This step facilitates that when the design plan is handed off, it includes a comprehensive log of all changes, user decisions, system suggestions, and annotations. For example, when the design plan is transferred to a maintenance team post-construction, they will have access to all prior modifications and registered changes, allowing them to understand the rationale behind each alteration. This historical record enhances accountability and provides continuity, so that the future teams can make informed decisions based on past data.

Glossary

"Artificial Intelligence" as used herein means machine-based decision making and machine learning including but not limited to: supervised and unsupervised recognition of patterns, classification, and numerical regression. Supervised learning of patterns includes a human indicating that a pattern (such as a pattern of dots formed via the rasterization of a two-dimensional image) is representative of a line, polygon, shape, angle or other geometric form, or an architectural aspect, unsupervised learning can include a machine finding a pattern submitted for analysis. One or both may use mathematical optimization, formal logic, artificial neural networks, and methods based on one or more of: statistics, probability, linear regression, linear algebra, and/or matrix multiplication.

"AI Engine" as used herein an AI Engine (sometimes referred to as an AI model) refers to methods and apparatus for applying artificial intelligence and/or machine learning to a task performed by a controller. In some embodiments, a controller may be operative via executable software to function as an AI engine capable of recognizing aspects and/or tally aspects of a design plan that are relevant to generating an estimate for performing projects included in construction of a building or other activities related to construction of a building.

"Computer Aided Design," sometimes referred to as "CAD," as used herein shall mean the use of automation for the creation, modification, analysis, or optimization of a design plan or design plan file.

"Building Information Modeling" sometimes referred to as "BIM," as used herein.

"Vector File" as used herein a vector file is a computer graphic that uses mathematical formulas to render its image. In some embodiments, a sharpness of a vector file will be agnostic to size within a range of sizes viewable on smart devices and personal computer display screens.

Typically, a vector image includes segments with two points. These two points create a path. Paths can be straight or curved. Paths may be connected at connection points. Connected paths form more complex shapes. More points may be used to form longer paths or closed shapes. Each path, curve, or shape has its own formula, so they can be sized up or down and the formulas will maintain the crispness and sharp qualities of each path.

A vector file may include connected paths that may be viewed as graphics. The paths that make up the graphics may include geometric shapes or portions of geometric shapes, such as: circles, ellipsis, Bezier curves, squares, rectangles, polygons, and lines. More sophisticated designs may be created by joining and intersecting shapes and/or paths. Each shape may be treated as an individual object within the larger image. Vector graphics are scalable, such that they may be increased or decreased without significantly distorting the image.

The terms "design plan," "building plan," "building design," "floor plan," "two-dimensional reference," "two-dimensional or three-dimensional static representation," or simply "design" are used interchangeably, often referring to the same or similar concepts in the context of architectural or construction documentation.

The present invention provides for systems of one or more computers that can be configured to perform particular operations or actions by virtue of having software, firmware, hardware, or a combination of them installed on the system that in operation causes or cause the system to perform the actions. One or more computer programs can be configured to perform artificial intelligence operations or actions by virtue of including instructions that, when executed by data processing apparatus, cause the apparatus to perform the actions.

The present invention provides for automated processes to assist in construction "turnover" obligations and transfer spatially relevant details about a completed building and/or a partially completed building from a contractor or other entity responsible for construction of the building over to the building owner or other interested party, such as for example a building occupant, insurance entity, maintenance entity, or other person with an interest int eh building.

The automated systems and processes provide a user manipulatable interface on an automated device documenting construction activities and outstanding items noted (e.g. items included on an associated punch list). Such tasks may be identified and quantified in the automated systems during inspections that ascertain and record whether contractual obligations have been met. In addition, the automated systems act a receptacle for compiled information which may be conveyed to the building owner or other interested party, such as, by way of non-limiting example one or more of: As-Built Drawings detailing all changes made during construction, providing an accurate representation of the completed structure; Operation and Maintenance (O&M) Manuals: that outline the procedures for operating and maintaining building systems and equipment; Warranties specifying the terms under which repairs or replacements will be made in case of defects; and official documents verifying that the building meets all regulatory standards and codes.

Additional information that may be compiled and spatially located in a user interface replicating a design plan includes, by way of non-limiting example, one or more of:

Systems Commissioning: documentation of testing and verification processes that ensure that relevant building systems (e.g., HVAC, electrical, plumbing) operate according to design specifications. This step confirms that the systems are functional and efficient before occupancy.

Training for Operations and Maintenance Personnel: automated virtual training and Operations and Maintenance, ensuring they are well-versed in the building's systems and can manage them effectively. Training may address routine operations, maintenance procedures, and troubleshooting techniques.

Final Walkthrough and Acceptance: virtual data (e.g. image data, video, narrative, voice, or other data input format) documenting a joint inspection involving the contractor, owner, and relevant stakeholders is conducted to verify that all contractual obligations have been met. Formal acceptance of the building may be digitally quantified, marking the official transfer of responsibility for the building over to the building owner and/or other entities.

The automated systems of the present invention facilitate presentation and implementation of best practices during the turnover phase that is important for a seamless transition and not always apparent to less experienced persons involved in a turnover process. These practices include maintaining clear communication between all parties, ensuring thorough documentation, and providing adequate training for the owner's personnel. Such diligence helps prevent future operational issues and lays the foundation for the building's long-term success.

The automated systems and processes of the present invention enable managing of, and documenting of, the turnover process, wherein a contractor may deliver a building that not only meets an owner's expectations but also ensures efficient and effective operation of the building throughout its lifecycle.

The present invention may also be implemented to manage post-construction reports to simplify complex and otherwise overwhelming tasks for building owners, especially when dealing with a large or intricately detailed building. For example, a multi-story office building with complex HVAC systems, multiple electrical circuits, and extensive plumbing networks will generate a significant volume of data during construction. The present invention automates and makes such reports easily accessible documenting thereby managing changes that may be scattered across various documents, spreadsheets, and drawings, making it challenging for an owner or other user to get a clear picture of the final construction. In addition, the present invention may interpret such reports which may be highly technical, and require specialized knowledge to interpret, which may be beyond the expertise of a user, but well within the capabilities of an automated controller, and in particular a controller operating AI.

For example, if a client is trying to verify that the HVAC system was installed according to specification, the automated systems of the present invention may quickly analyze various reports detailing the model, installation date, rating, and any changes made to the system during construction. Even if these reports are disorganized or incomplete, the automated process and systems of the present invention may quickly draw correlations between disparate sources of information, eliminating delays and potential confusion often associated with manual human inspection of such a volume of documentation. In addition, the automated processes may accomplish the tasks of locating, identifying, organizing and presenting relevant information in a timeframe that is useful to a person responsible for a building, while manual attempts to accomplish these tasks would take more time than is practicable, and perhaps impossible.

The complexity of reviewing these scattered reports becomes even more pronounced when the building is large or has undergone numerous changes. Consider, for example, a large hospital with multiple wings, each containing specialized medical equipment, complex electrical systems, and a highly regulated HVAC network. If changes were made to any of these systems during construction, the reports documenting those changes would need to be meticulously organized to allow the hospital's facilities manager to understand what was installed, why it was changed, and how it affects the building's operations. Any misstep in reviewing these documents could result in operational inefficiencies or, worse, safety hazards.

Beyond understanding the construction progress, the building owner also needs to track the installation of fixtures and appliances. In many cases, the initial design plan may specify a certain type of fixture with specific ratings and warranty information. However, during construction, substitutions are often made due to material shortages or cost considerations. For example, the original design may call for high-efficiency lighting fixtures with a specific energy rating, but due to availability issues, a different model is installed. The building owner needs to be aware of these changes, not only for warranty purposes but also for future maintenance or replacements.

When the time comes to replace these fixtures or appliances, the owner must know exactly what was installed, and where it was installed in the building. If the reports documenting these changes are incomplete or difficult to interpret, the owner may purchase an incompatible fixture, leading to additional installation costs or potential system failures. For example, if the HVAC system requires a specific type of air filter, but the documentation only lists the original design specification rather than the installed model, the owner may purchase the wrong filter, which could damage the system.

The need for detailed reports documenting construction changes also extends into the future when the building may require renovations or retrofitting. Over time, buildings undergo modifications to accommodate changing needs, such as converting office space into residential units or adding new technology. In such cases, the owner or contractor will need to review the original construction reports to understand the building's current configuration and confirm that the planned renovations will not interfere with existing systems. However, if the reports are incomplete or disorganized, it becomes difficult to make informed decisions about the renovations.

For example, if an owner plans to retrofit a room with new lighting and electrical outlets, they will need to know where the existing wiring is located to avoid drilling into live wires or overloading the circuit. If the reports do not provide clear information about the wiring layout, the contractor may inadvertently damage the electrical system during the renovation, resulting in costly repairs and potential safety hazards.

Another scenario where incomplete reports can lead to issues is when modifications are made to walls or structural elements. For example, if a contractor is tasked with installing new fixtures in a wall, they will need to know whether the wall contains hidden plumbing or electrical wiring. Without accurate documentation, the contractor could drill into a water pipe, causing flooding, or cut through an electrical conduit, leading to a fire hazard. These types of mistakes are not only costly to repair but can also cause significant delays in the renovation process.

Furthermore, the difficulty of managing these scattered reports is compounded when the building has undergone multiple rounds of renovations over the years. In such cases, the original construction reports may no longer be sufficient, as subsequent changes to the building may not be well-documented. For example, if a building was constructed 20 years ago and has since undergone several renovations, the owner may need to review a mix of old and new reports to get a complete picture of the building's current configuration. This process can be time-consuming and prone to errors, as discrepancies between different reports, or inaccuracy in interpreting the reports, may lead to confusion about what was actually installed.

The systems, processes and apparatus of the present invention provide easily accessible reports is also important when it comes to maintaining building warranties and determining that systems are serviced according to manufacturer recommendations.

In another aspect, many fixtures and systems installed during construction come with warranties that specify maintenance schedules and approved replacement parts. For example, an HVAC system may require regular filter replacements to maintain warranty coverage. The present invention may assess and address these requirements due, and generate complete and organized reports, that preserve the warranty and offset the potential for costly repairs based upon the items continuing to be covered by insurance.

Similar issues may arise with other systems, such as plumbing or electrical, where maintenance schedules and part replacements are required for the system's longevity. For example, if the building's plumbing system uses specialized valves that require periodic servicing, the owner needs to know the specific model and service intervals so that the system remains functional. Without the accurate records provided by the present invention, the owner may miss critical maintenance deadlines, leading to system failures and expensive repairs.

Additionally, the reports documenting construction changes are often needed for regulatory compliance purposes. Many buildings are subject to strict building codes and regulations that govern everything from fire safety to energy efficiency. If changes are made during construction that affect the building's compliance with these codes, the reports need to document these changes in detail to satisfy regulatory requirements. For example, if a building's fire suppression system was modified during construction, the owner would need detailed records to demonstrate that the system still meets fire safety standards.

The automated processes, systems and apparatus of the present invention may receive as input one or more of: a combination of paper documents, spreadsheets, image data, video, audio transcriptions, automatically updated drawings and/or manually updated drawings to keep track of changes. This decentralized approach enables the systems to maintain a clear, organized record of the building's construction history. As changes accumulate over time, the reports become increasingly complex, and the automated systems of the present invention make it possible to manage and reduce a risk of errors or omissions.

In addition, the present invention may capture a full scope of changes made during construction. For example, while major changes such as structural modifications may be well-documented, smaller changes such as, for example, a substitution of fixtures or alterations to wiring layouts may be overlooked. This lack of detail can lead to problems at a later time during repairs, renovations, or future maintenance. For example, if the wiring for a particular room was changed during construction to accommodate a different type of lighting fixture, but that change was not properly documented, the building owner or future contractor may not be aware of this when attempting to modify or repair the electrical system later. This could result in an incorrect diagnosis of issues or potentially hazardous situations like overloading circuits.

One of the more significant challenges with current construction documentation methods is that they are often scattered across multiple sources. Unlike previously known systems where project managers, contractors, and subcontractors may each keep their own records, resulting in fragmented information that is difficult to consolidate, the present invention provides for each disparate person to input changes known to them, and the automated system can aggregate, organize, and store modifications made during construction and allow details of the changes to be retrieved at a later date in a comprehensive manner or as a result of user selection. For example, while a contractor might document changes to the HVAC system, a separate subcontractor handling plumbing installations may only be aware of changes that affect plumbing work. The present invention provides for centralized documentation that is spatially coordinated, making retrieval of building information intuitive. It also provides for a user to access a comprehensive history of a building's interconnected systems.

For example, a new owner seeking to retrofit a commercial space might need to know where specific wiring was routed or how the HVAC system was modified during construction so that any new systems installed will integrate properly with existing infrastructure. The present invention provides for accurate documentation that allows a new owner to resort to certainty and to understand the building's current configuration, which provides cost savings eliminates unnecessary delays.

Moreover, owners or contractors may be fully informed of changes made during construction, enabling future renovations or retrofitting projects to avoid unforeseen problems. For example, when drilling into a wall to install new equipment, the presence of hidden wiring or plumbing can easily go unnoticed if there is no clear documentation. A seemingly simple task, like mounting a shelf or installing a new outlet, could result in damaging pipes or electrical systems that were modified during construction but not properly documented. Such incidents can lead to water damage, electrical outages, or even safety hazards, which then require additional work and expense to repair.

These complications also extend to larger infrastructure systems within the building, such as HVAC, plumbing, or fire safety systems. If these systems were modified during construction but the modifications were not clearly documented, it can create problems down the line. For example, the use of substitute materials, rerouting of ducts, or changes to the plumbing layout to accommodate design changes may not be captured in the original construction reports. Without accurate knowledge of these modifications, future repairs may be improperly handled, leading to inefficiencies, further damage, or voided warranties.

One specific example is in the installation of HVAC systems. A contractor may be forced to modify a ductwork layout if the initially designed path interferes with structural elements uncovered during construction. The systems of the present invention may record such changes in a spatially relevant manner and provide accurate documentation of such changes so that system functions may be maintained correctly.

Another significant benefit of the present invention ease of transferring knowledge between contractors and building owners. Often, the knowledge of what changes were made and why is retained by the contractors or project managers involved in the construction process. When ownership of the building is transferred or new contractors are hired for maintenance or renovations, this knowledge does not easily transfer with the building itself. The present invention provides spatially relevant information about building aspects enabling new contractors or owners to access with an incomplete picture of the building's systems, facilitating planning and execution of future projects.

CONCLUSION

A number of embodiments of the present disclosure have been described. While this specification contains many specific implementation details, they should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings, and the detailed description thereto, are not intended to limit the present disclosure to the form disclosed, but to the contrary, the present disclosure is to cover all modifications, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" be used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

The phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising," "including," and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that all illustrated operations be performed, to achieve desirable results.

Moreover, the separation of various system components in the embodiments described above should not be understood as requiring such separation in all embodiments, and it should be understood that the described program components and systems can generally be integrated together into a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. An apparatus for automatically creating design plan aspects, the apparatus comprising:

a display screen configured to present an interactive user interface;

a digital storage medium comprising executable software code; and a controller operating an Artificial Intelligence (AI) engine, the controller comprising a processor, wherein the executable software code, when executed by the processor, causes the processor to:

a. receive, by the controller, a design plan of at least a portion of a building;

b. convert, by the controller, the design plan into multiple dynamic components each having one or more changeable parameters, determine a scale associated with the design plan, and generate, by the controller, the interactive user interface comprising at least some of the multiple dynamic components, wherein the interactive user interface allows a user to view, select, and interact with the multiple dynamic components;

c. spatially locate the multiple dynamic components of the design plan by arranging the multiple dynamic components to form boundaries and by determining one or more measurements and relative spatial distances associated with the multiple dynamic components using the scale;

d. enable the user to select at least one of the multiple dynamic components of the design plan at a selected location on the design plan to register as-built details related to a selected dynamic component during construction of the building;

e. enable the user to amend the as-built details associated with the selected dynamic component, wherein the as-built details include information describing what was built at the selected location and comprise at least one of: dimensions, material, manufacturer, specifications, warranty information, maintenance requirements, and a reason for a registered change;

f. analyze, by the controller using the AI engine, the as-built details, the determined one or more measurements, and the relative spatial distances to determine impacts on one or more other dynamic components within the design plan, the one or more other dynamic components including at least one of: electrical wiring, plumbing pipes, ventilation ducts, and structural elements associated with the selected dynamic component, including hidden infrastructure within a wall or beneath a floor;

g. automatically generate, by the controller based on the determined impacts, one or more updated layouts for the one or more other dynamic components, including at least one of rerouted wiring, rerouted plumbing, a repositioned vent, an adjusted duct layout, an adjusted structural support, a recalculated dimension, and a recalculated routing length;

h. update the interactive user interface comprising the design plan to reflect the as-built details and the one or more updated layouts;

i. automatically generate, by the controller, a turnover package comprising an updated design plan, the as-built details, and a history of registered changes to the design plan with reasons for the registered changes; and j. provide the turnover package to the contractors, the stakeholders, or the clients for building handover.

2. The apparatus of claim 1, wherein the interactive user interface enables users to upload multimedia annotations related to the as-built details, including photos, videos, and voice notes.

3. The apparatus of claim 1, wherein the controller notifies other contractors responsible for adjacent areas about the as-built details and provides the other contractors with automated suggestions related to the adjacent areas, wherein the adjacent areas are affected by the as-built details.

4. The apparatus of claim 1, wherein the AI engine detects if a physical change introduces a potential obstruction or structural issue within the building and prompts the user with alternative options.

5. The apparatus of claim 4, wherein the controller generates an error window on the interactive user interface if the physical change conflicts with other building systems.

6. The apparatus of claim 5, wherein the controller automatically generates layout alternatives when the physical change impacts other building systems.

7. The apparatus of claim 1, wherein the controller updates the design plan with a change indicator icon linked to the as-built details.

8. The apparatus of claim 1, wherein the controller restricts access to authorized contractors only, enabling the authorized contractors to register physical changes on the design plan solely within designated areas of responsibilities of the authorized contractors.

9. The apparatus of claim 1, wherein the controller dynamically updates impacted areas of the design plan based on the as-built details made by the user in a designated area of the design plan, and selectively shares the updated impacted areas of the design plan with relevant contractors assigned to the impacted areas.

10. The apparatus of claim 1, wherein the controller generates a turnover package comprising the design plan, registered changes, and associated annotations, and subsequently delivers the turnover package to authorized stakeholders, comprising one or more of: contractors, owners, and clients.

11. The apparatus of claim 1, wherein the AI engine is configured to generate automated suggestions for resolving conflicts between the as-built details and existing building components.

12. The apparatus of claim 1, wherein the controller is configured to propose alternative design layouts for components affected by the as-built details.

13. The apparatus of claim 1, wherein the interactive user interface includes tools for selecting, resizing, and relocating components on the design plan.

14. The apparatus of claim 1, wherein the controller is configured to calculate dimensions of components based on a predefined scale.

15. The apparatus of claim 1, further comprising a notification module to alert users of potential conflicts or compliance issues related to the as-built details.

16. The apparatus of claim 1, further comprising a database storing multimedia annotations, including photos and videos, associated with the as-built details.

17. The apparatus of claim 1, wherein the controller is configured to restrict access to authorized users based on predefined roles and permissions.

18. The apparatus of claim 1, wherein the controller is further configured to include in the turnover package annotations associated with the changes to the design plan in the as-built details.

19. The apparatus of claim 1, wherein the interactive user interface provides a question section for users to inquire about a feasibility of proposed changes.

20. The apparatus of claim 1, wherein the AI engine performs predictive analysis to suggest future modifications based on historical data.

21. The apparatus of claim 1, further comprising a compliance check module to ensure the as-built details adhere to building codes and regulations.

22. The apparatus of claim 1, wherein the controller dynamically updates interconnected systems, such as HVAC and plumbing, based on the as-built details.

23. The apparatus of claim 1, wherein the interactive user interface includes a search function to locate specific components or changes within the design plan.

24. The apparatus of claim 1, further comprising a reporting module to generate summaries of the as-built details and their impacts on the design plan.

25. The apparatus of claim 1, wherein the controller integrates with third-party platforms for material procurement and compliance verification.

26. The apparatus of claim 1, wherein the AI engine is trained to recognize and categorize architectural components within the design plan.

27. The apparatus of claim 1, further comprising a module for tracking warranty information and maintenance schedules for installed components.

28. The apparatus of claim 1, wherein the interactive user interface supports collaboration between multiple users working on different sections of the building.

29. The apparatus of claim 1, wherein the controller generates change indicators on the design plan to visually mark registered modifications.

* * * * *